United States Patent
Kataoka et al.

(10) Patent No.: US 10,649,329 B2
(45) Date of Patent: May 12, 2020

(54) ACTIVE LIGHT SENSITIVE OR RADIATION SENSITIVE RESIN COMPOSITION, ACTIVE LIGHT SENSITIVE OR RADIATION SENSITIVE FILM, PATTERN FORMING METHOD, METHOD FOR MANUFACTURING ELECTRONIC DEVICE, AND ELECTRONIC DEVICE

(71) Applicant: FUJIFILM Corporation, Tokyo (JP)

(72) Inventors: Shohei Kataoka, Shizuoka (JP); Akinori Shibuya, Shizuoka (JP); Keiyu Ou, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/384,521

(22) Filed: Dec. 20, 2016

(65) Prior Publication Data

US 2017/0097565 A1 Apr. 6, 2017

Related U.S. Application Data

(63) Continuation of application No. PCT/JP2015/065729, filed on Jun. 1, 2015.

(30) Foreign Application Priority Data

Aug. 22, 2014 (JP) .................................. 2014-169761

(51) Int. Cl.
| | | |
|---|---|---|
| G03F 7/004 | (2006.01) |
| G03F 7/38 | (2006.01) |
| G03F 7/40 | (2006.01) |
| G03F 7/038 | (2006.01) |
| G03F 7/039 | (2006.01) |
| G03F 7/09 | (2006.01) |
| G03F 7/16 | (2006.01) |
| G03F 7/20 | (2006.01) |
| G03F 7/32 | (2006.01) |

(52) U.S. Cl.
CPC .......... *G03F 7/0045* (2013.01); *G03F 7/0046* (2013.01); *G03F 7/038* (2013.01); *G03F 7/0392* (2013.01); *G03F 7/0397* (2013.01); *G03F 7/091* (2013.01); *G03F 7/16* (2013.01); *G03F 7/168* (2013.01); *G03F 7/2041* (2013.01); *G03F 7/325* (2013.01); *G03F 7/38* (2013.01); *G03F 7/40* (2013.01)

(58) Field of Classification Search
CPC .... G03F 7/0045; G03F 7/0392; G03F 7/0397; G03F 7/038; G03F 7/0382; G03F 7/325; G03F 7/38; G03F 7/04; G03F 7/2041
USPC ..................... 430/270.1, 919, 920
See application file for complete search history.

(56) References Cited

U.S. PATENT DOCUMENTS

| 3,532,748 | A | * | 10/1970 | Smith ..................... A61K 31/13 |
| | | | | 514/888 |
| 3,906,007 | A | * | 9/1975 | Albrecht .............. C07D 307/91 |
| | | | | 544/357 |
| 6,673,511 | B1 | | 1/2004 | Hatakeyama et al. |
| 9,120,288 | B2 | | 9/2015 | Takahashi |
| 2002/0098443 | A1 | | 7/2002 | Hatakeyama et al. |
| 2003/0157428 | A1 | | 8/2003 | Trefonas, III et al. |
| 2004/0106063 | A1 | | 6/2004 | Hatakeyama et al. |
| 2005/0238993 | A1 | | 10/2005 | Watanabe et al. |
| 2008/0102405 | A1 | | 5/2008 | Watanabe et al. |
| 2011/0129777 | A1 | | 6/2011 | Hatakeyama et al. |
| 2011/0201823 | A1 | | 8/2011 | Yoshida et al. |
| 2013/0065183 | A1 | | 3/2013 | Kobayashi et al. |
| 2013/0089817 | A1 | | 4/2013 | Miyata et al. |
| 2014/0080055 | A1 | | 3/2014 | Hatakeyama et al. |
| 2015/0079520 | A1 | | 3/2015 | Namai et al. |
| 2017/0131632 | A1 | | 5/2017 | Namai et al. |

FOREIGN PATENT DOCUMENTS

| JP | 11-52575 A | 2/1999 |
| JP | 2000-298348 A | 10/2000 |
| JP | 2001-194776 A | 7/2001 |
| JP | 2002-226470 A | 8/2002 |
| JP | 2003-122011 A | 4/2003 |
| JP | 2004-294552 A | 10/2004 |
| JP | 3632410 B2 | 3/2005 |
| JP | 2005306812 A | 11/2005 |
| JP | 2008107513 A | 5/2008 |
| JP | 2008-281975 A | 11/2008 |
| JP | 2010-139996 A | 6/2010 |
| JP | 2010-164958 A | 7/2010 |
| JP | 2010250076 A | 11/2010 |
| JP | 2011-138111 A | 7/2011 |

(Continued)

OTHER PUBLICATIONS

Communication dated May 22, 2018, issued by the Japanese Patent Office in counterpart Japanese application No. 2016-543846.

(Continued)

*Primary Examiner* — John S Chu
(74) *Attorney, Agent, or Firm* — Sughrue Mion, PLLC

(57) ABSTRACT

An active-light-sensitive or radiation-sensitive resin composition includes a basic compound (A) corresponding to at least one of the following basic compound (A1) or (A2):

(A1) a nonionic compound having an alicyclic structure (a1) and a basic site (b2) at a site different from the alicyclic structure within one molecule, or (A2) a nonionic compound having a heterocyclic structure (a2) having no basicity and a basic site (b2) at a site different from the heterocyclic structure within one molecule.

17 Claims, No Drawings

(56) References Cited

FOREIGN PATENT DOCUMENTS

| | | |
|---|---|---|
| JP | 2012008553 A | 1/2012 |
| JP | 2012072109 A | 4/2012 |
| JP | 2013-057836 A | 3/2013 |
| JP | 2013-68777 A | 4/2013 |
| JP | 2013-105147 A | 5/2013 |
| JP | 2013-225094 A | 10/2013 |
| JP | 2014-074896 A | 4/2014 |
| JP | 2014-115638 A | 6/2014 |
| JP | 2014115622 A | 6/2014 |
| JP | 2014191121 A | 10/2014 |
| KR | 10-2008-0037535 A | 4/2008 |
| KR | 10-2014-0035827 A | 3/2014 |
| TW | I269940 B | 1/2007 |
| TW | 201418886 A | 5/2014 |
| WO | 2013172239 A1 | 11/2013 |

OTHER PUBLICATIONS

International Preliminary Report on Patentability and Written Opinion, dated Feb. 28, 2017, in corresponding International Application No. PCT/JP2015/065729, 19 pages in English and Japanese.
International Search Report for PCT/JP2015/065729 dated Jul. 7, 2015.
Kyoritsu Shuppan Co Ltd., Chemicals great dictionary 7, Oct. 30, 1961, 793 (3 pages).
Communication dated Jan. 16, 2018, issued by the Japan Patent Office in counterpart application No. 2016-543846.
Communication dated Aug. 8, 2017, from the Japanese Patent Office in counterpart application No. 2016-543846.
Communication dated Aug. 18, 2017 from the Korean Intellectual Property Office in counterpart application No. 10-2016-7036250.
Communication dated Feb. 27, 2019, from the Taiwanese Patent Office in application No. 104118556.

* cited by examiner

ACTIVE LIGHT SENSITIVE OR RADIATION SENSITIVE RESIN COMPOSITION, ACTIVE LIGHT SENSITIVE OR RADIATION SENSITIVE FILM, PATTERN FORMING METHOD, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2015/065729 filed on Jun. 1, 2015, which claims priority under 35 U.S.C § 119 (a) to Japanese Patent Application No. 2014-169761 filed on Aug. 22, 2014. Each of the above application(s) is hereby expressly incorporated by reference, in its entirety, into the present application.

BACKGROUND OF THE INVENTION

1. Field of the Invention

The present invention relates to an active-light-sensitive or radiation-sensitive resin composition, an active-light-sensitive or radiation-sensitive film, and a pattern forming method. More specifically, the present invention relates to an active-light-sensitive or radiation-sensitive resin composition which is used for a process for manufacturing a semiconductor such as an IC, a process for manufacturing a circuit board for a liquid crystal, a thermal head or the like, and other photofabrication processes, a planographic printing plate, or an acid curable composition, and a pattern forming method. In addition, the present invention relates to a method for manufacturing an electronic device, including the pattern forming method, and an electronic device manufactured by the method.

2. Description of the Related Art

Since a resist for a KrF excimer laser (248 nm) was developed, a pattern forming method using chemical amplification has been used in order to complement desensitization caused by light absorption. For example, in a positive tone chemical amplification method, a photoacid generator included in an exposed area first decomposes upon irradiation with light to generate an acid. Further, in a post exposure bake (PEB) step or the like, an alkali-insoluble group included in a photosensitive composition is changed into an alkali-soluble group by the catalytic action of the generated acid. Thereafter, development is carried out by using, for example, an alkali solution. Thus, the exposed area is removed to obtain a desired pattern (see, for example, JP3632410B, JP2011-138111A, and JP2014-74896A).

In the method, various ones have been proposed as the alkaline developer. For example, a water-based alkaline developer with 2.38% by mass of aqueous tetramethylammonium hydroxide (TMAH) solution is universally used as the alkaline developer.

Moreover, in order to make semiconductor elements finer, the wavelength of an exposure light source has been shortened and a projection lens with a high numerical aperture (high NA) has been advanced. Thus, an exposure machine using an ArF excimer laser having a wavelength of 193 nm as a light source has been currently developed. As a technique for further improving resolving power, a method (that is, a liquid immersion method) in which a liquid having a high refractive index (hereinafter also referred to as an "immersion liquid") is filled between a projection lens and a sample. In addition, EUV lithography in which exposure is carried out with ultraviolet rays at a shorter wavelength (13.5 nm) has also been proposed.

Recently, a pattern forming method using a developer including an organic solvent has also been developed (see, for example, JP2013-68777A, JP2008-281975A, JP2010-139996A, JP2010-164958A, and JP2013-105147A).

SUMMARY OF THE INVENTION

However, more recently, there has been a drastically increasing demand for higher fineness, and for example, in a case of particularly forming an ultrafine pattern (in particular, a trench pattern having a trench width of 50 nm or less or a hole pattern having a hole diameter of 50 nm or less) on a resist film, further improvement has been required. Specifically, in formation of an ultrafine pattern, it has been desired to develop a resist composition having an excellent depth of focus (hereinafter also referred to as a DOF).

The present invention has been made in consideration of the problems, and has an object to provide an active-light-sensitive or radiation-sensitive resin composition having an excellent depth of focus in formation of an ultrafine pattern (in particular, a trench pattern having a trench width of 50 nm or less or a hole pattern having a hole diameter of 50 nm or less), an active-light-sensitive or radiation-sensitive film using the same, and a pattern forming method. The present invention has other objects to provide a method for manufacturing an electronic device, including the pattern forming method, and an electronic device manufactured by this manufacturing method.

The present invention is configured as follows, whereby the objects of the present invention are accomplished.

[1] An active-light-sensitive or radiation-sensitive resin composition comprising a basic compound (A) corresponding to at least one of the following basic compound (A1) or (A2):

(A1) a nonionic compound having an alicyclic structure (a1) and a basic site (b2) at a site different from the alicyclic structure within one molecule, or (A2) a nonionic compound having a heterocyclic structure (a2) having no basicity and a basic site (b2) at a site different from the heterocyclic structure within one molecule.

[2] The active-light-sensitive or radiation-sensitive resin composition as described in [1], in which the alicyclic structure (a1) of (A1) includes a polar group.

[3] The active-light-sensitive or radiation-sensitive resin composition as described in [1], in which the heterocyclic structure (a2) of (A2) is a heterocyclic structure having 6 or more carbon atoms.

[4] The active-light-sensitive or radiation-sensitive resin composition according to [1], wherein the pKa of a conjugated acid of the basic compound (A) is from 1.0 to 6.0.

[5] The active-light-sensitive or radiation-sensitive resin composition according to [1], wherein the basic compound (A) is a compound which is stable against an acid in the active-light-sensitive or radiation-sensitive resin composition.

[6] The active-light-sensitive or radiation-sensitive resin composition according to [1], wherein the basic compound (A) is represented by the following General Formula (I),

in General Formula (I), $R_N$ represents a basic site,

L represents a single bond or a divalent linking group, and

W represents a bridged alicyclic group including a polar group, or a heterocyclic group.

[7] The active-light-sensitive or radiation-sensitive resin composition according to [6], wherein W in General Formula (I) is a bridged alicyclic group including a polar group, or a monovalent group formed by removing a hydrogen atom from any one from structures of anthraquinone, xanthene, thioxanthene, dibenzofuran, carbazole, dibenzothiophene, benzofuran, or benzothiophene.

[8] The active-light-sensitive or radiation-sensitive resin composition according to [6], wherein W in General Formula (I) is a monovalent group formed by removing a hydrogen atom from any one from structures of anthraquinone, xanthene, thioxanthene, dibenzofuran, carbazole, dibenzothiophene, benzofuran, or benzothiophene.

[9] The active-light-sensitive or radiation-sensitive resin composition according to [6], wherein W in General Formula (I) is a monovalent group formed by removing a hydrogen atom from any one from structures of xanthene, thioxanthene, dibenzofuran, carbazole, dibenzothiophene, benzofuran, or benzothiophene.

[10] The active-light-sensitive or radiation-sensitive resin composition according to [6], wherein $R_N$ in General Formula (I) is represented by any one of the following General Formulae (II-1) to (II-3),

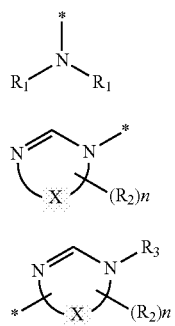

in General Formulae (II-1) to (II-3), $R_1$'s each independently represent an alkyl group, and $R_1$'s may be bonded to each other to form a ring via at least one atom selected from a carbon atom, an oxygen atom, or a nitrogen atom, $R_2$'s each independently represent a monovalent organic group and n represents an integer of 0 to 3, $R_3$ represents a hydrogen atom or a monovalent organic group, a plurality of $R_2$'s, and $R_2$ and $R_3$ may form a linked ring,

* represents a binding site to L, and

X represents a group that forms a ring together with a nitrogen atom.

[11] The active-light-sensitive or radiation-sensitive resin composition according to [6], wherein $R_N$ in General Formula (I) is represented by any one of the following General Formulae (II-2) and (II-3).

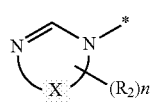

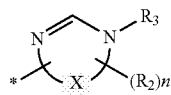

in General Formulae (II-2) and (II-3), $R_2$'s each independently represent a monovalent organic group and n represents an integer of 0 to 3, $R_3$ represents a hydrogen atom or a monovalent organic group, a plurality of $R_2$'s, and $R_2$ and $R_3$ may form a linked ring,

* represents a binding site to L, and

X represents a group that forms a ring together with a nitrogen atom.

[12] The active-light-sensitive or radiation-sensitive resin composition according to [1], further comprising a resin (P) having a group that decomposes by the action of an acid to generate a polar group.

[13] The active-light-sensitive or radiation-sensitive resin composition according to [12], wherein the resin (P) has a repeating unit having at least one structure selected from a lactone structure, a sultone structure, or a cyclic carbonic acid ester structure.

[14] An active-light-sensitive or radiation-sensitive film formed using the active-light-sensitive or radiation-sensitive resin composition according to [1]. [15] A pattern forming method comprising:

forming an active-light-sensitive or radiation-sensitive film using the active-light-sensitive or radiation-sensitive resin composition according to [1];

exposing the active-light-sensitive or radiation-sensitive film; and developing the exposed active-light-sensitive or radiation-sensitive film by a developer.

According to the present invention, it is possible to provide an active-light-sensitive or radiation-sensitive resin composition having an excellent depth of focus in formation of an ultrafine pattern (in particular, a trench pattern having a trench width of 50 nm or less or a hole pattern having a hole diameter of 50 nm or less), an active-light-sensitive or radiation-sensitive film using the same, and a pattern forming method. The present invention can also provide a method for manufacturing an electronic device, including the pattern forming method, and an electronic device manufactured by this manufacturing method.

DESCRIPTION OF THE PREFERRED EMBODIMENTS

Hereinafter, embodiments of the present invention will be described in detail.

In citations for a group and an atomic group in the present specification, in a case where a group is denoted without specifying whether it is substituted or unsubstituted, the group includes both a group not having a substituent and a group having a substituent. For example, an "alkyl group" denoted without specifying whether it is substituted or unsubstituted includes not only an alkyl group not having a substituent (unsubstituted alkyl group), but also an alkyl group having a substituent (substituted alkyl group).

In the present invention, "active light" or "radiation" means, for example, a bright line spectrum of a mercury lamp, far ultraviolet rays represented by an excimer laser, extreme ultraviolet rays (EUV light), X-rays, and particle rays such as electron beams and ion beams. In addition, in the present invention, light means active light or radiation.

In addition, unless otherwise specified. "exposure" in the present specification includes not only exposure by a bright line spectrum of a mercury lamp, far ultraviolet rays represented by an excimer laser, X-rays, extreme ultraviolet rays (EUV light), or the like, but also writing by particle rays such as electron beams and ion beams.

The reason why the depth of focus is excellent in formation of an ultrafine pattern (for example, a trench pattern having a trench width of 50 nm or less or a hole pattern having a hole diameter of 50 nm or less) by the pattern forming method of the present invention and the active-light-sensitive or radiation-sensitive resin composition of the present invention is not clearly known but is presumed as follows.

When the basic compound (A) has the alicyclic structure (a1) or the heterocyclic structure (a2) having no basicity, the diffusion in a film is suppressed. Thus, the neutralization rate in unexposed areas is lowered, and thus, some of acids diffused in the unexposed area can cause a deprotection reaction. As a result, it is considered that a reaction distribution suitable for a trench pattern or a hole pattern occurs, and thus, the depth of focus is improved.

Incidentally, according to a positive tone image forming method using an alkaline developer, it is likely to be difficult for the ultrafine pattern as described above to be formed. This is because in a case of forming a trench pattern or a hole pattern by the positive tone image forming method, an exposed area works out to a region in which a trench pattern or a hole pattern is to be formed, but it is likely to be optically more difficult to expose and resolve an ultrafine region. However, since the reaction distribution as described above is also suitable in an isolated pattern in formation of a positive tone image, the use of the reaction distribution in a positive tone image forming method contributes to improvement of the depth of focus of the isolated pattern.

Hereinafter, the active-light-sensitive or radiation-sensitive resin composition that can be used in the present invention (hereinafter also referred to as "the composition of the present invention" or "the resist composition of the present invention") will be described.

In addition, the present invention also relates to the active-light-sensitive or radiation-sensitive resin composition which will be described below.

In a case where the active-light-sensitive or radiation-sensitive resin composition according to the present invention is particularly used to form an ultrafine pattern (for example, a trench pattern having a trench width of 50 nm or less or a hole pattern having a hole diameter of 50 nm or less) on a resist film, the composition is preferably used in negative tone development (development in which at a time of exposure, the solubility in a developer is reduced, and thus, an exposed area remains as a pattern and an unexposed area is removed). That is, the active-light-sensitive or radiation-sensitive resin composition according to the present invention can be formed as an active-light-sensitive or radiation-sensitive resin composition for organic solvent development, which is used for development using a developer including an organic solvent. Here, the use for organic solvent development means an application of the composition to be provided to a step for carrying out development using a developer including at least an organic solvent.

The active-light-sensitive or radiation-sensitive resin composition of the present invention is typically a resist composition, and may be either a negative tone resist composition or a positive resist composition, but is preferably a negative tone resist composition (that is, a resist composition for organic solvent development) from the viewpoint that particularly enhanced effects can be obtained. In addition, the composition according to the present invention is typically a chemical amplification type resist composition.

The active-light-sensitive or radiation-sensitive resin composition of the present invention includes [1] a basic compound (A) corresponding to at least one of the basic compound (A1) or (A2).

Examples of additional components that can be included in the active-light-sensitive or radiation-sensitive resin composition of the present invention include [2] a compound that generates an acid upon irradiation with active light or radiation, [3] a resin (P) having a group that decomposes by the action of an acid to generate a polar group, [4] a hydrophobic resin. [5] an acid diffusion control agent, [6] a solvent, [7] a surfactant, and [8] a dissolution inhibiting compound having a molecular weight of 3,000 or less, which decomposes by the action of an acid to enhance the solubility in an alkaline developer. The active-light-sensitive or radiation-sensitive resin composition of the present invention can be used for pattern formation according to, for example, the method which will be described later as a "pattern forming method."

Hereinafter, these respective components will be described in order.

[1] Basic Compound (A) Corresponding to at Least One of Basic Compound (A1) or (A2)

The active-light-sensitive or radiation-sensitive resin composition of the present invention includes a basic compound (A) corresponding to at least one of the following basic compound (A1) or (A2).

(A1) Nonionic compound having an alicyclic structure (a1) and a basic Site (b2) at a site different from the alicyclic structure within one molecule (A2) Nonionic compound having a heterocyclic structure (a2) having no basicity and a basic site (b2) at a site different from the heterocyclic structure within one molecule.

In (A1) and (A2), the basic site (b2) is preferably a site having a functional group with proton acceptor properties. The functional group with proton acceptor properties refers to a functional group having a group or an electron which is capable of electrostatically interacting with a proton, and for example, means a functional group with a macrocyclic structure, such as a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following formula.

Furthermore, in the basic site (b2), it is preferable that all of the atoms adjacent to a nitrogen atom included in the structure are carbon atoms or hydrogen atoms from the viewpoint of increasing the basicity. Further, it is preferable that a functional group with electron withdrawing properties (a carbonyl group, a sulfonyl group, a cyano group, a halogen atom, and the like) is not directly linked to the nitrogen atom from the viewpoint of increasing the basicity.

In (A2), "having no basicity" in the heterocyclic structure (a2) having no basicity preferably means having no functional group with proton acceptor properties. The heterocyclic structure (a2) having no basicity is preferably a heterocyclic structure including no nitrogen atom.

The alicyclic structure (a1) of (A1) preferably does not include a polar group.

Examples of embodiments in which the alicyclic structure (a1) includes a polar group include an embodiment in which a polar group is substituted with an alicyclic structure, and an embodiment in which a carbon atom as a ring member in the alicyclic structure is substituted with a polar group.

The polar group is not particularly limited as long as it is a functional group having a larger dipole moment than that of a hydrogen atom, an alkyl group, or an alkylene group, and examples thereof include a hydroxyl group, a carbonyl bond, a carboxyl group, an alkoxy group, an ether bond, an ester bond, a carbonic acid bond, a thioether bond, a thioester bond, a sulfonyl bond, a sulfonester bond, an amino group, an amide bond, a sulfonamide bond, and a cyano group.

The heterocyclic structure (a2) of (A2) is preferably a heterocyclic structure having 6 or more carbon atoms.

As the heterocyclic structure having 6 or more carbon atoms, a heterocyclic structure including at least one heteroatom selected from a nitrogen atom, a sulfur atom, or an oxygen atom is preferable, and a heterocyclic structure including at least one heteroatom selected from a sulfur atom or an oxygen atom is more preferable. The number of carbon atoms of the heterocyclic structure is preferably from 6 to 30, more preferably from 6 to 20, and still more preferably from 8 to 16. Specifically, the heterocyclic structure having 6 or more carbon atoms is preferably a structure of xanthene, thioxanthene, dibenzofuran, carbazole, dibenzothiophene, benzofuran, benzothiophene, or the like.

The pKa of a conjugated acid of the basic compound (A) is typically from 1.0 to 6.0.

The pKa of the conjugated acid as mentioned herein means that the pKa representing an acid-dissociating constant of the conjugated acid of the basic compound (A) is from 1.0 to 6.0, more preferably from 2.0 to 6.0, and still more preferably from 3.0 to 5.5. The pKa value in the present invention is represented by a value obtained by calculation using ACD/ChemSketch (ACD/Labs 8.00 Release Product Version: 8.08).

The basic compound (A) is preferably a compound which is stable against an acid in the active-light-sensitive or radiation-sensitive resin composition of the present invention. The basic compound (A) is more preferably not a compound that forms a cyclic structure (for example, a lactone structure) by the action of an acid.

As the basic compound (A), a compound represented by the following General Formula (I) is preferable in view that the effects of the present invention are more excellent.

In General Formula (I), $R_N$ represents a basic site,

L represents a single bond or a divalent linking group, and

W represents a crosslinked alicyclic group including a polar group, or a heterocyclic group.

The crosslinked alicyclic group including a polar group in W represents a group in which a hydrogen atom in a crosslinked alicyclic group is substituted with a polar group, or a group in which a carbon atom as a ring member in a crosslinked alicyclic group is substituted with a polar group.

The crosslinked alicyclic group in W represents a group in which carbon atoms at two or more positions of the alicyclic group are bonded through an alkylene group. The number of carbon atoms of the crosslinked alicyclic group is preferably 6 to 30, more preferably 6 to 20, and still more preferably 7 to 15. Specific examples of the crosslinked alicyclic group include a norbornyl group, a tricyclodecanyl group, a tetracyclodecanyl group, an adamantyl group, and a diadamantyl group.

The polar group in W is not particularly limited as long as it is a functional group having a larger dipole moment than that of a hydrogen atom, an alkyl group, or an alkylene group, and examples thereof include a hydroxyl group, a carbonyl bond, a carboxyl group, an alkoxy group, an ether bond, an ester bond, a carbonic acid bond, a thioether bond, a thioester bond, a sulfonyl bond, a sulfonester bond, an amino group, an amide bond, a sulfonamide bond, and a cyano group.

The heterocyclic group in W preferably includes at least one heteroatom selected from a nitrogen atom, a sulfur atom, and an oxygen atom, and more preferably includes at least one heteroatom selected from a sulfur atom and an oxygen atom. The number of carbon atoms of the heterocyclic group is preferably 6 or more, more preferably from 6 to 30, still more preferably from 6 to 20, and particularly preferably from 7 to 15. Specific examples of the heterocyclic group include a monovalent group formed by removing a hydrogen atom from any one from structures of xanthene, thioxanthene, dibenzofuran, carbazole, dibenzothiophene, benzofuran, and benzothiophene.

Specific examples of W are shown below, but the present invention is not limited thereto. Further, a hydrogen atom is removed from a carbon atom in any one of the following structures to form a binding site to L.

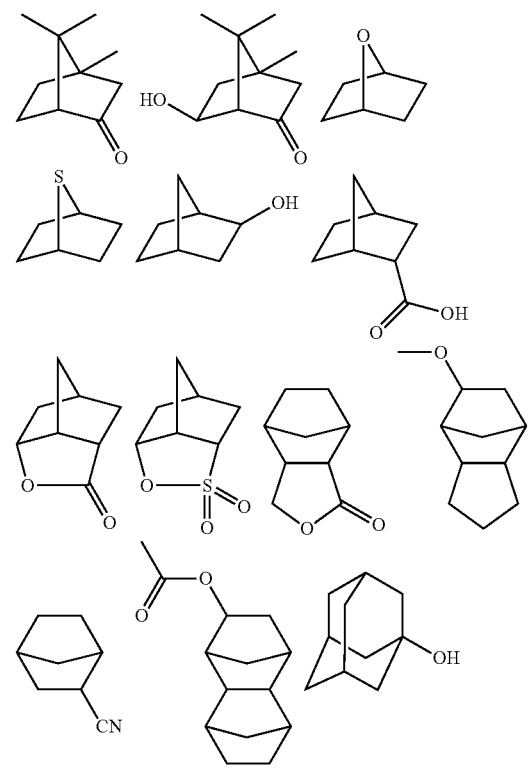

-continued

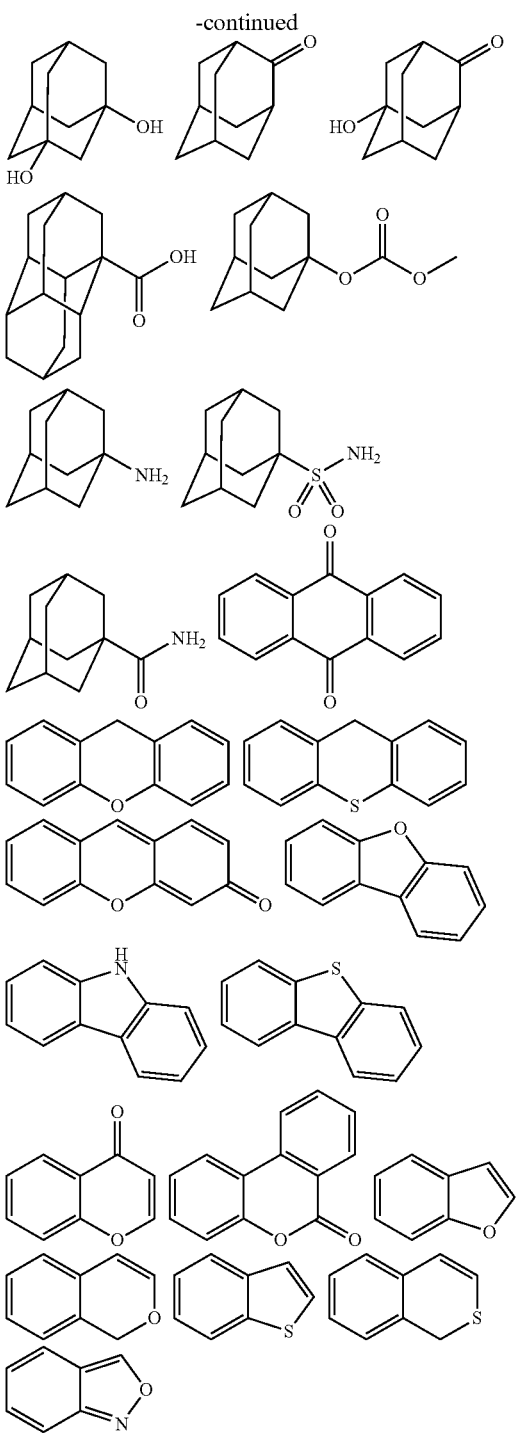

L represents a single bond or a divalent linking group.

As the L as a divalent linking group, an alkylene group, a cycloalkylene group, an arylene group, an oxygen atom (an ether group), a carbonyl group, —NH—, or a combination thereof is preferable. As an examples of the combination, a combination (an ester bond) of an oxygen atom and a carbonyl group, a combination of an alkylene group and an oxygen atom, a combination of an alkylene group, an oxygen atom, and a carbonyl group, or a combination of an alkylene group, a carbonyl group, and —NH— is preferable. The alkylene group, the cycloalkylene group, and the arylene group in L may each have a substituent, and examples of the substituent include a methyl group.

$R_N$ in General Formula (I) is preferably represented by any one of the following General Formulae (II-1) to (II-3).

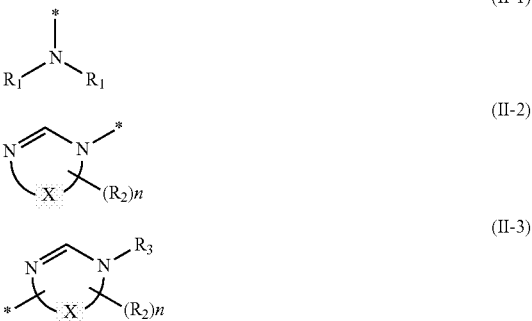

In General Formulae (II-1) to (II-3), $R_1$'s each independently represent an alkyl group, and $R_1$'s may be bonded to each other to form a ring via at least one atom selected from a carbon atom, an oxygen atom, or a nitrogen atom.

$R_2$'s each independently represent a monovalent organic group and n represents an integer of 0 to 3.

$R_3$ represents a hydrogen atom or a monovalent organic group.

a plurality of $R_2$'S, and $R_2$ and $R_3$ may form a linked ring.

* represents a binding site to L.

X represents a group that forms a ring together with a nitrogen atom.

The monovalent organic group as $R_2$ or $R_3$ preferably has 1 to 30 carbon atoms, and examples thereof include an alkyl group, a cycloalkyl group, an aryl group, an aralkyl group, and an alkenyl group.

The alkyl group in each of $R_1$, $R_2$, and $R_3$ may be linear or branched, and may have a substituent. The alkyl group in each of $R_1$, $R_2$, and $R_3$ is preferably an alkyl group having 1 to 20 carbon atoms, and may have an oxygen atom, a sulfur atom, or a nitrogen atom in the alkyl chain. Examples of the alkyl group in each of $R_1$, $R_2$, and $R_3$ include a methyl group, an ethyl group, an n-propyl group, and an n-butyl group.

The cycloalkyl group in each of $R_2$ and $R_3$ may have a substituent, is preferably a cycloalkyl group having 3 to 20 carbon atoms, and may have an oxygen atom in the ring. Examples of the cycloalkyl group in each of $R_2$ and $R_3$ include a cyclohexyl group, a cycloheptyl group, a cyclooctyl group, a cyclodecyl group, and a cyclododecyl group.

The aryl group in each of $R_2$ and $R_3$ may have a substituent, and is preferably an aryl group having 6 to 14 carbon atoms. Examples of the aryl group in each of $R_2$ and $R_3$ include a phenyl group and a naphthyl group.

The aralkyl group in each of $R_2$ and $R_3$ may have a substituent, and preferred examples thereof include an aralkyl group having 7 to 20 carbon atoms. Examples of the aralkyl group in each of $R_2$ and $R_3$ include a benzyl group, a penethyl group, a naphthylmethyl group, a naphthylethyl group, and a naphthylbutyl group.

The alkenyl group in each of $R_2$ and $R_3$ may have a substituent, and examples thereof include the groups having a double bond in an arbitrary position of the alkyl groups mentioned as $R_2$ and $R_3$.

Examples of the substituent which the alkyl group, the cycloalkyl group, the aryl group, the aralkyl group, or the alkenyl group as each of $R_1$, $R_2$, and $R_3$ may have include halogen atoms (a fluorine atom and the like), a hydroxyl group, an nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), an aminoacyl group (preferably having 2 to 10 carbon atoms), an amino group, a pyrrolidino group, a piperidino group, a morpholino group, a group having a silicon atom, or a group formed by combination of two or more kinds thereof. Regarding the cyclic structure in the aryl group, the cycloalkyl group, and the like, additional examples of the substituent include alkyl groups (preferably having 1 to 10 carbon atoms). Regarding the aminoacyl group, additional examples of the substituent include alkyl groups (preferably having 1 to 10 carbon atoms).

Moreover, $CH_2$ in the alkyl group, the cycloalkyl group, or the aralkyl group as each of $R_2$ and $R_3$ may be substituted with —O—, —C(O)—, —S(O)$_m$—, —S(O)$_2$—NR$_4$—, —C(O)—NR$_5$—, —OC(O)—NR$_5$—, or a combination thereof. $R_4$ represents a hydrogen atom or a monovalent organic group, and m represents an integer of 0 to 2.

Specific examples and preferred examples of the organic group as $R_4$ include the specific examples and the preferred examples of the monovalent organic group of each of $R_2$ and $R_3$.

X preferably represents an arylene group or an alkenylene group, more preferably represents an arylene group having 6 to 10 carbon atoms or an alkenylene group having 2 to 5 carbon atoms, and still more preferably represents a phenylene group or an ethynylene group.

The basic compound (A) may have a form of a low molecular weight compound, or may have a form in which the basic compound (A) is incorporated into a part of a polymer. In addition, a form of a low molecular weight compound and a form in which the basic compound (A) is incorporated into a part of a polymer may be used in combination.

In a case where the basic compound (A) has a form of a low molecular weight compound, the molecular weight of the basic compound (A) is preferably 3,000 or less, more preferably 2.000 or less, and still more preferably 1,000 or less.

In the present invention, the basic compound (A) preferably has a form of a low molecular compound.

Specific examples of the basic compound (A) are shown below, but the present invention is not limited thereto. Further, the pKa shown below is one of the conjugated acid of the basic compound (A).

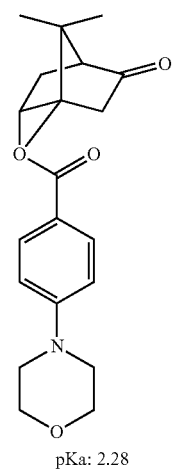

pKa: 2.28 (A-1)

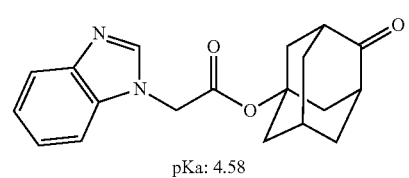

pKa: 4.58 (A-2)

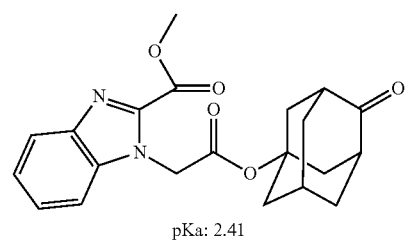

pKa: 2.41 (A-3)

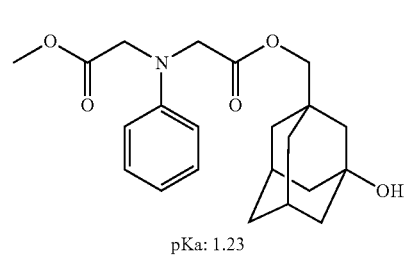

pKa: 1.23 (A-4)

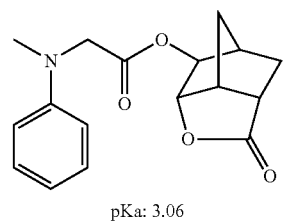

pKa: 3.06 (A-5)

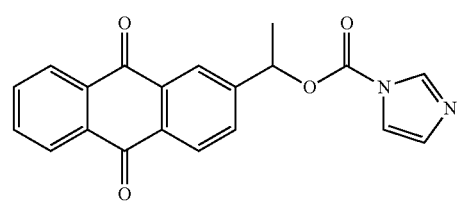

pKa: 3.23 (A-6)

(A-7)

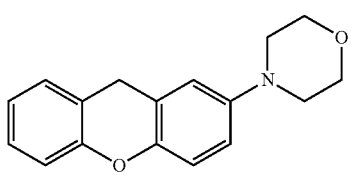

pKa: 5.47

(A-8)

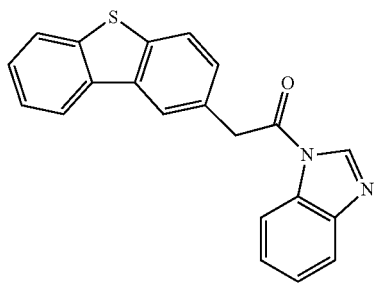

pKa: 4.61

(A-9)

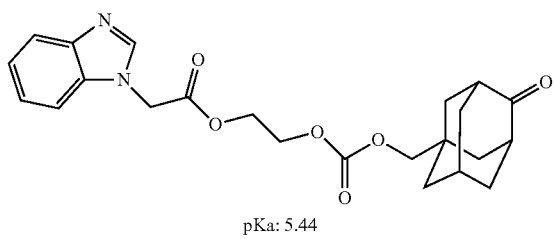

pKa: 5.44

The basic compound (A) may be used singly or in combination of two or more kinds thereof.

The content of the basic compound (A) in the active-light-sensitive or radiation-sensitive resin composition of the present invention is preferably 0.1% to 10% by mass, more preferably 0.3% to 8% by mass, and still more preferably 0.5% to 5% by mass, with respect to the total solid content of the active-light-sensitive or radiation-sensitive resin composition.

The basic compound (A) can be synthesized with reference to, for example, WO2010/064631 A, or the like, or commercial products can also be used.

[2] (B) Compound that Generates Acid Upon Irradiation with Active Light or Radiation The active-light-sensitive or radiation-sensitive resin composition of the present invention preferably contains a compound that generates an acid upon irradiation with active light or radiation (hereinafter also referred to as an "acid generator" or a "photoacid generator (B)").

The photoacid generator may be in a form of a low molecular compound or in a form introduced into a part of a polymer. Further, a combination of the form of a low molecular compound and the form introduced into a part of a polymer may also be used.

In a case where the photoacid generator is in the form of a low molecular compound, the molecular weight of the photoacid generator is preferably 3,000 or less, more preferably 2,000 or less, and still more preferably 1,000 or less.

In a case where the photoacid generator is in the form introduced into a part of a polymer, it may be introduced into a part of an acid-decomposable resin or into a resin other than the acid-decomposable resin.

In the present invention, the photoacid generator is preferably in the form of a low molecular compound.

The acid generator is not particularly limited, but preferred examples thereof include a compound represented by the following General Formula (ZI), (ZII), or (ZIII).

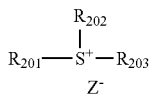

(ZI)

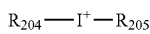

(ZII)

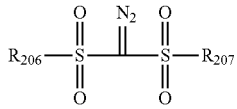

(ZIII)

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

Furthermore, two members out of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two members out of $R_{201}$ to $R_{203}$ include an alkylene group (for example, a butylene group and a pentylene group).

Moreover, the acid generator may be a compound having a plurality of structures represented by General Formula (ZI). For example, the photoacid generator may be a compound having a structure in which at least one of $R_{201}$, ..., or $R_{203}$ of the compound represented by General Formula (ZI) is bonded to at least one of $R_{210}$, ..., or $R_{203}$ of another compound represented by General Formula (ZI) through a single bond or a linking group.

$Z^-$ represents a non-nucleophilic anion (an anion having an extremely low ability of causing a nucleophilic reaction).

Examples of $Z^-$ include a sulfonate anion (an aliphatic sulfonate anion, an aromatic sulfonate anion, and a camphorsulfonate anion), a carboxylate anion (an aliphatic carboxylate anion, an aromatic carboxylate anion, and an aralkylcarboxylate anion), a sulfonylimido anion, a bis(alkylsulfonyl)imido anion, and a tris(alkylsulfonyl)methide anion.

Incidentally, $Z^-$ is preferably the same as the anionic moiety of the compound (A).

The aliphatic site in the aliphatic sulfonate anion and the aliphatic carboxylate anion may be an alkyl group, or a cycloalkyl group, and preferred examples thereof include a linear or branched alkyl group having 1 to 30 carbon atoms or a cycloalkyl group having 3 to 30 carbon atoms.

Preferred examples of the aromatic group in the aromatic sulfonate anion and the aromatic carboxylate anion include an aryl group having 6 to 14 carbon atoms, such as a phenyl group, a tolyl group, and a naphthyl group.

The alkyl group, the cycloalkyl group, and the aryl group as described above may have a substituent. Specific examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkylaminosulfonyl group (preferably having 2 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). The aryl group or ring structure which each of the groups has may further have an alkyl group (preferably having 1 to 15 carbon atoms) as a substituent.

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

Examples of the sulfonylimido anion include a saccharin anion.

The alkyl group in the bis(alkylsulfonyl)imido anion and the tris(alkylsulfonyl)methide anion is preferably an alkyl group having 1 to 5 carbon atoms, and examples of the substituent on this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Other examples of $Z^-$ include fluorinated phosphorus (for example, $PF_6^-$), fluorinated boron (for example, $BF_4^-$), and fluorinated antimony (for example, $SbF_6^-$).

$Z^-$ is preferably an aliphatic sulfonate anion substituted with a fluorine atom, at least at the α-position of sulfonic acid, an aromatic sulfonate anion substituted with a fluorine atom or a group having a fluorine atom a bis(alkylsulfonyl) imido anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (having 4 to 8 carbon atoms) or a benzenesulfonate anion having a fluorine atom, still more preferably a nonafluorobutanesulfonate anion, a perfluorooctanesulfonate anion, a pentafluorobenzenesulfonate anion, or a 3,5-bis(trifluoromethyl)benzenesulfonate anion.

From the viewpoint of the acid strength, the pKa of the generated acid is preferably −1 or less in order to improve the sensitivity.

Examples of the organic group of each of $R_{201}$, $R_{202}$, and $R_{203}$ include an aryl group (preferably having 6 to 15 carbon atoms), a linear or branched alkyl group (preferably having 1 to 10 carbon atoms), and a cycloalkyl group (preferably having 3 to 15 carbon atoms).

It is preferable that at least one of $R_{201}$, $R_{202}$, or $R_{203}$ is an aryl group, and it is more preferable that all of these three members are aryl groups. The aryl group may be a heteroaryl group such as indole residue and pyrrole residue, other than a phenyl group, a naphthyl group, and the like.

The aryl group, the alkyl group, and the cycloalkyl group of each of $R_{201}$, $R_{202}$, and $R_{203}$ may further have a substituent. Examples of the substituent include, but are not limited to, a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

Furthermore, two members selected from $R_{201}$, $R_{202}$, or $R_{203}$ may be bonded through a single bond or a linking group. Examples of the linking group include, but are not limited to, an alkylene group (preferably having 1 to 3 carbon atoms). —O—, —S—, —CO—, and —SO$_2$—.

Examples of the preferred structure in a case where at least one of $R_{201}$, $R_{202}$, or $R_{203}$ is not an aryl group include cation structures such as the compounds exemplified in paragraphs 0046 and 0047 of JP2004-233661A, paragraphs 0040 to 0046 of JP2003-35948A, the compounds exemplified as Formulae (I-1) to (I-70) in US2003/0224288A1, and the compounds exemplified as Formulae (IA-1) to (IA-54), and Formulae (IB-1) to (IB-24) in US2003/0077540A1.

More preferred examples of the compound represented by General Formula (ZI) include a compound represented by General Formula (ZI-3) or (ZI-4) which will be described below. First, the compound represented by General Formula (ZI-3) will be described.

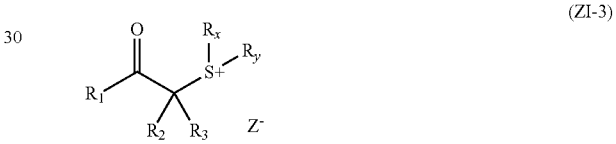

In General Formula (ZI-3), $R_1$ represents an alkyl group, a cycloalkyl group, an alkoxy group, a cycloalkoxy group, an aryl group, or an alkenyl group, and $R_2$ and $R_3$ each independently represent a hydrogen atom, an alkyl group, a cycloalkyl group, or an aryl group, and $R_2$ and $R_3$ may be linked to each other to form a ring.

$R_1$ and $R_2$ may be linked to each other to form a ring structure, and $R_x$ and $R_y$ each independently represent an alkyl group, a cycloalkyl group, an alkenyl group, an aryl group, a 2-oxoalkyl group, a 2-oxocycloalkyl group, an alkoxycarbonylalkyl group, or an alkoxycarbonylcycloalkyl group, and $R_x$ and $R_y$ may be linked to each other to form a ring structure. This structure may include an oxygen atom, a nitrogen atom a sulfur atom, a ketone group, an ether bond, an ester bond, or an amide bond.

$Z^-$ represents a non-nucleophilic anion.

The alkyl group as $R_1$ preferably a linear or branched alkyl group having 1 to 20 carbon atoms, and may have an oxygen atom, a sulfur atom, or a nitrogen atom in the alkyl chain. Specific examples thereof include linear alkyl groups such as a methyl group, an ethyl group, an n-propyl group, an n-butyl group, an n-pentyl group, an n-hexyl group, an n-octyl group, an n-dodecyl group, an n-tetradecyl group, and an n-octadecyl group, and branched alkyl groups such as an isopropyl group, an isobutyl group, a t-butyl group, a neopentyl group, and a 2-ethylhexyl group. The alkyl group of $R_1$ may have a substituent, and examples of the alkyl group having a substituent include a cyanomethyl group, a 2,2,2-trifluoroethyl group, a methoxycarbonylmethyl group, and an ethoxycarbonylmethyl group.

The cycloalkyl group as $R_1$ is preferably a cycloalkyl group having 3 to 20 carbon atoms, and may have an oxygen atom or a sulfur atom in the ring. Specific examples thereof include a cyclopropyl group, a cyclopentyl group, a cyclohexyl group, a norbornyl group, and an adamantyl group. The cycloalkyl group of $R_1$ may have a substituent, and examples of the substituent include an alkyl group and an alkoxy group.

The alkoxy group as $R_1$ is preferably an alkoxy group having 1 to 20 carbon atoms. Specific examples thereof include a methoxy group, an ethoxy group, an isopropyloxy group, a t-butyloxy group, a t-amyloxy group, and an n-butyloxy group. The alkoxy group as $R_1$ may have a substituent, and examples of the substituent include an alkyl group and a cycloalkyl group.

The cycloalkoxy group as $R_1$ preferably a cycloalkoxy group having 3 to 20 carbon atoms, and examples thereof include a cyclohexyloxy group, a norbornyloxy group, and an adamantyloxy group. The cycloalkoxy group of $R_1$ may have a substituent, and examples of the substituent include an alkyl group and a cycloalkyl group.

The aryl group as $R_1$ is preferably an aryl group having 6 to 14 carbon atoms, and examples thereof include a phenyl group, a naphthyl group, and a biphenyl group. The aryl group of $R_1$ may have a substituent, and preferred examples of the substituent include an alkyl group, a cycloalkyl group, an alkoxy group, a cycloalkoxy group, an aryloxy group, an alkylthio group, and an arylthio group. In a case where the substituent is an alkyl group, a cycloalkyl group, an alkoxy group, or a cycloalkoxy group, examples thereof are the same as those for the alkyl group, the cycloalkyl group, the alkoxy group, and the cycloalkoxy group as $R_1$.

Examples of the alkenyl group as $R_1$ include a vinyl group and an allyl group.

$R_2$ and $R_3$ represent a hydrogen atom, an alkyl group, a cycloalkyl group, or an aryl group, and $R_2$ and $R_3$ may be linked to each other to form a ring. However, at least one of $R_2$ or $R_3$ represents an alkyl group, a cycloalkyl group, or an aryl group. Specific and preferred examples of the alkyl group, the cycloalkyl group, and the aryl group for $R_1$ or $R_3$ are the same specific and preferred examples as described above for $R_1$. In a case where $R_2$ and $R_3$ are linked to each other to form a ring, the total number of carbon atoms contributing to formation of a ring included in $R_2$ and $R_3$ is preferably 4 to 7, and particularly preferably 4 or 5.

$R_1$ and $R_2$ may be linked to each other to form a ring structure. In a case where $R_1$ and $R_1$ are linked to each other to form a ring, it is preferable that $R_1$ is an aryl group (preferably a phenyl group having a substituent or a naphthyl group) and $R_2$ is an alkylene group having 1 to 4 carbon atoms (preferably a methylene group or an ethylene group), and preferred examples of the substituent include the same ones as the substituent which the aryl group as $R_1$ may have. In another embodiment of a case where $R_1$ and $R_2$ are linked to each other to form a ring, it is also preferable that $R_1$ is a vinyl group and $R_2$ is an alkylene group having 1 to 4 carbon atoms.

The alkyl group represented by each of $R_x$ and $R_y$ is preferably an alkyl group having 1 to 15 carbon atoms, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an eicosyl group.

The cycloalkyl group represented by each of $R_x$ and $R_y$ is preferably a cycloalkyl group having 3 to 20 carbon atoms, and examples thereof include a cyclopropyl group, a cyclopentyl group, a cyclohexyl group, a norbornyl group, and an adamantyl group.

The alkenyl group represented by each of $R_x$ and $R_y$ is preferably an alkenyl group having 2 to 30 carbon atoms, and examples thereof include a vinyl group, an allyl group, and a styryl group.

The aryl group represented by each of $R_x$ and $R_y$ is preferably, for example, an aryl group having 6 to 20 carbon atoms, and specific examples thereof include a phenyl group, a naphthyl group, an azulenyl group, an acenaphthylenyl group, a phenanthrenyl group, a phenalenyl group, a phenanthracenyl group, a fluorenyl group, anthracenyl group, a pyrenyl group, and a benzopyrenyl group. The aryl group is preferably a phenyl group or a naphthyl group, and more preferably a phenyl group.

Examples of the alkyl group moiety of the 2-oxoalkyl group and the alkoxycarbonylalkyl group represented by each of $R_x$ and $R_y$ include those enumerated above as each of $R_x$ and $R_y$.

Examples of the cycloalkyl group moiety in the 2-oxocycloalkyl group and the alkoxycarbonylcycloalkyl group represented by each of $R_x$ and $R_y$ include those enumerated above as $R_x$ and $R_y$.

Examples of $Z^-$ include those enumerated above as $Z^-$ in General Formula (ZI).

The compound represented by General Formula (ZI-3) is preferably a compound represented by any one of the following General Formulae (ZI-3a) and (ZI-3b).

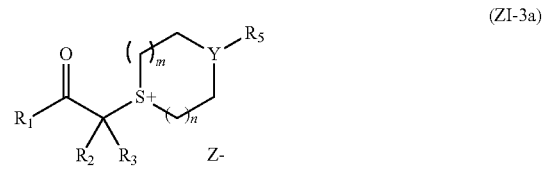

(ZI-3a)

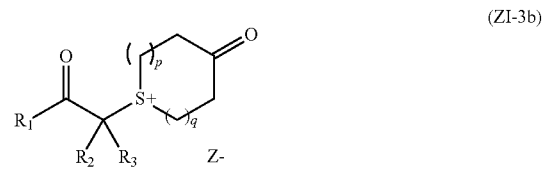

(ZI-3b)

In General Formulae (ZI-3a) and (ZI-3b), $R_1$, $R_2$, and $R_3$ each have the same definitions as those in the General Formula (ZI-3).

Y is preferably an oxygen atom, a sulfur atom, or a nitrogen atom, an oxygen atom, or a nitrogen atom, m, n, p, and q each mean an integer, and are each preferably 0 to 3, more preferably 1 to 2, and particularly preferably 1. The alkylene group that links $S^+$ with Y may have a substituent, and preferred examples of the substituent include an alkyl group.

In a case where Y is a nitrogen atom, $R_5$ represents a monovalent organic group, and in a case where Y is an oxygen atom or a sulfur atom. $R_5$ is not present. $R_5$ is preferably a group having an electron withdrawing group, and particularly preferably a group represented by any one of the following General Formulae (ZI-3a-1) to (ZI-3a-4).

(ZI-3a-1)

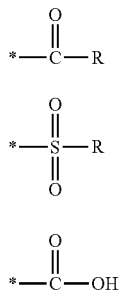

(ZI-3a-2)

(ZI-3a-3)

(ZI-3a-4)

In (ZI-3a-1) to (ZI-3a-3), R represents a hydrogen atom, an alkyl group, a cycloalkyl group, or an aryl group, and is preferably an alkyl group. Specific examples and preferred examples of the alkyl group, the cycloalkyl group, or the aryl group with respect to R include the same specific examples and preferred examples as described above with respect to $R_1$ in General Formula (ZI-3).

In (ZI-3a-1) to (ZI-3a-4). * represents a bonding arm for connecting to a nitrogen atom as Y in the compound represented by General Formula (ZI-3a).

In a case where Y is nitrogen atom, $R_5$ is particularly preferably a group represented by $—SO_2—R_4$, $R_4$ represents an alkyl group, a cycloalkyl group, or an aryl group, and is preferably an alkyl group. Specific examples and preferred examples of the alkyl group, the cycloalkyl group, or the aryl group with respect to $R_4$ include the same specific examples and preferred examples as described above with respect to $R_1$.

Examples of $Z^-$ include those enumerated above as $Z^-$ in General Formula (ZI).

The compound represented by General Formula (ZI-3) is particularly preferably a compound represented by any one of the following General Formulae (ZI-3a') and (ZI-3b').

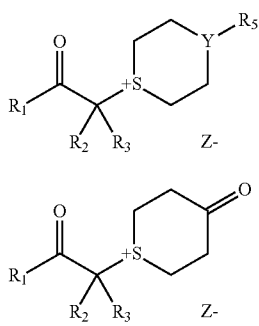

(ZI-3a')

(ZI-3b')

In General Formulae (ZI-3a') and (ZI-3b'), $R_1$, $R_2$, $R_3$, Y, and $R_5$ each have the same definitions as those in General Formula (ZI-3a) and (ZI-3b).

Examples of $Z^-$ include those enumerated above as $Z^-$ in General Formula (ZI).

Specific examples of the cationic site of the compound represented by General Formula (ZI-3) include the following moieties.

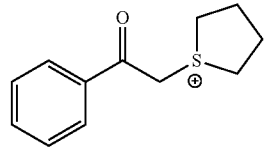
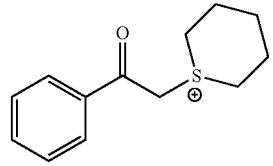
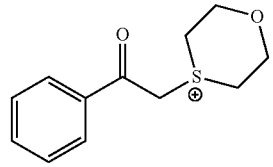
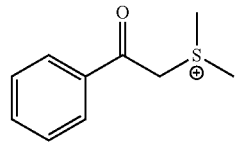
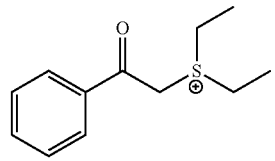
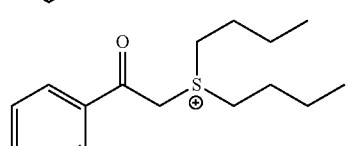
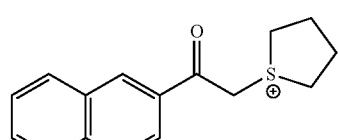
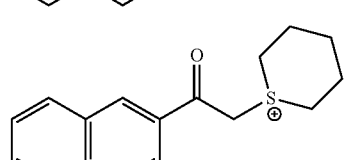
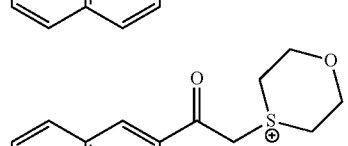
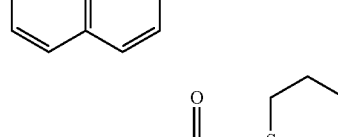
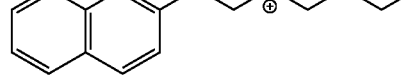

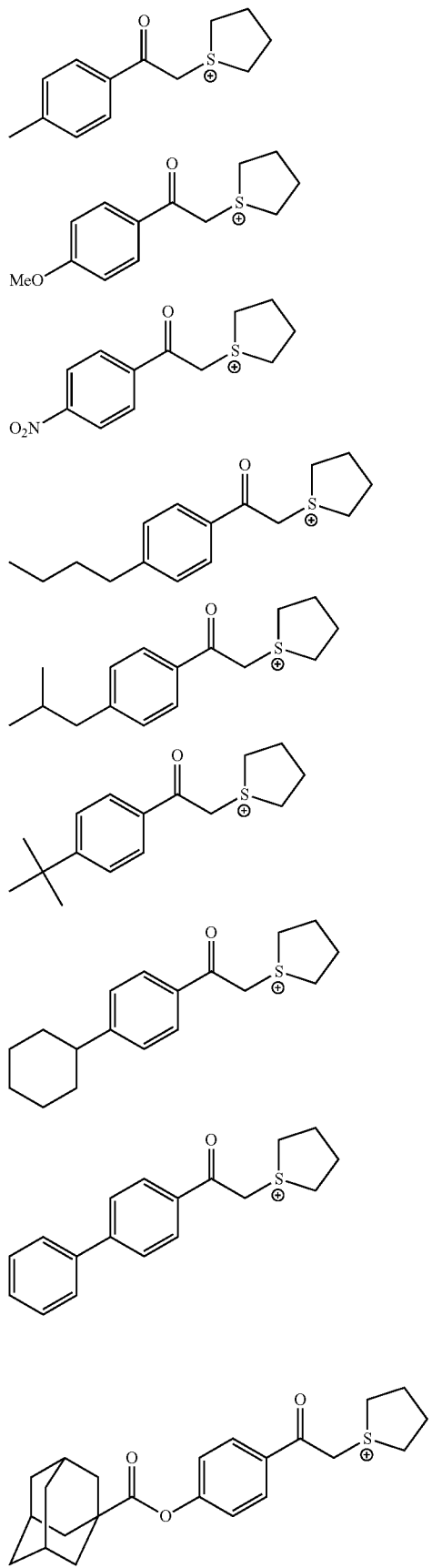
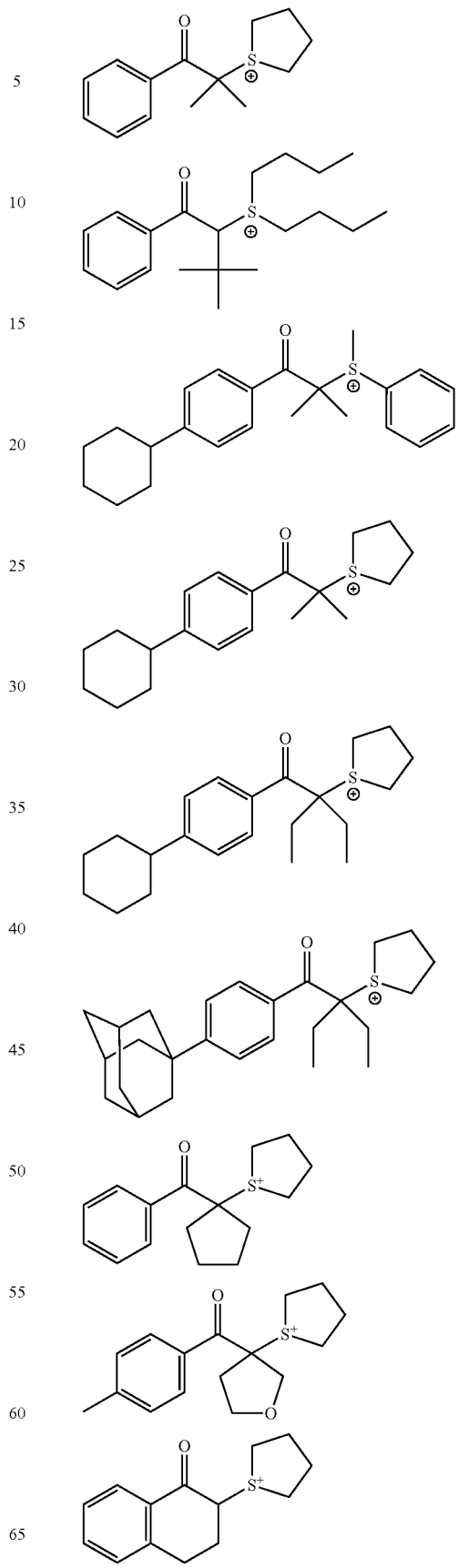

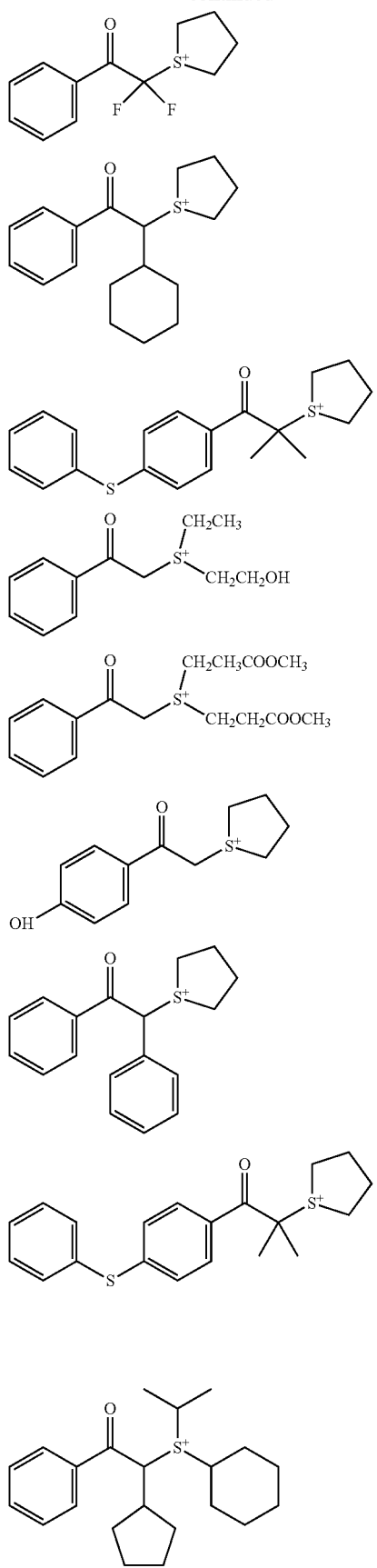
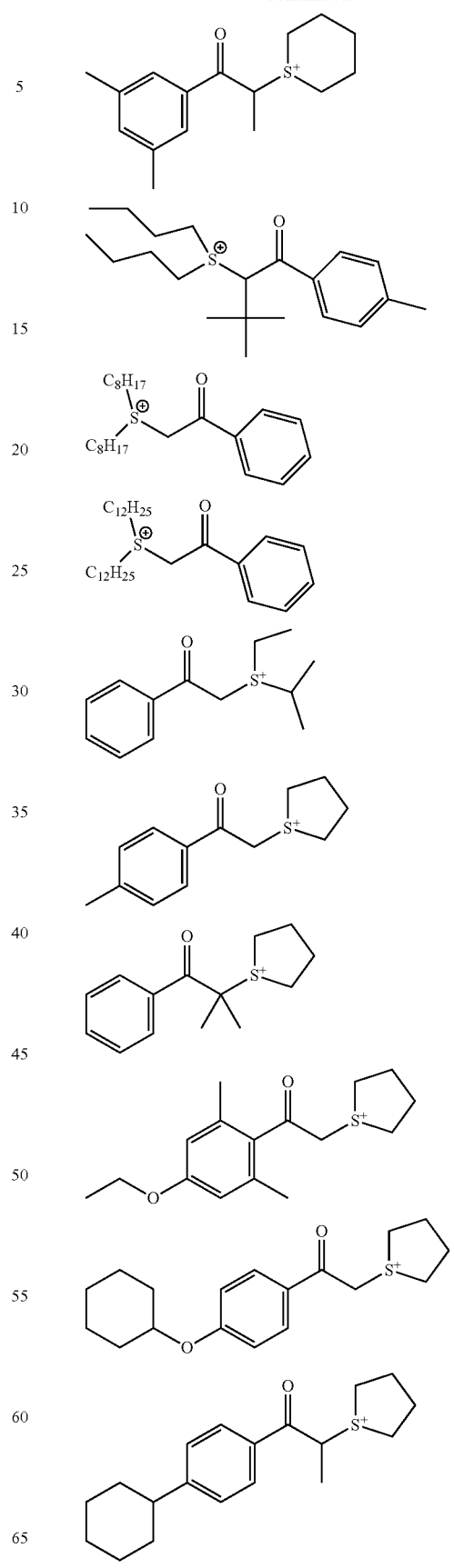

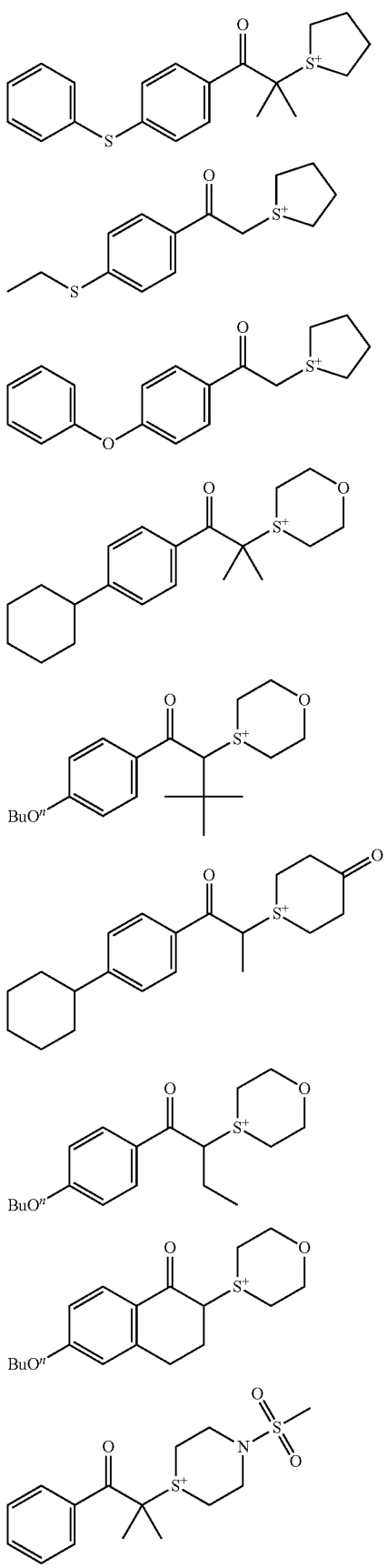

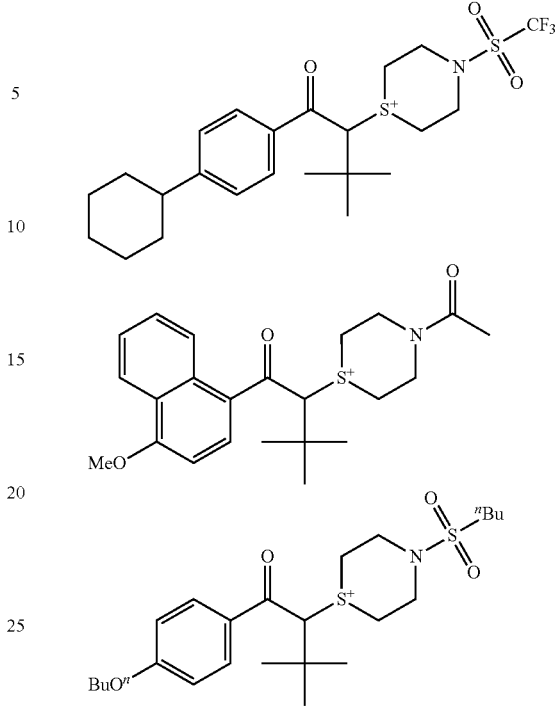

Next, a compound represented by General Formula (ZI-4) will be described.

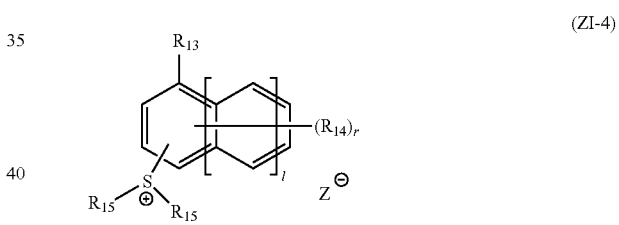

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent. Further, the alkyl group, the cycloalkyl group, the alkoxy group, the alkoxycarbonyl group, or the group having a cycloalkyl group has a carbon chain intervened by a heteroatom such as an oxygen atom, a sulfur atom, and a nitrogen atom, and as a result, may have a hydroxy group, a cyano group, a carbonyl group, an ether bond, an ester bond, a sulfonic acid ester bond, a carbonic acid bond, a lactone ring, a sultone ring, a carboxylic acid anhydride, or the like formed or intervened therein.

In a case where $R_{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. Two $R_{15}$'s may be bonded to each other to form a ring together with a sulfur atom in the formula, and may further include a heteroatom such as an oxygen atom, a sulfur atom, and a nitrogen atom, in addition to the sulfur atom in the formula, as an atom constituting the ring. These groups may have a substituent.

l represents an integer of 0 to 2.

r represents an integer of 0 to 8.

$Z^-$ represents a non-nucleophilic anion, and examples thereof include the same non-nucleophilic anions as $Z^-$ in General Formula (ZI).

In General Formula (ZI-4), the alkyl group of each of $R_{13}$, $R_{14}$, and $R_{15}$ is linear or branched, and is preferably an alkyl group having 1 to 10 carbon atoms.

Examples of the cycloalkyl group of each of $R_{13}$, $R_{14}$, and $R_{15}$ include a monocyclic or polycyclic cycloalkyl group.

The alkoxy group of each of $R_{13}$ and $R_{14}$ is linear or branched, and is preferably an alkyl group having 1 to 10 carbon atoms.

The alkoxycarbonyl group of each of $R_{13}$ and $R_{14}$ is linear or branched, and is preferably an alkoxycarbonyl group having 2 to 11 carbon atoms.

Examples of group having the cycloalkyl group of each of $R_{13}$ and $R_{14}$ include groups having a monocyclic or polycyclic cycloalkyl group. These groups may further have a substituent.

Examples of the alkyl group of the alkylcarbonyl group of $R_1$, include the same specific examples of those of the alkyl group as each of $R_{13}$ to $R_{15}$ above.

The alkylsulfonyl group and the cycloalkylsulfonyl group of $R_{14}$ are linear, branched, or cyclic, and preferably have 1 to 10 carbon atoms.

Examples of a substituent which each of the groups may have may include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group. In one embodiment, regarding the alkyl group, the cycloalkyl group, the alkoxy group, the alkoxycarbonyl group, or the group having a cycloalkyl group of $R_{13}$, at least some of hydrogen atoms in these groups are preferably substituted with fluorine atoms.

Examples of the ring structure which may formed by the mutual bonding of two $R_{15}$'s include a 5- or 6-membered ring formed by two $R_{15}$'s together with a sulfur atom in General Formula (ZI-4), and particularly preferably a 5-membered ring (that is, a tetrahydrothiophene ring or a 2,5-dihydrothiophene ring) and may be fused with an aryl group or a cycloalkyl group. The two $R_{15}$ may have a substituent, and examples of the substituent may include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. Substituents may be present in plural numbers for the ring structure, and may be bonded to each other to form a ring.

In General Formula (ZI-4), $R_{15}$ is preferably a methyl group, an ethyl group, a naphthyl group, or a divalent group capable of forming a tetrahydrothiophene ring structure together with the sulfur atom by the mutual bonding of two $R_{15}$'s, and is particularly preferably a divalent group capable of forming a tetrahydrothiophene ring structure together with the sulfur atom by the mutual bonding of two $R_{15}$'s.

The substituent which each of $R_{13}$ and $R_{14}$ can have is preferably a hydroxyl group, an alkoxy group, an alkoxycarbonyl group, or a halogen atom (particularly a fluorine atom).

l is preferably 0 or 1, and more preferably 1.

r is preferably 0 to 2.

Specific examples of the cation structure which the compound represented by General Formula (ZI-3) or (ZI-4) as described above has include the cation structures in the chemical structures and the like exemplified in paragraphs 0046, 0047, 0072 to 0077, and 0107 to 0110 of JP2011-53360A, the cation structures in the chemical structures and the like exemplified in paragraphs 0135 to 0137, 0151, and 0196 to 0199 of JP2011-53430A, the cation structures in sulfonium salts disclosed in paragraphs 0048 and 0049 of JP2014-133723A, and the cation structures in sulfonium salts disclosed in paragraphs 0048 and 0049 of JP2014-133725A, in addition to the cation structures of the compounds and the like exemplified in JP2004-233661A, JP2003-35948A, US2003/0224288A1, and US2003/0077540A1 as described above.

In General Formulae (ZII) and (ZIII), $R_{204}$ to $R_{207}$ each independently represent an aryl group, an alkyl group, or a cycloalkyl group.

The aryl group, the alkyl group, and the cycloalkyl group of each of $R_{204}$ to $R_{207}$ are each the same as the aryl group, the alkyl group, and the cycloalkyl group of each of $R_{201}$ to $R_{203}$ in the compound (ZI) as described above.

The aryl group, the alkyl group, and the cycloalkyl group of each of $R_{204}$ to $R_{207}$ may have a substituent. Examples of the substituent include the substituents that the aryl group, the alkyl group, and the cycloalkyl group of each of $R_{201}$ to $R_{203}$ in the compound (ZI) as described above may have.

Examples of $Z^-$ include those enumerated above as $Z^-$ in General Formula (ZI).

Moreover, a compound represented by the following General Formula (I') is also preferable as an acid generator, in addition to the compound represented by General Formula (ZI-3) or (ZI-4). By using a compound represented by the following General Formula (I'), transmittance to light for exposure is improved, and LWR and DOF are enhanced.

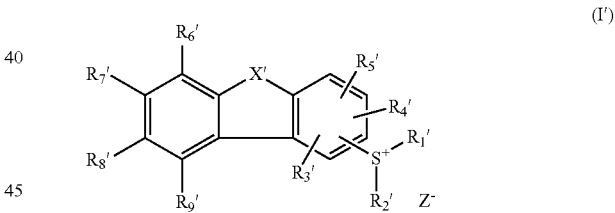

(I')

In General Formula (I'),

X' represents an oxygen atom, a sulfur atom, or —N(Rx)-.

$R_1$' and $R_2$' each independently represent an alkyl group, a cycloalkyl group, or an aryl group.

$R_3$' to $R_9$' each independently represent a hydrogen atom, an alkyl group, a cycloalkyl group, an alkoxy group, an alkoxycarbonyl group, an acyl group, an alkylcarbonyloxy group, an aryl group, an aryloxy group, an aryloxycarbonyl group, or an arylcarbonyloxy group.

Rx represents a hydrogen atom, an alkyl group, a cycloalkyl group, an acyl group, an alkenyl group, an alkoxycarbonyl group, an aryl group, an arylcarbonyl group, or an aryloxycarbonyl group.

$R_1$' and $R_2$' may be linked to each other to form a ring. Further, any two or more members out of $R_6$' to $R_9$', or $R_3$' and $R_9$', $R_4$' and $R_5$', $R_5$' and Rx, $R_6$' and Rx may be linked to each other to form a ring.

X' is preferably a sulfur atom or —N(Rx)- from the viewpoint of keeping the absorbancy (for example, an absorbance at a wavelength of 193 nm) low.

Examples of Z⁻ include those enumerated above as Z⁻ in General Formula (ZI).

The alkyl group as $R_1'$ to $R_9'$, and Rx may have a substituent and is preferably a linear or branched alkyl group having 1 to 20 carbon atoms, and the alkyl group may contain an oxygen atom, a sulfur atom, or a nitrogen atom in the alkyl chain.

Incidentally, examples of the alkyl group having a substituent of Rx include a cyanomethyl group, a 2,2,2-trifluoroethyl group, a methoxycarbonylmethyl group, and an ethoxycarbonylmethyl group.

Examples of the alkyl group having a substituent for $R_1'$ or $R_2'$ include a methoxyethyl group.

Other examples thereof include a group formed by substituting a cycloalkyl group in a linear or branched alkyl group (for example, an adamantylmethyl group, an adamantylethyl group, a cyclohexylethyl group, and a camphor residue).

The cycloalkyl group as each of $R_1'$ to $R_9'$, and Rx may have a substituent, is preferably a cycloalkyl group having 3 to 20 carbon atoms, and may have an oxygen atom in the ring The acyl group as each of $R_3'$ to $R_9'$, and $R_x$ may have a substituent and is preferably an acyl group having 1 to 10 carbon atoms.

The alkenyl group as $R_x$ is preferably an alkenyl group having 2 to 8 carbon atoms.

The alkoxy group as each of $R_3'$ to $R_9'$ may have a substituent and is preferably an alkoxy group having 1 to 20 carbon atoms.

The alkoxycarbonyl group as each of $R_3'$ to $R_9'$ may have a substituent and is preferably an alkoxycarbonyl group having 2 to 20 carbon atoms.

The alkylcarbonyloxy group as each of $R_3'$ to $R_9'$ may have a substituent and is preferably an alkylcarbonyloxy group having 2 to 20 carbon atoms.

The aryl group as each of $R_1'$ to $R_9'$, and Rx may have a substituent and is preferably an aryl group having 6 to 14 carbon atoms.

The aryloxy group as each of $R_3'$ to $R_9'$ may have a substituent and is preferably an aryloxy group having 6 to 14 carbon atoms.

The aryloxycarbonyl group as each of $R_3'$ to $R_9'$, and Rx may have a substituent and is preferably an aryloxycarbonyl group having 7 to 15 carbon atoms.

The arylcarbonyloxy group as each of $R_3'$ to $R_9'$ may have a substituent and is preferably an arylcarbonyloxy group having 7 to 15 carbon atoms.

The arylcarbonyl group as Rx may have a substituent and is preferably an arylcarbonyl group having 7 to 15 carbon atoms.

Examples of the substituent which the alkyl group as each of $R_3'$ to $R_9'$, the cycloalkyl group as each of $R_1'$ to $R_9'$, and Rx, the acyl group as $R_3'$ to $R_9'$, and Rx, the alkoxy group as each of $R_3'$ to $R_9'$, the alkoxycarbonyl group as each of $R_3'$ to $R_9'$, the alkylcarbonyloxy group as each of $R_3'$ to $R_9'$, the aryl group as $R_1'$ to $R_9'$, and Rx, the aryloxy group as each of $R_3'$ to $R_9'$, the aryloxycarbonyl group as each of $R_3'$ to $R_9'$, and Rx, the arylcarbonyloxy group as each of $R_3'$ to $R_9'$, and the arylcarbonyl group as Rx may each further have include an alkyl group (which may be linear, branched, or cyclic, and preferably has 1 to 12 carbon atoms), an aryl group (preferably having 6 to 14 carbon atoms), a nitro group, halogen atoms such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), and an acyl group (preferably having 2 to 12 carbon atoms).

Examples of the ring structure which may be formed by the mutual bonding of $R_1'$ and $R_2'$ include a 5- or 6-membered ring formed by divalent $R_1'$ and $R_2'$ (for example, an ethylene group, a propylene group, and a 1,2-cyclohexylene group) together with a sulfur atom in General Formula (I'), and particularly preferably a 5-membered ring (that is, a tetrahydrothiophene ring). However, from the viewpoint of decomposition efficiency for generation of an acid anion, $R_1'$ and $R_2'$ are preferably not bonded to each other to form a ring.

The ring structure which may be formed by the mutual bonding of any two or more members out of $R_6'$ to $R_9'$, and $R_3'$ and $R_9'$, $R_4'$ and $R_5'$, $R_5'$ and Rx, and Re and Rx is preferably a 5- or 6-membered ring, and particularly preferably a 6-membered ring.

$R_1'$ or $R_2'$ is particularly preferably an alkyl group or an aryl group.

Particularly preferred examples of $R_3'$ to $R_9'$ include an alkyl group which may have a substituent, and a hydrogen atom, but in a case of using the composition for an ArF resist, a hydrogen atom is particularly preferable in view of absorption intensity at 193 nm.

Rx is particularly preferably an alkyl group or an acyl group.

Next, General Formula (2), General Formula (2'), and General Formula (2") which are preferred structures of the non-nucleophilic anion Z⁻ will be described.

First, a sulfonate anion represented by General Formula (2) will be described.

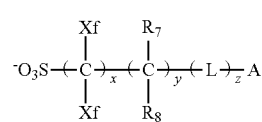
(2)

In General Formula (2),

Xf's each independently represent a fluorine atom or an alkyl group substituted with at least one fluorine atom.

$R_7$ and $R_8$ each independently represent a hydrogen atom, a fluorine atom, an alkyl group, or an alkyl group substituted with at least one fluorine atom, and in a case where $R_7$ and $R_8$ are present in plural numbers, they may be the same as or different from each other.

L represents a divalent linking group, and in a case where L's are present in plural numbers, they may be the same as or different from each other.

A represents an organic group including a cyclic structure.

x represents an integer of 1 to 20, y represents an integer of 0 to 10, z represents an integer of 0 to 10.

The anion of General Formula (2) will be described in more detail.

Xf is a fluorine atom or an alkyl group substituted with at least one fluorine atom, as described above, and as an alkyl group in the alkyl group substituted with a fluorine atom, an alkyl group having 1 to 10 carbon atoms is preferable, and an alkyl group having 1 to 4 carbon atoms is more preferable. Further, the alkyl group substituted with a fluorine atom of Xf is preferably a perfluoroalkyl group.

Xf is preferably a fluorine atom or a perfluoroalkyl group having 1 to 4 carbon atoms. Specific examples thereof include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, CH$_2$CH$_2$C$_2$F$_7$, CH$_2$C$_3$F$_7$, CH$_2$CH$_2$C$_3$F$_7$, CH$_2$C$_4$F$_9$, and CH$_2$CH$_2$C$_4$F$_9$, and among these, a fluorine atom and CF$_3$ are preferable. In particular, it is preferable that both Xf's are fluorine atoms.

R$_7$ and R$_8$ each represent a hydrogen atom, a fluorine atom, an alkyl group, or an alkyl group substituted with at least one fluorine atom, as described above, and the alkyl group is preferably an alkyl group having 1 to 4 carbon atoms, and more preferably a perfluoroalkyl group having 1 to 4 carbon atoms. Specific examples of the alkyl group in which at least one of R$_7$ or R$_8$ is substituted with a fluorine atom include CF$_3$, C$_2$F$_7$, C$_3$F$_7$, C$_4$F$_9$, C$_5$F$_7$, C$_6$F$_{13}$, C$_7$F$_{15}$, C$_8$F$_{17}$, CH$_2$CF$_3$, CH$_2$CH$_2$CF$_3$, CH$_2$C$_2$F$_5$, CH$_2$CH$_2$C$_2$F$_5$, CH$_2$C$_3$F$_7$, CH$_2$CH$_2$C$_3$F$_7$, CH$_2$C$_4$F$_9$, and CH$_2$CH$_2$C$_4$F$_9$, and among these, CF$_3$ is preferable.

L represents a divalent linking group, and examples thereof include —COO—, —OCO—, —CO—, —O—, —S—, —SO—, —SO$_2$—, —N(Ri)- (in the formula, Ri represents a hydrogen atom or alkyl), an alkylene group (preferably having 1 to 6 carbon atoms), a cycloalkylene group (preferably having 3 to 10 carbon atoms), an alkenylene group (preferably having 2 to 6 carbon atoms), or a divalent linking group formed by combination of these plurality of groups. L is preferably —COO—, —OCO—, —CO—, —SO$_2$—, —CON(Ri)-, —SO$_2$N(Ri)-, —CON(Ri)-alkylene group-, —N(Ri)CO-alkylene group-, —COO-alkylene group-, or —OCO-alkylene group-, and more preferably —COO—, —OCO—, —SO$_2$—, —CON(Ri)-, or —SO$_2$N(Ri)-. In a case where L's are present in plural numbers, they may be the same as or different from each other.

The alkyl group as Ri is preferably a linear or branched alkyl group having 1 to 20 carbon atoms, and may have an oxygen atom, a sulfur atom, or a nitrogen atom in the alkyl chain. Specific examples of the alkyl group include linear alkyl groups such as a methyl group, an ethyl group, an n-propyl group, an n-butyl group, an n-pentyl group, an n-hexyl group, an n-octyl group, an n-dodecyl group, an n-tetradecyl group, and an n-octadecyl group, and branched alkyl groups such as an isopropyl group, an isobutyl group, a t-butyl group, neopentyl group, and a 2-ethylhexyl group. Examples of the alkyl group having a substituent include a cyanomethyl group, a 2,2,2-trifluoroethyl group, a methoxycarbonylmethyl group, and an ethoxycarbonylmethyl group.

The organic group including a cyclic structure of A is not particularly limited as long as it has a cyclic structure, and examples thereof include structures with an alicyclic group, an aryl group, a heterocyclic group (including not only an aromatic heterocyclic group but also a non-aromatic heterocyclic group, for example, a tetrahydropyran ring and a lactone ring structure).

The alicyclic group may be monocyclic or polycyclic, and is preferably a monocyclic cycloalkyl group such as a cyclopentyl group, a cyclohexyl group, a cyclooctyl group, or a polycyclic cycloalkyl group such as a norbornyl group, a norbornenyl group, a tricyclodecanyl group (for example, a tricyclo[5.2.1.0(2,6)]decanyl group), a tetracyclodecanyl group, a tetracyclododecanyl group, and an adamantyl group. In addition, a nitrogen atom-containing alicyclic group such as piperidine group, a decahydroquinoline group, and a decahydroisoquinoline group is also preferable. Among these, an alicyclic group having a bulky structure having 7 or more carbon atoms, such as a norbornyl group, a tricyclodecanyl group, a tetracyclodecanyl group, a tetracyclododecanyl group, an adamantyl group, a decahydroquinoline group, and a decahydroisoquinoline group, is preferable from the viewpoint of suppressing diffusivity into a film during a post exposure baking (PEB) step and improving an exposure latitude.

Examples of the aryl group include a benzene ring group, a naphthalene ring group, a phenanthrene ring group, and an anthracene ring group. Among these, a naphthalene ring group having a low light absorbance is preferable from the viewpoint of the light absorbance at 193 nm.

Examples of the heterocyclic group include a furan ring group, a thiophene ring group, a benzofuran ring group, a benzothiophene ring group, a dibenzofuran ring group, a dibenzothiophene ring group, and a pyridine ring. Among these, a furan ring group, a thiophene ring group, and a pyridine ring group are preferable.

The cyclic organic group may have a substituent, and examples of the substituent include an alkyl group (which may be linear, branched, or cyclic, and preferably has 1 to 12 carbon atoms), an aryl group (preferably having 6 to 14 carbon atoms), a hydroxy group, an alkoxy group, an ester group, an amido group, a urethane group, a ureido group, a thioether group, a sulfonamido group, a sulfonic acid ester group, and a cyano group.

Moreover, carbon constituting an organic group including a cyclic structure (carbon contributing ring formation) may be carbonyl carbon.

x is preferably 1 to 8, more preferably 1 to 4, and particularly preferably 1, y is preferably 0 to 4, more preferably 0 or 1, and still more preferably 0, z is preferably 0 to 8, more preferably 0 to 4, and still more preferably 1.

Furthermore, in one embodiment of the present invention, the number of fluorine atoms in the anion represented by General Formula (2) is preferably 2 or 3, whereby the effects from the use in combination with the resin (P) can be enhanced.

Next, a disulfonylimide anion represented by General Formula (2') and a trisulfonylmethide anion represented by General Formula (2") will be described.

(2')

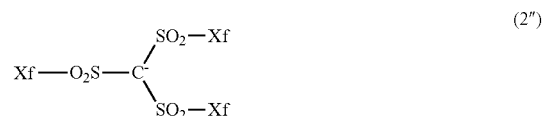

(2")

In General Formulae (2') and (2"),

Xf has the same definition as in General Formula (2), and preferred examples thereof are also the same. In General Formulae (2') and (2"), two Xf's may be linked to each other to form a ring structure.

As the disulfonylimide anion for Z$^-$, a bis(alkylsulfonyl)imide anion is preferable.

The alkyl group in the bis(alkylsulfonyl)imide anion is preferably an alkyl group having 1 to 5 carbon atoms.

Two alkyl groups in the bis(alkylsulfonyl)imide anion may be linked to each other to form an alkylene group (preferably having 2 to 4 carbon atoms), or may be combined with an imido group and two sulfonyl groups to form a ring. The ring structure which the bis(alkylsulfonyl)imide anion may form is preferably a 5- to 7-membered ring, and more preferably a 6-membered ring.

Examples of the substituent which the alkylene group formed by the mutual linking of these alkyl groups and two alkyl groups may have include a halogen atom, an alkyl group substituted with a halogen atom, an alkoxy group, an alkylthio group, an alkyloxysulfonyl group, an aryloxysulfonyl group, and a cycloalkylaryloxysulfonyl group, with a fluorine atom or an alkyl group substituted with a fluorine atom being preferable.

$Z^-$ is also preferably a sulfonate anion represented by the following General Formula (B-1).

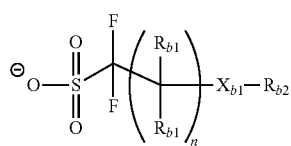
(B-1)

In General Formula (B-1), $R_{b1}$'s each independently represent a hydrogen atom, a fluorine atom, or a trifluoromethyl group ($CF_3$).

n represents an integer of 0 to 4.

n is preferably an integer of 0 to 3, and more preferably 0 or 1.

$X_{b1}$ represents a single bond, an alkylene group, an ether bond, an ester bond (—OCO— or —COO—), a sulfonic acid ester bond (—OSO$_2$— or —SO$_3$—), or a combination thereof.

$X_{b1}$ is preferably an ester bond (—OCO— or —COO—) or a sulfonic acid ester bond (—OSO$_2$— or —SO$_3$—), and more preferably an ester bond (—OCO— or —COO—).

$R_{b2}$ represents an organic group having 6 or more carbon atoms.

The organic group having 6 or more carbon atoms for $R_{b2}$ is preferably a bulky group, and may be an alkyl group, an alicyclic group, an aryl group, or a heterocyclic group, having 6 or more carbon atoms.

The alkyl group having 6 or more carbon atoms for $R_{b2}$ may be linear or branched, and is preferably a linear or branched alkyl group having 6 to 20 carbon atoms. Examples thereof may include a linear or branched hexyl group, a linear or branched heptyl group, and a linear or branched octyl group. From the viewpoint of bulkiness, a branched alkyl group is preferable.

The alicyclic group having 6 or more carbon atoms for $R_{b2}$ may be monocyclic or polycyclic. Examples of the monocyclic alicyclic group include monocyclic cycloalkyl groups such as a cyclohexyl group and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and adamantyl group. Among these, an alicyclic group with a bulky structure having 7 or more carbon atoms, such as a norbornyl group, a tricyclodecanyl group, a tetracyclodecanyl group, a tetracyclododecanyl group or an adamantyl group is preferable from the viewpoints of suppressing diffusivity into a film during a post exposure baking (PEB) step and improving Mask Error Enhancement Factor (MEEF).

The aryl group having 6 or more carbon atoms for $R_{b2}$ may be monocyclic or polycyclic. Examples of the aryl group include a phenyl group, a naphthyl group, a phenanthryl group, and an anthryl group. Among these, a naphthyl group having a relatively low light absorbance at 193 nm is preferable.

The heterocyclic group having 6 or more carbon atoms for $R_{b2}$ may be monocyclic or polycyclic, but is preferably polycyclic so as to suppress acid diffusion. Further, the heterocyclic group may have aromaticity or may not have aromaticity. Examples of the heterocycle having aromaticity include a benzofuran ring, a benzothiophene ring, a dibenzofuran ring and a dibenzothiophene ring. Examples of the heterocycle having no aromaticity include a tetrahydropyran ring, a lactone ring, a sultone ring, and a decahydroisoquinoline ring.

The substituent having 6 or more carbon atoms for $R_{2b}$ may further have a substituent. Examples of the additional substituent may include an alkyl group (which may be linear or branched, and preferably has 1 to 12 carbon atoms), a cycloalkyl group (which may be monocyclic, polycyclic, or spirocyclic, and preferably has 3 to 20 carbon atoms), an aryl group (preferably having 6 to 14 carbon atoms), a hydroxy group, an alkoxy group, an ester group, an amido group, a urethane group, a ureido group, a thioether group, a sulfonamido group and a sulfonic acid ester group. Meanwhile, a carbon which constitutes the alicyclic group, the aryl group or the heterocyclic group as described above (a carbon contributing to ring formation) may be a carbonyl carbon.

Specific examples of the sulfonate anion structure represented by General Formula (B-1) are shown below, but the present is not limited thereto.

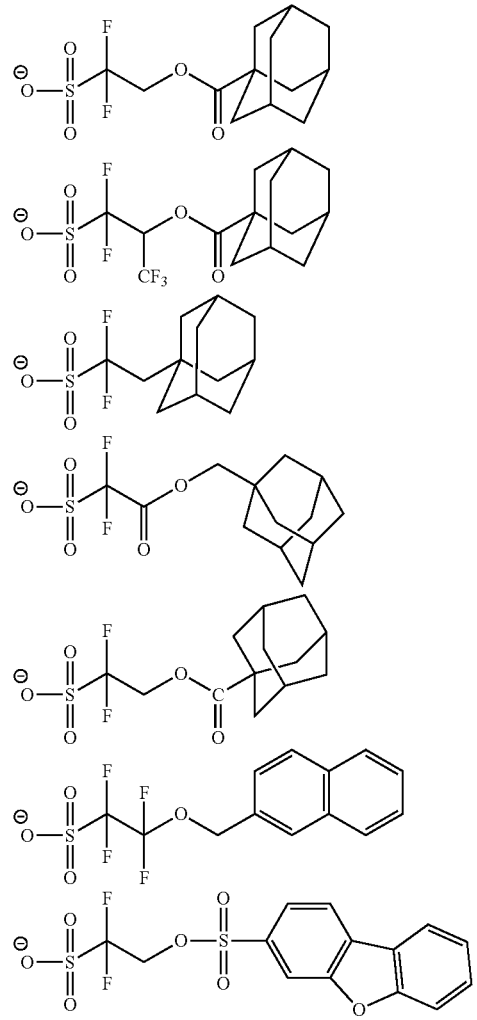

-continued

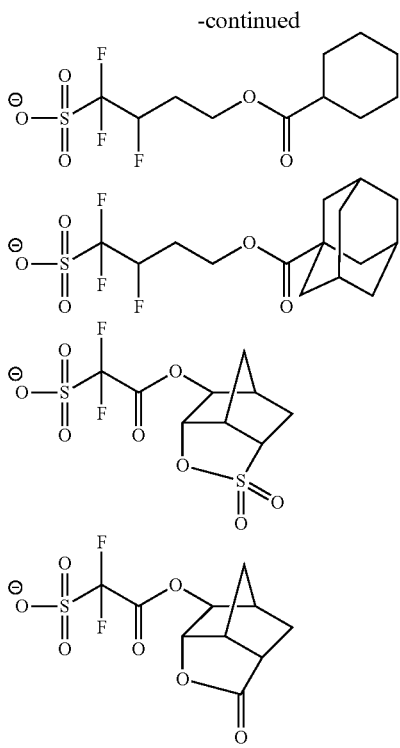

Z⁻ is also preferably a sulfonate anion represented by the following General Formula (A-I).

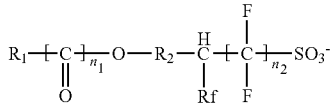

In General Formula (A-I), $R_1$ is an alkyl group, a monovalent alicyclic hydrocarbon group, an aryl group or a heteroaryl group.

$R_2$ is a divalent linking group.

Rf is a fluorine atom or an alkyl group substituted with at least one fluorine atom.

$n_1$ and $n_2$ each independently are 0 or 1.

The alkyl group represented by $R_1$ is preferably an alkyl group having 1 to 20 carbon atoms, more preferably an alkyl group having 1 to 10 carbon atoms, still more preferably an alkyl group having 1 to 5 carbon atoms, and particularly preferably an alkyl group having 1 to 4 carbon atoms. Specific examples of the alkyl group include a methyl group, an ethyl group, a 1-propyl group, a 2-propyl group, a 1-butyl group, a 2-butyl group, a 2-(2-methylpropyl) group, a 1-pentyl group, a 2-pentyl group, a 3-pentyl group, a 1-(2-methylbutyl) group, a 1-(3-methylbutyl) group, a 2-(2-methylbutyl) group, a 2-(3-methylbutyl) group, neopentyl group, a 1-hexyl group, a 2-hexyl group, a 3-hexyl group, a 1-(2-methylpentyl) group, a 1-(3-methylpentyl) group, a 1-(4-methylpentyl) group, a 2-(2-methylpentyl) group, a 2-(3-methylpentyl) group, a 2-(4-methylpentyl) group, a 3-(2-methylpentyl) group, and a 3-(3-methylpentyl) group.

Furthermore, the alkyl group may have a substituent (preferably a fluorine atom), and the alkyl group having the substituent is preferably an alkyl group having 1 to 5 carbon atoms substituted with at least one fluorine atom, and more preferably a perfluoroalkyl group having 1 to 5 carbon atoms.

The alkyl group represented by $R_1$ is preferably a methyl group, an ethyl group, or a trifluoromethyl group, and more preferably a methyl group or an ethyl group.

The monovalent alicyclic hydrocarbon group represented by $R_1$ preferably has 5 or more carbon atoms. Further, the carbon number of the monovalent alicyclic hydrocarbon group is preferably 20 or less, and more preferably 15 or less. The monovalent alicyclic hydrocarbon group may be a monocyclic alicyclic hydrocarbon group or a polycyclic alicyclic hydrocarbon group. Some of —$CH_2$—'s in the alicyclic hydrocarbon group may be substituted with —O— or —C(=O)—.

The monocyclic alicyclic hydrocarbon group preferably has 5 to 12 carbon atoms, and examples thereof include a cyclopentyl group, a cyclohexyl group, a cycloheptyl group, a cyclooctyl group, a cyclododecanyl group, a cyclopentenyl group, a cyclohexenyl group, a cyclooctadienyl group, and a piperidine ring group, with the cyclopentyl group, the cyclohexyl group, or the cyclooctyl group being particularly preferable.

The polycyclic alicyclic hydrocarbon has 10 to 20 carbon atoms, and examples thereof include a bicyclo[4.3.0]nonanyl group, a decahydronaphthalenyl group, a 1,2,3,4-tetrahydronaphthalene group, a tricyclo[5.2.1.0(2,6)]decanyl group, a tetracyclodecanyl group, a tetracyclododecanyl group, a bornyl group, an isobornyl group, a norbornyl group, an adamantyl group, a noradamantyl group, a 1,7,7-trimethyltricyclo[2.2.1.0$^{2,6}$]heptanyl group, a 3,7,7-trimethylbicyclo[4.1.0]heptanyl group, and a decahydroisoquinoline ring group, with the norbornyl group, the adamantly group, or the noradamantyl group being particularly preferable.

The aryl group represented by $R_1$ preferably has 6 or more carbon atoms. Further, the carbon number of the aryl group is preferably 20 or less, and more preferably 15 or less.

The heteroaryl group represented by $R_1$ preferably has 2 or more carbon atoms. Further, the carbon number of the heteroaryl group is preferably 20 or less, and more preferably 15 or less.

The aryl group or the heteroaryl group may be a monocyclic aryl group or a monocyclic heteroaryl group, and may be a polycyclic aryl group or a polycyclic heteroaryl group.

Examples of the monocyclic aryl group include a phenyl group.

Examples of the polycyclic aryl group include a naphthyl group and an anthracenyl group.

Examples of the monocyclic heteroaryl group include a pyridyl group, a thienyl group, and a furanyl group.

Examples of the polycyclic heteroaryl group include a quinolyl group and an isoquinolyl group.

The monovalent alicyclic hydrocarbon group, the aryl group, and the heteroaryl group as $R_1$ may each further have a substituent, and examples of the substituent may include a hydroxyl group, a halogen atom (a fluorine atom, a chlorine atom, a bromine atom, an iodine atom, and the like), a nitro group, a cyano group, an amido group, a sulfonamido group, alkyl groups such as a methyl group, an ethyl group, a propyl group, an n-butyl group, a sec-butyl group, a hexyl group, a 2-ethylhexyl group, and an octyl group, alkoxy groups such as a methoxy group, an ethoxy group, a hydroxyethoxy group, a propoxy group, a hydroxypropoxy group, and a butoxy group, alkoxycarbonyl groups such as a methoxycarbonyl group and an ethoxycarbonyl group, acyl groups such as a formyl group, an acetyl group, and a benzoyl group, acyloxy groups such as an acetoxy group and a butyryloxy group, and a carboxyl group.

$R_1$ is particularly preferably a cyclohexyl group or an adamantyl group.

The divalent linking group represented by $R_2$ is not particularly limited, and examples thereof include —COO—, —OCO—, —CO—, —O—, —S—, —SO—, —SO$_2$—, an alkylene group (preferably an alkylene group having 1 to 30 carbon atoms), a cycloalkylene group (preferably a cycloalkylene group having 3 to 30 carbon atoms), an alkenylene group (preferably an alkenylene group having 2 to 30 carbon atoms), an arylene group (preferably an arylene group having 6 to 30 carbon atoms), a heteroarylene group (preferably a heteroarylene group having 2 to 30 carbon atoms) and a group obtained by combining two or more kinds of these. The alkylene group, the cycloalkylene group, the alkenylene group, the arylene group and the heteroarylene group may each further have substituent, and specific examples of the substituent may be the same as those described above for the monovalent alicyclic hydrocarbon group, the aryl group and the heteroaryl group as $R_1$.

The divalent linking group represented by $R_2$ is preferably an alkylene group, a cycloalkylene group, an alkenylene group, an arylene group, or a heteroarylene group, more preferably an alkylene group, still more preferably an alkylene group having 1 to 10 carbon atoms, and particularly preferably an alkylene group having 1 to 5 carbon atoms.

Rf is preferably a fluorine atom or an alkyl group substituted with at least one fluorine atom. The number of carbon atoms of the alkyl group is preferably 1 to 30, more preferably 1 to 10, and still more preferably 1 to 4. In addition, the alkyl group substituted with at least one fluorine atom is preferably a perfluoroalkyl group.

Rf is preferably a fluorine atom or a perfluoroalkyl group having 1 to 4 carbon atoms. More specifically, Rf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, and more preferably a fluorine atom or $CF_3$.

$n_1$ is preferably 1.

$n_2$ is preferably 1.

Preferred specific examples of the sulfonate anion represented by General Formula (A-I) are shown below, but the present invention is not limited thereto.

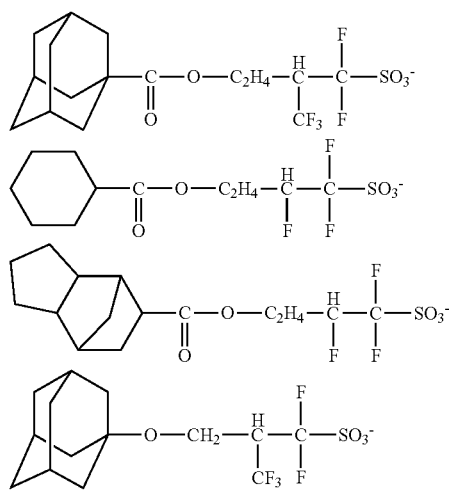

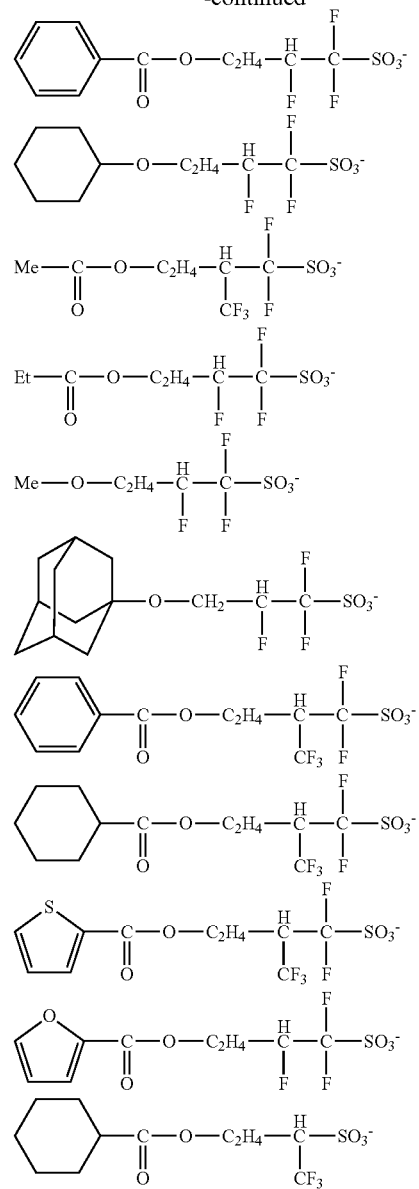

Other examples of the acid generator include a compound represented by the following General Formula (ZV).

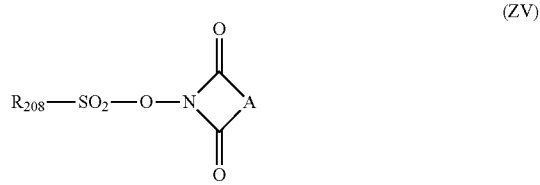

In General Formula (ZV), $R_{208}$ represents an alkyl group, an cycloalkyl group, or an aryl group.

A represents an alkylene group, an alkenylene group, or an arylene group.

Specific examples of the aryl group of $R_{208}$ include the same specific examples of the aryl group as $R_{201}$ to $R_{203}$ in General Formula (ZI).

Specific example of the alkyl group and the cycloalkyl group of $R_{208}$ include the same specific examples of the alkyl group and the cycloalkyl group, respectively, as $R_{201}$ to $R_{203}$ in General Formula (ZI).

Examples of the alkylene group of A include an alkylene group having 1 to 12 carbon atoms, examples of the alkenylene group of A include an alkenylene group having 2 to 12 carbon atoms, and examples of the arylene group of A include an arylene group having 6 to 10 carbon atom.

Furthermore, as for the acid generator, the fluorine content ratio represented by (total mass of all fluorine atoms contained in the compound)/(total mass of all atoms contained in the compound) is preferably 0.30 or less, more preferably 0.25 or less, still more preferably 0.20 or less, particularly more preferably 0.15 or less, and most preferably 0.10 or less.

Among the acid generators, particularly preferred examples are shown below.

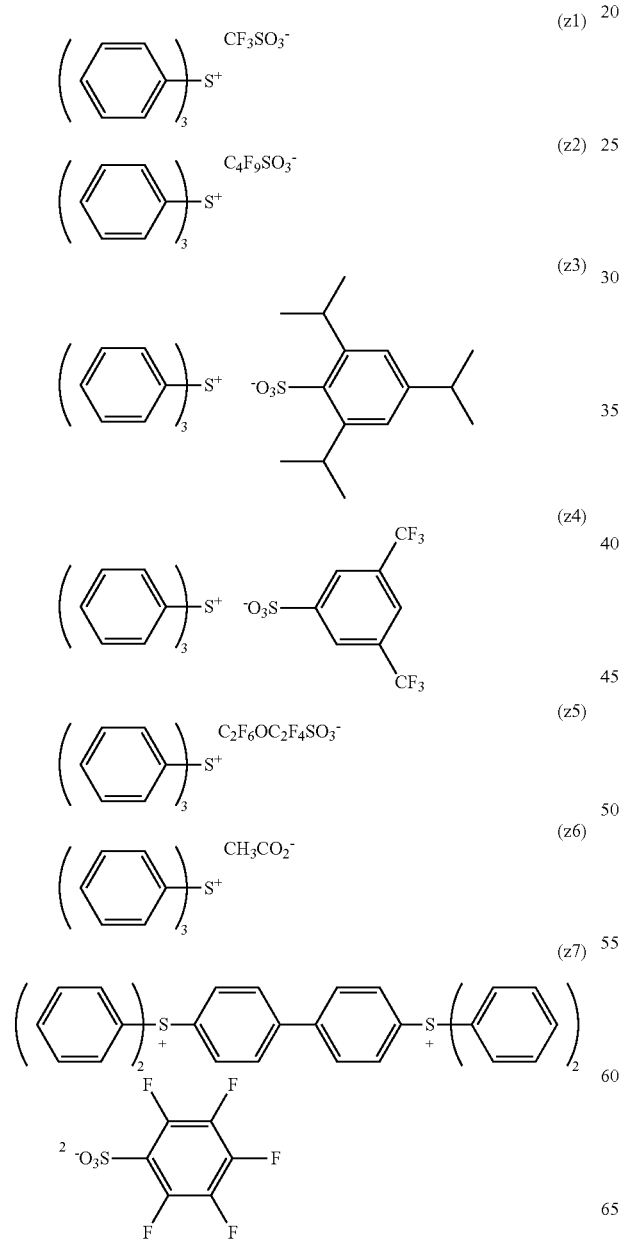

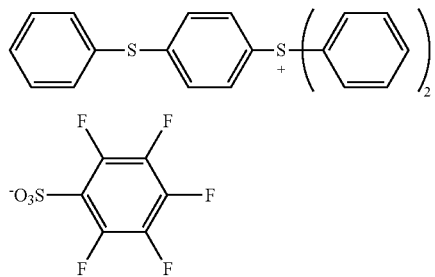

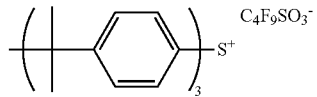

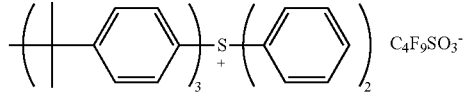

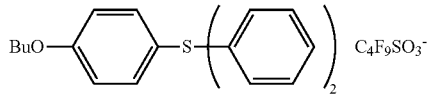

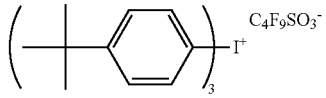

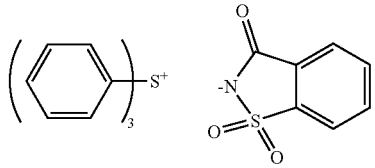

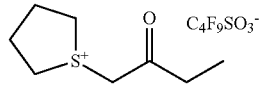

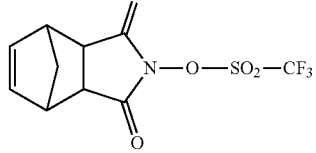

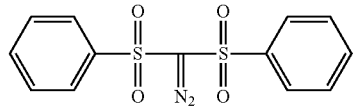

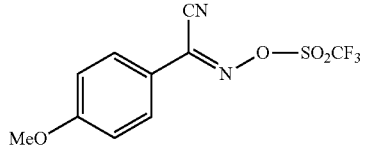

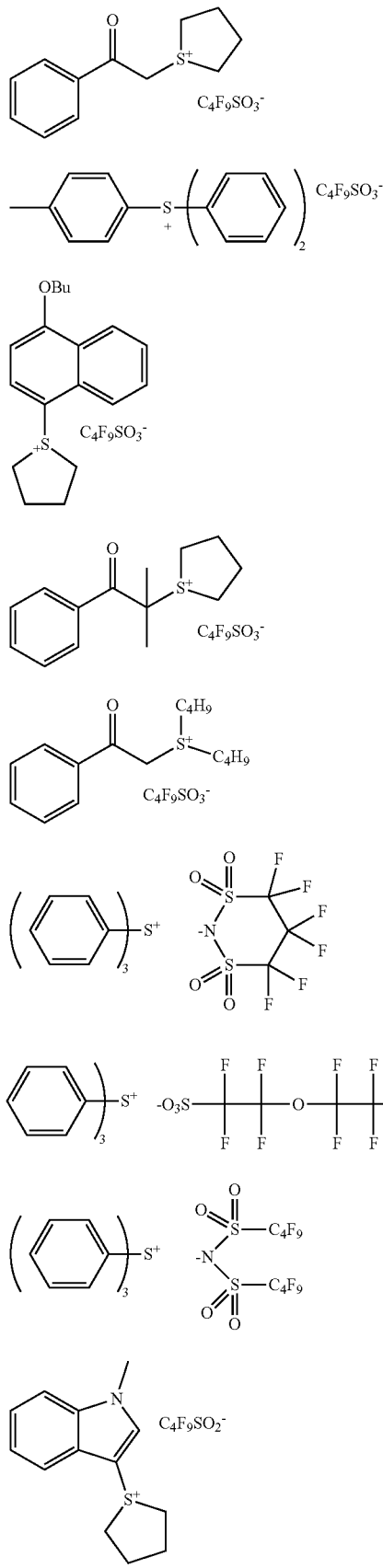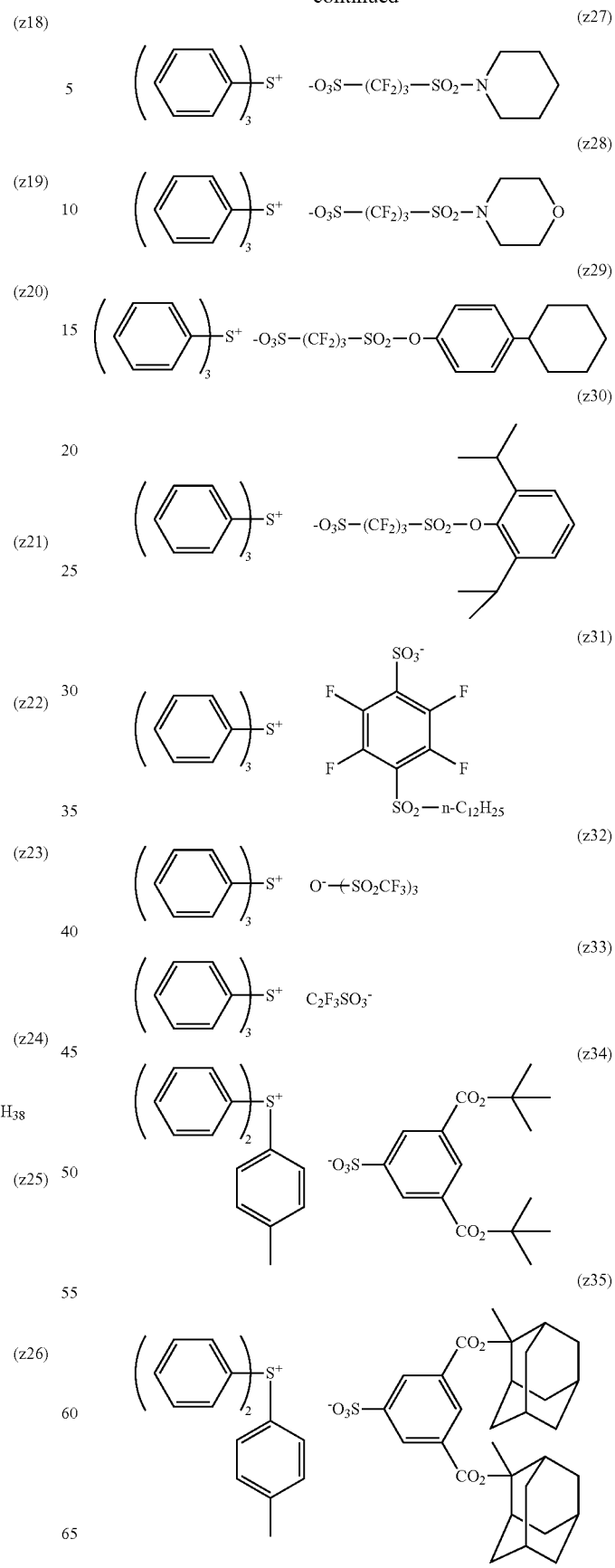

-continued (z36) (z37) (z38) (z39) (z40) (z41) (z42) (z43) (z44) (z45) (z46) (z47)

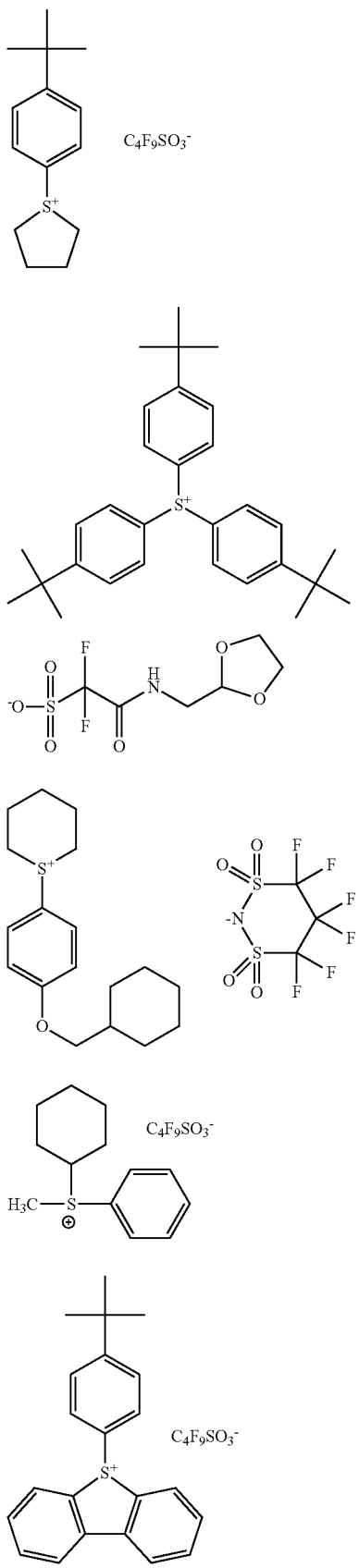
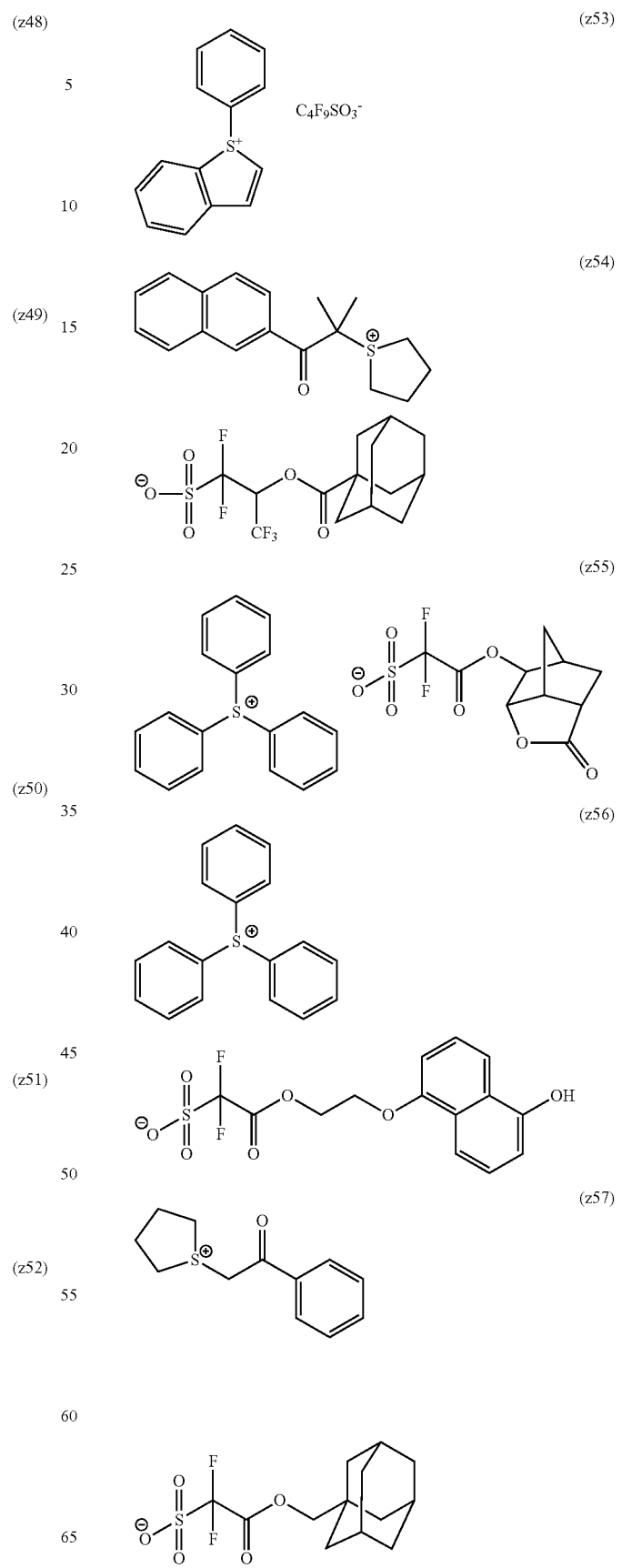

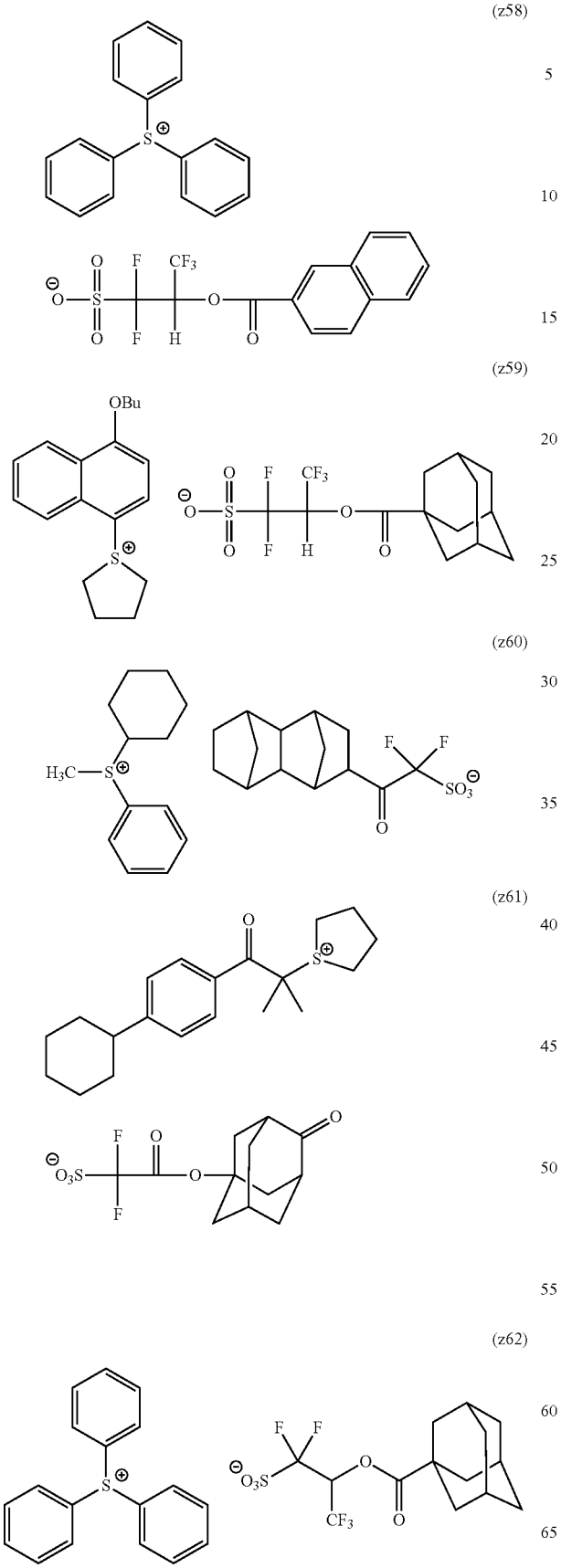
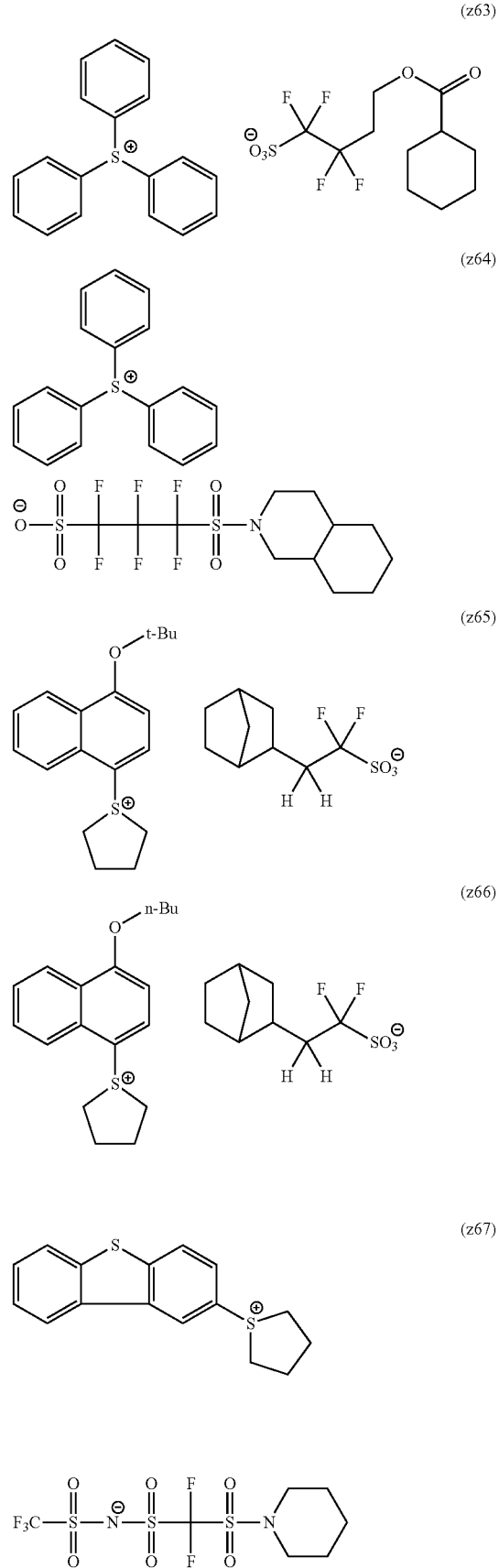

(z68)
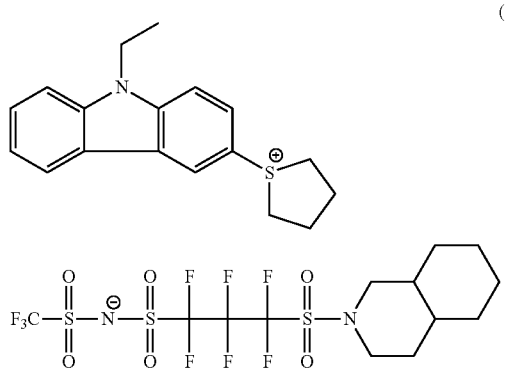
(z69)
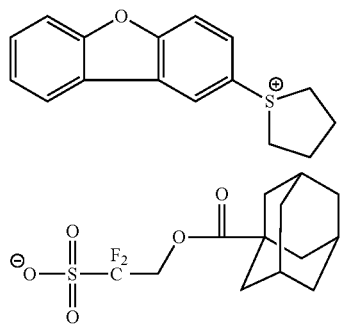
(z70)
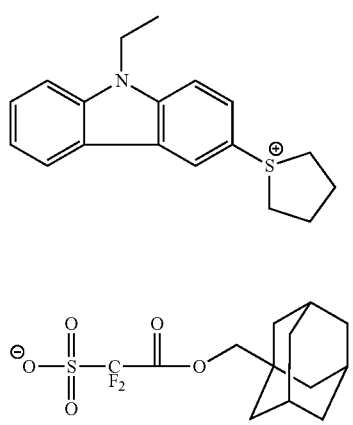
(z71)
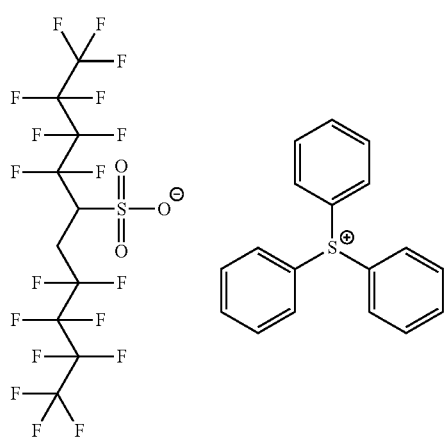
(z72)
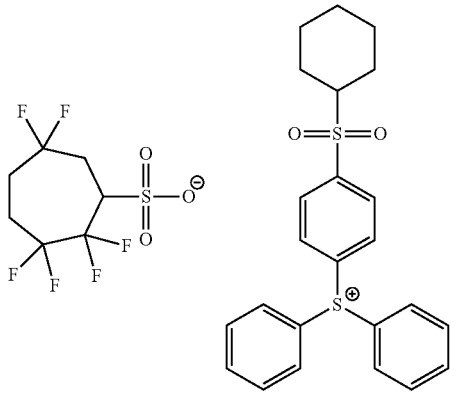
(z73)
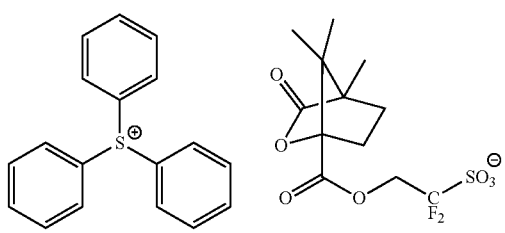
(z74)
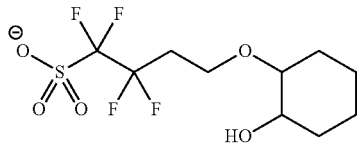
(z75)
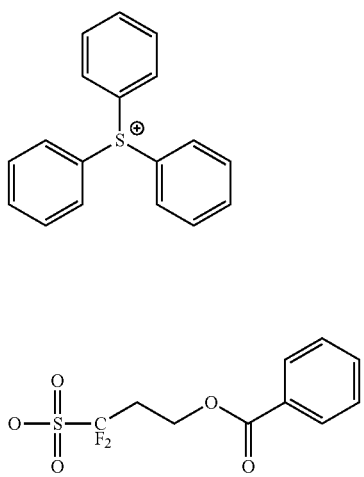

-continued
(z76)
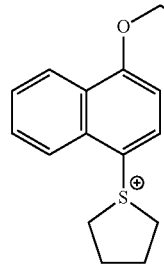
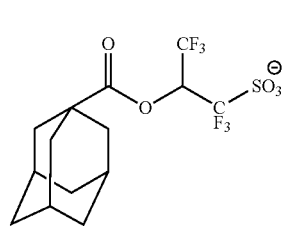
(z77)
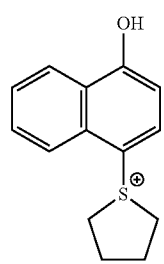
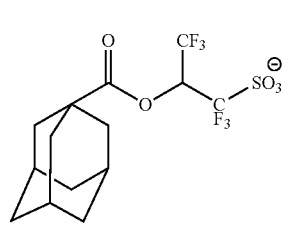
(z78)
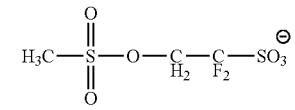
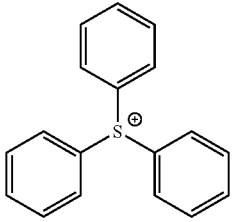
(z79)
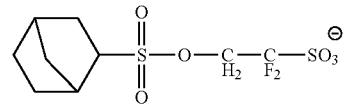
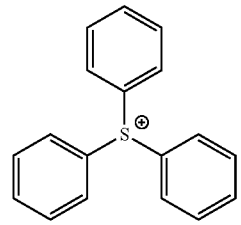
(z80)
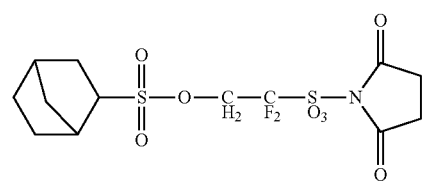
(z81)
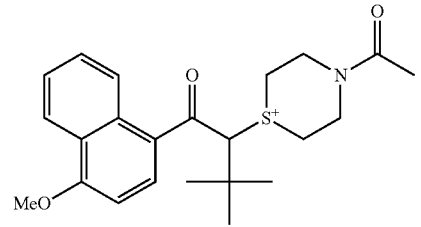
-continued
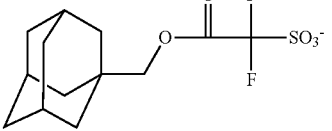
(z82)
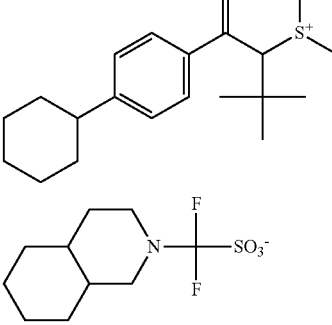
(z83)
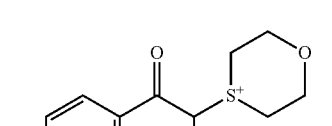
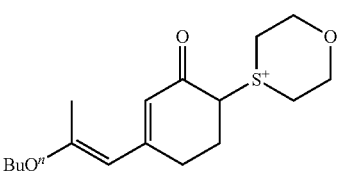
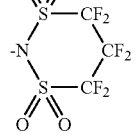

-continued
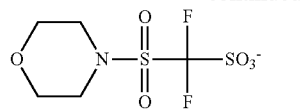
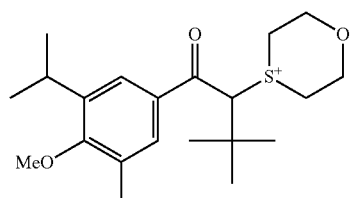
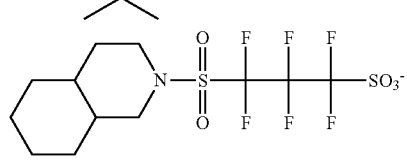
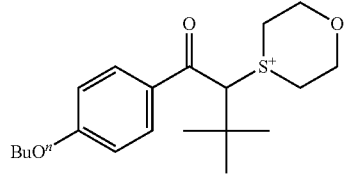
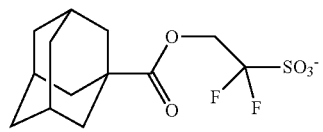
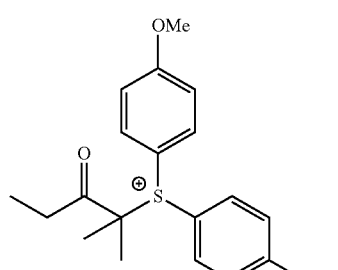
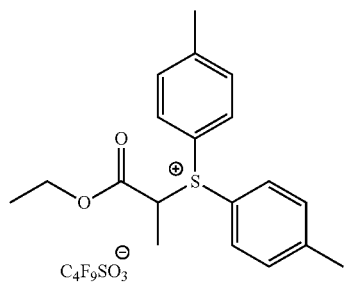
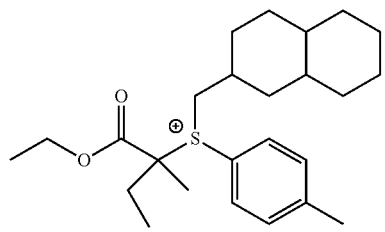
-continued
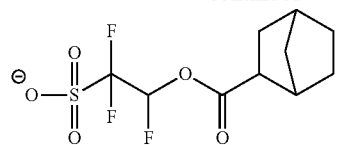
(z87)
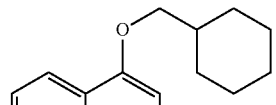
(z92)
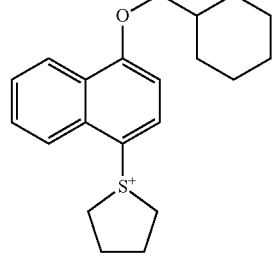
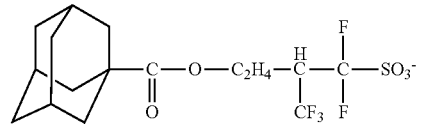
(z88)
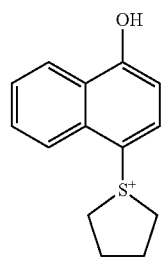
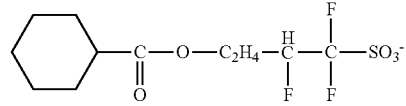
(z93)
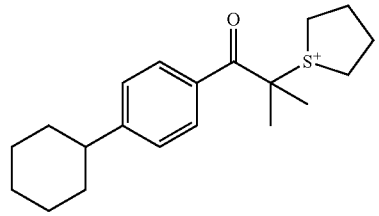
(z89)
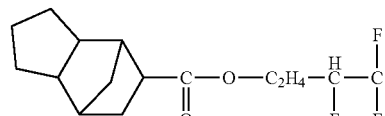
(z94)
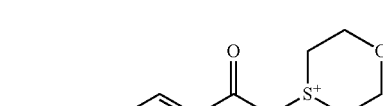
(z90)
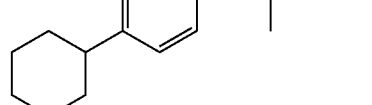
(z95)
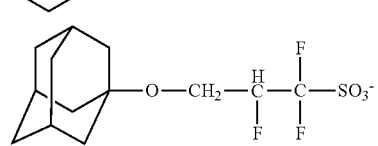
(z91)

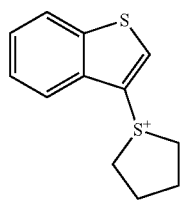 (z96) 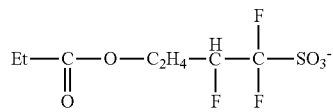
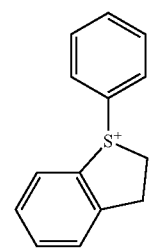 (z97) 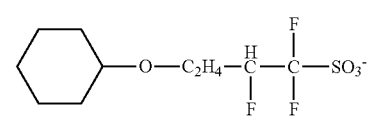
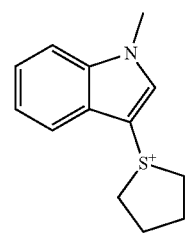 (z98) 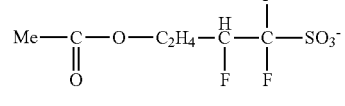
(z99)
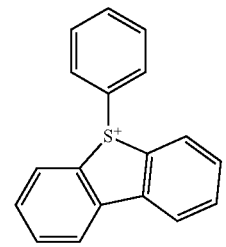
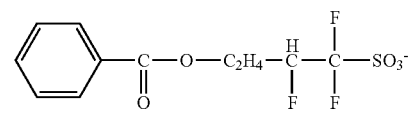
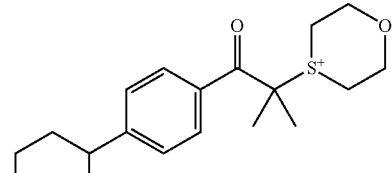
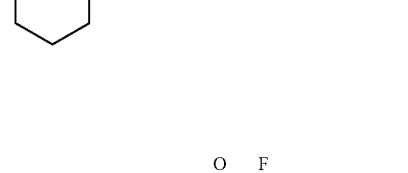
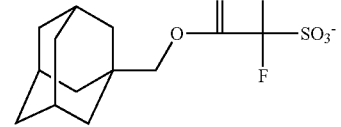
(z101) 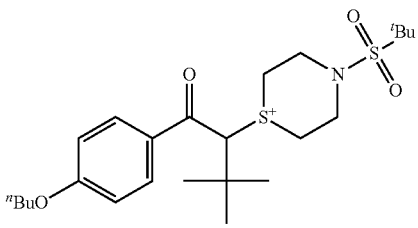
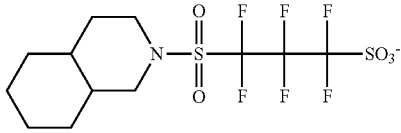
(z102) 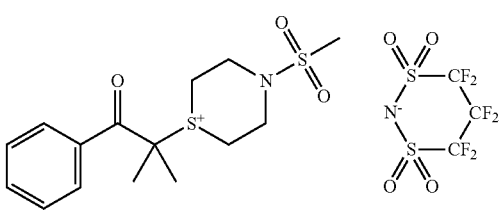
(z103) 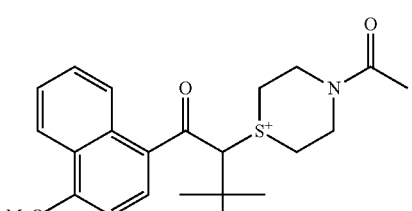
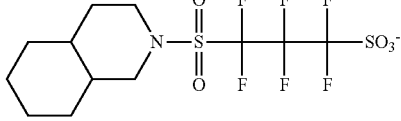
(z104) 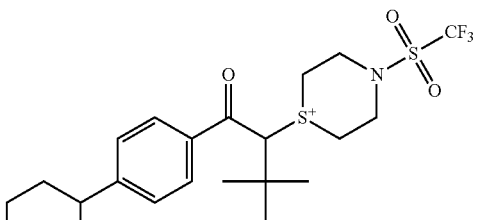
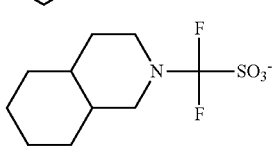
(z105) 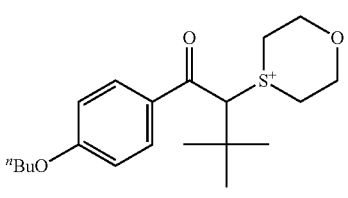

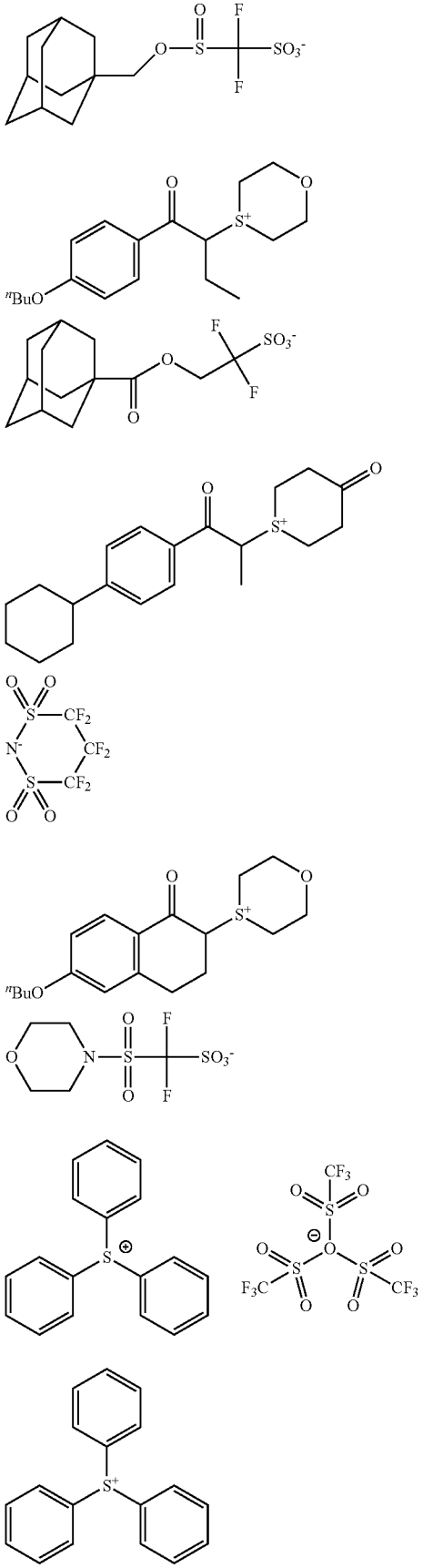

(z105)

(z106)

(z107)

(z109)

(z110)

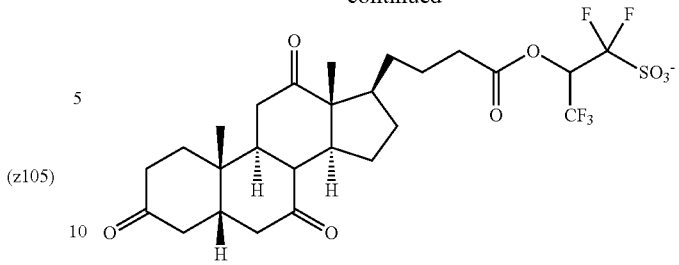

The acid generator may be used singly or in combination of two or more kinds thereof.

The active-light-sensitive or radiation-sensitive resin composition of the present invention may or may not contain an acid generator, and in a case where the composition contains the acid generator, the content of the acid generator is preferably 0.1% to 30% by mass, more preferably 3% to 25% by mass, and still more preferably 7% to 20% by mass, with respect to the total solid content of the active-light-sensitive or radiation-sensitive resin composition.

[3] Resin (P) Having Group that Decomposes by Action of Acid to Generate Polar Group The active-light-sensitive or radiation-sensitive resin composition of the present invention preferably further includes a resin (P) having a group that decomposes by the action of an acid to generate a polar group (hereinafter also referred to as a "resin (P)," an "acid-decomposable resin," or an "acid-decomposable resin (P)").

The active-light-sensitive or radiation-sensitive resin composition of the present invention can take embodiments of positive tone and negative tone active-light-sensitive or radiation-sensitive resin compositions. The resin (P) has a group that decomposes by the action of an acid to generate a polar group (hereinafter also referred to as an "acid-decomposable group") on either one or both of the main chain and the side chain. The resin (P) preferably includes a repeating unit having an acid-decomposable group.

(1) Repeating Unit Having Acid-Decomposable Group

The acid-decomposable group preferably has a structure in which a polar group is protected with a group that decomposes by the action of an acid to leave.

Preferred examples of the polar group include a carboxyl group, a fluorinated alcohol group (preferably hexafluoroisopropanol), and a sulfonic acid group.

As the acid-decomposable group, groups obtained by substituting hydrogen atoms of these polar groups with groups that leaves by the action of an acid are preferable.

Examples of the group that leaves by the action of an acid include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

The acid-decomposable group is preferably a cumyl ester group, an enol ester group, an acetal ester group, a tertiary alkyl ester group, or the like, and more preferably a tertiary alkyl ester group.

As the repeating unit having the acid-decomposable group that the resin (P) can contain, a repeating unit represented by the following General Formula (AI) is preferable.

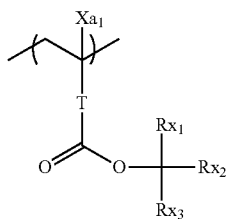
(AI)

In General Formula (AI),

Xa₁ represents a hydrogen atom, a methyl group which may have a substituent, or a group represented by —CH₂—R₉. The methyl group may have a substituent. R₉ represents a hydroxyl group or a monovalent organic group. Examples of the monovalent organic group include an alkyl group having 5 or less carbon atoms, and an acyl group, and the monovalent organic group is preferably an alkyl group having 3 or less carbon atoms, and still more preferably a methyl group. Xa₁ is preferably a hydrogen atom, a methyl group, a trifluoromethyl group, or a hydroxymethyl group.

T represents a single bond or a divalent linking group.

Rx₁ to Rx₃ each independently represent an (linear or branched) alkyl group or a (monocyclic or polycyclic) cycloalkyl group.

Two members out of Rx₁ to Rx₃ may be bonded to each other to form a (monocyclic or polycyclic) cycloalkyl group.

Examples of the divalent linking group of T include an alkylene group, a —COO-Rt-group, and an —O-Rt-group. In the formulae, Rt represents an alkylene group or a cycloalkylene group.

T is preferably a single bond or a —COO-Rt-group. Rt is preferably an alkylene group having 1 to 5 carbon atoms, and more preferably a —CH₂— group or a —(CH₂)₃— group.

As the alkyl group of Rx₁ to Rx₃, a linear or branched alkyl group having 1 to 4 carbon atoms is preferable.

As the cycloalkyl group of Rx₁ to Rx₃, a monocyclic cycloalkyl group having 3 to 8 carbon atoms and a polycyclic cycloalkyl group having 7 to 20 carbon atoms are preferable.

As the cycloalkyl group formed by the mutual bonding of two members out of Rx₁ to Rx₃, a monocyclic cycloalkyl group having 3 to 8 carbon atoms and a polycyclic cycloalkyl group having 7 to 20 carbon atoms are preferable, and a monocyclic cycloalkyl group having 5 or 6 carbon atoms is particularly preferable.

An embodiment in which Rx₁ is a methyl group or an ethyl group, and Rx₂ and Rx₃ are bonded to each other to form the above-described cycloalkyl group is preferable.

In one embodiment, it is preferable that in General Formula (AI), T is a single bond, and Rx₁, Rx₂, and Rx₃ are each an alkyl group, the sum of the numbers of carbon atoms of the alkyl groups represented by Rx₁, Rx₂, and Rx₃ is more preferably 4 or more, still more preferably 5 or more, and particularly preferably 6 or more. In this case, two or three members out of Rx₁, Rx₂, and Rx₃ are not bonded to one another to form a ring in any case.

Specific preferred examples of the repeating unit having an acid-decomposable group are shown below, but the present invention is not limited thereto. Further, in the formulae, Xa₁ represents any one of H, CH₃, CF₃, and CH₂OH, and Rxa and Rxb each represent a linear or branched alkyl group having 1 to 4 carbon atoms.

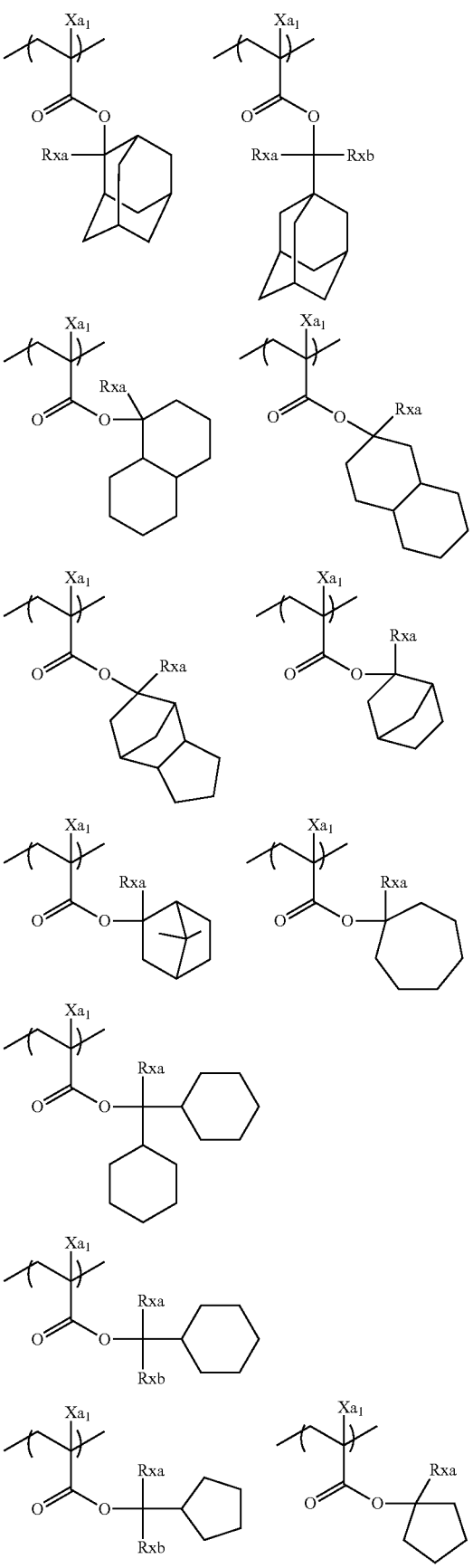

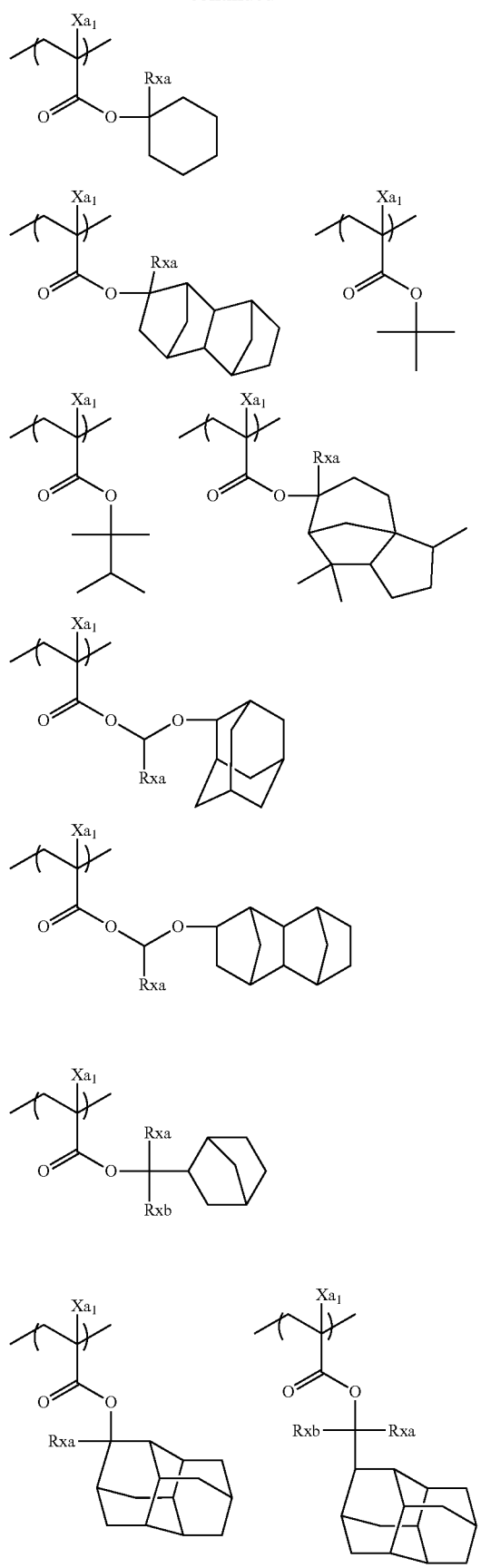
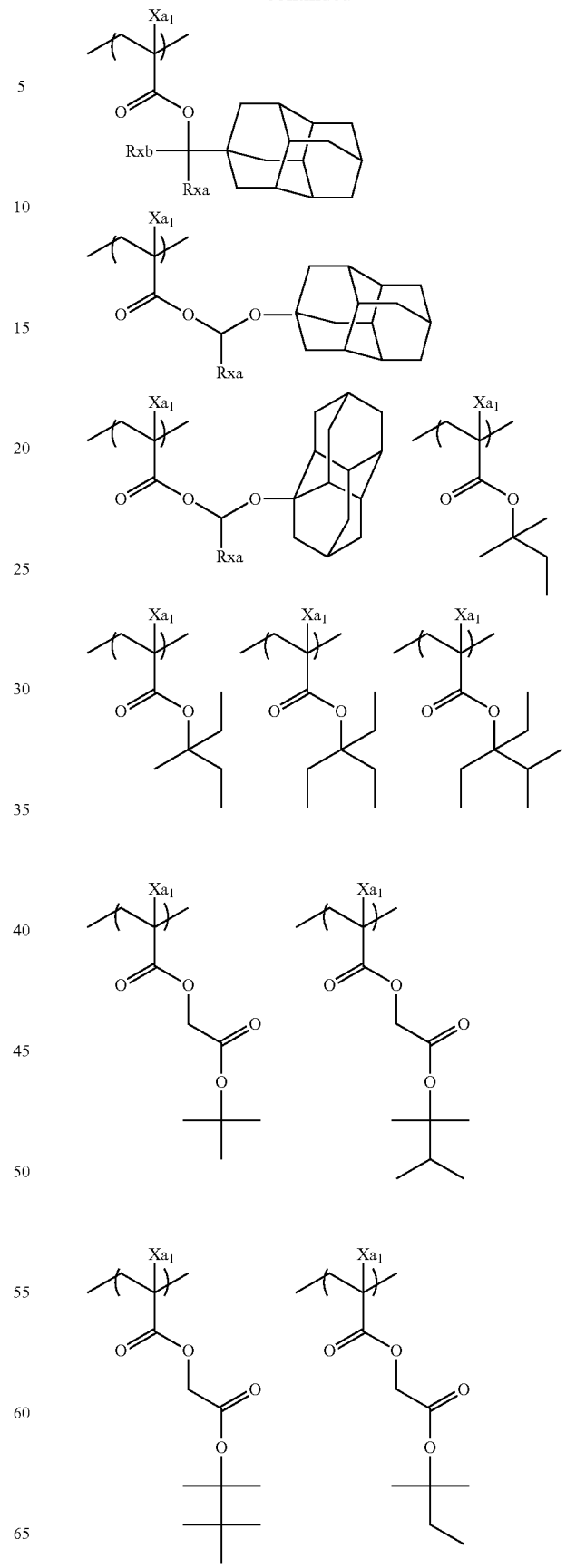

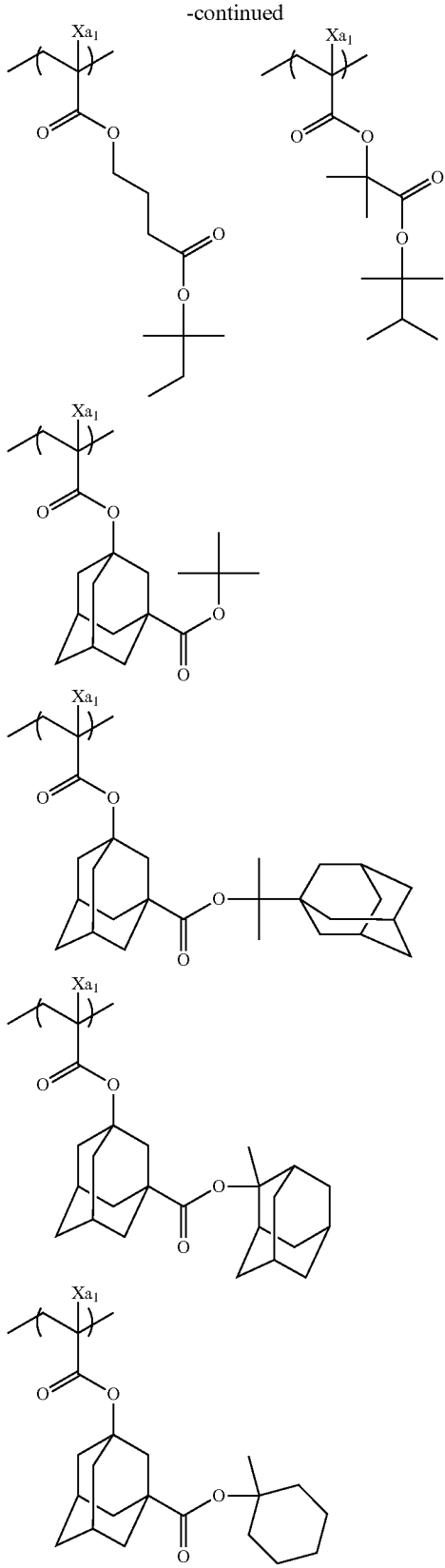

The resin (P) is more preferably a resin having a repeating unit represented by the following General Formula (1) as the repeating unit represented by General Formula (AI).

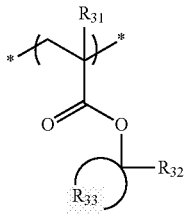

In General Formula (1), $R_{31}$ represents a hydrogen atom, an alkyl group, or a fluorinated alkyl group, $R_{32}$ represents an alkyl group, $R_{33}$ represents an atomic group required for forming a monocyclic alicyclic hydrocarbon structure together with carbon atoms to which $R_{32}$ is bonded.

In the alicyclic hydrocarbon structure, some of carbon atoms constituting a group may be substituted with a heteroatom, or a group having a heteroatom.

The alkyl group of $R_{31}$ may have a substituent and examples of the substituent include a fluorine atom and a hydroxyl group.

$R_{31}$ preferably represents a hydrogen atom, a methyl group, a trifluoromethyl group, or a hydroxymethyl group.

$R_{32}$ is preferably an alkyl group having 3 to 10 carbon atoms, and more preferably an alkyl group having 4 to 7 carbon atoms.

$R_{32}$ is, for example, a methyl group, an ethyl group, an isopropyl group, or a t-butyl group, preferably an isopropyl group or a t-butyl group, and more preferably a t-butyl group.

The monocyclic alicyclic hydrocarbon structure formed by $R_{33}$ together with carbon atoms is preferably a 3- to 8-membered ring, and more preferably a 5- or 6-membered ring.

In the monocyclic alicyclic hydrocarbon structure formed by $R_{33}$ together with carbon atoms, examples of the heteroatom which can substitute some of carbon atoms constituting a ring include an oxygen atom and a sulfur atom, and examples of the group having a heteroatom include a carbonyl group. Here, it is preferable that the group having a heteroatom is not an ester group (ester bond).

The monocyclic alicyclic hydrocarbon structure formed by $R_{33}$ together with carbon atoms is preferably formed of only carbon atoms and hydrogen atoms.

The repeating unit represented by General Formula (1) is preferably a repeating unit represented by the following General Formula (1').

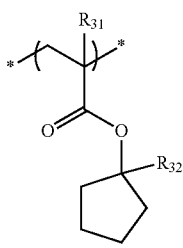

In General Formula (1'), $R_{31}$ and $R_{32}$ have the same definitions as those in General Formula (1), respectively.

Specific examples of the repeating unit having the structure represented by General Formula (1) are shown below, but are not limited thereto.
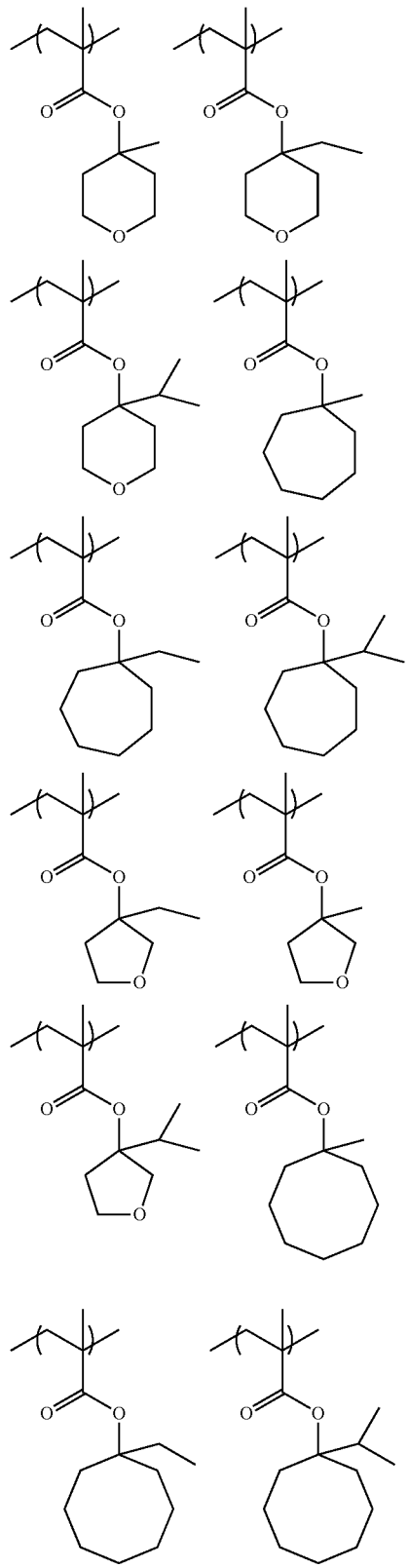
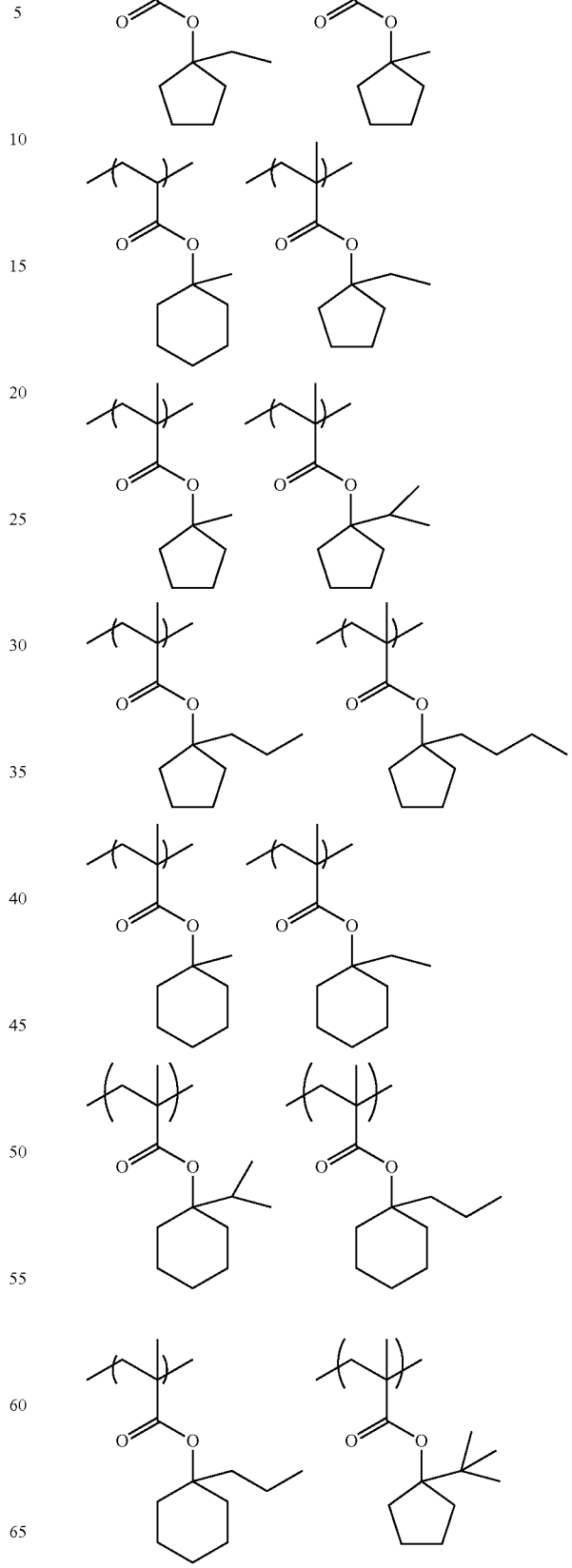

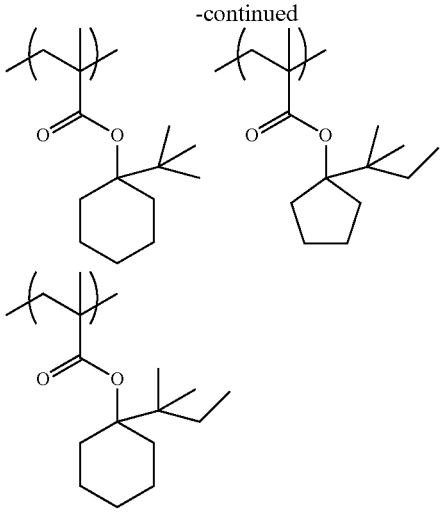

The resin (P) is more preferably a resin which has, for example, at least one of the repeating unit represented by General Formula (II) or the repeating unit represented by General Formula (III), as the repeating unit represented by General Formula (AI).

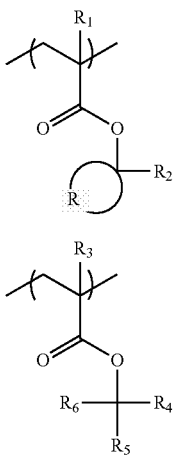

In Formulae (II) and (III), $R_1$ and $R_3$ each independently represent a hydrogen atom, a methyl group which may have a substituent, or a group represented by —$CH_2$—$R_{11}$. $R_{11}$ represents a monovalent organic group.

$R_2$, $R_4$, $R_5$, and $R_6$, each independently represent an alkyl group or a cycloalkyl group.

Any two members out of $R_4$, $R_5$, and $R_6$ may be bonded to each other to form a ring.

R represents an atomic group required for forming an alicyclic structure together with a carbon atom to which $R_2$ is bonded.

$R_1$ and $R_3$ preferably represent a hydrogen atom, a methyl group, a trifluoromethyl group, or a hydroxymethyl group. Specific and preferred examples of the monovalent organic group in $R_{11}$ include the same ones as described for $Xa_1$ in General Formula (AI).

The alkyl group in $R_2$ may be linear or branched, and may have a substituent.

The cycloalkyl group in $R_2$ monocyclic or polycyclic, and may have a substituent.

$R_2$ is preferably an alkyl group, more preferably an alkyl group having 1 to 10 carbon atoms, and still more preferably an alkyl group having 1 to 5 carbon atoms.

R represents an atomic group required to form an alicyclic structure together with a carbon atom. The alicyclic structure formed by R together with the carbon atom is preferably a monocyclic alicyclic structure. R preferably has 3 to 7 carbon atoms, and more preferably 5 or 6 carbon atoms.

$R_3$ is preferably a hydrogen atom or a methyl group, and more preferably a methyl group.

The alkyl group in $R_4$, $R_5$, or $R_6$ may be linear or branched, and may have a substituent. As the alkyl group, an alkyl group having 1 to 4 carbon atoms is preferable.

The cycloalkyl group in $R_4$, $R_5$, or $R_6$ may be monocyclic or polycyclic, and may have a substituent. Preferred examples of the cycloalkyl group include monocyclic cycloalkyl groups such as a cyclopentyl group and a cyclohexyl group, and polycyclic cycloalkyl group such as a norbornyl group, a tetracyclodecanyl group, a tetracyclododecanyl group, and an adamantyl group.

Examples of the substituent which each of the groups may have include the same groups as those described as the substituent which each of the groups in General Formula (AI) may have.

In General Formula (III), $R_4$, $R_5$, and $R_6$ are each preferably an alkyl group, and the sum of the numbers of carbon atoms of $R_4$, $R_5$, and $R_6$ is preferably 5 or more, preferably 6 or more, and still more preferably 7 or more.

The resin (P) is more preferably a resin which contains the repeating unit represented by General Formula (II) and the repeating unit represented by General Formula (III), as the repeating unit represented by General Formula (AI).

Moreover, in another embodiment, a resin which contains at least two kinds of the repeating unit represented by General Formula (II) as the repeating unit represented by General Formula (AI) is more preferable. In a case where the resin contains at least two kinds of the repeating unit represented by General Formula (II), it is preferable that the resin contains both of a repeating unit in which an alicyclic structure formed by R together with a carbon atom is a monocyclic alicyclic structure and a repeating unit in which an alicyclic structure formed by R together with a carbon atom is a polycyclic alicyclic structure. The monocyclic alicyclic structure preferably has 5 to 8 carbon atoms, more preferably 5 or 6 carbon atoms, and particularly preferably 5 carbon atoms. As the polycyclic alicyclic structure, a norbornyl group, a tetracyclodecanyl group, a tetracyclododecanyl group, and an adamantyl group are preferable.

The content of the repeating unit having an acid-decomposable group is preferably 10% to 80% by mole, more preferably 15% to 80% by mole, still more preferably 25% to 70% by mole, particularly preferably 30% to 60% by mole, and most preferably 35% to 60% by mole, with respect to all the repeating units in the resin (P).

The repeating unit having an acid-decomposable group included in the resin (P) may be used singly or in combination of two or more kinds thereof. In a case where the repeating units are used in combination, the following combinations are preferable. As the specific structures, the combinations mentioned below are preferable. In the following formulae, R's each independently represent a hydrogen atom or a methyl group.

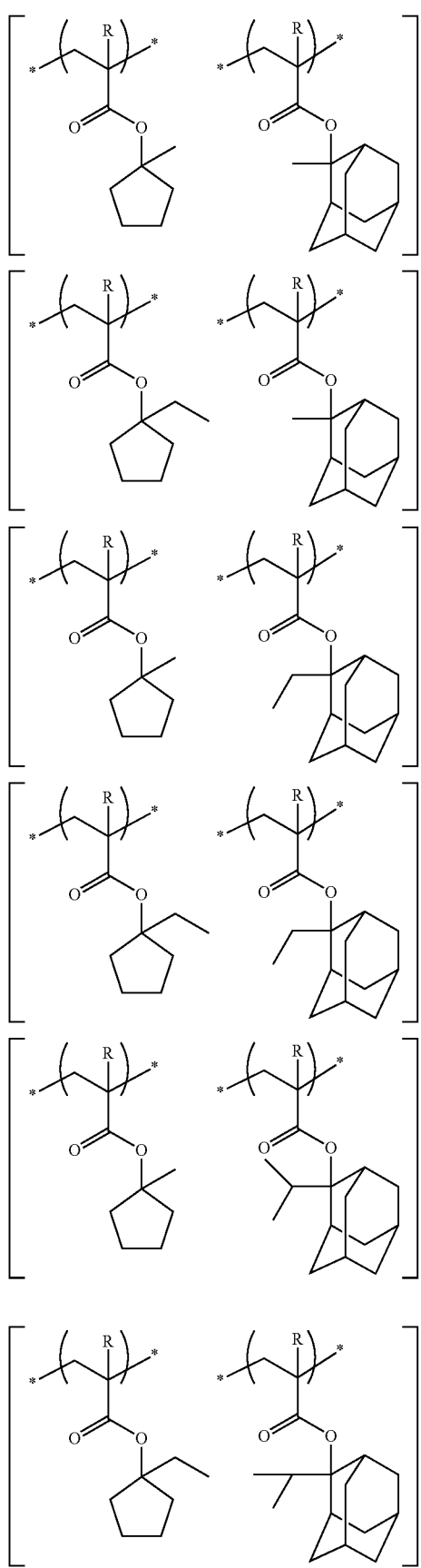
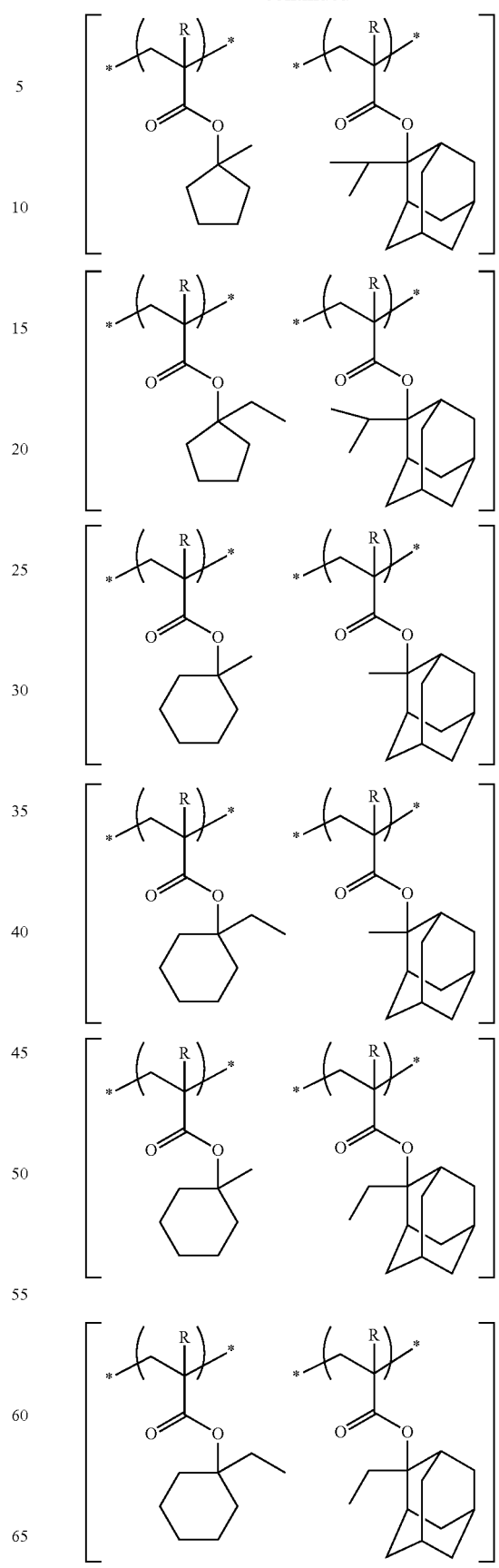

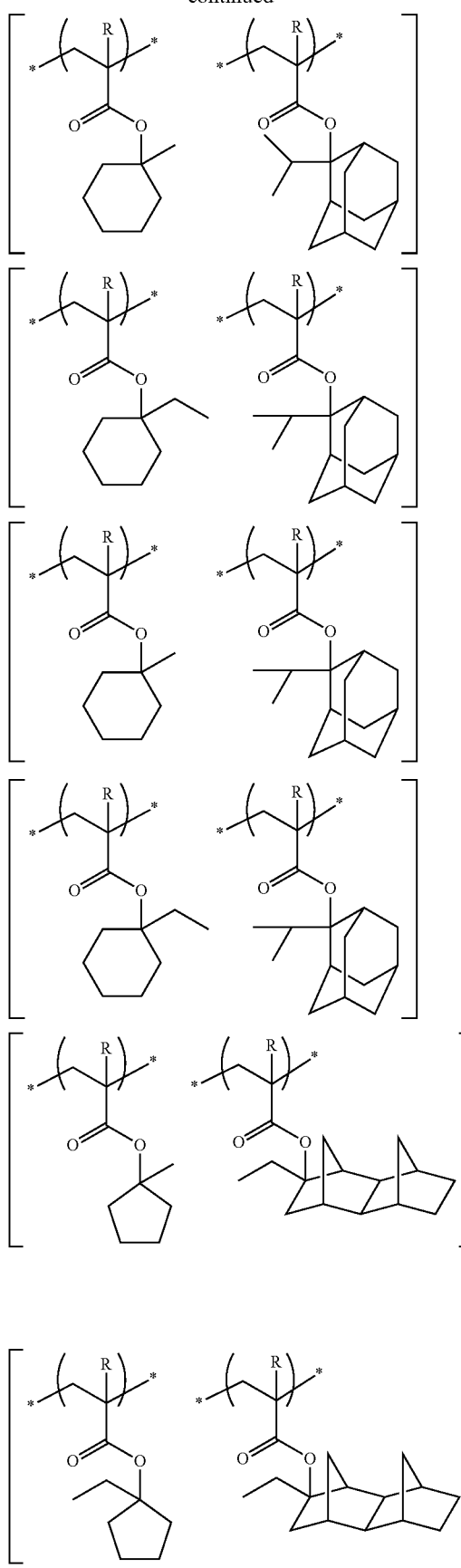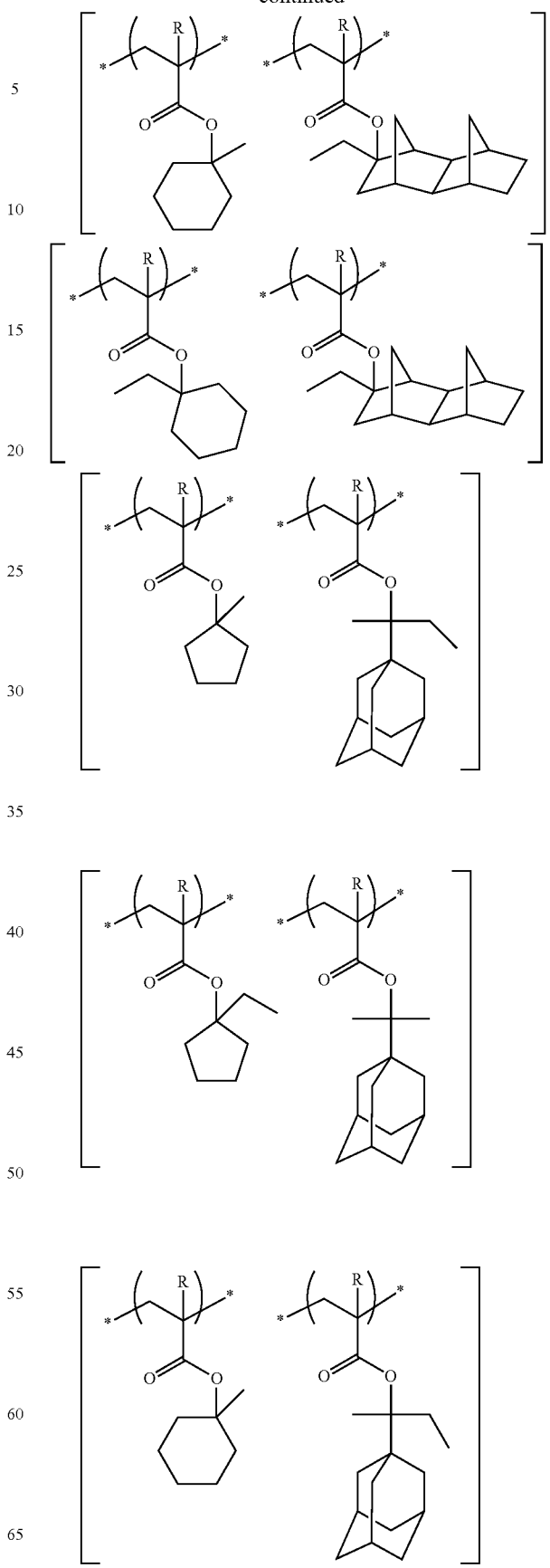

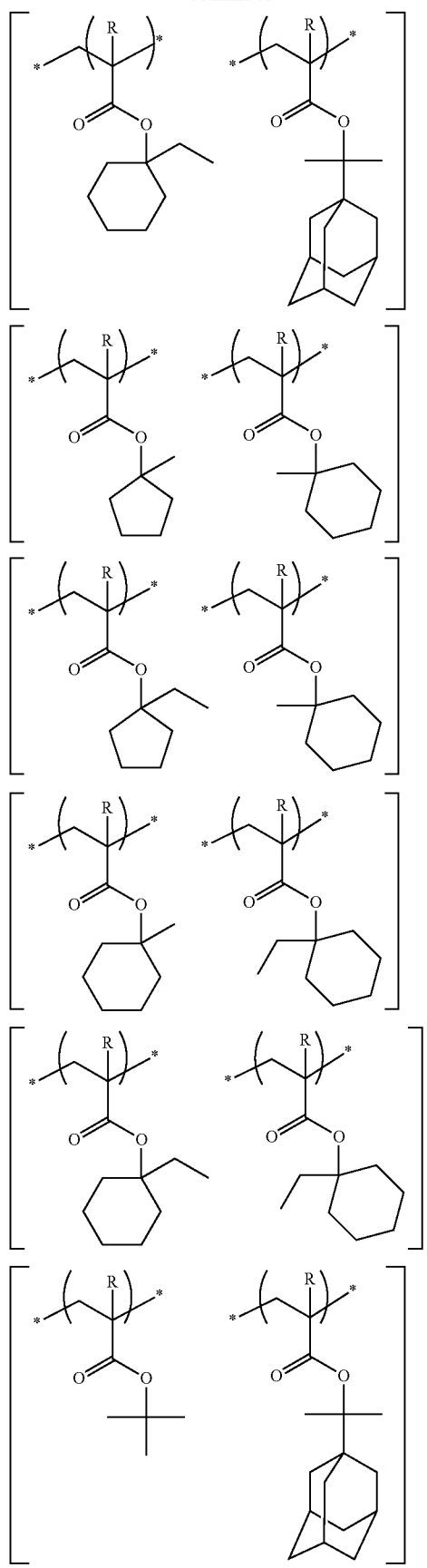

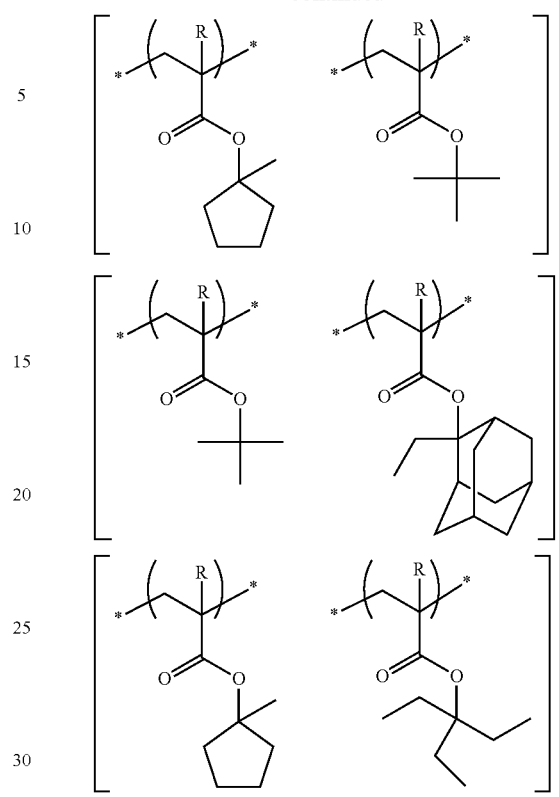

Furthermore, the resin (P) may contain a repeating unit that decomposes by the action of an acid to generate an alcoholic hydroxyl group, as the acid-decomposable repeating unit. For example, the repeating unit may be used in combination with the repeating unit represented by General Formula (AI). In one embodiment of the repeating unit that decomposes by the action of an acid to generate an alcoholic hydroxyl group, the following specific examples can be mentioned. Further, in the formulae, $Xa_1$ represents any one of H, $CH_3$, $CF_3$, and $CH_2OH$.

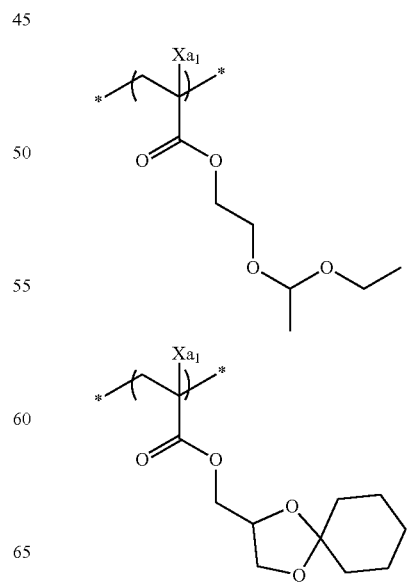

75
-continued
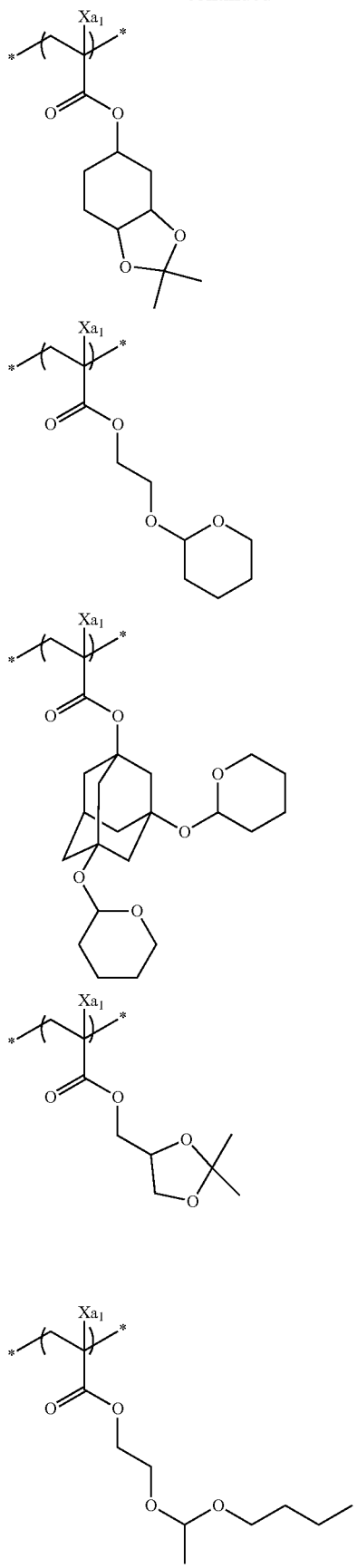
76
-continued
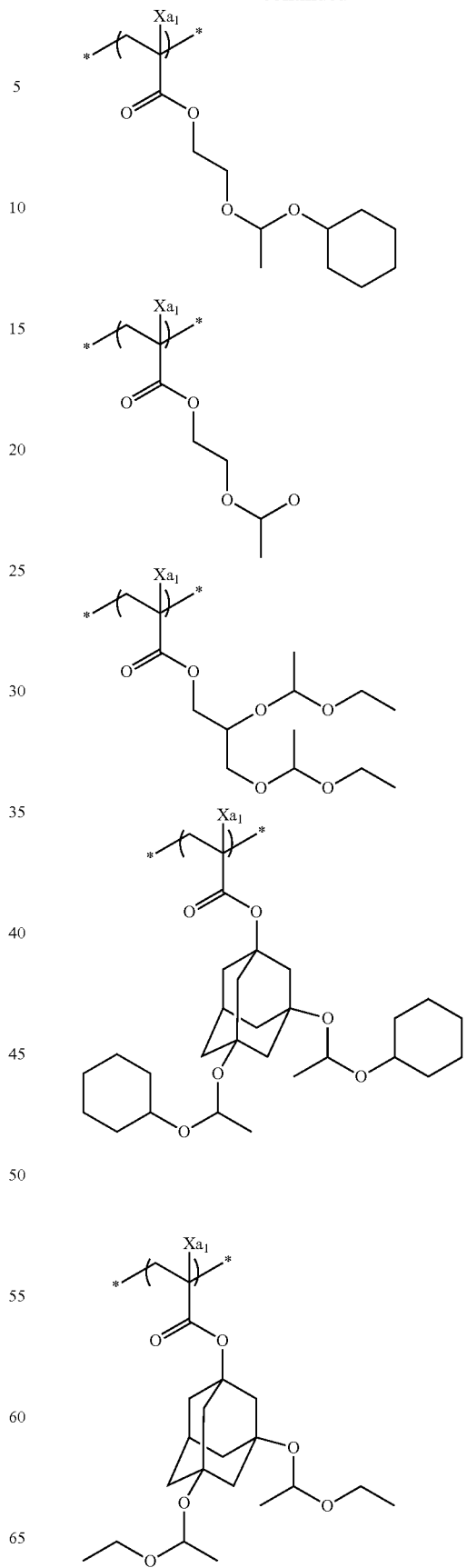

-continued

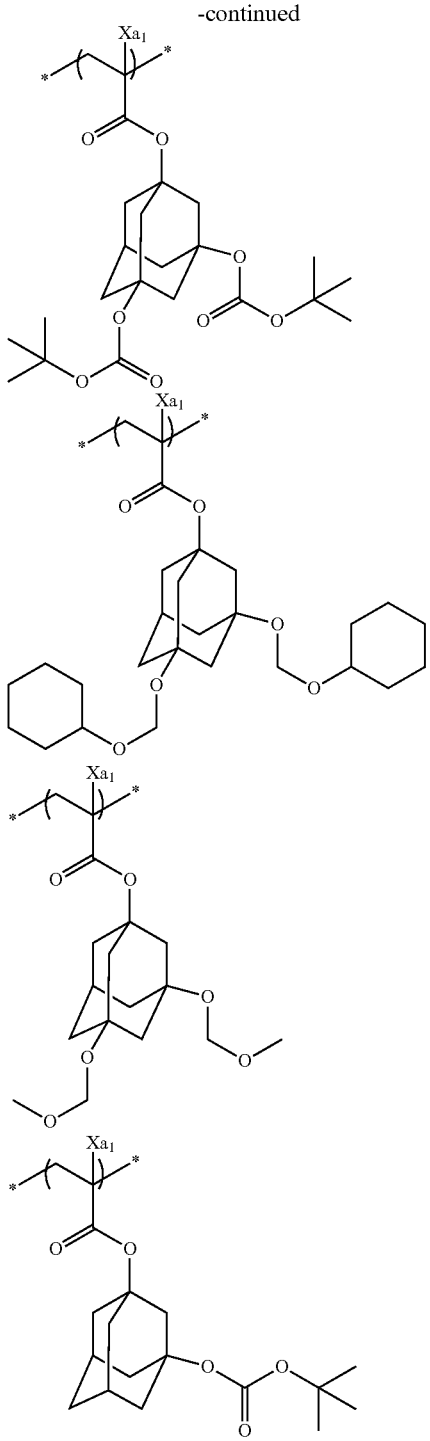

(2) Repeating Unit Having at Least One Structure Selected from Lactone Structure, Sultone Structure, Cyclic Carbonic Acid Ester Structure, Hydroxyl Group, Cyano Group, or Acid Group The resin (P) preferably has a repeating unit further having at least one group selected from a lactone structure, a sultone structure, a cyclic carbonic acid ester structure, a hydroxyl group, a cyano group, or an acid group, and more preferably has a repeating unit having at least one structure selected from a lactone structure, a sultone structure, or a cyclic carbonic acid ester structure.

The repeating unit having a lactone structure or a sultone structure, which the resin (P) can contain, will be described.

It is preferable that the resin (P) contains a repeating unit having a lactone structure or a sultone (cyclic sulfonic acid ester) structure.

As the lactone structure (lactone group) or the sultone structure (sultone group), any group may be used as long as it has a lactone structure or a sultone structure, but the structure is preferably a 5- to 7-membered ring lactone structure or sultone structure, and more preferably a 5- to 7-membered ring lactone structure or sultone structure to which another ring structure is fused in the form of forming a bicyclo structure or a spiro structure. The resin (P) more preferably has a repeating unit having a lactone structure or a sultone structure represented by any one of the following General Formulae (LC1-1) to (LC1-17), (SL-1), and (SL1-2). Further, the lactone structure or the sultone structure may be bonded directly to the main chain. The lactone structures or the sultone structures are preferably (LC1-1), (LC1-4), (LC1-5), and (LC1-8), and more preferably (LC1-4). By using such a specific lactone structure or sultone structure. LWR and development defects are relieved.

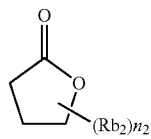
LC1-1

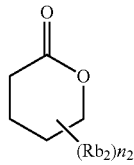
LC1-2

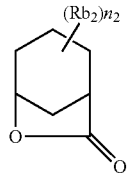
LC1-3

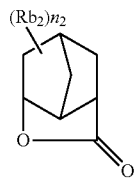
LC1-4

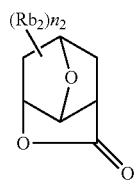
LC1-5

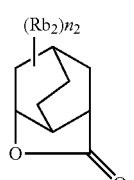
LC1-6

-continued

LC1-7 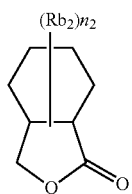

LC1-8 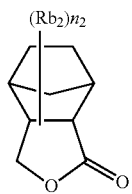

LC1-9 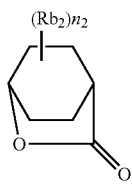

LC1-10 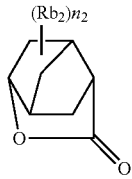

LC1-11 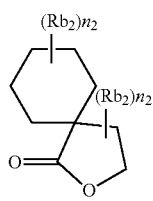

LC1-12 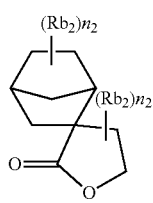

LC1-13 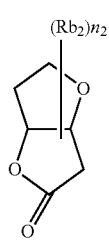

LC1-14 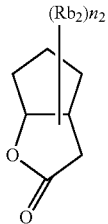

LC1-15 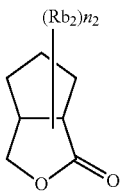

LC1-16 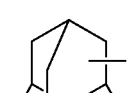

LC1-17 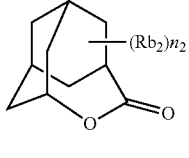

SL1-1 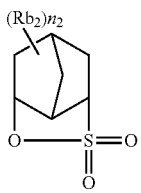

SL1-2 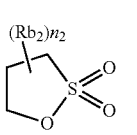

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable, $n_2$ represents an integer of 0 to 4. When $n_2$ is 2 or more, the substituents ($Rb_2$) which are present in plural numbers may be the same as or different from each other, and further, the substituents ($Rb_2$) which are present in plural numbers may be bonded to each other to form a ring.

It is preferable that the resin (P) contains a repeating unit having a lactone structure or a sultone structure, represented by the following General Formula (III).

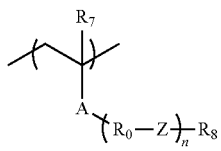

(III)

In Formula (III),

A represents an ester bond (a group represented by —COO—) or an amide bond (a group represented by —CONH—).

In a case where $R_0$'s are present in plural numbers, they each independently represent an alkylene group, a cycloalkylene group, or a combination thereof.

In a case where Z's are present in plural numbers, they each independently represent a single bond, an ether bond, an ester bond, an amide bond, a urethane bond, a group represented by:

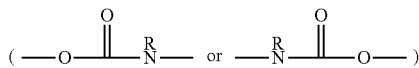

an urea bond, or a group represented by:

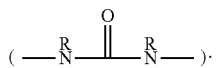

Here, R's each independently represent a hydrogen atom, an alkyl group, a cycloalkyl group, or an aryl group.

$R_8$ represents a monovalent organic group having a lactone structure or a sultone structure.

n is the repetition number of the structure represented by —$R_0$—Z—, and represents an integer of 0 to 2.

$R_7$ represents a hydrogen atom, a halogen atom, or an alkyl group.

The alkylene group and the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group in $R_7$ may be each substituted, and examples of the substituent include a halogen atom such as a fluorine atom, a chlorine atom, and a bromine atom, a mercapto group, a hydroxy group, an alkoxy group such as a methoxy group, an ethoxy group, an isopropoxy group, a t-butoxy group, and a benzyloxy group, and an acetoxy group such as an acetyloxy group and a propionyloxy group. $R_7$ is preferably a hydrogen atom, a methyl group, a trifluoromethyl group, or a hydroxymethyl group.

The preferred chained alkylene group in $R_0$ is chained alkylene group, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In order to express the effects of the present invention, a chained alkylene group is more preferable, and a methylene group is particularly preferable.

The monovalent organic group having a lactone structure or sultone structure represented by $R_8$ is not limited as long as it has the lactone structure or sultone structure, specific examples thereof include the above-mentioned lactone structures or sultone structures represented by General Formula (LC1-1) to (LC1-17), (SL1-1), and (SL1-2), and among these, the structure represented by (LC1-4) is particularly preferable. Further, $n_2$ in (LC1-1) to (LC1-17), (SL1-1), and (SL1-2) is more preferably 2 or less.

Moreover, $R_8$ is preferably a monovalent organic group having an unsubstituted lactone structure or sultone structure, or a monovalent organic group having a lactone structure or a sultone structure having a methyl group, a cyano group, or an alkoxycarbonyl group as a substituent, and more preferably a monovalent organic group having a lactone structure having a cyano group as a substituent (cyanolactone) or a sultone structure having a cyano group as a substituent (cyanosultone).

In General Formula (III), n is preferably 0 or 1.

As the repeating unit having a lactone structure or a sultone structure, a repeating unit represented by the following General Formula (III-1) or (III-1') is more preferable.

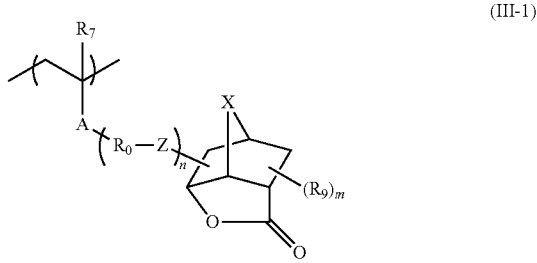

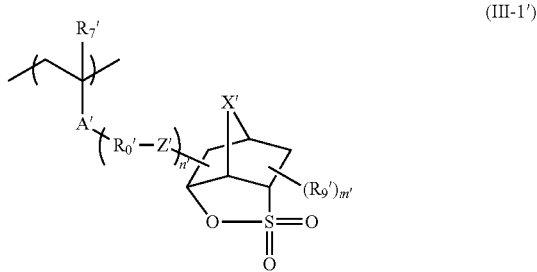

In General Formulae (III-1) and (III-1'), $R_7$, A, $R_0$, Z, and n have the same definitions as in General Formula (III), respectively.

$R_7'$, A', $R_0'$, Z', and n' have the same definitions $R_7$, A, $R_0$, Z, and n, respectively, in General Formula (III).

In a case where $R_9$ are in plural numbers, they each independently represent an alkyl group, a cycloalkyl group, an alkoxycarbonyl group, a cyano group, a hydroxyl group, or an alkoxy group, and in a case where they are in plural numbers, two $R_9$'s may be bonded to each other to form a ring.

In a case where $R_9$'s are in plural numbers, they each independently represent an alkyl group, a cycloalkyl group, an alkoxycarbonyl group, a cyano group, a hydroxyl group, or an alkoxy group, and in a case where they are in plural numbers, two $R_9$'s may be bonded to each other to form a ring.

X and X' each independently represent an alkylene group, an oxygen atom, or a sulfur atom.

m and m' are each the number of substituents, and each independently represent an integer of 0 to 5, m and m' are each independently preferably 0 or 1.

As the alkyl group of $R_9$ and $R_9'$, an alkyl group having 1 to 4 carbon atoms is preferable, a methyl group and an ethyl group are more preferable, and a methyl group is most preferable. Examples of the cycloalkyl group include a cyclopropyl group, a cyclobutyl group, a cyclopentyl group, and a cyclohexyl group. Examples of the alkoxycarbonyl group include a methoxycarbonyl group, an ethoxycarbonyl group, an n-butoxycarbonyl group, and a t-butoxycarbonyl group. Examples of the alkoxy group include a methoxy group, an ethoxy group, a propoxy group, an isopropoxy group, and a butoxy group. These groups may have a substituent, and examples of the substituent include an alkoxy group such as a hydroxy group, a methoxy group, and an ethoxy group, a cyano group, and a halogen atom such as a fluorine atom. $R_9$ and $R_9'$ are each more preferably a methyl group, a cyano group, or an alkoxycarbonyl group, and still more preferably a cyano group.

Examples of the alkylene group of X and X⁻ include a methylene group and an ethylene group. X and X' are preferably an oxygen atom or a methylene group, and more preferably a methylene group.

In a case where m and m' are 1 or more, at least one of $R_9$ or $R_9'$ are preferably substituted at the α- or β-position of the carbonyl group of the lactone, and particularly preferably at the α-position.

Specific examples of the group having a lactone structure or the repeating unit having a sultone structure, represented by General Formula (III-1) or (III-1') include the structures described in paragraphs <0150> and <0151> of JP2013-178370A.

In a case where the repeating units are present in plural kinds, the content of the repeating unit represented by General Formula (III) is preferably 15% to 60% by mole, more preferably 20% to 60% by mole, and still more preferably 30% to 50% by mole, with respect to all the repeating units in the resin (P).

The resin (P) may further contain the repeating unit having a lactone structure or a sultone structure as described above, in addition to the unit represented by General Formula (III).

The repeating unit having a lactone group or a sultone group usually has an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

The content of the repeating unit having a lactone structure or a sultone structure, other than the repeating units represented by General Formula (III), is preferably 15% to 60% by mole, more preferably 20% to 50% by mole, and still more preferably 30% to 50% by mole, with respect to all the repeating units in the resin in a case where the repeating units are contained in plural kinds.

In order to enhance the effects of the present invention, it is also possible to use two or more kinds of the lactone or sultone repeating units selected from General Formula (III) in combination. In a case of using them in combination, it is preferable to use two or more selected from the lactone or sultone repeating units of General Formula (III) in which n is 0 in combination.

The resin (P) may have a repeating unit having a cyclic carbonic acid ester structure.

The repeating unit having a cyclic carbonic acid ester structure is preferably a repeating unit represented by the following General Formula (A-1).

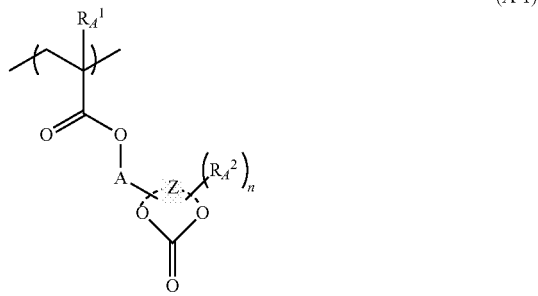

(A-1)

In General Formula (A-1), $R_A^1$ represents a hydrogen atom or an alkyl group.

In a case where n is 2 or more, $R_A2$'S each independently represent a substituent.

A represents a single bond or a divalent linking group.

Z represents an atomic group which forms a monocyclic or polycyclic structure together with a group represented by —O—C(=O)—O— in the formula.

n represents an integer of 0 or more.

General Formula (A-1) will be described in detail.

The alkyl group represented by $R_A^1$ may have a substituent such as a fluorine atom. $R_A^1$ is preferably a hydrogen atom, a methyl group, or a trifluoromethyl group, and more preferably a methyl group.

The substituent represented by $R_A^2$ is, for example, an alkyl group, a cycloalkyl group, a hydroxyl group, an alkoxy group, an amino group, or an alkoxycarbonylamino group. The substituent is preferably an alkyl group having 1 to 5 carbon atoms, and examples thereof include a linear alkyl group having 1 to 5 carbon atoms; and a branched alkyl group having 3 to 5 carbon atoms. The alkyl group may have a substituent such as a hydroxyl group.

n is an integer of 0 or more, which represents the number of substituents. For example, n is preferably 0 to 4, and more preferably 0.

Examples of the divalent linking group represented by A include an alkylene group, a cycloalkylene group, an ester bond, an amide bond, an ether bond, a urethane bond, a urea bond, and combinations thereof. As the alkylene, an alkylene group having 1 to 10 carbon atoms is preferable, and an alkylene group having 1 to 5 carbon atoms is more preferable.

In one embodiment of the present invention, A is preferably a single bond or an alkylene group.

Examples of a monocycle including —O—C(=O)—O—, represented by Z, include a 5- to 7-membered ring having $n_A$ of 2 to 4, in the cyclic carbonic acid ester represented by the following General Formula (a), and the monocycle is preferably a 5-membered ring or a 6-membered ring ($n_A$=2 or 3), and more preferably a 5-membered ring ($n_A$=2).

Examples of a polycycle including —O—C(=O)—O—, represented by Z, include a structure in which a fused ring is formed by cyclic carbonic acid ester represented by the following General Formula (a) together with one or two more other ring structures or a structure in which a spiro ring is formed. "Other ring structures" capable of forming a fused ring or a spiro ring may be an alicyclic hydrocarbon group, may be an aromatic hydrocarbon group, or may be a heterocycle.

(a)

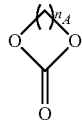

The resin (P) may include one kind of repeating units represented by General Formula (A-1), having a cyclic carbonic acid ester structure, or may include two or more kinds thereof.

In the resin (P), the content of the repeating unit having a cyclic carbonic acid ester structure (preferably the repeating unit represented by General Formula (A-1)) is preferably 3% to 80% by mole, more preferably 3% to 60% by mole, particularly preferably 5% to 50% by mole, and most preferably 10% to 30% by mole, with respect to all the repeating units constituting the resin (P). By setting the content to fall within the above range, developability, low defects, low LWR, low PEB temperature dependence, profiles, and the like as a resist can be improved.

Specific examples of the repeating unit represented by General Formula (A-1) are shown below, but the present invention is not limited thereto.

Moreover, $R_A^1$ in the following specific examples has the same definition as $R_A^1$ in General Formula (A-1).

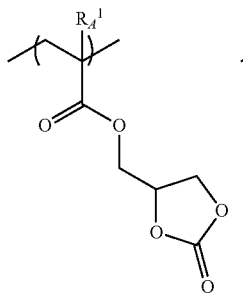

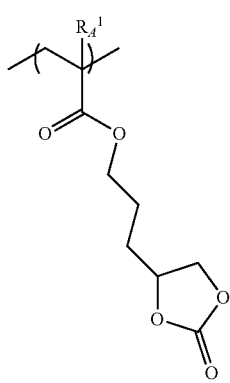

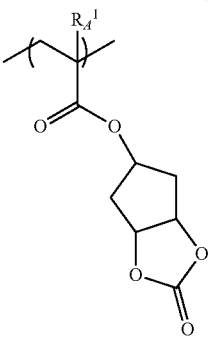

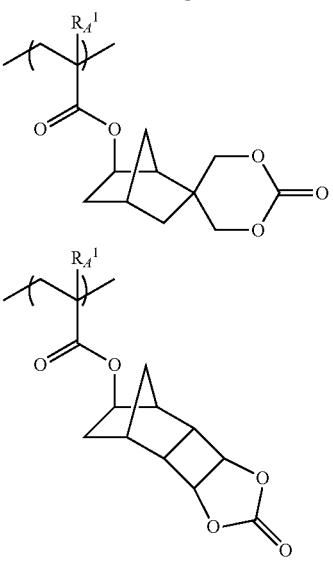

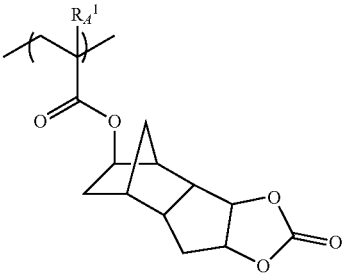

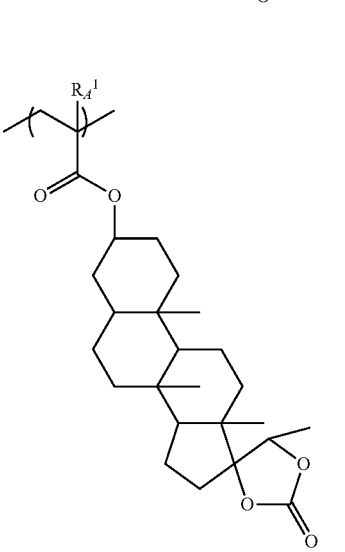

-continued

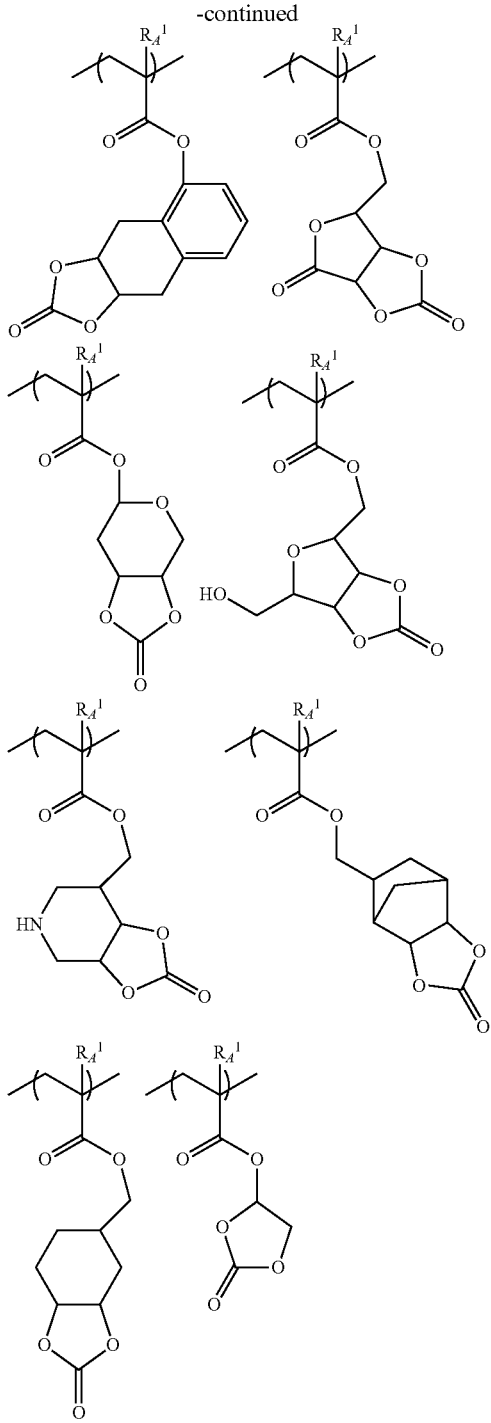

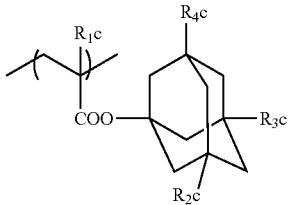
(AIIa)

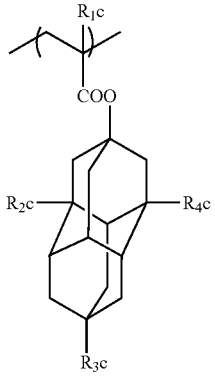
(AIIb)

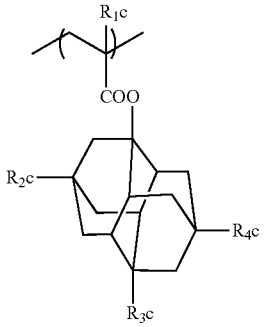
(AIIc)

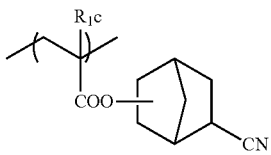
(AIId)

In General Formulae (AIIa) to (AIId), $R_1c$ represents a hydrogen atom, a methyl group, a trifluoromethyl group, or a hydroxymethyl group.

$R_2c$ to $R_4c$ each independently represent a hydrogen atom, hydroxyl group, or a cyano group, but at least one of $R_2c$, . . . , or $R_4c$ represents a hydroxyl group or a cyano group. It is preferable that one or two members out of $R_2c$ to $R_4c$ are hydroxyl groups and the remainders are hydrogen atoms, and it is more preferable that two members out of $R_2c$ to $R_4c$ are hydroxyl groups and the remainders are hydrogen atoms.

The content of the repeating unit having a hydroxyl group or a cyano group is preferably 5% to 40% by mole, more preferably 5% to 30% by mole, and still more preferably 10% to 25% by mole, with respect to all the repeating units in the resin (P).

Specific examples of the repeating unit having a hydroxyl group or a cyano group are shown below, but the present invention is not limited thereto.

It is preferable that the resin (P) has repeating units having a hydroxyl group or a cyano group, in addition to General Formula (AI). With the repeating units, the adhesiveness to a substrate and the developer affinity are enhanced. The repeating unit having a hydroxyl group or a cyano group is preferably a repeating unit having an alicyclic hydrocarbon structure substituted with a hydroxyl group or a cyano group, and preferably has no acid-decomposable group. Examples of the repeating units having the structures include repeating units represented by the following General Formulae (AIIa) to (AIId).

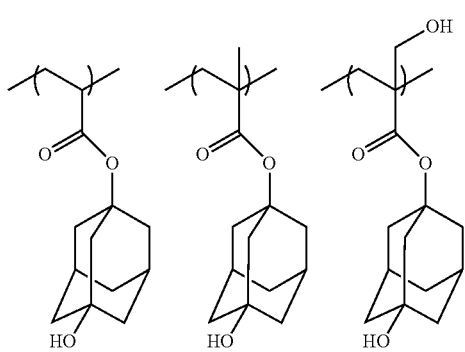
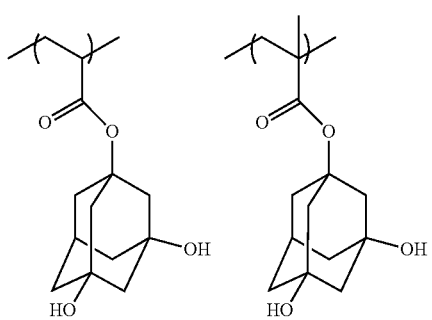
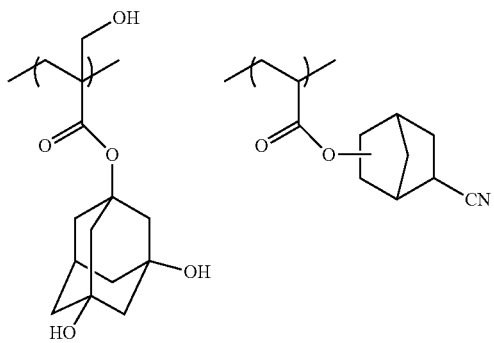
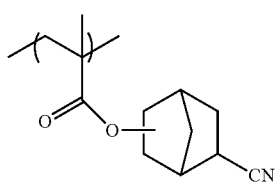
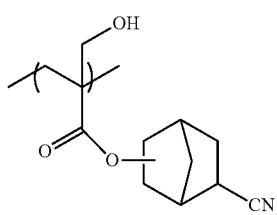

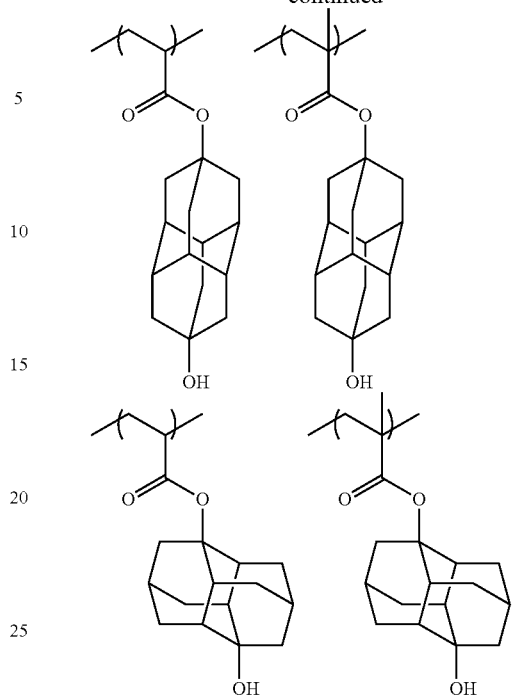

-continued

It is preferable that the resin (P) has a repeating unit having an acid group. Examples of the acid group include a carboxyl group, a sulfonamido group, a sulfonylimido group, a bisulfonylimido group, and an aliphatic alcohol group with the α-position being substituted with an electron-withdrawing group (for example, a hexafluoroisopropanol group), and it is more preferable that the resin (P) has a repeating unit having a carboxyl group. By virtue of containing a repeating unit having an acid group, the resolution increases in the applications of contact holes. As the repeating unit having an acid group, all of a repeating unit in which an acid group is directly bonded to the main chain of the resin, such as a repeating unit by an acrylic acid or a methacrylic acid, a repeating unit in which an acid group is bonded to the main chain of the resin through a linking group, and a repeating unit in which an acid group is introduced into the polymer chain terminal by using a polymerization initiator having an acid group, or a chain transfer agent at the polymerization, are preferable. The linking group may have a monocyclic or polycyclic hydrocarbon structure. A repeating unit by an acrylic acid or a methacrylic acid is particularly preferable.

The content of the repeating unit having an acid group is preferably 0% to 20% by mole, more preferably 3% to 15% by mole, and still more preferably 5% to 10% by mole, with respect to all the repeating units in the resin (P).

Specific examples of the repeating unit having an acid group are shown below, but the present invention is not limited thereto. In the specific examples, Rx represents H, CH$_3$, CH$_2$OH, or CF$_3$.

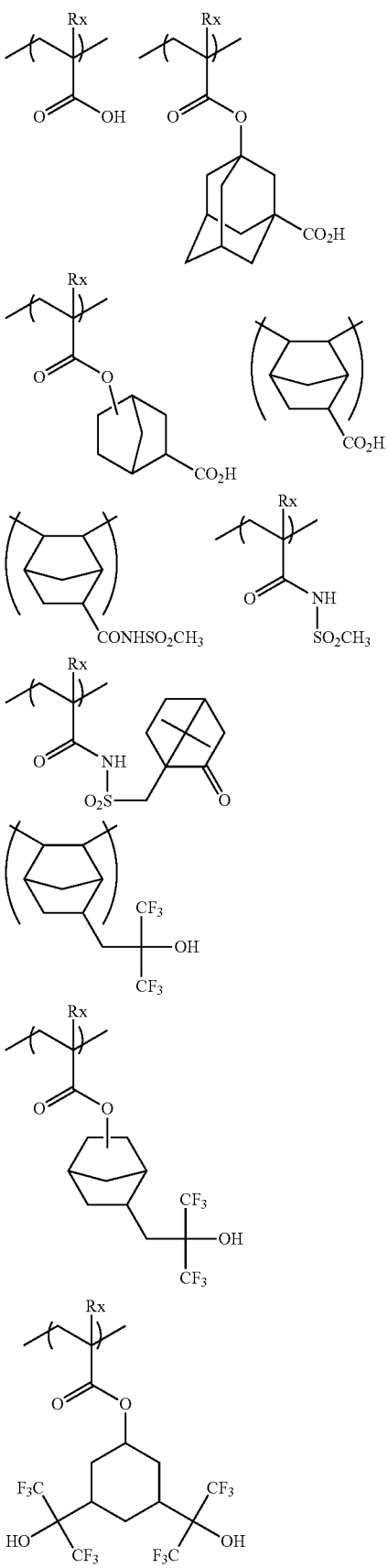

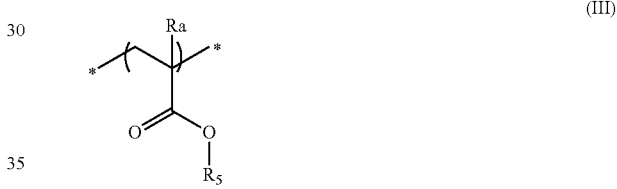

The repeating unit having at least one group selected from a lactone group, a hydroxyl group, a cyano group, or an acid group is preferably a repeating unit having at least two groups selected from a lactone group, a hydroxyl group, a cyano group, or an acid group, and more preferably a repeating unit having a cyano group and a lactone group. A repeating unit having a structure in which a cyano group is substituted in the lactone structure of (LC1-4) is particularly preferable.

(3) Repeating Unit Having Alicyclic Hydrocarbon Structure and not Exhibiting Acid-Decomposability The resin (P) may further have a repeating unit having an alicyclic hydrocarbon structure and not exhibiting acid-decomposability. Thus, it is possible to reduce elution of the low molecular components from the resist film to the immersion liquid during liquid immersion exposure. Examples of such a repeating unit include repeating units formed from 1-adamantyl (meth)acrylate, diadamantyl (meth)acrylate, tricyclodecanyl (meth)acrylate, cyclohexyl (meth)acrylate, and the like.

(4) Repeating Unit not Having any One of Hydroxyl Group and Cyano Group

It is preferable that the resin (P) of the present invention contains a repeating unit represented by General Formula (III), which does not have any one of a hydroxyl group and a cyano group.

In General Formula (III), $R_5$ represents a hydrocarbon group having at least one cyclic structure and not having any one of a hydroxyl group and a cyano group.

Ra represents a hydrogen atom, an alkyl group, or a —$CH_2$—O—$Ra_2$ group. In the formula. $Ra_2$ represents a hydrogen atom, an alkyl group, or an acyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms (more preferably having 3 to 7 carbon atoms), and a cycloalkenyl group having 3 to 12 carbon atoms.

Examples of the polycyclic hydrocarbon group include a ring-assembly hydrocarbon group and a crosslinked cyclic hydrocarbon group. Examples of the crosslinked cyclic hydrocarbon ring include a bicyclic hydrocarbon ring, a tricyclic hydrocarbon ring, and a tetracyclic hydrocarbon ring. Further, other examples of the crosslinked cyclic hydrocarbon ring include fused rings formed by fusing a plurality of 5- to 8-membered cycloalkane rings.

Preferred examples of the crosslinked cyclic hydrocarbon ring include a norbornyl group, an adamantyl group, a bicyclooctanyl group, and a tricyclo[5.2.1.0$^{2,6}$]decanyl group. More preferred examples of the crosslinked cyclic hydrocarbon rings include a norbornyl group and an adamantyl group.

These alicyclic hydrocarbon groups may have a substituent, and preferred examples of the substituent include a halogen atom, an alkyl group, a hydroxyl group protected with a protective group, and an amino group protected with a protective group. Preferred examples of the halogen atom include bromine, chlorine, and fluorine atoms, and preferred examples of the alkyl group include methyl, ethyl, butyl, and t-butyl groups. The alkyl group may further have a substituent, and examples of the substituent that the alkyl group can further have include a halogen atom, an alkyl group, a hydroxyl group protected with a protective group, and an amino group protected with a protective group.

Examples of the protective group include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, preferred examples of the substituted methyl group include methoxymethyl, methoxythiomethyl, benzyloxymethyl, t-butoxymethyl, and 2-methoxyethoxymethyl groups, preferred examples of the substituted ethyl group include 1-ethoxyethyl, and 1-methyl-1-methoxyethyl, preferred examples of the acyl group include aliphatic acyl groups having 1 to 6 carbon atoms, such as formyl, acetyl, propionyl, butyryl, isobutyryl, valeryl, and pivaloyl groups, and examples of the alkoxycarbonyl group include an alkoxycarbonyl group having 1 to 4 carbon atoms.

The content of the repeating unit not having any one of a hydroxyl group and a cyano group, represented by General Formula (III), is preferably 0% to 40% by mole, and more preferably 0% to 20% by mole, with respect to all the repeating units in the resin (P).

Specific examples of the repeating unit represented by General Formula (III) are shown below, but the present invention is not limited thereto. In the formulae, Ra represents H, $CH_3$, $CH_2OH$, or $CF_3$.

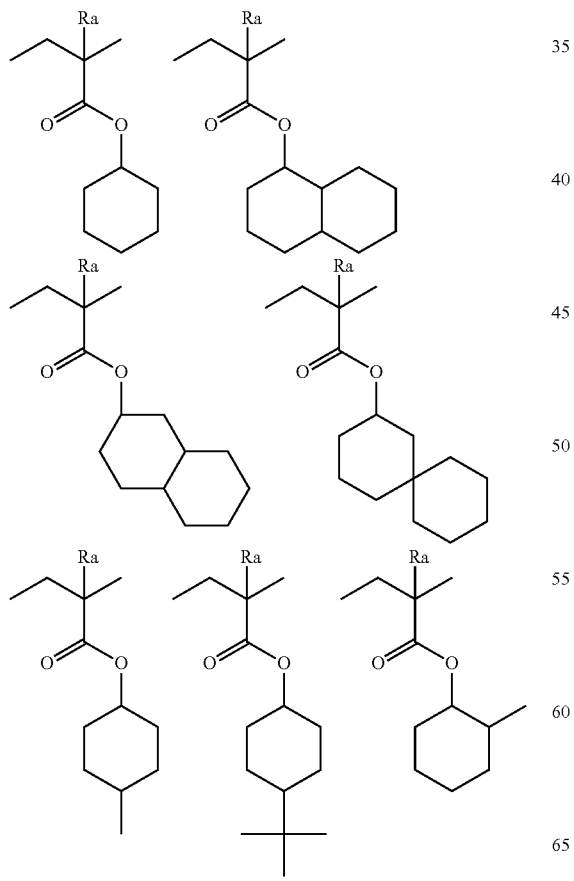

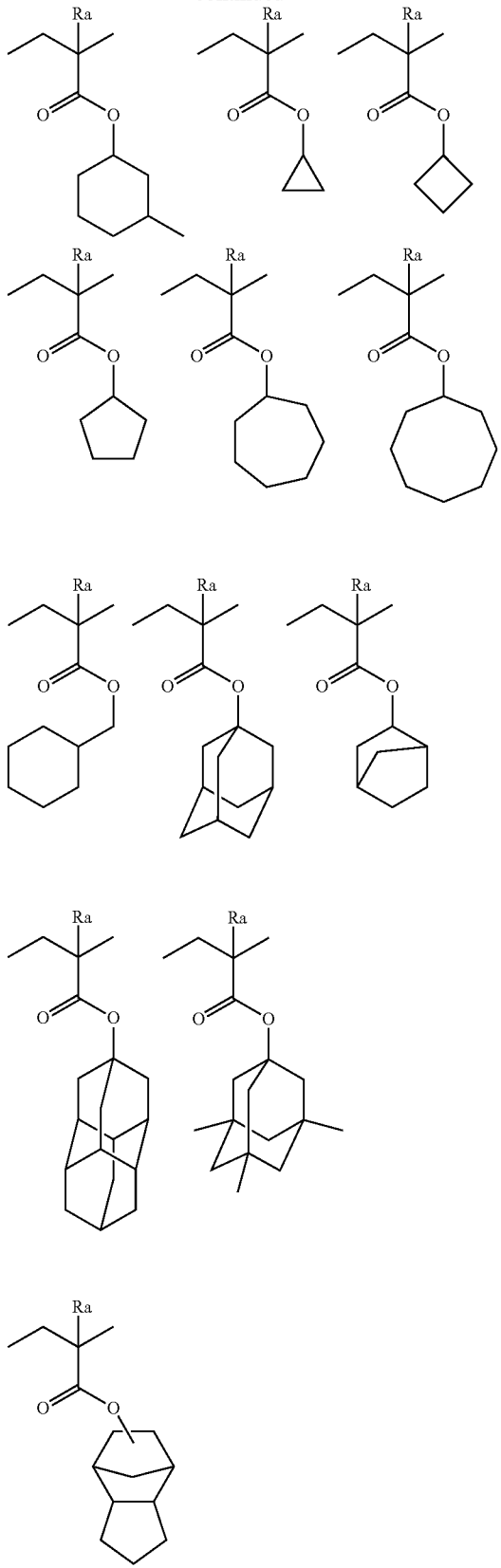

The resin (P) may contain a repeating unit represented by the following General Formula (nI) or (nII).

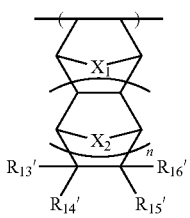

(nI)

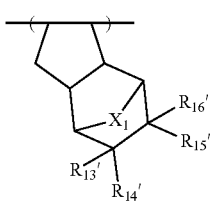

(nII)

In General Formulae (nI) and (nII), $R_{13}'$ to $R_{16}'$ each independently represent a hydrogen atom, a halogen atom, a cyano group, a hydroxyl group, a carboxyl group, an alkyl group, a cycloalkyl group, an alkoxy group, an alkoxycarbonyl group, an alkylcarbonyl group, a group having a lactone structure, or a group having an acid-decomposable group.

$X_1$ and $X_2$ each independently represent a methylene group, an ethylene group, an oxygen atom, or a sulfur atom.

n represents an integer of 0 to 2.

Examples of the acid-decomposable group having an acid-decomposable group as $R_{13}'$ to $R_{16}'$ include a cumyl ester group, an enol ester group, an acetal ester group, and a tertiary alkyl ester group, and the acid-decomposable group is preferably a tertiary alkyl ester group represented by —C(=O)—O—$R_0$.

In the formula, $R_0$ represents a tertiary alkyl group such as a t-butyl group and a t-amyl group, an isoboronyl group, a 1-alkoxyethyl group such as a 1-ethoxyethyl group, a 1-butoxyethyl group, a 1-isobutoxyethyl group, and a 1-cyclohexyloxyethyl group, an alkoxymethyl group such as a 1-methoxymethyl group and a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, and a mevalonic lactone residue.

At least one of $R_{13}'$, ..., or $R_{16}'$ is preferably a group having an acid-decomposable group.

Examples of the halogen atom in $R_{13}'$ to $R_{16}'$ include a chlorine atom, a bromine atom, a fluorine atom, and an iodine atom.

The alkyl group of $R_{13}'$ to $R_{16}'$ is more preferably a group represented by the following General Formula (F1).

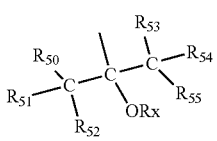

(F1)

In General Formula (F1).

$R_{50}$ to $R_{55}$ each independently represent a hydrogen atom, a fluorine atom, or an alkyl group. Here, at least one of $R_{50}$, ..., or $R_{55}$ represents a fluorine atom or an alkyl group having at least one hydrogen atom substituted with a fluorine atom, and Rx represents a hydrogen atom or an organic group (preferably an acid-decomposable protecting group, an alkyl group, a cycloalkyl group, an acyl group, or an alkoxycarbonyl group), and preferably a hydrogen atom.

It is preferable that all of $R_{50}$ to $R_{55}$ are fluorine atoms.

Examples of the repeating unit represented by General Formula (nI) or General Formula (nII) include the following specific examples, but the present invention is not limited to these compounds. Among these, repeating units represented by (II-f-16) to (II-f-19) are preferable.

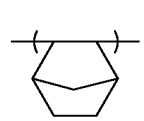

(II-a-1)

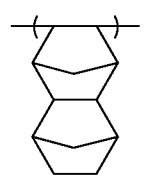

(II-a-2)

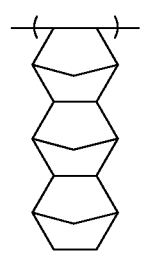

(II-a-3)

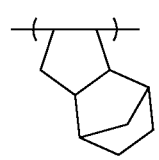

(II-a-4)

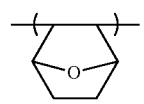

(II-a-5)

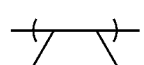

(II-a-6)

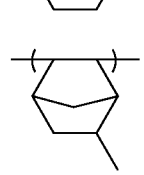

(II-a-7)

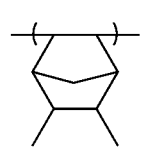

(II-a-8)

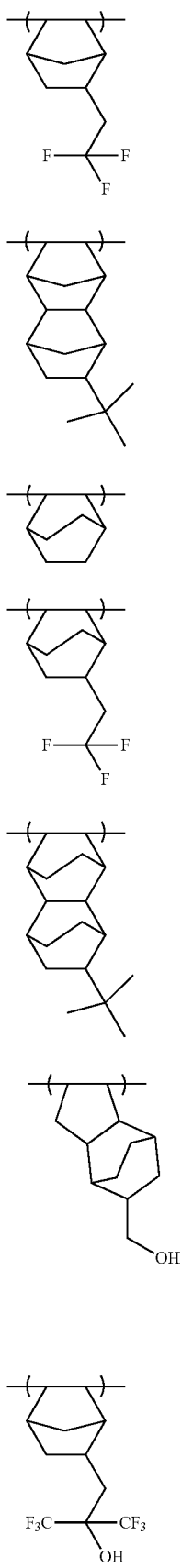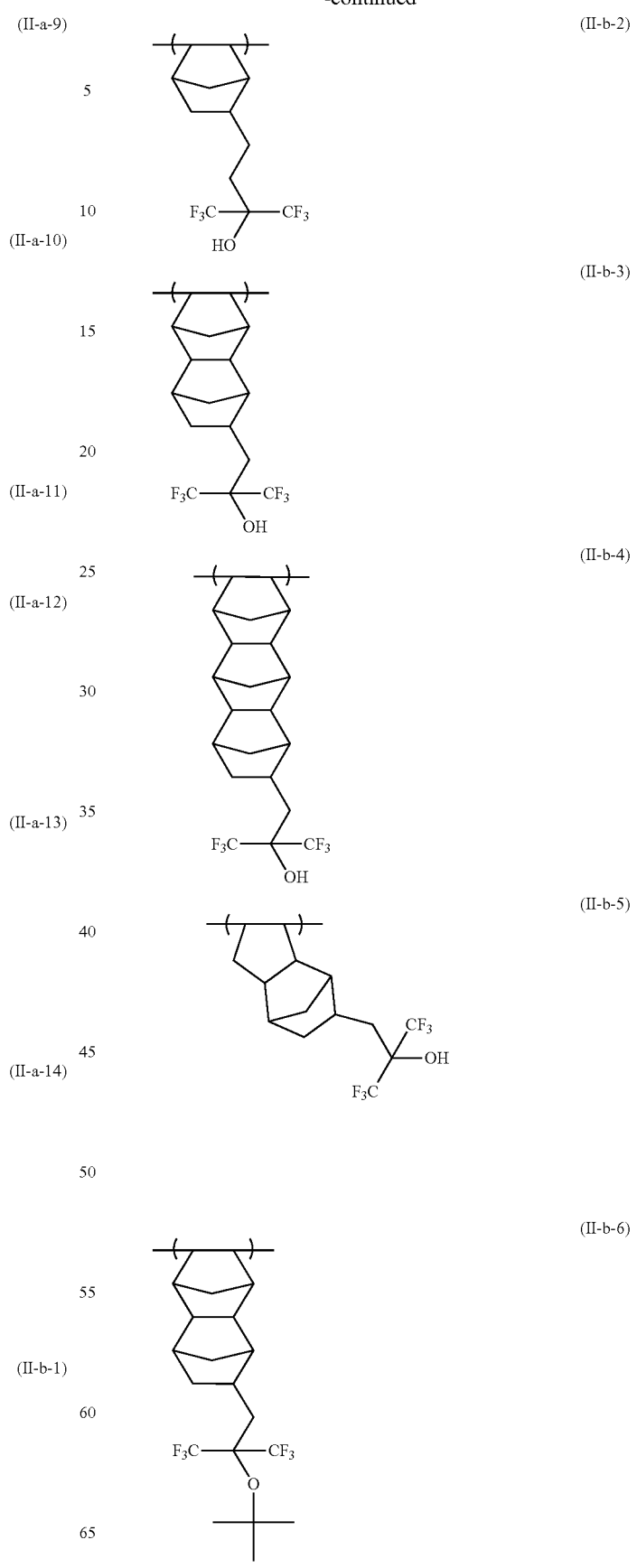

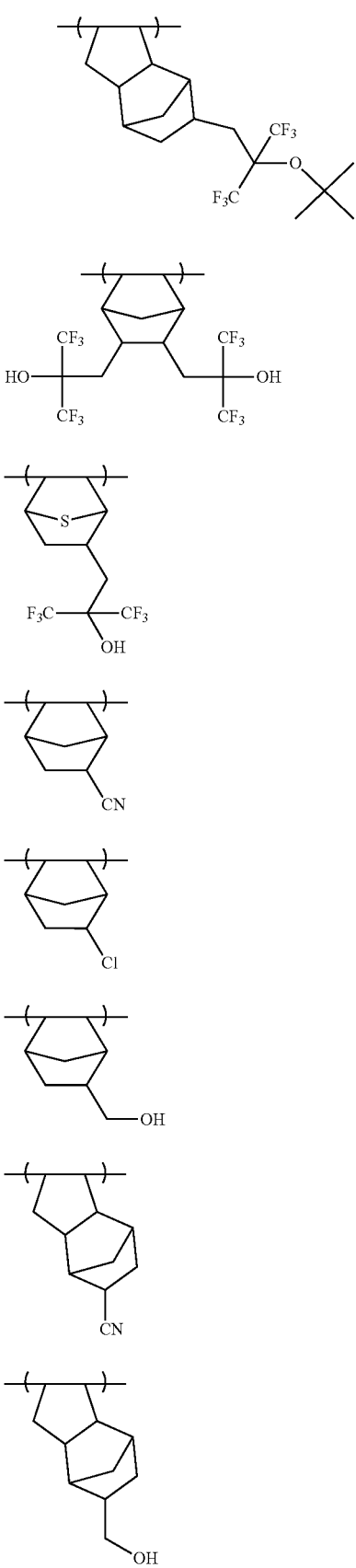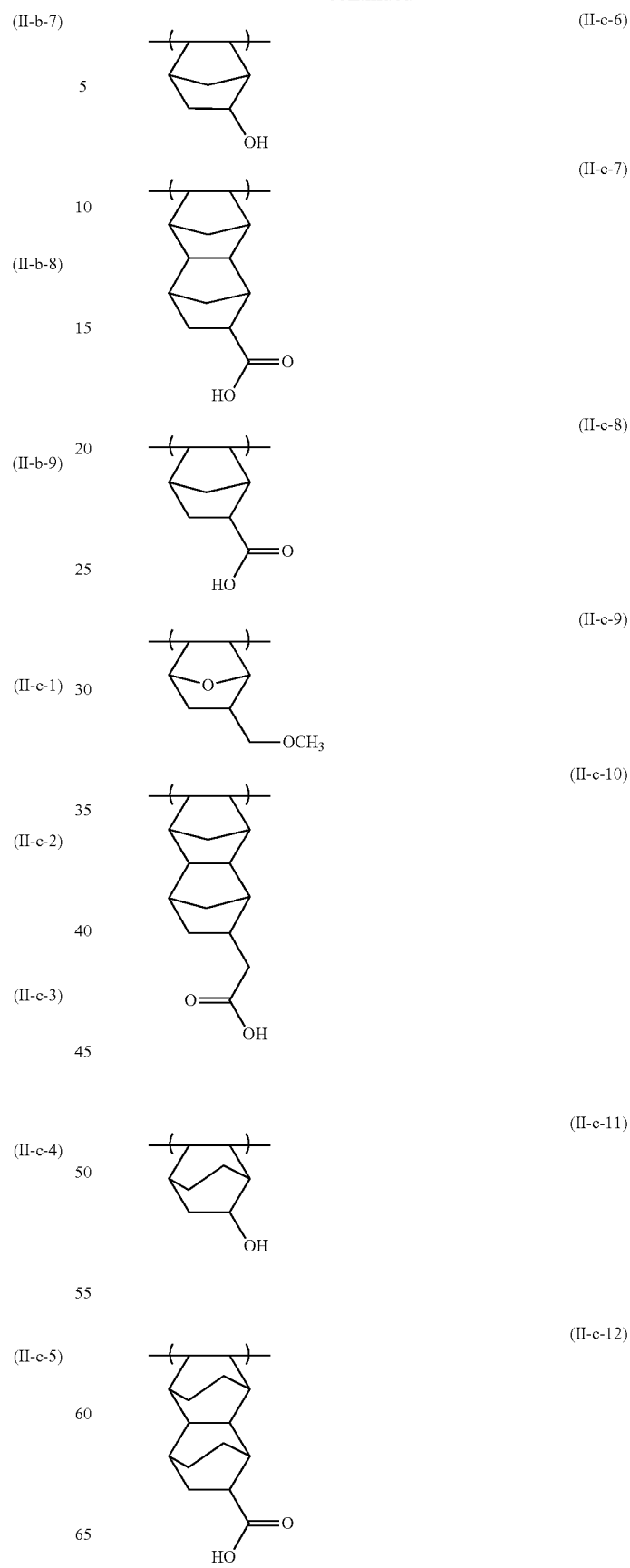

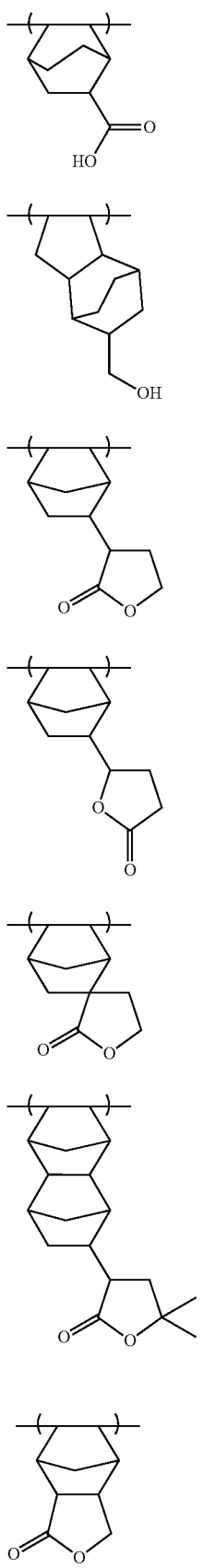
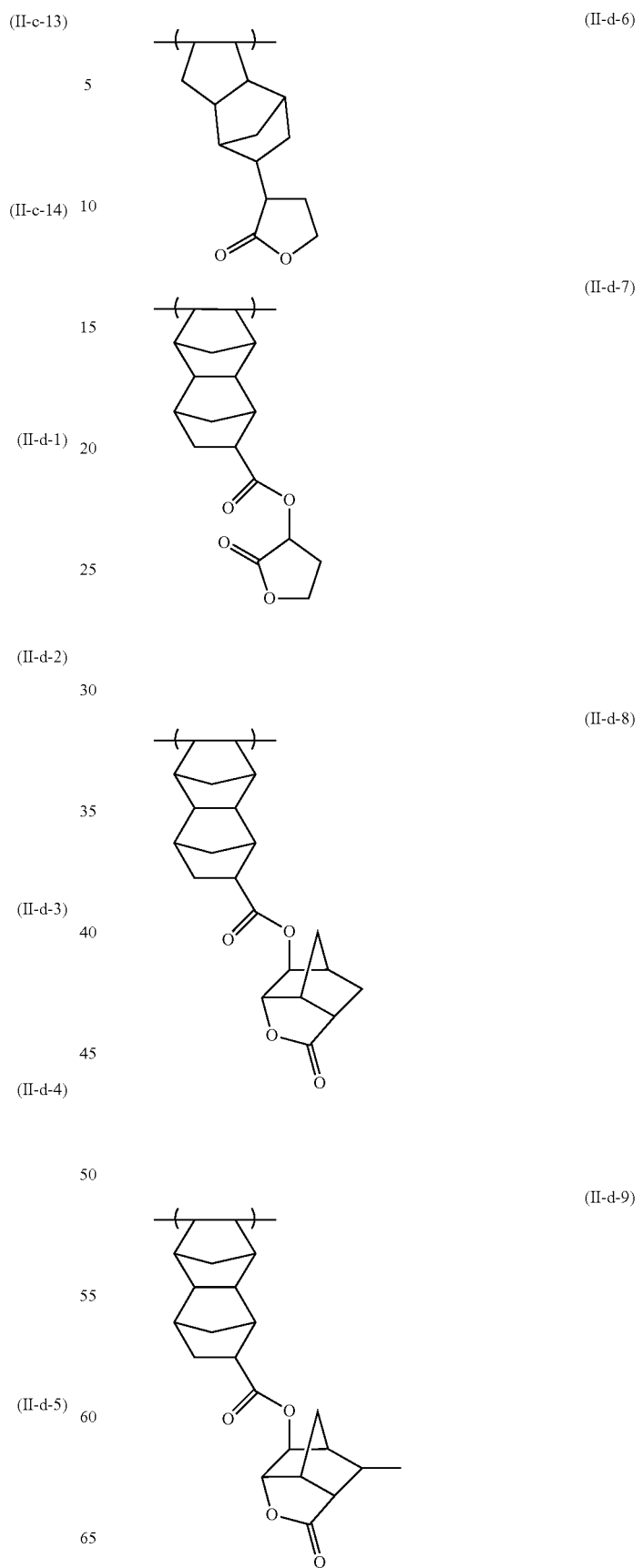

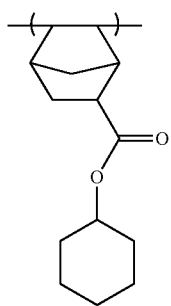 (II-e-1)
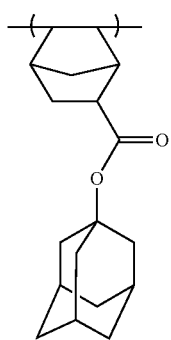 (II-e-2)
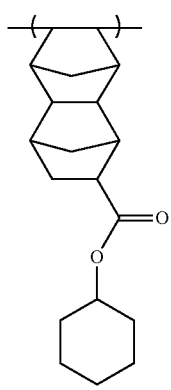 (II-e-3)
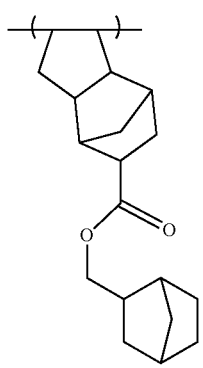 (II-e-4)
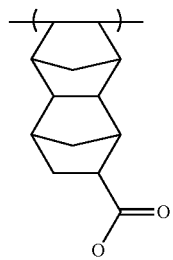 (II-e-5)
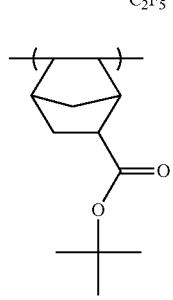 (II-f-1)
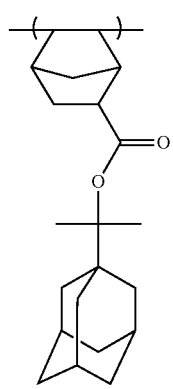 (II-f-2)
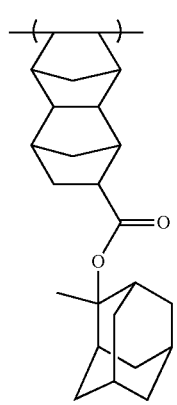 (II-f-3)

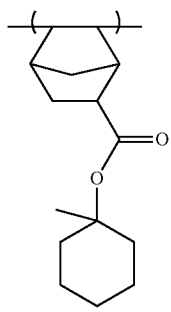 (II-f-4)
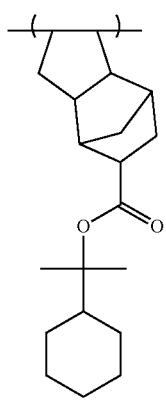 (II-f-5)
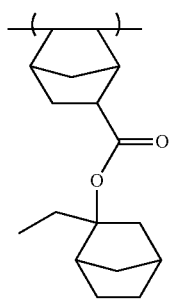 (II-f-6)
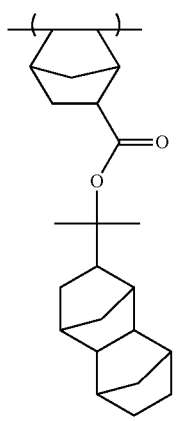 (II-f-7)
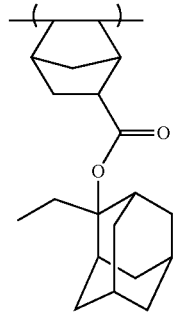 (II-f-8)
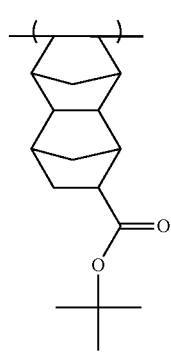 (II-f-9)
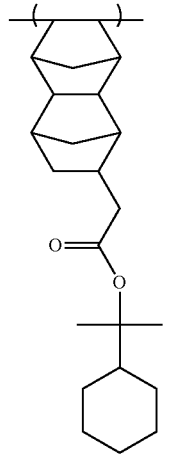 (II-f-10)
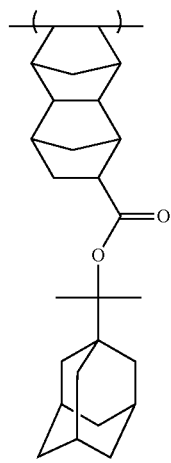 (II-f-11)

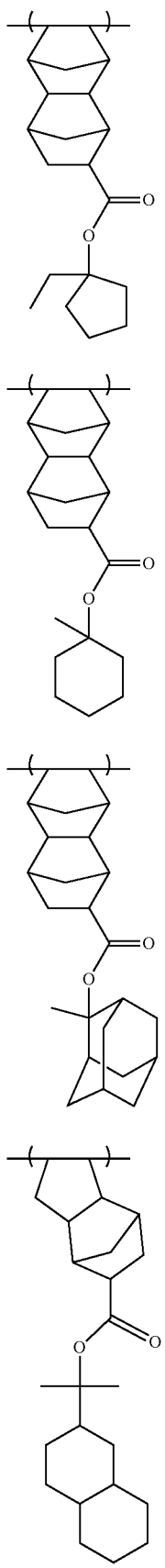
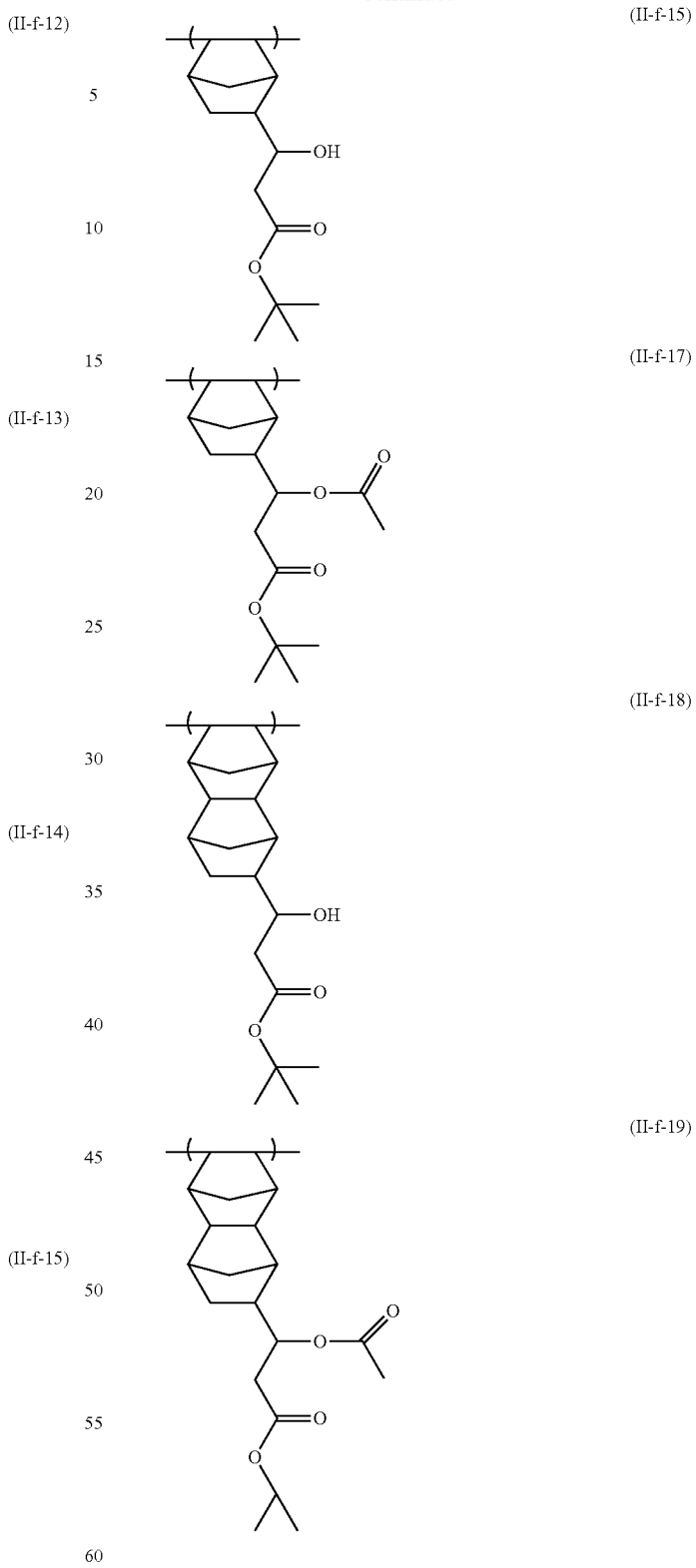

In addition to the repeating structural units, the resin (P) can have a variety of repeating structural units for the purpose of adjusting dry etching resistance, suitability for a standard developer, adhesiveness to a substrate, and a resist profile, and in addition, resolving power, heat resistance, sensitivity, and the like, which are characteristics generally required for the resist.

Examples of such repeating structural units include, but are not limited to, repeating structural units corresponding to the following monomers.

Thus, it becomes possible to perform fine adjustments to performance required for the resin (P), in particular, (1) solubility in a coating solvent,
(2) film formability (glass transition point),
(3) alkaline developability,
(4) film reduction (selection of hydrophilic, hydrophobic, or alkali-soluble groups),
(5) adhesiveness of an unexposed area to a substrate,
(6) dry etching resistance, and the like.

Examples of such a monomer include a compound having one addition-polymerizable unsaturated bond, selected from acrylic esters, methacrylic esters, acrylamides, a methacrylamides, allyl compounds, vinyl ethers, and vinyl esters.

In addition to these, an addition-polymerizable unsaturated compound that is copolymerizable with the monomers corresponding to various repeating structural units above may be copolymerized.

In the resin (P), the molar ratio of each repeating structural unit content is appropriately set in order to adjust dry etching resistance, suitability for a standard developer, adhesiveness to a substrate, and a resist profile of the resist, and in addition, resolving power, heat resistance, sensitivity, and the like, each of which is performance generally required for the resist.

When the active-light-sensitive or radiation-sensitive resin composition of the present invention is one for ArF exposure, from the viewpoint of transparency to ArF light, it is preferable that the resin (P) does not have an aromatic ring. Further, it is preferable that the resin (P) contains neither a fluorine atom nor a silicon atom from the viewpoint of compatibility with a hydrophobic resin which will be described later.

The resin (P) is preferably a resin in which all the repeating units thereof are composed of (meth)acrylate-based repeating units. In this case, any one of a resin in which all the repeating units are composed of methacrylate-based repeating units, a resin in which all the repeating units are composed of acrylate-based repeating units and a resin in which all the repeating units are composed of methacrylate-based repeating units and acrylate-based repeating units can be used, but acrylate-based repeating units preferably account for 50% by mole or less of all the repeating units. More preferably, the resin (P) is a copolymerization polymer including 20% to 50% by mole of (meth)acrylate-based repeating units having an acid-decomposable group, represented by General Formula (AI), 20% to 50% by mole of (meth)acrylate-based repeating units having a lactone group, and 5% to 30% by mole of (meth)acrylate-based repeating units having an alicyclic hydrocarbon structure substituted with a hydroxyl group or a cyano group, and in addition to these, 0% to 20% by mole of other(meth)acrylate-based repeating units.

In a case of exposing the active-light-sensitive or radiation-sensitive resin composition of the present invention with KrF excimer laser beams, electron beams, X-rays, or high-energy light rays (EUV or the like) at a wavelength of 50 nm or less, it is preferable that the resin (P) further has a hydroxystyrene-based repeating unit, in addition to the repeating unit represented by General Formula (AI). It is more preferable that the resin (P) has a hydroxystyrene-based repeating unit, a hydroxystyrene-based repeating unit protected by an acid-decomposable group, and an acid-decomposable repeating unit of a tertiary alkyl (meth)acrylate ester, or the like.

Preferred examples of the repeating unit containing an acid-decomposable group include repeating units derived from t-butoxycarbonyloxystyrene, 1-alkoxyethoxystyrene, and a tertiary alkyl (meth)acrylate ester, with a repeating unit derived from 2-alkyl-2-adamantyl (meth)acrylate and dialkyl(1-adamantyl)methyl (meth)acrylate being more preferable.

More detailed descriptions of the resin having a hydroxystyrene-based repeating unit include, for example, the resins described in paragraphs 0216 to 0281 of JP2013-205812A.

The resin (P) can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and a solvent which dissolves the active-light-sensitive or radiation-sensitive resin composition of the present invention, such as propylene glycol monomethyl ether acetate, propylene glycol monomethyl ether, and cyclohexanone, which will be described later. It is more preferable to perform polymerization using the same solvent as the solvent used in the active-light-sensitive or radiation-sensitive resin composition of the present invention. Thus, generation of the particles during storage can be inhibited.

The polymerization reaction is preferably carried out in an inert gas atmosphere such as nitrogen and argon. As the polymerization initiator, commercially available radical initiators (an azo-based initiator, a peroxide, or the like) are used to initiate the polymerization. As the radical initiator, an azo-based initiator is preferable, and the azo-based initiator having an ester group, a cyano group, or a carboxyl group is preferable. Preferred examples of the initiator include azobisisobutyronitrile, azobisdimethylvaleronitrile, and dimethyl 2,2'-azobis(2-methyl propionate). The initiator is added or added in portionwise, as desired, a desired polymer is recovered after the reaction is completed, the reaction mixture is poured into a solvent, and then a method such as powder or solid recovery is used. The concentration of the reactant is 5% to 50% by mass, and preferably 10% to 30% by mass. The reaction temperature is usually 10° C. to 150° C., preferably 30° C. to 120° C., and more preferably 60° C. to 100° C.

The weight-average molecular weight of the resin (P) is preferably 1,000 to 200,000, more preferably 2,000 to 20,000, still more preferably 3,000 to 15,000, and particularly preferably 3.000 to 10,000 as a value in terms of polystyrene by means of a GPC method. By setting the weight-average molecular weight to 1.000 to 200,000, it is possible to prevent the deterioration of heat resistance or dry-etching resistance, and also prevent the deterioration of film forming properties due to deterioration of developability or increased viscosity.

In the present invention, the weight-average molecular weight (Mw), the number-average molecular weight (Mn), and the dispersity (Mw/Mn) of the resin is defined as a value in terms of polystyrene by GPC measurement (solvent: tetrahydrofuran, column: TSK gel Multipore HXL-M, manufactured by TOSOH CORPORATION, column temperature: 40° C., flow rate: 1.0 mL/min, and detector: RI).

The dispersity (molecular weight distribution) to be used is usually 1 to 3, preferably in the range of 1 to 2.6, more preferably in the range of 1 to 2, and particularly preferably in the range of 1.4 to 1.7. The smaller the molecular weight distribution is, the better the resolution and the resist shape are.

In the active-light-sensitive or radiation-sensitive resin composition of the present invention, the blend amount of resin (P) in the entire composition is preferably in the range of 50% to 99% by mass, and more preferably 60% to 95% by mass, with respect to the total solid content.

Incidentally, in the present invention, the resin (P) may be used singly or in combination of two or more kinds thereof.

Specific examples of the resin (P) are represented below, but are not limited thereto.

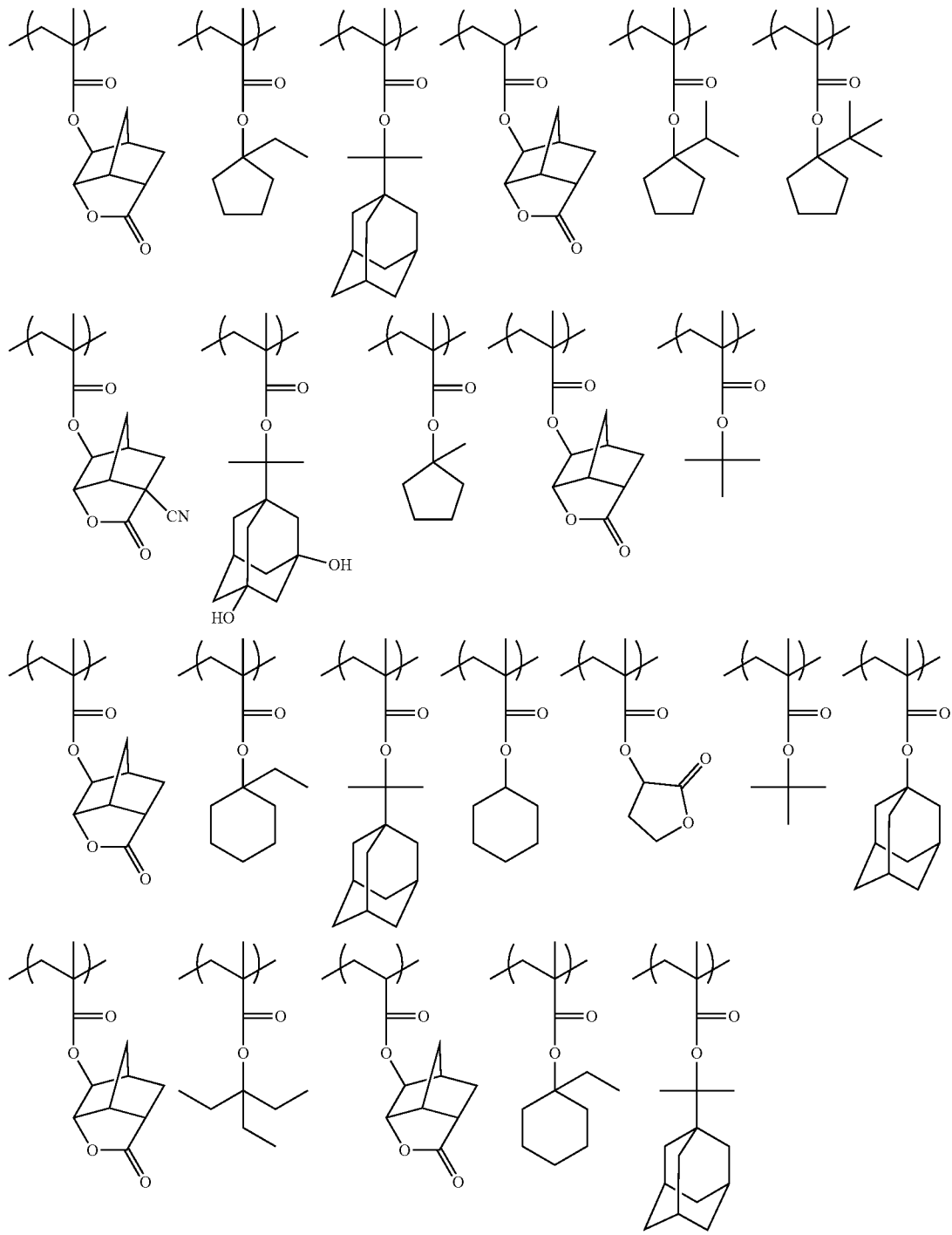

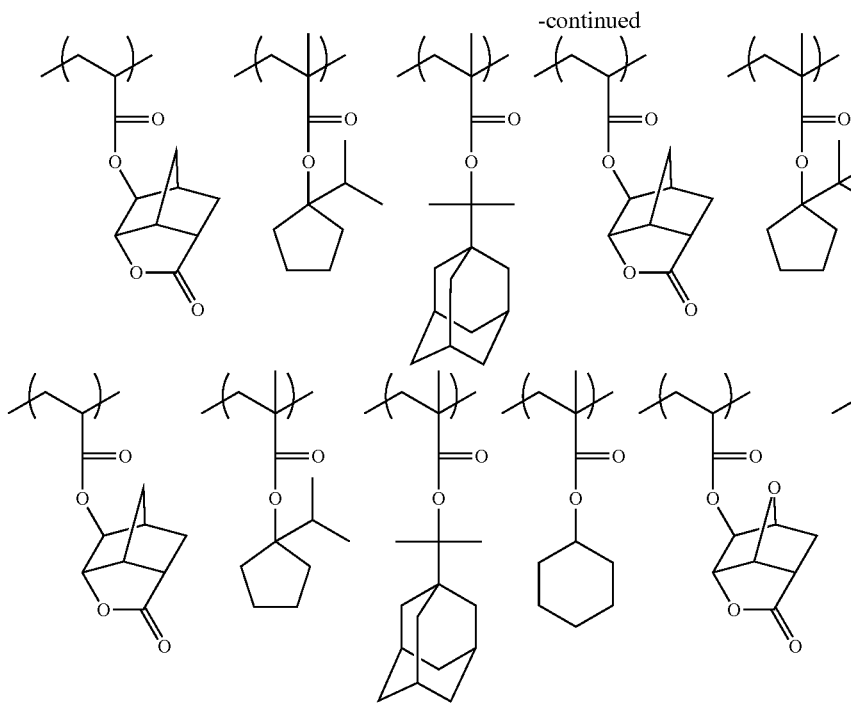

[4] Hydrophobic Resin (HR)

The active-light-sensitive or radiation-sensitive resin composition of the present invention may further contain a hydrophobic resin. In addition, the hydrophobic resin is preferably different from the resin (P).

Although the hydrophobic resin is preferably designed to be unevenly localized on an interface, it does not necessarily have to have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, improvement of the immersion liquid tracking properties, and suppression of out gas. The suppression of out gas is required, in particular, in a case where exposure is carried out with EUV light.

The hydrophobic resin preferably has at least one of a "fluorine atom," a "silicon atom," or a "$CH_3$ partial structure which is contained in a side chain moiety of a resin" from the point of view of uneven distribution on the film surface layer, and more preferably has two or more kinds.

In a case where hydrophobic resin contains a fluorine atom and/or a silicon atom, the fluorine atom and/or the silicon atom in the hydrophobic resin may be contained in the main chain or the side chain of the resin.

In a case where the hydrophobic resin contains a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom and may further have a substituent other than a fluorine atom.

Preferred examples of the alkyl group having a fluorine atom, the cycloalkyl group having a fluorine atom, and the aryl group having a fluorine atom include groups represented by the following General Formulae (F2) to (F4), but the present invention is not limited thereto.

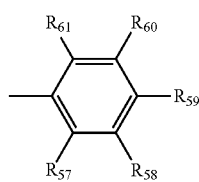

(F2)

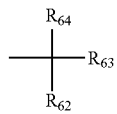

(F3)

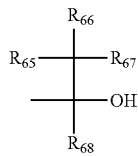

(F4)

In General Formulae (F2) to (F4), $R_{57}$ to $R_{69}$ each independently represent a hydrogen atom, a fluorine atom, or an (linear or branched) alkyl group, provided that at least one of $R_{57}, \ldots,$ or $R_{61}$, at least one of $R_{62}$, ..., or $R_{64}$, and at least one of $R_{65}$, ..., or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include those exemplified in [0500] of US2012/0251948A.

Specific examples of the group represented by General Formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferable.

The partial structure having a fluorine atom may be bonded directly to the main chain or may be bonded to the main chain through a group selected from the group consisting of an alkylene group, a phenylene group, an ether bond, a thioether bond, a carbonyl group, an ester bond, an amide bond, a urethane bond, and a ureylene bond, or a group formed by combination of two or more thereof.

The hydrophobic resin may contain a silicon atom. The resin preferably has, as the partial structure having a silicon atom, an alkylsilyl structure (preferably a trialkylsilyl group) or a cyclic siloxane structure.

Examples of the alkylsilyl structure or the cyclic siloxane structure include the partial structures described in paragraphs <0304> to <0307> of JP2013-178370A.

Examples of the repeating unit having a fluorine atom or a silicon atom include those exemplified in [0519] of US2012/0251948A1.

Furthermore, it is also preferable that the hydrophobic resin contains a CH$_3$ partial structure in the side chain moiety as described above.

Here, the CH$_3$ partial structure (hereinafter also simply referred to as a "side chain CH$_3$ partial structure") contained in the side chain moiety in the hydrophobic resin includes a CH$_3$ partial structure contained in an ethyl group, a propyl group, and the like.

On the other hand, a methyl group bonded directly to the main chain of the hydrophobic resin (for example, an α-methyl group in the repeating unit having a methacrylic acid structure) makes only a small contribution of uneven distribution to the surface of the hydrophobic resin due to the effect of the main chain, and it is therefore not included in the CH$_3$ partial structure in the present invention.

More specifically, in a case where the hydrophobic resin contains a repeating unit derived from a monomer having a polymerizable site with a carbon-carbon double bond, such as a repeating unit represented by the following General Formula (M), and in addition. $R_{11}$ to $R_{14}$ are CH$_3$ "themselves," such CH$_3$ is not included in the CH$_3$ partial structure contained in the side chain moiety in the present invention.

On the other hand, a CH$_3$ partial structure which is present via a certain atom from a C—C main chain corresponds to the CH$_3$ partial structure in the present invention. For example, in a case where $R_{11}$ is an ethyl group (CH$_2$CH$_3$), the hydrophobic resin has "one" CH$_3$ partial structure in the present invention.

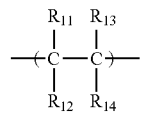

(M)

In General Formula (M),
$R_{11}$ to $R_{14}$ each independently represent a side chain moiety.

Examples of $R_{11}$ to $R_{14}$ at the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin is preferably a resin including a repeating unit having the CH$_3$ partial structure in the side chain moiety thereof. Further, the hydrophobic resin preferably has, as such a repeating unit, at least one repeating unit (x) selected from a repeating unit represented by the following General Formula (II) and a repeating unit represented by the following General Formula (III).

Hereinafter, the repeating unit represented by General Formula (II) will be described in detail.

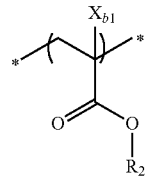

(II)

In General Formula (II), $X_{b1}$ represents a hydrogen atom, an alkyl group, a cyano group, or a halogen atom, and $R_2$ represents an organic group which has one or more CH$_3$ partial structures and is stable against an acid. Here, more specifically, the organic group which is stable against an acid is preferably an organic group which does not have an "acid-decomposable group" described with respect to the resin (P).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more CH$_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more CH$_3$ partial structures.

The number of the CH$_3$ partial structures contained in the organic group which has one or more CH; partial structures and is stable against an acid as $R_2$ is preferably 2 to 10, and more preferably 2 to 8.

Specific preferred examples of the repeating unit represented by General Formula (II) are shown below, but the present invention is not limited thereto.
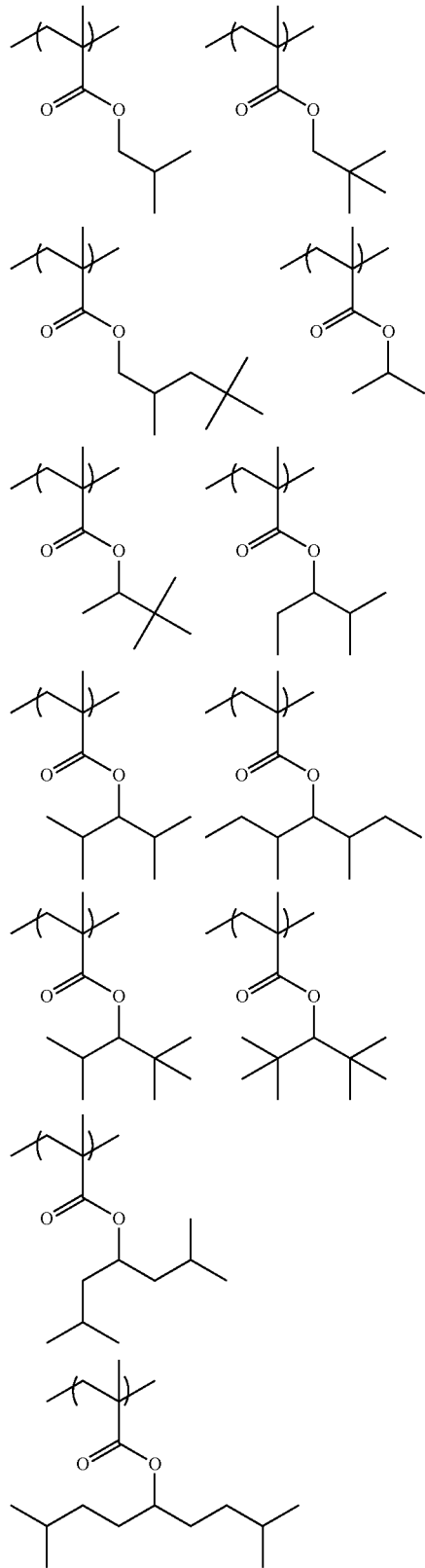
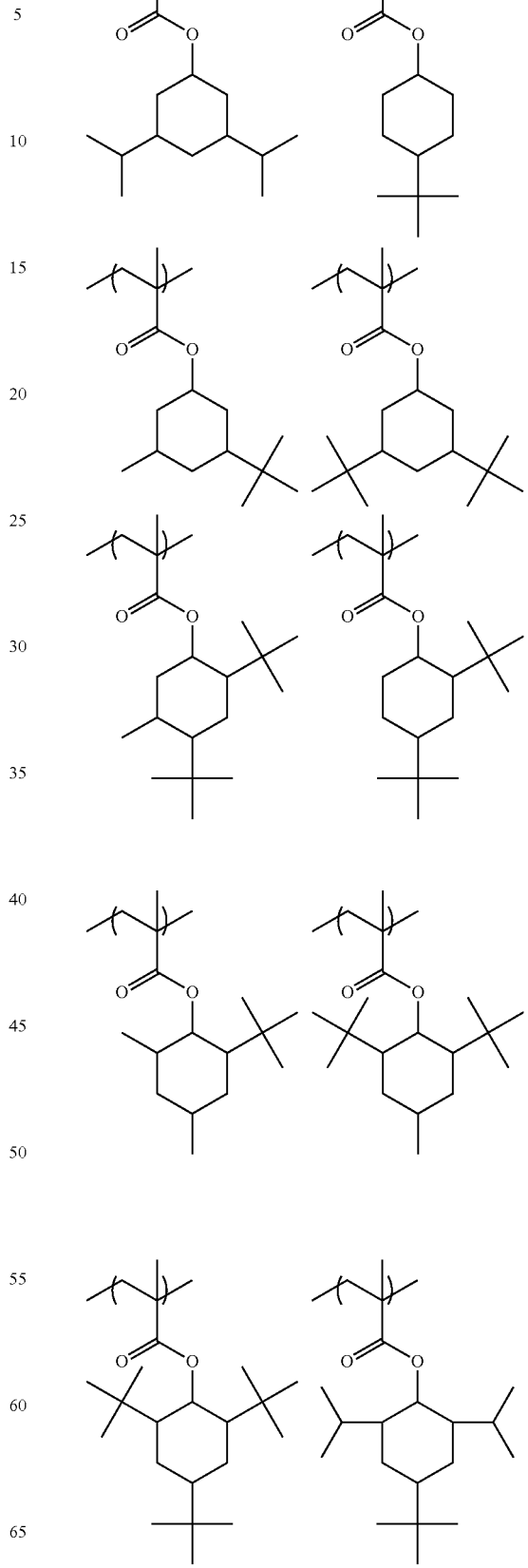

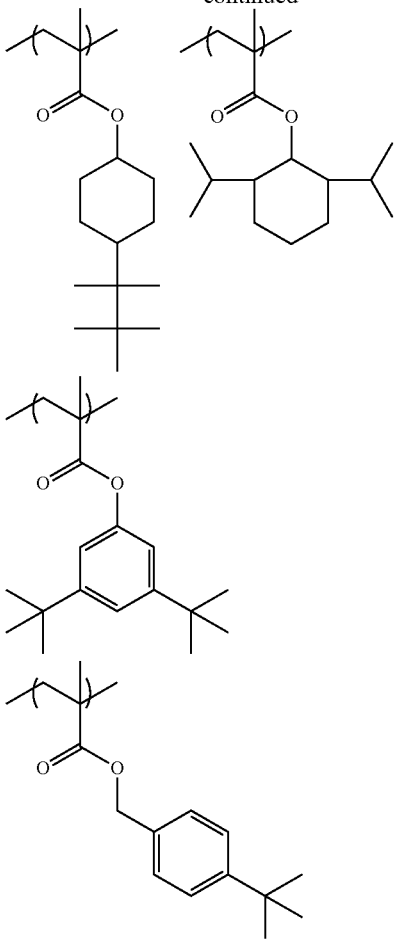

The repeating unit represented by General Formula (II) is preferably a repeating unit which is stable against an acid (acid-indecomposable), and specifically, it is preferably a repeating unit not having a group that decomposes by the action of an acid to generate a polar group.

Hereinafter, the repeating unit represented by General Formula (III) will be described in detail.

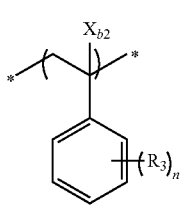

(III)

In General Formula (III), $X_{b2}$ represents a hydrogen atom, an alkyl group, a cyano group, or a halogen atom. $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

Since $R_3$ is an organic group stable against an acid, more specifically. $R_3$ is preferably an organic group which does not have the "acid-decomposable group" described with respect to the resin (P).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

n represents an integer of 1 to 5, more preferably 1 to 3, and still more preferably 1 or 2.

Specific preferred examples of the repeating unit represented by General Formula (III) are shown below, but the present invention is not limited thereto.

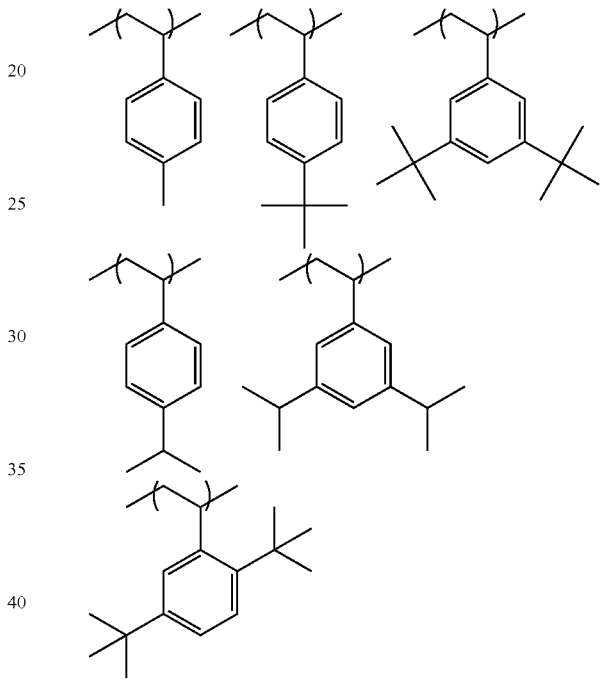

The repeating unit represented by General Formula (II) is preferably a repeating unit which is stable against an acid (acid-indecomposable), and specifically, it is a repeating unit which does not have a group that decomposes by the action of an acid to generate a polar group.

In a case where the hydrophobic resin contains a $CH_3$ partial structure in the side chain moiety thereof, and in particular, it does not have any one of a fluorine atom and a silicon atom, the content of at least one repeating unit (x) of the repeating unit represented by General Formula (II) and the repeating unit represented by General Formula (III) is preferably 90% by mole or more, and more preferably 95% by mole or more, with respect to all the repeating units of the hydrophobic resin. Further, the content is usually 100% by mole or less with respect to all the repeating units of the hydrophobic resin.

By incorporating at least one repeating unit (x) of the repeating unit represented by General Formula (II) and the repeating unit represented by General Formula (III) in a proportion of 90% by mole or more with respect to all the repeating units of the hydrophobic resin into the hydrophobic resin, the surface free energy of the hydrophobic resin is increased. As a result, it is difficult for the hydrophobic resin to be unevenly distributed on the surface of the resist film and the static/dynamic contact angle of the resist film with respect to water can be securely increased, thereby enhancing the immersion liquid tracking properties.

In addition, in a case (i) where the hydrophobic resin contains a fluorine atom and/or a silicon atom or a case (ii) where the hydrophobic resin contains a $CH_3$ partial structure in the side chain moiety, it may also have at least one group selected from the following groups (x) to (z):

(x) an acid group.

(y) a group having a lactone structure or a sultone structure, an acid anhydride group, or an acid imido group, and (z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl) methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably hexafluoroisopropanol), a sulfonamido group, and a bis(alkylcarbonyl)methylene group.

Examples of the repeating unit containing an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization. All of these cases are preferable. The repeating unit having an acid group (x) may have at least one of a fluorine atom or a silicon atom.

The content of the repeating unit having an acid group (x) is preferably 1% to 50% by mole, more preferably 3% to 35% by mole, and still more preferably 5% to 20% by mole, with respect to all the repeating units in the hydrophobic resin.

Specific preferred examples of the repeating unit containing an acid group (x) are shown below, but the present invention is not limited thereto. In the formulae, Rx represents a hydrogen atom, $CH_3$, $CF_3$, or $CH_2OH$.

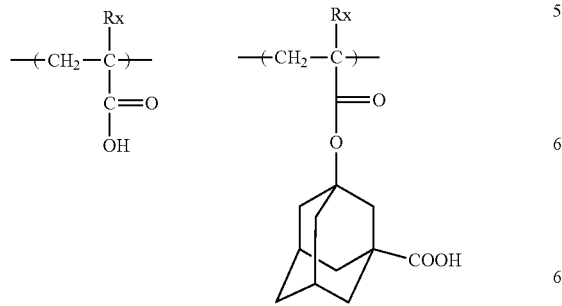
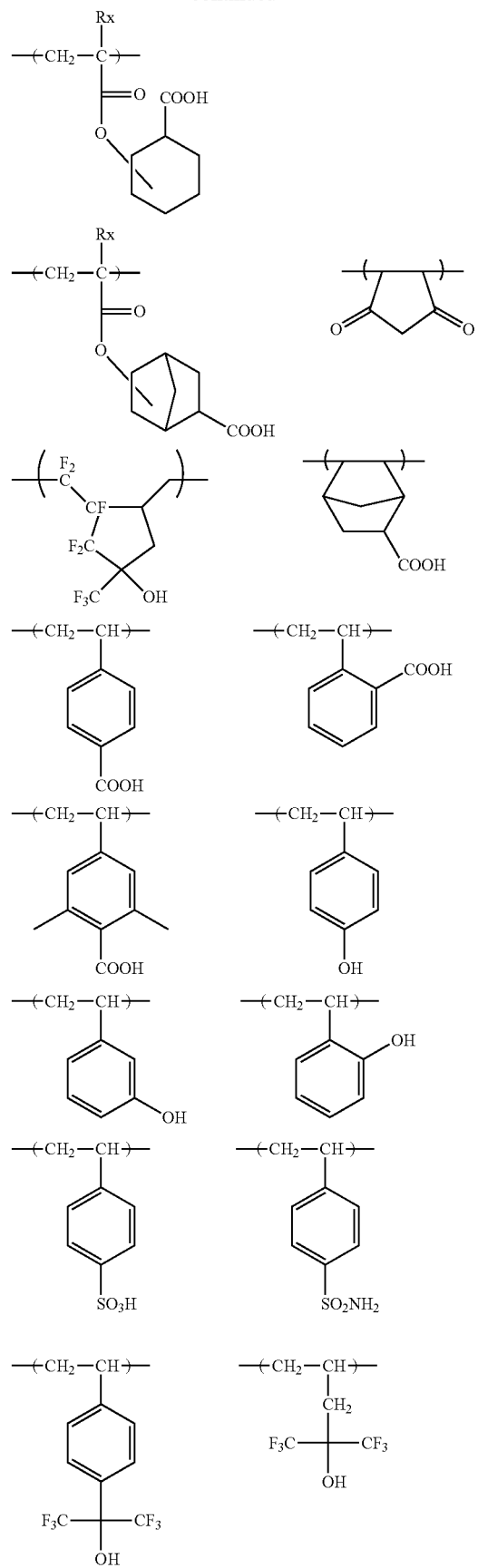

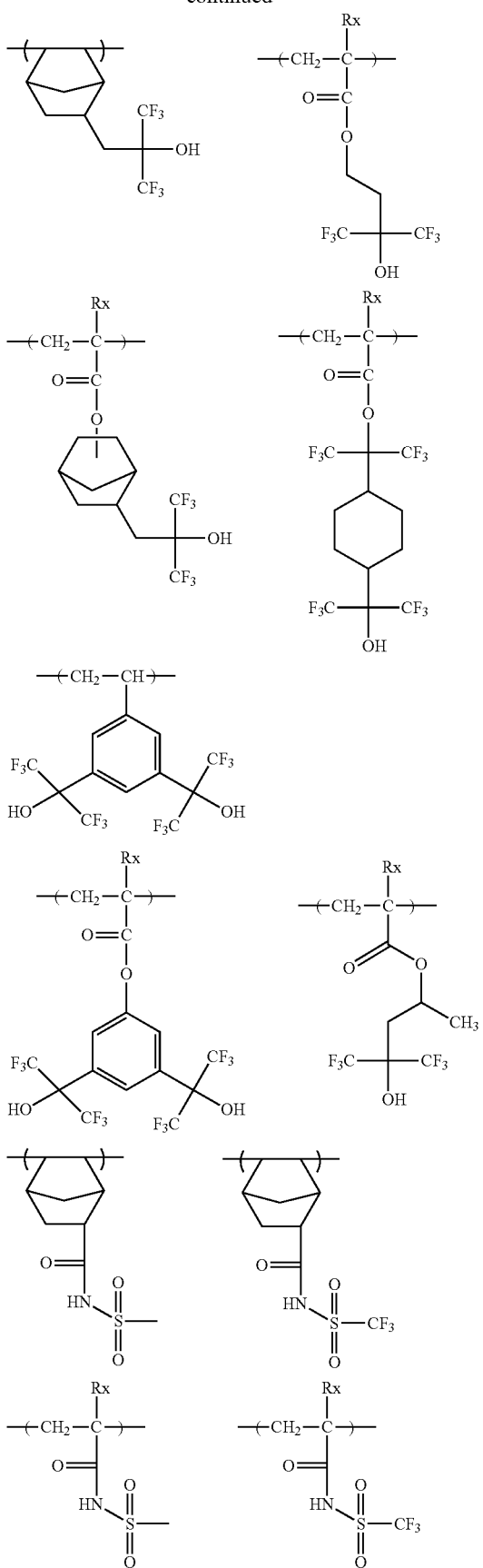
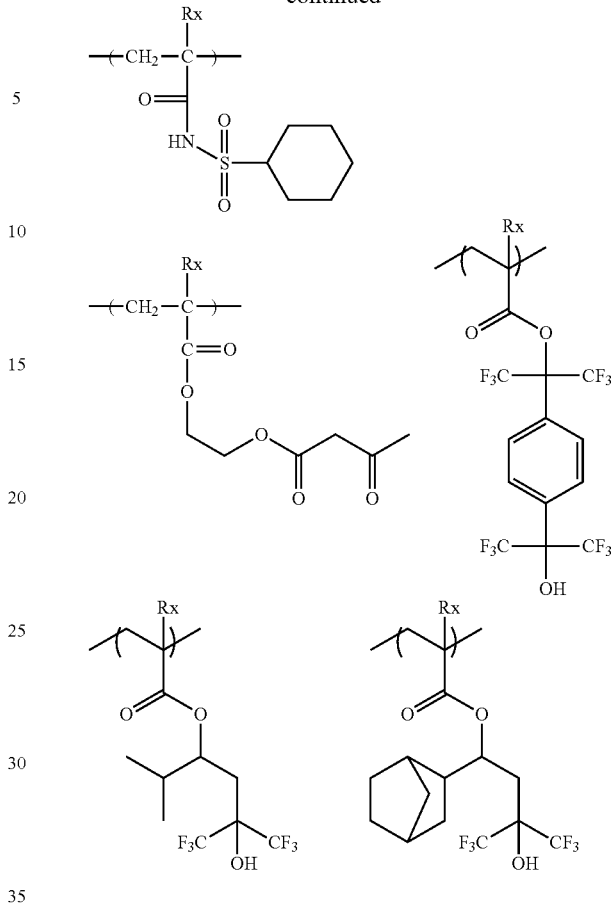

As the group having a lactone structure or a sultone structure, the acid anhydride group, or the acid imido group (y), a group having a lactone structure or a sultone structure is particularly preferable.

The repeating unit containing such a group is, for example, a repeating unit in which the group is directly bonded to the main chain of the resin, such as a repeating unit by an acrylic ester or a methacrylic ester. This repeating unit may be a repeating unit in which the group is bonded to the main chain of the resin through a linking group. Alternatively, this repeating unit may be introduced into the terminal of the resin by using a polymerization initiator or chain transfer agent containing the group during the polymerization.

Examples of the repeating unit containing a group having a lactone structure or a sultone structure include the same ones as the repeating unit having a lactone structure or a sultone structure as described earlier in the section of the resin (P).

The content of the repeating unit having a group having a lactone structure or a sultone structure, an acid anhydride group, or an acid imido group (y) is preferably 1% to 100% by mole, more preferably 3% to 98% by mole, and still more preferably 5% to 95% by mole, with respect to all the repeating units in the hydrophobic resin.

Regarding the hydrophobic resin, examples of the repeating unit having a group (z) that decomposes by the action of an acid include the same ones as the repeating units having an acid-decomposable group, as mentioned with respect to the resin (P). The repeating unit having a group (z) that decomposes by the action of an acid may have at least one of a fluorine atom or a silicon atom. Regarding the hydrophobic resin, the content of the repeating unit having a group (z) that decomposes by the action of an acid is preferably 1% to 80% by mole, more preferably 10% to 80% by mole, and still more preferably 20% to 60% by mole, with respect to all the repeating units in the hydrophobic resin.

The hydrophobic resin may further have a repeating unit represented by the following General Formula (III).

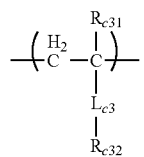
(III)

In General Formula (III), $R_{c31}$ represents a hydrogen atom, an alkyl group (which may be substituted with a fluorine atom or the like), a cyano group, or a —$CH_2$—O—$R_{ac2}$ group. In the formula, $Rac_2$ represents a hydrogen atom, an alkyl group, or an acyl group. $R_{c31}$ is preferably a hydrogen atom, a methyl group, a hydroxymethyl group, or a trifluoromethyl group, and particularly preferably a hydrogen atom or a methyl group.

$R_{c32}$ represents a group having an alkyl group, a cycloalkyl group, an alkenyl group, a cycloalkenyl group, or an aryl group. These groups may be substituted with a group containing a fluorine atom or a silicon atom.

$L_{c3}$ represents a single bond or a divalent linking group.

In General Formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group, and these groups may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating unit represented by General Formula (III) is preferably 1% to 100% by mole, more preferably 10% to 90% by mole, and still more preferably 30% to 70% by mole, with respect to all the repeating units in the hydrophobic resin.

It is also preferable that the hydrophobic resin further has a repeating unit represented by the following General Formula (CII-AB).

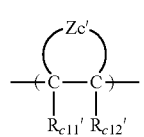
(CII-AB)

In Formula (CII-AB), $R_{c11}'$ and $R_{c12}'$ each independently represent a hydrogen atom, a cyano group, a halogen atom, or an alkyl group.

$Z_c'$ represents an atomic group for forming an alicyclic structure, which contains two bonded carbon atoms (C—C).

The content of the repeating unit represented by General Formula (CII-AB) is preferably 1% to 100% by mole, more preferably 10% to 90% by mole, and still more preferably 30% to 70% by mole, with respect to all the repeating units in the hydrophobic resin.

Specific examples of the repeating unit represented by General Formula (III) or (CII-AB) are shown below, but the present invention is not limited thereto. In the formulae, Ra represents H, $CH_3$, $CH_2OH$, $CF_3$, or CN.

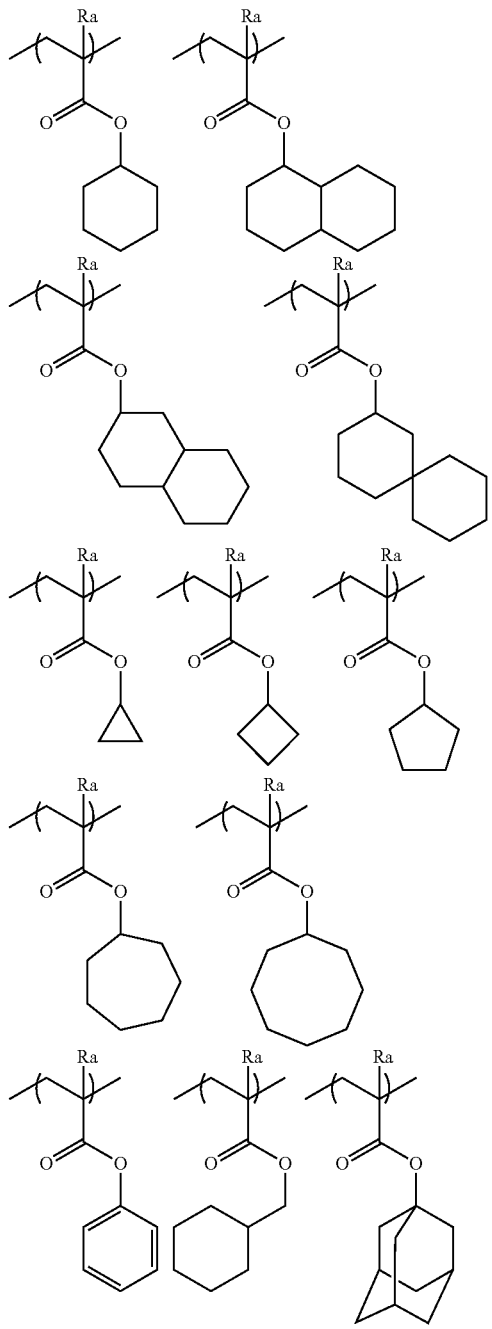

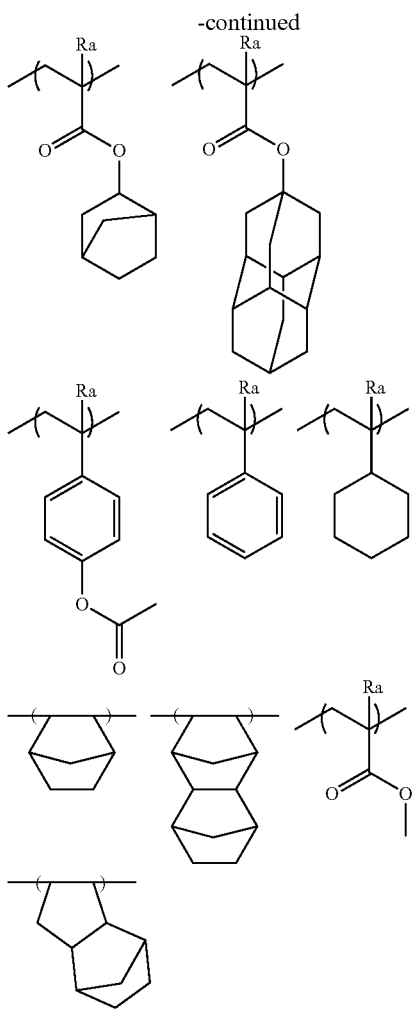

In a case where the hydrophobic resin has a fluorine atom, the content of the fluorine atom is preferably 5% to 80% by mass, and more preferably 10% to 80% by mass, with respect to the weight-average molecular weight of the hydrophobic resin. Further, the proportion of the repeating units containing a fluorine atom is preferably 10% (to 100% by mole, and more preferably 30% to 100% by mole, with respect to all the repeating units included in the hydrophobic resin.

In a case where the hydrophobic resin has a silicon atom, the content of the silicon atom is preferably 2% to 50% by mass, and more preferably 2% to 30% by mass, with respect to the weight-average molecular weight of the hydrophobic resin. Further, the proportion of the repeating unit containing a silicon atom is preferably 10% to 100% by mole, and more preferably 20% to 100% by mole, with respect to all the repeating units included in the hydrophobic resin.

On the other hand, in particular, in a case where the hydrophobic resin contains a $CH_3$ partial structure in the side chain portion thereof, it is also preferable that the hydrophobic resin has a form having substantially neither a fluorine atom nor a silicon atom. In this case, specifically the content of the repeating units containing a fluorine atom or a silicon atom is preferably 5% by mole or less, more preferably 3% by mole or less, still more preferably 1% by mole or less, and ideally 0% r by mole, that is, containing neither a fluorine atom nor a silicon atom, with respect to all the repeating units in the hydrophobic resin. In addition, it is preferable that the hydrophobic resin is composed substantially only of a repeating unit constituted with only an atom selected from the group consisting of a carbon atom, an oxygen atom, a hydrogen atom, a nitrogen atom, and a sulfur atom. More specifically the proportion of the repeating unit constituted with only an atom selected from the group consisting of a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, of all the repeating units in the hydrophobic resin.

The weight-average molecular weight of the hydrophobic resin in terms of standard polystyrene is preferably 1,000 to 100,000, more preferably 1,000 to 50,000, and still more preferably 2,000 to 15,000.

Furthermore, the hydrophobic resins may be used singly or in combination of plural kinds thereof.

The active-light-sensitive or radiation-sensitive resin composition of the present invention may or may not contain a hydrophobic resin, and the content of the hydrophobic resin in the composition is preferably 0.01% to 10% by mass, more preferably 0.05% to 8% by mass, and still more preferably 0.1% to 7% by mass, with respect to the total solid content of the active-light-sensitive or radiation-sensitive resin composition of the present invention.

In the hydrophobic resin, it is certain that the content of impurities such as metal is small, but the content of residual monomers or oligomer components is also preferably 0.01% to 5% by mass, more preferably 0.01% to 3% by mass, and still more preferably 0.05% to 1% by mass. Within these ranges, a composition free from in-liquid extraneous materials and a change in sensitivity or the like with aging can be obtained. Further, from the viewpoints of a resolution, a resist profile, the side wall of a resist pattern, a roughness, and the like, the molecular weight distribution (Mw/Mn, also referred to as a dispersity) is preferably in the range of 1 to 5, more preferably in the range of 1 to 3, and still more preferably in the range of 1 to 2.

As the hydrophobic resin, various commercial products may be used, or the resin may be synthesized by an ordinary method (for example, radical polymerization). Examples of the general synthesis method include a batch polymerization method of dissolving monomer species and an initiator in a solvent and heating the solution, thereby carrying out the polymerization, and a dropwise addition polymerization method of adding dropwise a solution containing monomer species and an initiator to a heated solvent for 1 to 10 hours, with the dropwise addition polymerization method being preferable.

The reaction solvent, the polymerization initiator, the reaction conditions (a temperature, a concentration, and the like) and the method for purification after reaction are the same as ones described for the resin (P), but in the synthesis of the hydrophobic resin, the concentration of the reactant is preferably 30% to 50% by mass.

Specific examples of the hydrophobic resin are shown below. Further, the molar ratio of the repeating units (corresponding to the respective repeating units in order from the left side), the weight-average molecular weight, and the dispersity with respect to the respective resins are shown in Tables below.

-continued

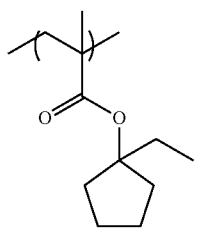
(B-11)
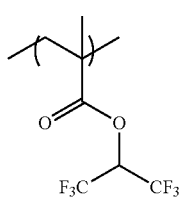
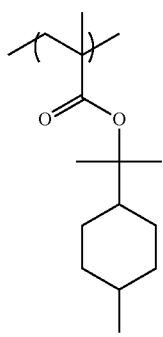
(B-12)
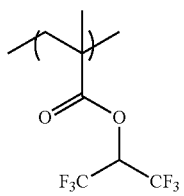
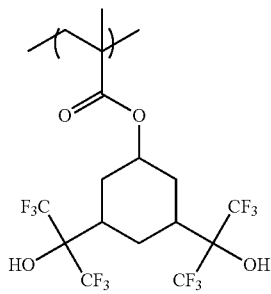
(B-13)
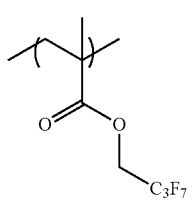
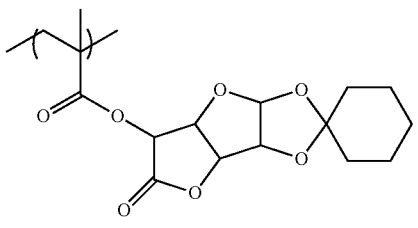
(B-14)
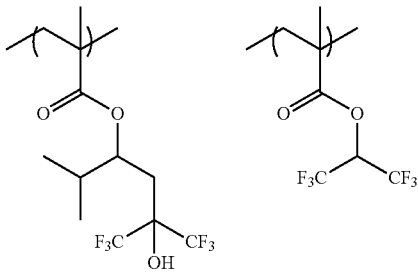
(B-15)
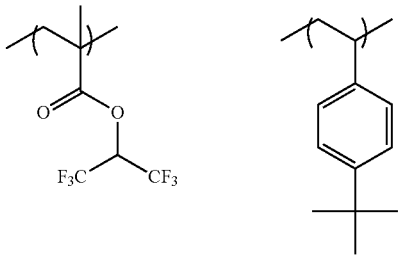
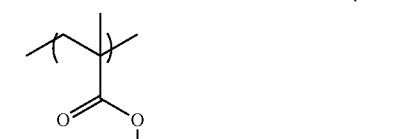
(B-16)
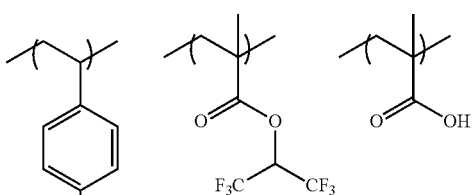
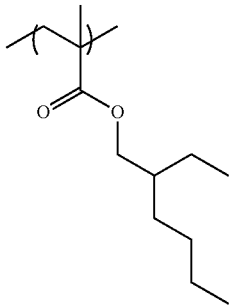

(B-17)
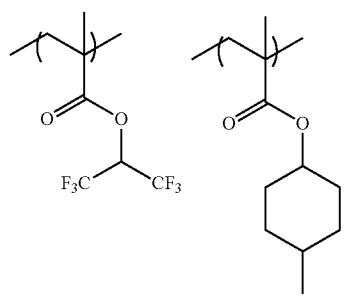
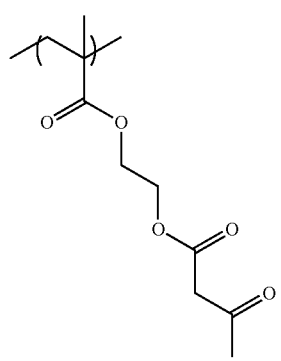
(B-18)
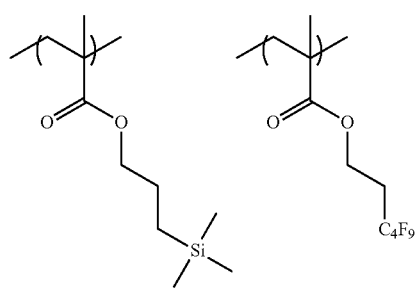
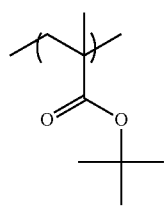
(B-19)
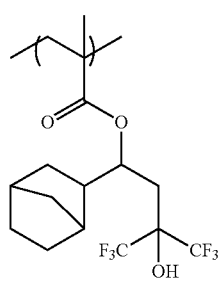
(B-20)
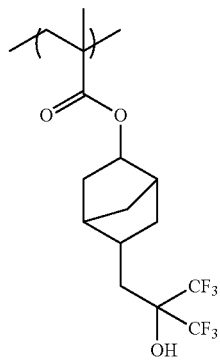
(B-21)
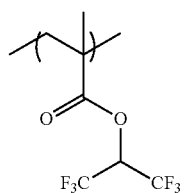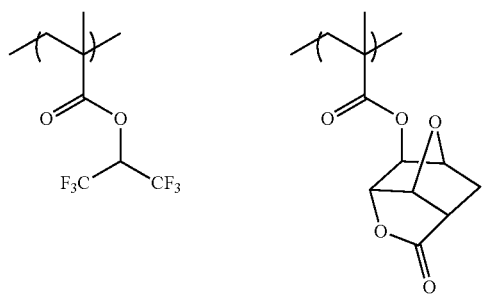
(B-22)
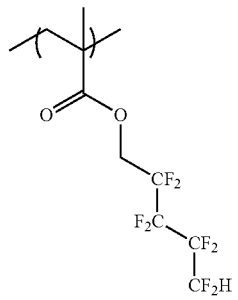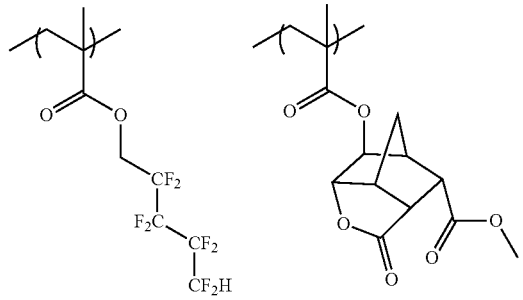
(B-23)
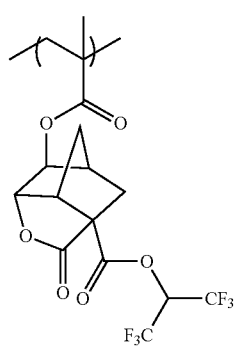

(B-24) 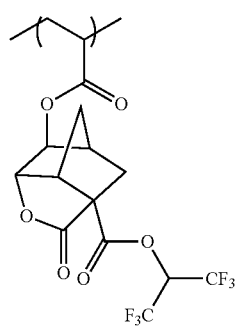
(B-25) 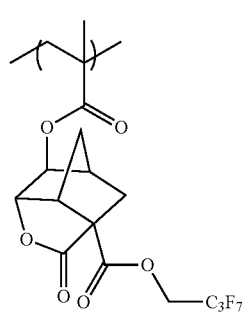
(B-26) 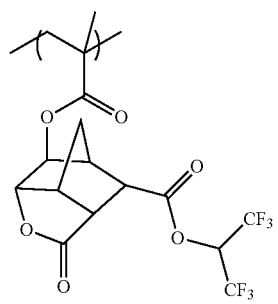
(B-27) 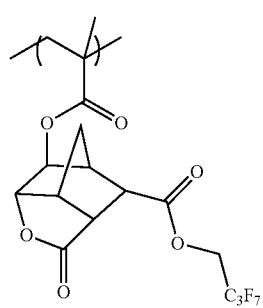
(B-28) 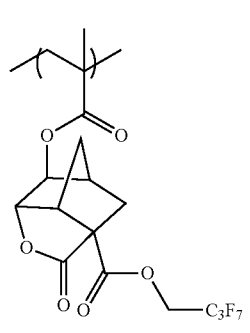 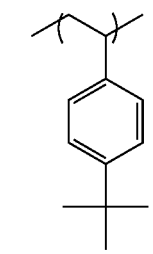
(B-29) 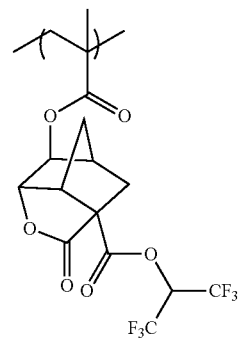
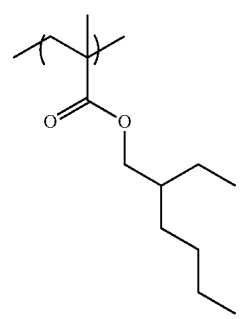
(B-30) 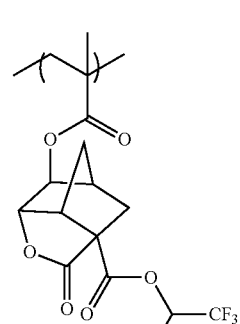
(B-31) 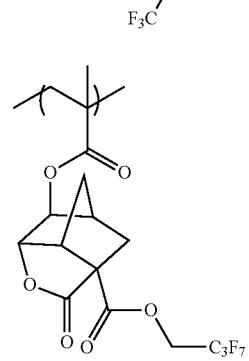 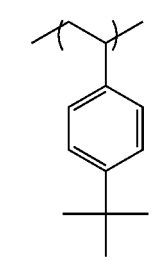
(B-32) 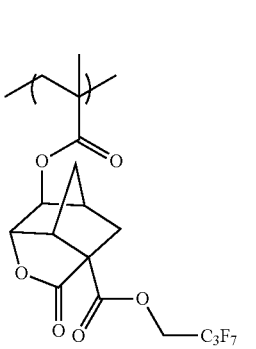 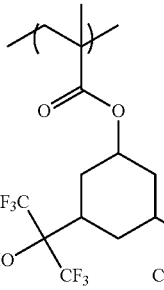

(B-33)
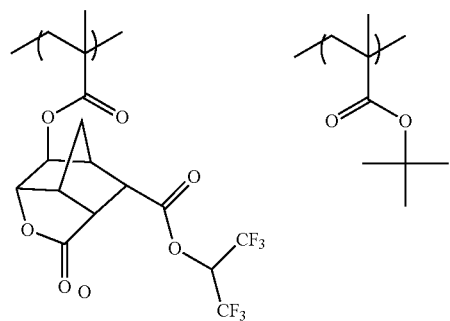
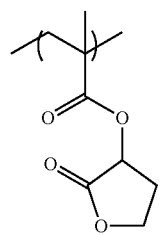
(B-34)
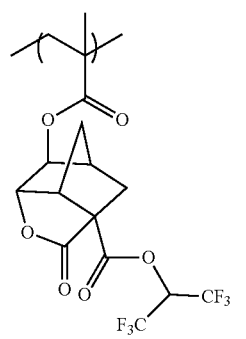 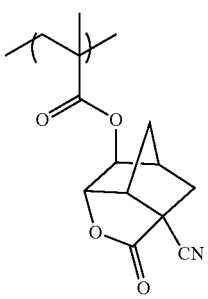
(B-35)
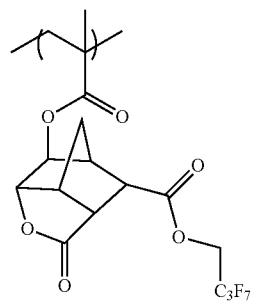 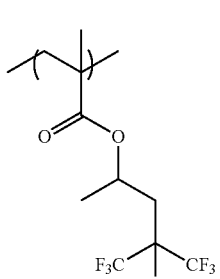
(B-36)
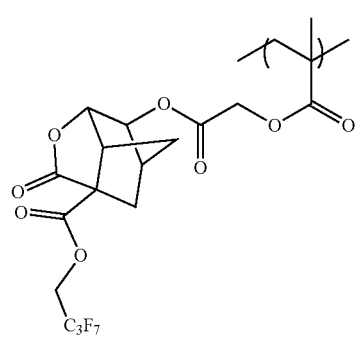
(B-37)
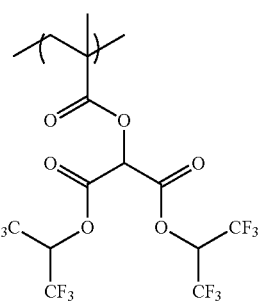 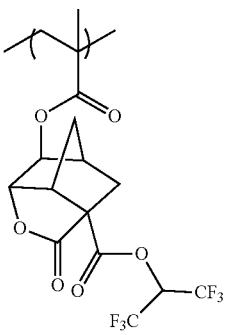
(B-38)
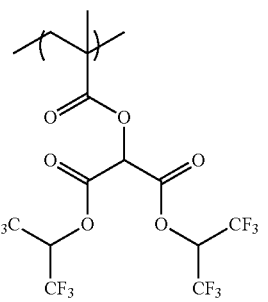
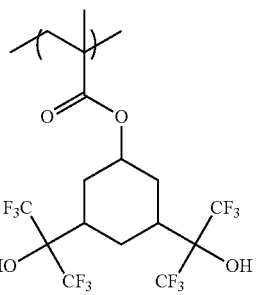
(B-39)
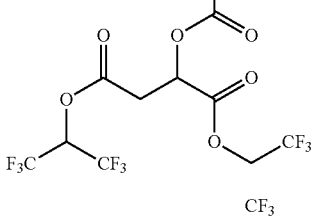 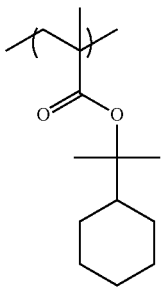
(B-40)
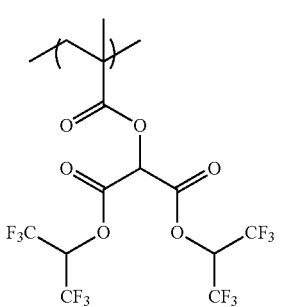

(B-41)
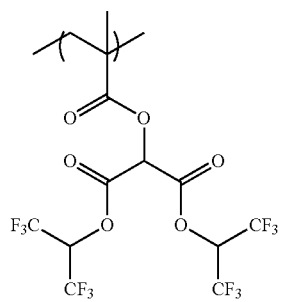
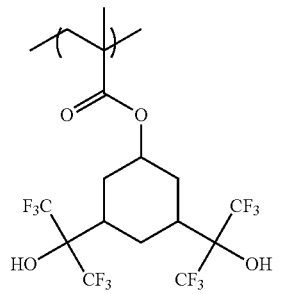
(B-42)
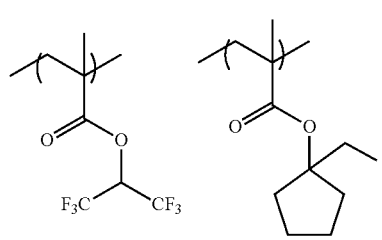
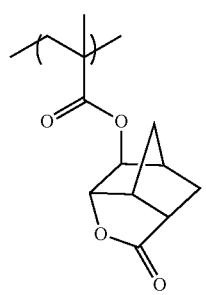
(B-43)
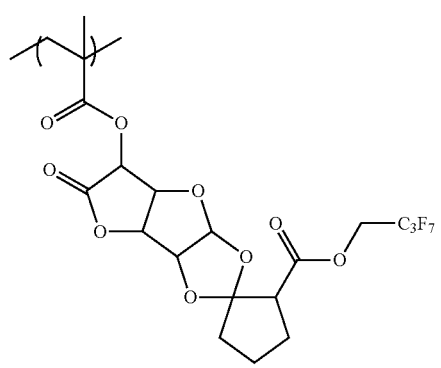
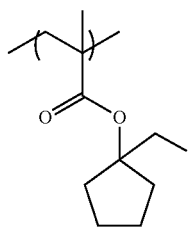 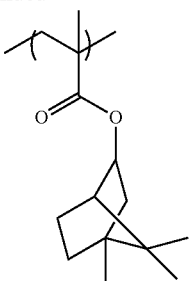
(B-44)
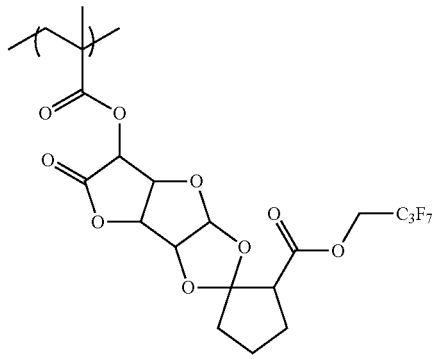
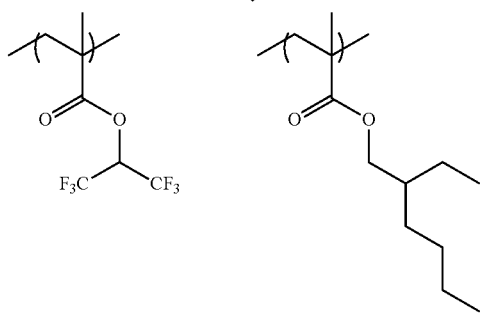
(B-45)
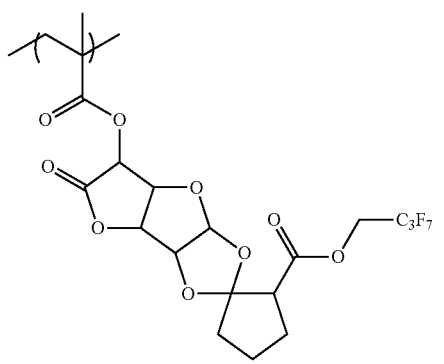
(B-46)
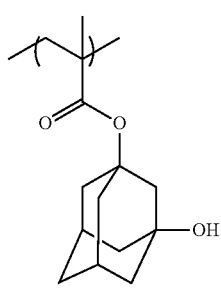

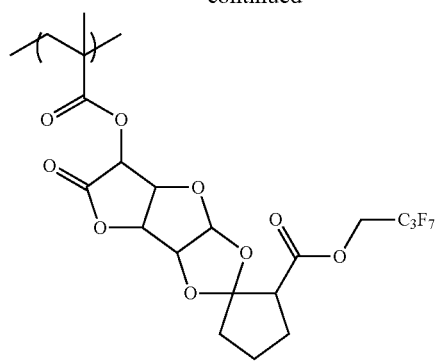
(B-47)
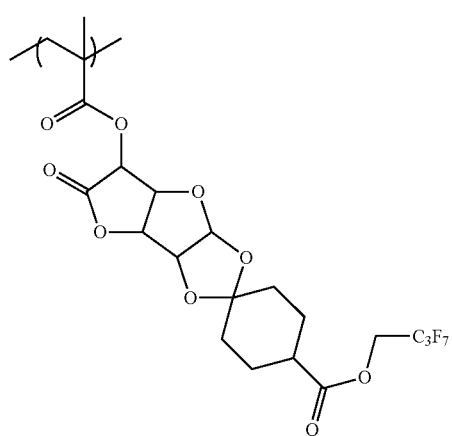
(B-48)
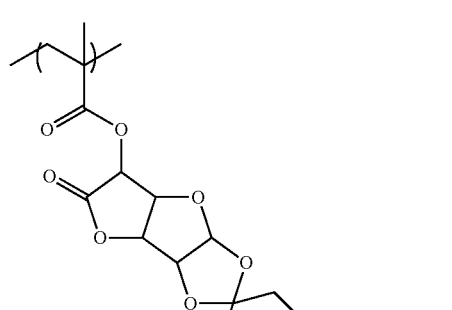
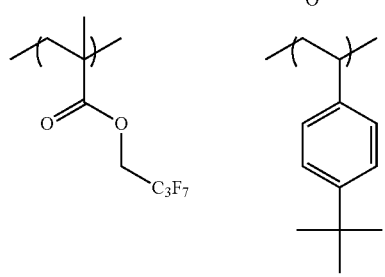
(B-49)
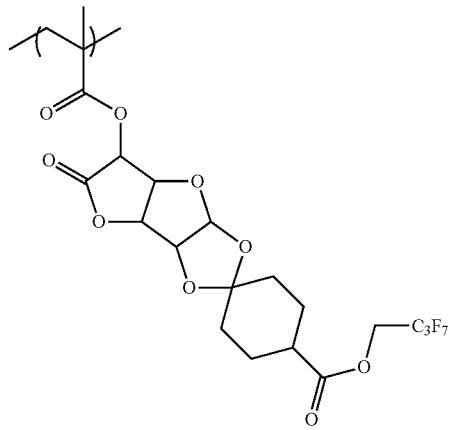
(B-50)
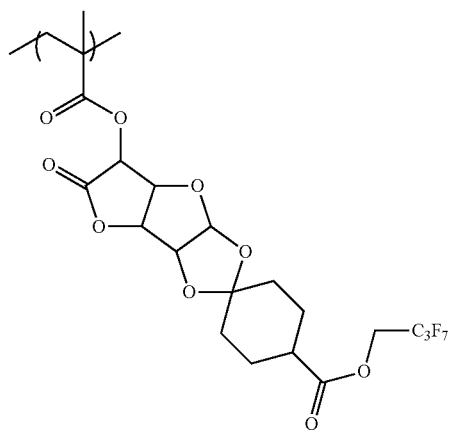
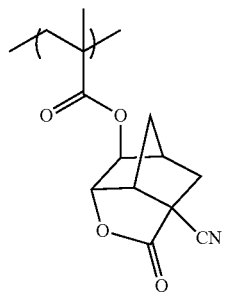
(B-51)
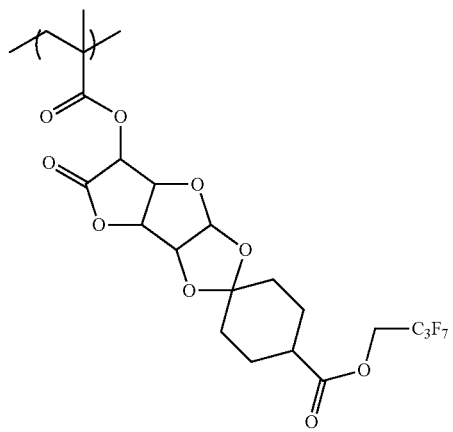

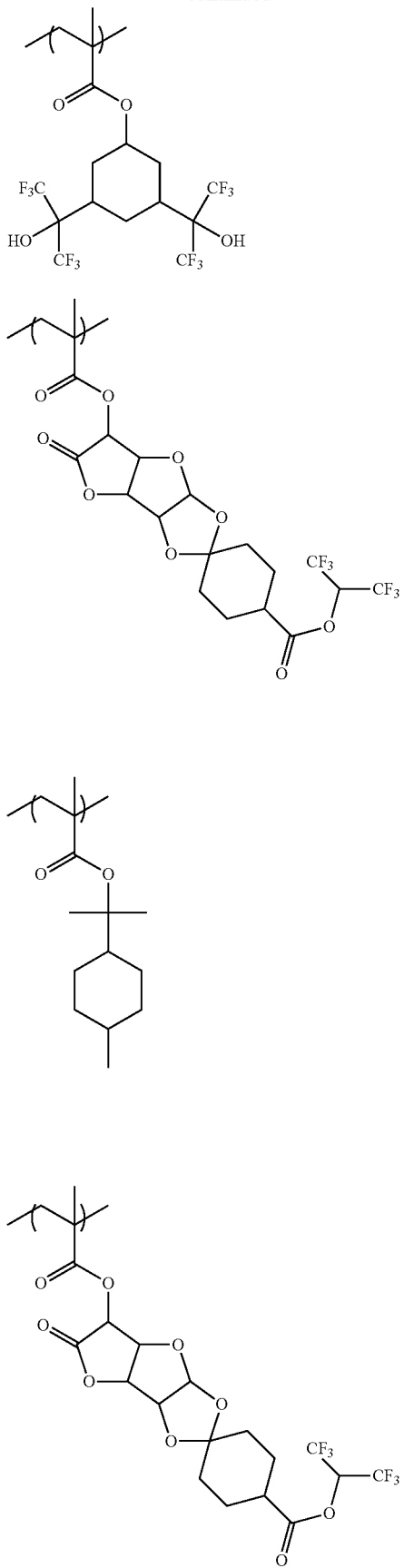
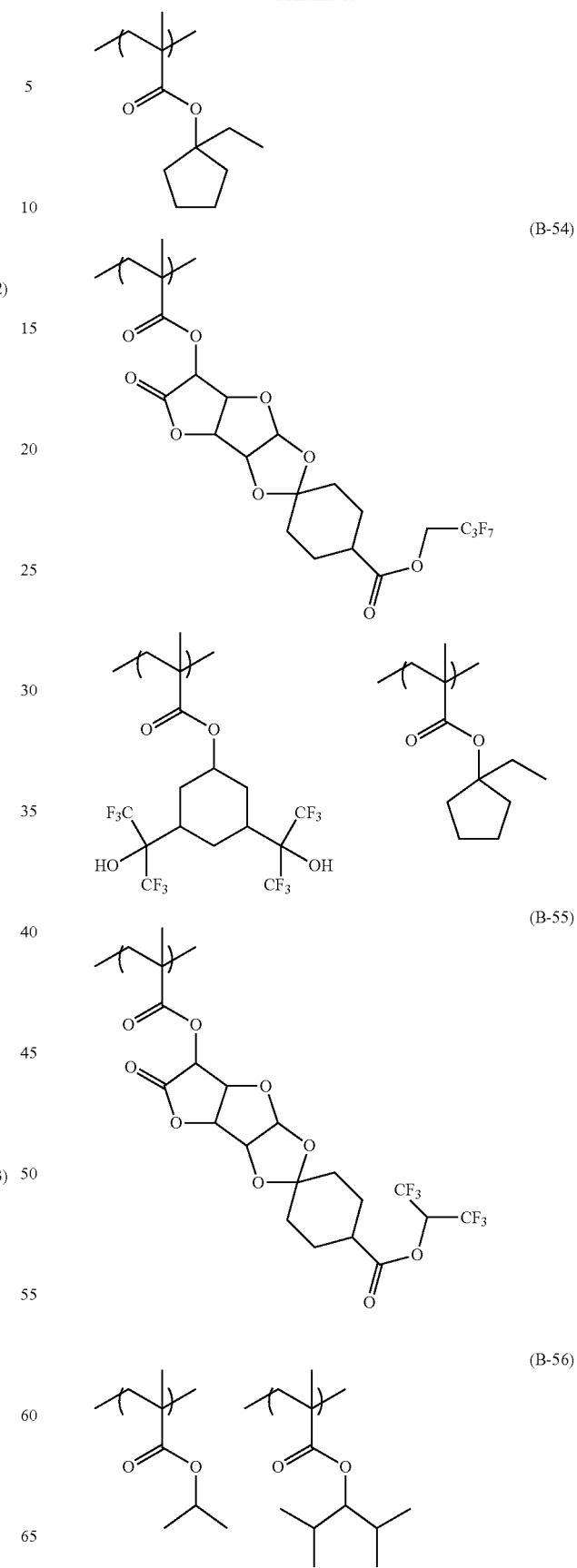

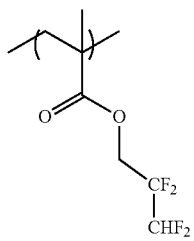
TABLE 1
| Polymer | Compositional ratio (% by mole) | Mw | Mw/Mn |
|---|---|---|---|
| B-1 | 50/50 | 6,000 | 1.5 |
| B-2 | 30/70 | 6,500 | 1.4 |
| B-3 | 45/55 | 8,000 | 1.4 |
| B-4 | 100 | 15,000 | 1.7 |
| B-5 | 60/40 | 6,000 | 1.4 |
| B-6 | 40/60 | 8,000 | 1.4 |
| B-7 | 30/40/30 | 8,000 | 1.4 |
| B-8 | 60/40 | 8,000 | 1.3 |
| B-9 | 50/50 | 6,000 | 1.4 |
| B-10 | 40/40/20 | 7,000 | 1.4 |
| B-11 | 40/30/30 | 9,000 | 1.6 |
| B-12 | 30/30/40 | 6,000 | 1.4 |
| B-13 | 60/40 | 9,500 | 1.4 |
| B-14 | 60/40 | 8,000 | 1.4 |
| B-15 | 35/35/30 | 7,000 | 1.4 |
| B-16 | 50/40/5/5 | 6,800 | 1.3 |
| B-17 | 20/30/50 | 8,000 | 1.4 |
| B-18 | 25/25/50 | 6,000 | 1.4 |
| B-19 | 100 | 9,500 | 1.5 |
| B-20 | 100 | 7,000 | 1.5 |
| B-21 | 50/50 | 6,000 | 1.6 |
| B-22 | 40/60 | 9,600 | 1.3 |
| B-23 | 100 | 20,000 | 1.7 |
| B-24 | 100 | 25,000 | 1.4 |
| B-25 | 100 | 15,000 | 1.7 |
| B-26 | 100 | 12,000 | 1.8 |
| B-27 | 100 | 18,000 | 1.3 |
| B-28 | 70/30 | 15,000 | 2.0 |
| B-29 | 80/15/5 | 18,000 | 1.8 |
| B-30 | 60/40 | 25,000 | 1.8 |
| B-31 | 90/10 | 19,000 | 1.6 |
| B-32 | 60/40 | 20,000 | 1.8 |
| B-33 | 50/30/20 | 11,000 | 1.6 |
| B-34 | 60/40 | 12,000 | 1.8 |
| B-35 | 60/40 | 15,000 | 1.6 |
| B-36 | 100 | 22,000 | 1.8 |
| B-37 | 20/80 | 35,000 | 1.6 |
| B-38 | 30/70 | 12,000 | 1.7 |
| B-39 | 30/70 | 9,000 | 1.5 |
| B-40 | 100 | 9,000 | 1.5 |
| B-41 | 40/15/45 | 12,000 | 1.9 |
| B-42 | 30/30/40 | 13,000 | 2.0 |
| B-43 | 40/40/20 | 23,000 | 2.1 |
| B-44 | 65/30/5 | 25,000 | 1.6 |
| B-45 | 100 | 15,000 | 1.7 |
| B-46 | 20/80 | 9,000 | 1.7 |
| B-47 | 70/30 | 18,000 | 1.5 |
| B-48 | 60/20/20 | 18,000 | 1.8 |
| B-49 | 100 | 12,000 | 1.4 |
| B-50 | 60/40 | 20,000 | 1.6 |
| B-51 | 70/30 | 33,000 | 2.0 |
| B-52 | 60/40 | 19,000 | 1.8 |
| B-53 | 50/50 | 15,000 | 1.5 |
| B-54 | 40/20/40 | 35,000 | 1.9 |
| B-55 | 100 | 16,000 | 1.4 |
| B-56 | 30/65/5 | 28,000 | 1.7 |
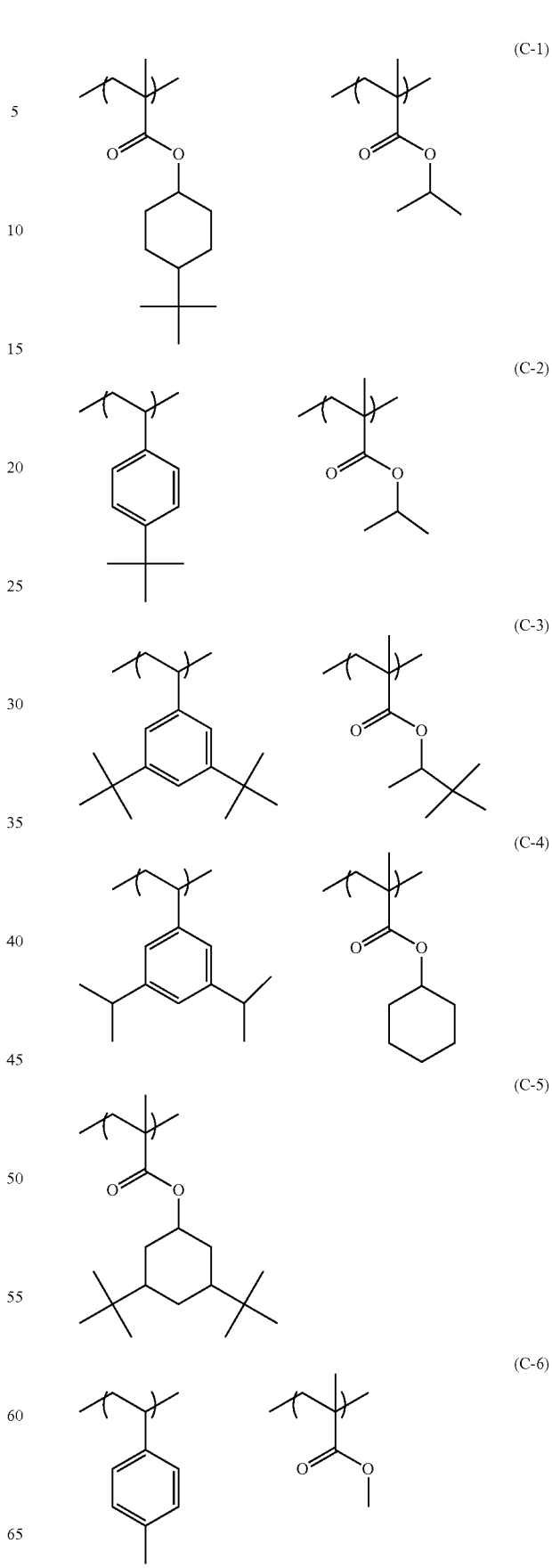

(C-7) 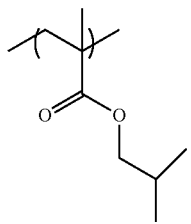
(C-8) 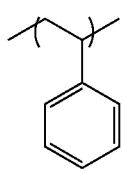 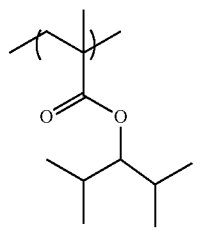
(C-9) 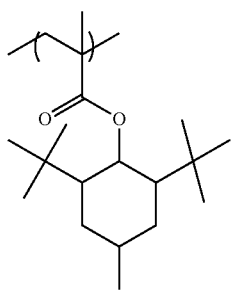
(C-10) 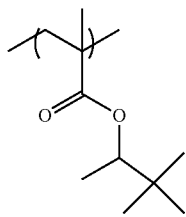
(C-11) 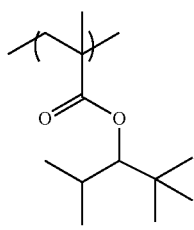
(C-12) 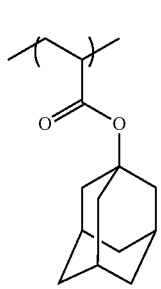 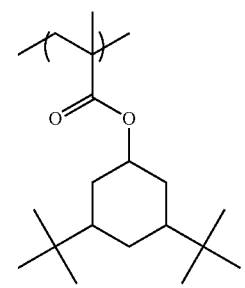
(C-13) 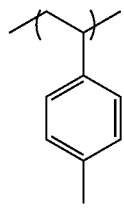
(C-14) 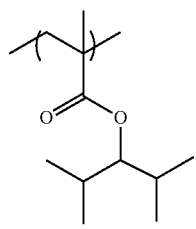
(C-15) 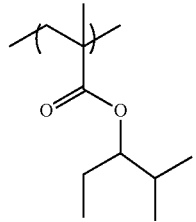
(C-16) 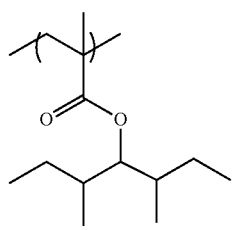
(C-17) 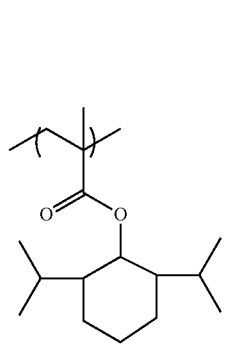
(C-18) 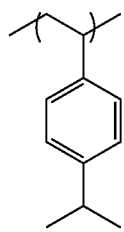

-continued
(C-19) 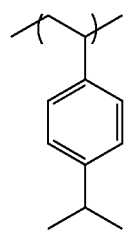 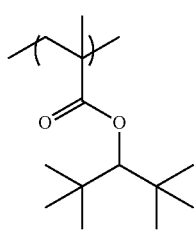
(C-20) 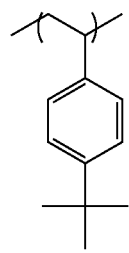 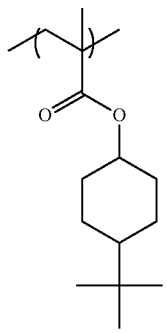
(C-21) 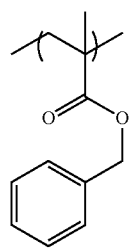 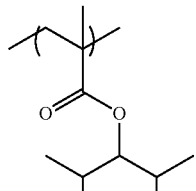
(C-22) 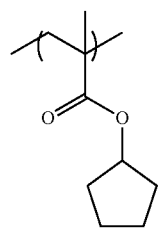 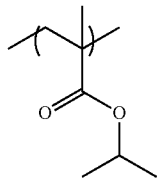
(C-23) 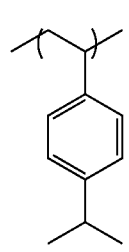 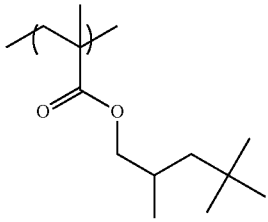
(C-24) 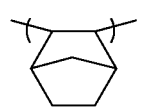 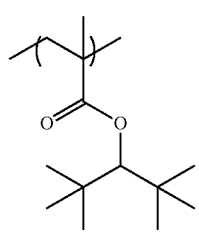
-continued
(C-25) 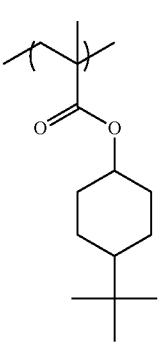 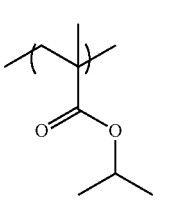 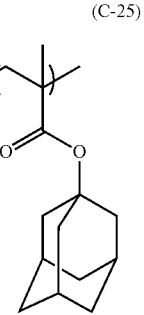
(C-26) 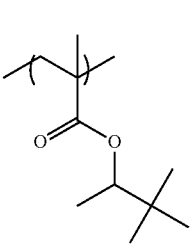 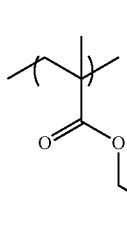
(C-27) 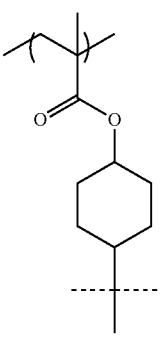
(C-28)
TABLE 2
| Resin | Compositional ratio | Mw | Mw/Mn |
|---|---|---|---|
| C-1 | 50/50 | 9,600 | 1.74 |
| C-2 | 60/40 | 34,500 | 1.43 |
| C-3 | 30/70 | 19,300 | 1.69 |
| C-4 | 90/10 | 26,400 | 1.41 |
| C-5 | 100 | 27,600 | 1.87 |
| C-6 | 80/20 | 4,400 | 1.96 |
| C-7 | 100 | 16,300 | 1.83 |
| C-8 | 5/95 | 24,500 | 1.79 |
| C-9 | 20/80 | 15,400 | 1.68 |
| C-10 | 50/50 | 23,800 | 1.46 |
| C-11 | 100 | 22,400 | 1.57 |

TABLE 2-continued

| Resin | Compositional ratio | Mw | Mw/Mn |
|---|---|---|---|
| C-12 | 10/90 | 21,600 | 1.52 |
| C-13 | 100 | 28,400 | 1.58 |
| C-14 | 50/50 | 16,700 | 1.82 |
| C-15 | 100 | 23,400 | 1.73 |
| C-16 | 60/40 | 18,600 | 1.44 |
| C-17 | 80/20 | 12,300 | 1.78 |
| C-18 | 40/60 | 18,400 | 1.58 |
| C-19 | 70/30 | 12,400 | 1.49 |
| C-20 | 50/50 | 23,500 | 1.94 |
| C-21 | 10/90 | 7,600 | 1.75 |
| C-22 | 5/95 | 14,100 | 1.39 |
| C-23 | 50/50 | 17,900 | 1.61 |
| C-24 | 10/90 | 24,600 | 1.72 |
| C-25 | 50/40/10 | 23,500 | 1.65 |
| C-26 | 60/30/10 | 13,100 | 1.51 |
| C-27 | 50/50 | 21,200 | 1.84 |
| C-28 | 10/90 | 19,500 | 1.66 |

In Table 2 above, the compositional ratios of the repeating units are the molar ratios.

[5] Acid Diffusion Control Agent

The active-light-sensitive or radiation-sensitive resin composition of the present invention preferably contains an acid diffusion control agent. The acid diffusion control agent is preferably different from the basic compound (A) as described above. The acid diffusion control agent acts as a quencher that inhibits a reaction of the acid-decomposable resin (resin (P)) in the unexposed area by excessive generated acids by trapping the acids generated from an acid generator or the like upon exposure. As the acid diffusion control agent, (i) a basic compound, (ii) a low molecular compound having a group that leaves by the action of an acid and nitrogen atom, (iii) a basic compound whose basicity is reduced or lost upon irradiation with active light or radiation, or (iv) an onium salt that becomes a relatively weak acid with respect to a photoacid generator can be used.

Preferred examples of the basic compound include compounds having structures represented by the following General Formulae (A) to (E).

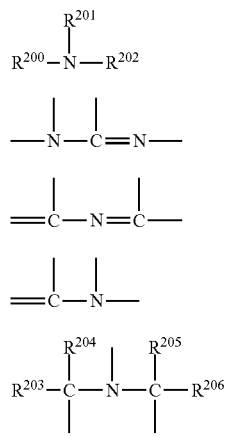

In General Formulae (A) to (E),
$R^{200}$, $R^{201}$, and $R^{202}$ may be the same as or different from each other, and represent a hydrogen atom, an alkyl group (preferably having 1 to 20 carbon atoms), a cycloalkyl group (preferably having 3 to 20 carbon atoms) or an aryl group (having 6 to 20 carbon atoms), in which $R^{201}$ and $R^{202}$ may be bonded to each other to form a ring.

$R^{203}$, $R^{204}$, $R^{205}$, and $R^{206}$ may be the same as or different from each other, and represent an alkyl group having 1 to 20 carbon atoms.

Regarding the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl group in each of General Formulae (A) to (E) is more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure: an alkylamine derivative having a hydroxyl group and/or an ether bond; and an aniline derivative having a hydroxyl group and/or an ether bond.

Specific examples of the preferred compound include the compounds exemplified in <0379> of US2012/0219913A1.

Moreover, the following compounds are also preferable as the basic compound.

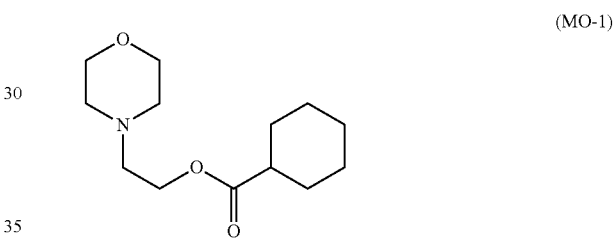

(MO-1)

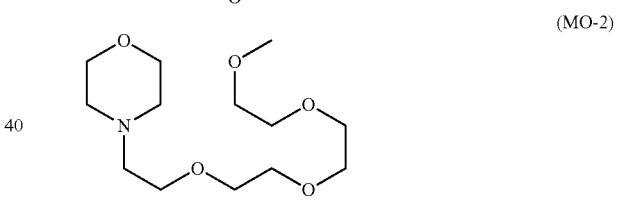

(MO-2)

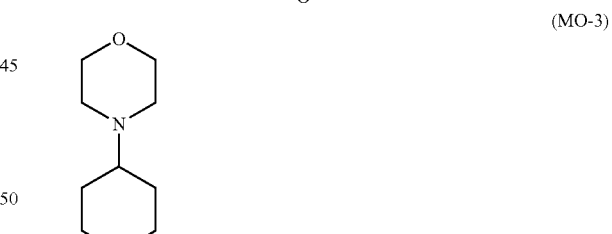

(MO-3)

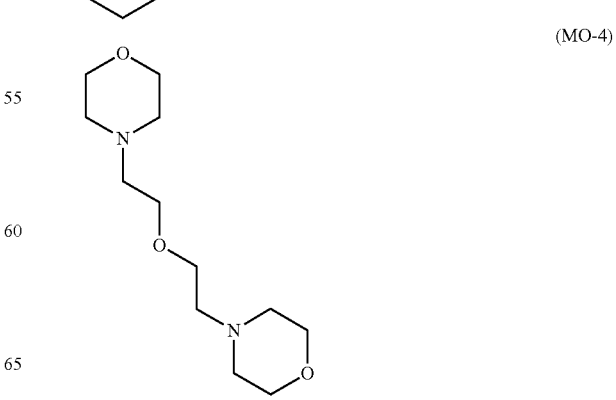

(MO-4)

(MO-5)

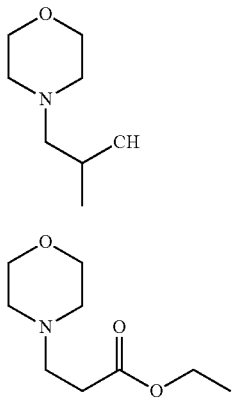

(MO-6)

As the basic compound, the compounds described in [0180] to [0225] of JP2011-22560A, [0218] and [0219] of JP2012-137735A, and [0416] to [0438] of WO2011/158687A1, and the like can also be used, in addition to the compounds as described above.

These basic compounds may be used singly or in combination of two or more kinds thereof.

The active-light-sensitive or radiation-sensitive resin composition of the present invention may or may not contain the basic compound, but in a case where it contains the basic compound, the content of the basic compound is preferably 0.001% to 10% by mass, and more preferably 0.01% to 5% by mass, with respect to the solid content of the composition.

The ratio between the photoacid generator and the basic compound to be used in the composition is preferably photoacid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The photoacid generator/basic compound (molar ratio) is more preferably 5.0 to 200, and still more preferably 7.0 to 150.

The low molecular compound (hereinafter referred to as a "compound (C)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group are preferable, and a carbamate group or a hemiaminal ether group is particularly preferable.

The molecular weight of the compound (C) is preferably 100 to 1,000, more preferably 100 to 700, and particularly preferably 100 to 500.

The compound (C) may have a carbamate group having a protecting group on a nitrogen atom. The protecting group constituting the carbamate group can be represented by the following General Formula (d-1).

(d-1)

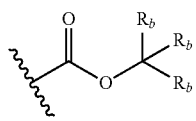

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably a linear or branched alkyl group or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Specific examples of the structure of the group represented by General Formula (d-1) include, but are not limited to, the structures disclosed in paragraph <0466> of US2012/0135348A1.

The compound (C) particularly preferably has a structure represented by the following General Formula (6).

(6)

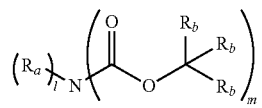

In General Formula (6), Ra represents a hydrogen atom, an alkyl group, a cycloalkyl group, an aryl group, or an aralkyl group. When l is 2, two $R_a$'s may be the same as or different from each other. Two $R_a$'s may be linked to each other to form a heterocycle together with the nitrogen atom in the formula. The heterocycle may contain a heteroatom other than the nitrogen atom in the formula.

$R_b$ has the same meaning as $R_b$ in General Formula (d-1), and preferred examples are also the same. l represents an integer of 0 to 2, and m represents an integer of 1 to 3, satisfying 1+m=3.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (such the alkyl group, a cycloalkyl group, aryl group, and aralkyl group may be substituted with the groups as described above) of $R_a$ include the same groups as the specific examples as described above with respect to $R_b$.

Specific examples of the particularly preferred compounds (C) in the present invention are shown below, but the present invention is not limited thereto.

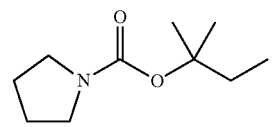

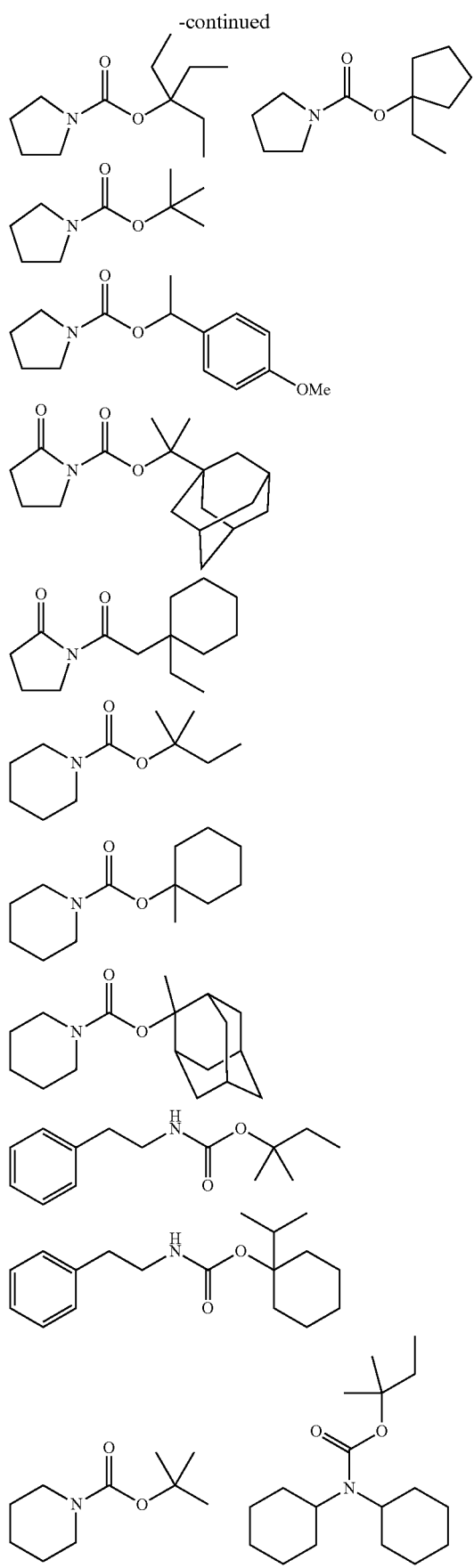
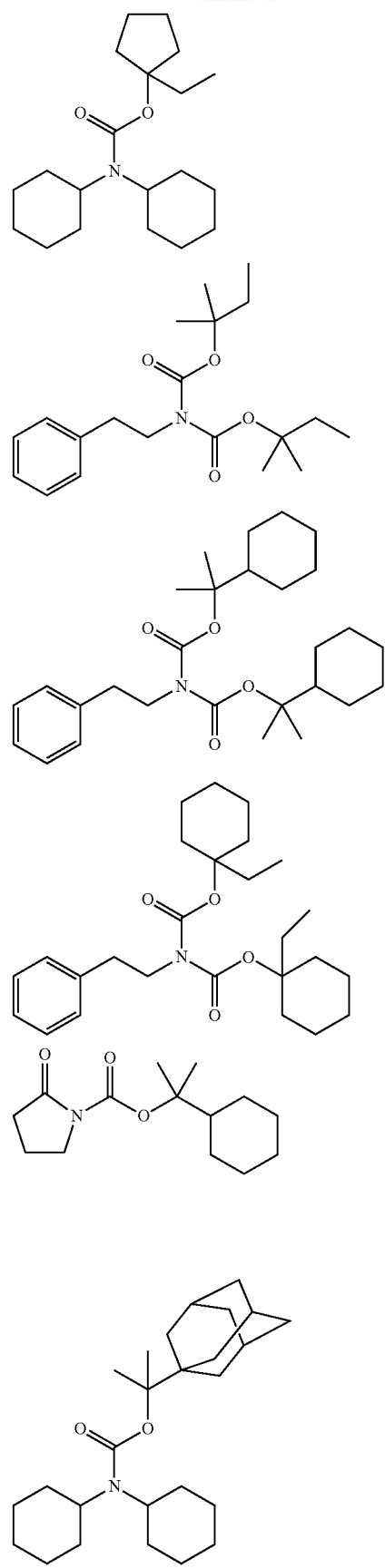

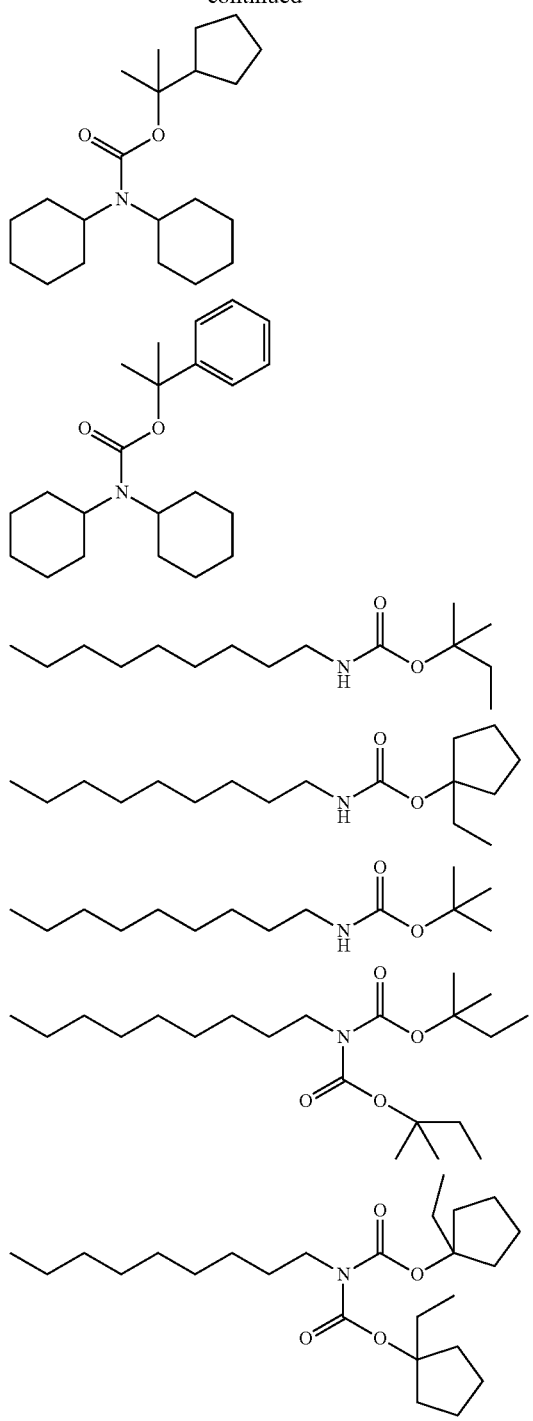
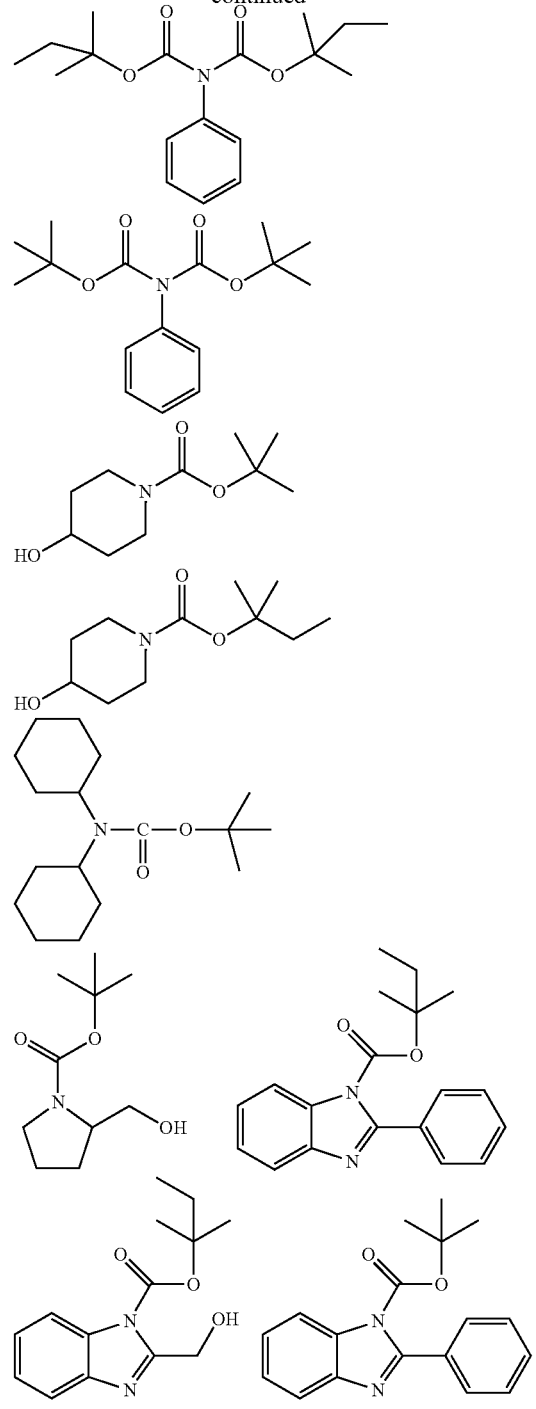
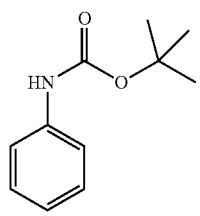

The compounds represented by General Formula (6) can be synthesized in accordance with JP2007-298569A, JP2009-199021A, and the like.

In the present invention, the compound (C) may be used singly or in combination of two or more kinds thereof.

The content of the compound (C) in the active-light-sensitive or radiation-sensitive resin composition of the present invention is preferably 0.001% to 20% by mass, more preferably 0.001% to 10% by mass, and still more preferably 0.01% to 5% by mass, with respect to the total solid content of the composition.

The basic compound whose basicity is reduced or lost upon irradiation with active light or radiation (hereinafter also referred to as a "compound (PA)") is a compound which has a functional group with proton acceptor properties, and decomposes under irradiation with active light or radiation to exhibit deterioration in proton acceptor properties, no proton acceptor properties, or a change from the proton acceptor properties to acid properties. The definition and the preferred ranges of the functional group with proton acceptor properties are the same as those described above for the basic compound (A).

The compound (PA) generates, for example, a compound represented by the following General Formula (PA-1) as a proton adduct generated by decomposition upon irradiation with active light or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

Q-A-(X)$_n$—B—R    (PA-1)

In General Formula (PA-1),

Q represents —SO$_3$H, —CO$_2$H, or —W$_1$NHW$_2$R$_f$, in which R$_f$ represents an alkyl group (preferably having 1 to 20 carbon atoms), a cycloalkyl group (preferably having 3 to 20 carbon atoms), or an aryl group (preferably having 6 to 30 carbon atoms), and W$_1$ and W$_2$ each independently represent —SO$_2$— or —CO—.

A represents a single bond or a divalent linking group.

X represents —SO$_2$— or —CO—.

n represents 0 or 1.

B represents a single bond, an oxygen atom, or —N(R$_x$)R$_y$—, in which R$_x$ represents a hydrogen atom or a monovalent organic group, and R$_y$ represents a single bond or a divalent organic group, provided that R$_x$ may be bonded to R$_y$ to form a ring or may be bonded to R to form a ring.

R represents a monovalent organic group having a functional group with proton acceptor properties.

General Formula (PA-1) will be described in more detail.

The divalent linking group in A is preferably a divalent linking group having 2 to 12 carbon atoms, such as and examples thereof include an alkylene group and a phenylene group. The divalent linking group is more preferably an alkylene group having at least one fluorine atom, which preferably has 2 to 6 carbon atoms, and more preferably has 2 to 4 carbon atoms. The alkylene chain may contain a linking group such as an oxygen atom and a sulfur atom. In particular, the alkylene group is preferably an alkylene group in which 30% to 100% by number of the hydrogen atoms are substituted with fluorine atoms, and more preferably, the carbon atom bonded to the Q site has a fluorine atom. The alkylene group is still more preferably a perfluoroalkylene group, and even still more preferably a perfluoroethylene group, a perfluoropropylene group, or a perfluorobutylene group.

The monovalent organic group in R$_x$ is preferably an organic group having 1 to 30 carbon atoms, and examples thereof include an alkyl group, a cycloalkyl group, an aryl group, an aralkyl group, and an alkenyl group. These groups may further have a substituent.

The alkyl group in R$_x$ may have a substituent, is preferably a linear and branched alkyl group having 1 to 20 carbon atoms, and may have an oxygen atom, a sulfur atom, or a nitrogen atom in the alkyl chain.

The cycloalkyl group in R$_x$ may have a substituent, is preferably a monocyclic cycloalkyl group or a polycyclic cycloalkyl group having 3 to 20 carbon atoms, and may have an oxygen atom, a sulfur atom, or a nitrogen atom in the ring.

The aryl group in R$_x$ may have a substituent, is preferably an aryl group having 6 to 14 carbon atoms, and examples thereof include a phenyl group and a naphthyl group.

The aralkyl group in R$_x$ may have a substituent and is preferably an aralkyl group having 7 to 20 carbon atoms, and examples thereof include a benzyl group and a phenethyl group.

The alkenyl group in R$_x$ may have a substituent and may be linear, branched, or chained. The alkenyl group is preferably an alkenyl group having 3 to 20 carbon atoms. Examples of the alkenyl group include a vinyl group, an allyl group, and a styryl group.

Examples of a substituent in a case where R$_x$ further has a substituent include a halogen atom, a linear, branched, or cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxyl group, an alkoxy group, an aryloxy group, an alkylthio group, an arylthio group, a heterocyclic oxy group, an acyloxy group, an amino group, a nitro group, a hydrazino group, and a heterocyclic group.

Preferred examples of the divalent organic group in R$_y$ include an alkylene group.

Examples of the ring structure which may be formed by the mutual bonding of R$_x$ and R$_y$ include a 5- to 10-membered ring, and particularly preferably a 6-membered ring, each containing a nitrogen atom.

The functional group with proton acceptor properties in R is the same as above, and examples thereof include groups having a heterocyclic aromatic, nitrogen-containing structure such as azacrown ether, primary to tertiary amines, pyridine, and imidazole.

The organic group having such a structure is preferably an organic group having 4 to 30 carbon atoms, and examples thereof include an alkyl group, a cycloalkyl group, an aryl group, an aralkyl group, and an alkenyl group.

In the alkyl group, the cycloalkyl group, the aryl group, the aralkyl group, or the alkenyl group containing a functional group with proton acceptor properties or an ammonium group in R, the alkyl group, the cycloalkyl group, the aryl group, the aralkyl group, or the alkenyl group is the same as the alkyl group, the cycloalkyl group, the aryl group, the aralkyl group, or the alkenyl group as mentioned as R$_x$, respectively.

When B is —N(R$_x$)R$_y$—, it is preferable that R and R$_x$ are bonded to each other to form a ring. The formation of a ring structure improves the stability and enhances the storage stability of a composition using the same. The number of carbon atoms which form a ring is preferably 4 to 20, the ring may be monocyclic or polycyclic, and an oxygen atom, a sulfur atom, or a nitrogen atom may be contained in the ring.

Examples of the monocyclic structure include a 4-membered ring, a 5-membered ring, a 6-membered ring, a 7-membered ring, and a 8-membered ring, each containing a nitrogen atom, or the like. Examples of the polycyclic structure include structures formed by a combination of two, or three or more monocyclic structures.

R$_f$ of —W$_1$NHW$_2$R$_f$ represented by Q is preferably an alkyl group having 1 to 6 carbon atoms, which may have a fluorine atom, and more preferably a perfluoroalkyl group having 1 to 6 carbon atoms. Further, it is preferable that at least one of $W_1$ or $W_2$ is —$SO_2$—, with a case where both $W_1$ and $W_2$ are —$SO_2$— being more preferable.

Q is particularly preferably —$SO_3H$ or —$CO_2H$ from the viewpoint of the hydrophilicity of an acid group.

The compound represented by General Formula (PA-1) in which Q site is sulfonic acid can be synthesized by a common sulfonamidation reaction. For example, the compound can be synthesized by a method in which one sulfonyl halide moiety of a bissulfonyl halide compound is selectively reacted with an amine compound to form a sulfonamide bond, and then the another sulfonyl halide moiety thereof is hydrolyzed, or a method in which a cyclic sulfonic acid anhydride is reacted with an amine compound to cause ring opening.

The compound (PA) is preferably an ionic compound. The functional group with proton acceptor properties may be contained in any one of an anion moiety and a cation moiety, and the functional group is preferably included in an anion site. Specifically, the following compounds are preferable, but are not limited thereto.

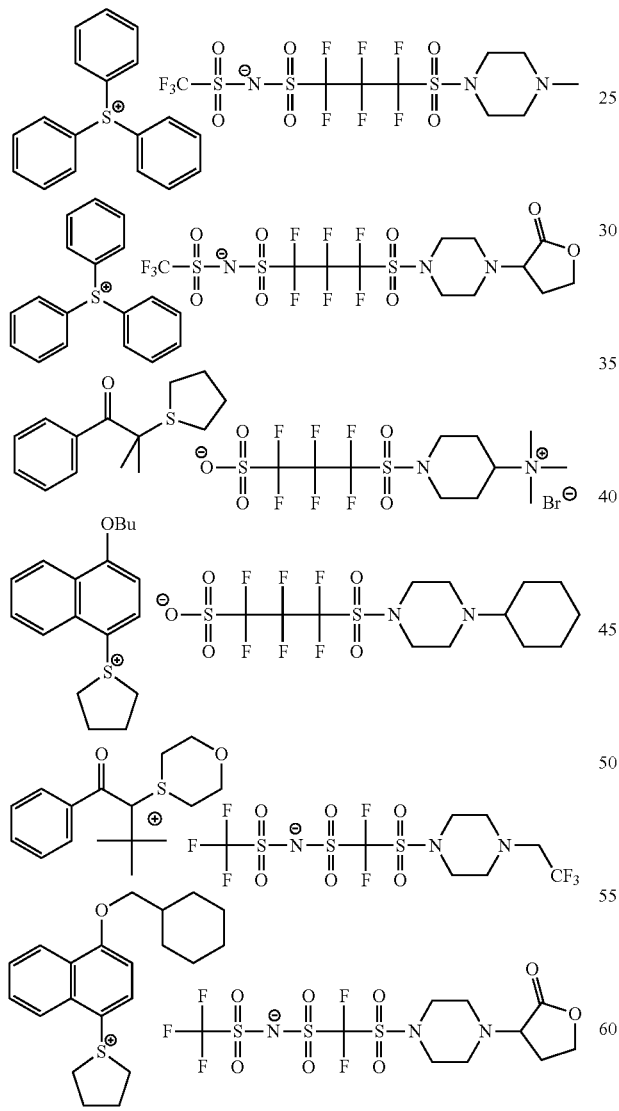

Furthermore, as the compound (PA), a compound represented by the following General Formula (7) is also preferable.

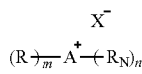

(7)

In the formula. A represents a sulfur atom or an iodine atom.

m represents 1 or 2 and n represents 1 or 2, provided that m+n=3 when A is a sulfur atom and that m+n=2 when A is an iodine atom.

R represents an aryl group.

$R_N$ represents an aryl group substituted with the functional group with proton acceptor properties, and $X^-$ represents a counter anion.

Specific examples of $X^-$ include the same anions as those of the photoacid generators (B) as described above.

Specific preferred examples of the aryl group of R and $R_N$ include a phenyl group.

Specific examples of the functional group with proton acceptor properties contained in $R_N$ are the same as those of the functional group with proton acceptor properties as described above in Formula (PA-1).

Specific examples of the ionic compounds having a proton acceptor site at a cation moiety include the compounds exemplified in <0291> of US2011/0269072A1.

Furthermore, such compounds can be synthesized, for example, with reference to the methods described in JP2007-230913A, JP2009-122623A, and the like.

The compound (PA) may be used singly or in combination of two or more kinds thereof.

The content of the compound (PA) is preferably 0.1% to 10% by mass, and more preferably 1% to 8% by mass, with respect to the total solid content of the composition.

In the active-light-sensitive or radiation-sensitive resin composition of the present invention, an onium salt which becomes a relatively weak acid with respect to the photoacid generator can be used as an acid diffusion control agent.

In a case of mixing the photoacid generator and an onium salt that generates an acid which is a relatively weak acid with respect to an acid generated from the photoacid generator, and using the mixture, when the acid generated from the photoacid generator upon irradiation with active light or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the photoacid generator, compounds represented by the following General Formulae (d1-1) to (d1-3) are preferable.

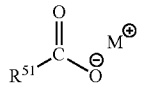

(d1-1)

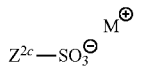

(d1-2)

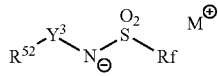

(d1-3)

In the formulae, $R^{51}$ is a hydrocarbon group which may have a substituent, $Z^{2c}$ is a hydrocarbon group (provided that carbon adjacent to an S atom is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group containing a fluorine atom, and $M^+$'s are each independently a sulfonium or iodonium cation.

Preferred examples of the sulfonium cation or the iodonium cation represented by $M^+$ include the sulfonium cations in General Formula (ZI) as described above and the iodonium cations in General Formula (ZII) as described above.

Preferred examples of the anion moiety of the compound represented by General Formula (d1-1) include the structures exemplified in paragraph [0198] of JP2012-242799A.

Preferred examples of the anion moiety of the compound represented by General Formula (d1-2) include the structures exemplified in paragraph [0201] of JP2012-242799A.

Preferred examples of the anion moiety of the compound represented by General Formula (d1-3) include the structures exemplified in paragraphs [0209] and [0210] of JP2012-242799A.

The onium salt which becomes a relatively weak acid with respect to the photoacid generator may be a compound (hereinafter also referred to as an "onium salt (C)") having a cation site (C) and an anion site in the same molecule, in which the cation site and the anion site are linked to each other via a covalent bond.

As the onium salt (C), a compound represented by any one of the following General Formulae (C-1) to (C-3) is preferable.

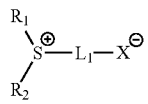
(C-1)

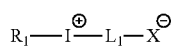
(C-2)

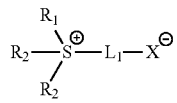
(C-3)

In General Formulae (C-1) to (C-3).

$R_1$, $R_2$, and $R_3$ represent a substituent having 1 or more carbon atoms.

$L_1$ represents a divalent linking group that links a cation site with an anion site, or a single bond.

—$X^-$ represents an anion site selected from —COO$^-$, —SO$_3^-$, —SO$_2^-$, and —N$^-$—R$_4$, R$_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to one another to form a ring structure. Further, in (C-3), two members out of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, an ester bond, amide bond, a urethane bond, a urea bond, and a group formed by a combination of two or more kinds of these groups. $L_1$ is more preferably alkylene group, an arylene group, an ether bond, an ester bond, and a group formed by a combination of two or more kinds of these groups.

Preferred examples of the compound represented by General Formula (C-1) include the compounds exemplified in paragraphs [0037] to [0039] of JP2013-6827A and paragraphs [0027] to 100291 of JP2013-8020A.

Preferred examples of the compound represented by General Formula (C-2) include the compounds exemplified in paragraphs [0012] and [0013] of JP2012-189977A.

Preferred examples of the compound represented by General Formula (C-3) include the compounds exemplified in paragraphs [0029] to [0031] of JP2012-252124A.

The content of the onium salt which becomes a relatively weak acid with respect to the photoacid generator is preferably 0.5% to 10.0% by mass, more preferably 0.5% to 8.0% by mass, and still more preferably 1.0% to 8.0% by mass, with respect to the solid content of the composition.

[6] Solvent

The active-light-sensitive or radiation-sensitive resin composition of the present invention preferably includes a solvent.

Examples of the solvent which can be used in the preparation of the active-light-sensitive or radiation-sensitive resin composition of the present invention by dissolving the respective components include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl ester of lactic acid include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone include β-propiolactone, β-butyrolactone, γ-butyrolactone, α-methyl-γ-butyrolactone. β-methyl-γ-butyrolactone, γ-valerolactone, γ-caprolactone, γ-octanoic lactone, and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4- tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxy acetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C., or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the present invention, the solvents may be used singly or in combination of two or more kinds thereof.

In the present invention, a mixed solvent prepared by mixing a solvent containing a hydroxyl group in its structure with a solvent not containing a hydroxyl group in its structure may be used as an organic solvent.

As the solvent containing a hydroxyl group and the solvent not containing a hydroxyl group, the exemplified compounds as described above can be appropriately selected, as the solvent containing a hydroxyl group, alkylene glycol monoalkyl ether, alkyl lactate, and the like are preferable, and propylene glycol monomethyl ether and ethyl lactate are more preferable. Further, as the solvent not containing a hydroxyl group, alkylene glycol monoalkyl ether acetate, alkylalkoxypropionate, a monoketone compound which may contain a ring, cyclic lactone, alkyl acetate, and the like are preferable, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxvpropionate, and 2-heptanone are most preferable.

The mixing ratio (based on mass) of a solvent containing a hydroxyl group and a solvent not containing a hydroxyl group is 1/99 to 99/1, preferably 10/90 to 90/10, and more preferably 20/80 to 60/40. A mixed solvent containing the solvent not containing a hydroxyl group in the amount of 50% by mass or more is particularly preferable from the viewpoint of coating evenness.

In addition, from other viewpoints, the solvent is preferably a mixed solvent of two or more kinds of solvents, containing propylene glycol monomethyl ether acetate. A mixed solvent including at least propylene glycol monomethyl ether acetate and cyclohexanone, or a mixed solvent including at least propylene glycol monomethyl ether acetate and γ-butyrolactone are more preferable.

A mixed solvent including at least three kinds of propylene glycol monomethyl ether acetate, cyclohexanone, and γ-butyrolactone is particularly preferable.

The mixing ratio (based on mass) of propylene glycol monomethyl ether acetate to other solvents is 1/99 to 99/1, and preferably 10/90 to 90/10. A mixed solvent having a proportion of propylene glycol monomethyl ether acetate of 50% by mass or more is particularly preferable from the viewpoint of coating evenness.

The solid content concentration of the radiation-sensitive or active-light-sensitive resin composition of the present invention is preferably 1% to 40% by mass, more preferably 1% to 30% by mass, and still more preferably 3% to 20% by mass.

[7] Surfactant

The active-light-sensitive or radiation-sensitive resin composition of the present invention may further contain a surfactant. In a case where the composition further contains the surfactant, it preferably contains any one of fluorine- and/or silicon-based surfactants (a fluorine-based surfactant, a silicon-based surfactant, and a surfactant having both a fluorine atom and a silicon atom), or two or more kinds thereof.

By incorporating the surfactant into the active-light-sensitive or radiation-sensitive resin composition of the present invention, it becomes possible to provide a resist pattern which is improved in adhesiveness and decreased in development defects with good sensitivity and resolution when an exposure light source of 250 nm or less, and particularly 220 nm or less, is used.

Examples of the fluorine- and/or silicon-based surfactants include the surfactants described in <0276> of US2008/0248425A, and examples thereof include EFTOP EF301 and EF303 (manufactured by Shin-Akita Kasei K. K.); FLORAD FC430, 431, and 4430 (manufactured by Sumitomo 3M Inc.); MEGAFACE F171, F173, F176, F189, F113. F110, F177, F120, and R08 (manufactured by DIC Corp.): Surflon S-382, SC 101, 102, 103, 104, 105, and 106 (manufactured by Asahi Glass Co., Ltd.): TROYSOL S-366 (manufactured by Troy Chemical Corp.); GF-300 and GF-150 (manufactured by Toagosei Chemical Industry Co., Ltd.): SURFLON S-393 (manufactured by Seimi Chemical Co., Ltd.); EFTOP EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA), and FTX-204G, 208G, 218G, 230G, 204D, 208D, 212D, 218D, and 222D (manufactured by NEOS Co., Ltd.). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoro-aliphatic group derived from a fluoro-aliphatic compound which is produced by a telomerization method (also referred to as a telomer method) or an oligomerization method (also referred to as an oligomer method), can be used as the surfactant. The fluoro-aliphatic compound can be synthesized in accordance with the method described in JP2002-90991A.

The polymer having a fluoro-aliphatic group is preferably a copolymer of a fluoro-aliphatic group-containing monomer with a (poly(oxyalkylene))acrylate and/or a (poly(oxyalkylene))methacrylate, and the polymer may have an irregular distribution or may be a block copolymer.

Examples of the poly(oxyalkylene) group include a poly(oxyethylene) group, a poly(oxypropylene) group, and a poly(oxybutylene) group. This group may also be a unit having alkylenes differing in the chain length within the same chain, such as block-linked poly(oxyethylene, oxypropylene, and oxyethylene) and block-linked poly(oxyethylene and oxypropylene). Furthermore, the copolymer of a fluoro-aliphatic group-containing monomer and a (poly(oxyalkylene))acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene))acrylates (or methacrylates).

Examples of the commercially available surfactant corresponding to the above include MEGAFACE F178, F-470, F-473, F-475, F-476, and F-472 (manufactured by DIC Corp.); a copolymer of an acrylate (or methacrylate) having a $C_6F_{13}$ group with a (poly(oxyalkylene)) acrylate (or methacrylate): and a copolymer of an acrylate (or methacrylate) having a $C_3F_7$ group with a (poly(oxyethylene)) acrylate (or methacrylate) and a (poly(oxypropylene)) acrylate (or methacrylate).

In addition, in the present invention, a surfactant other than the fluorine- and/or silicon-based surfactants described in <0280> of US2008/0248425A can also be used.

These surfactants may be used singly or in combination of a few surfactants.

The radiation-sensitive or active-light-sensitive resin composition of the present invention may or may not contain a surfactant, but in a case where the composition contains a surfactant, the content of the surfactant is preferably 0.0001% to 2% by mass, and more preferably 0.0005% to 1% by mass, with respect to the total solid content amount (excluding the solvent) of the active-light-sensitive or radiation-sensitive resin composition.

[8] Dissolution Inhibiting Compound Having Molecular Weight of 3,000 or Less, which Decomposes by Action of Acid to Enhance Solubility in Alkaline Developer The radiation-sensitive or active-light-sensitive resin composition of the present invention may contain a dissolution inhibiting compound having a molecular weight of 3,000 or less, which decomposes by the action of an acid to enhance the solubility in an alkaline developer.

As the dissolution inhibiting compound having a molecular weight of 3,000 or less, which decomposes by the action of an acid to enhance the solubility in an alkaline developer (hereinafter also referred to as a "dissolution inhibiting compound"), an alicyclic or aliphatic compound which contains an acid-decomposable group such as a cholic acid derivative which includes an acid-decomposable group described in the Proceeding of SPIE, 2724, 355 (1996) is preferable since the transparency with respect to light having a wavelength of 220 nm or less is not reduced. Examples of the acid-decomposable group and the alicyclic structure include the same ones as described for the resin (P), respectively.

Furthermore, in a case where the active-light-sensitive or radiation-sensitive resin composition of the present invention is exposed to a KrF excimer laser or irradiated with electron beams, the dissolution inhibiting compound is preferably a compound including a structure in which the phenolic hydroxyl group of a phenol compound is substituted with an acid-decomposable group. As the phenol compound, a phenol compound containing 1 to 9 phenol skeletons is preferable, and a phenol compound having 2 to 6 phenol skeletons is more preferable.

The radiation-sensitive or active-light-sensitive resin composition of the present invention may or may not contain the dissolution inhibiting compound, but in a case where the composition contains the dissolution inhibiting compound, the content of the dissolution inhibiting compound is preferably 3% to 50% by mass, and more preferably 5% to 40%/c by mass, with respect to the solid content of the radiation-sensitive or active-light-sensitive resin composition.

Specific examples of the dissolution inhibiting compound are shown below, but the present invention is not limited thereto.

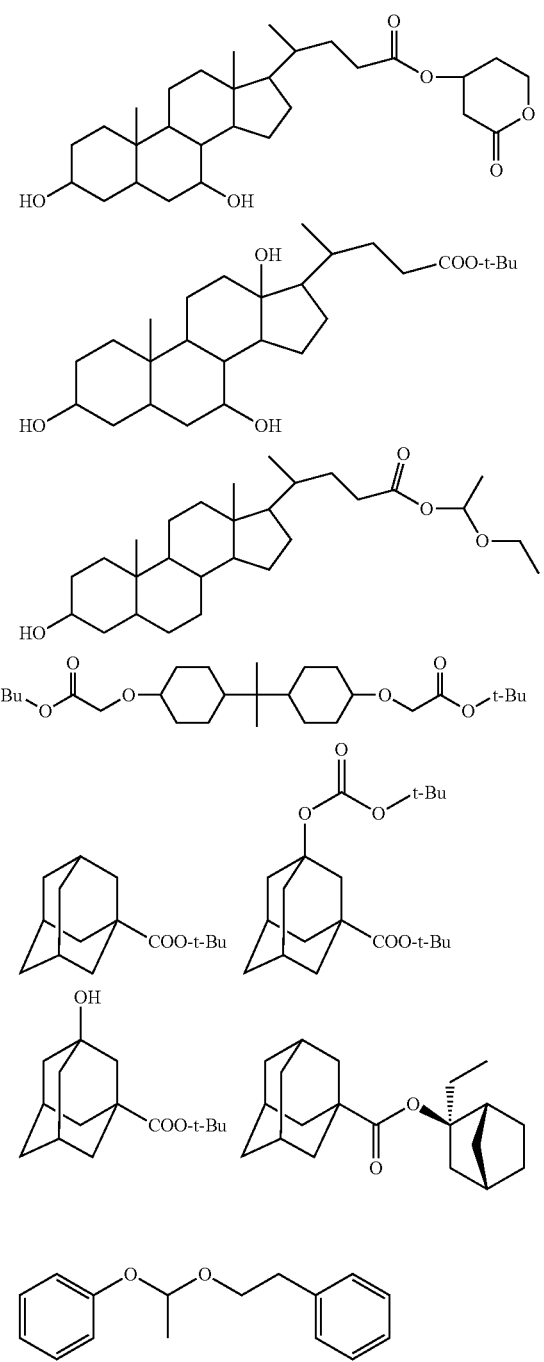

-continued

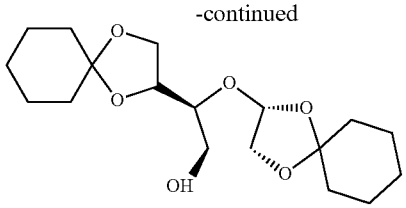

<Other Additives>

The active-light-sensitive or radiation-sensitive resin composition of the present invention may further contain a dye, a plasticizer, a light sensitizer, a light absorbent, and a compound that promotes solubility in a developer (for example, a phenol compound having a molecular weight of 1,000 or less, and an alicyclic or aliphatic compound having a carboxyl group), or the like, if desired.

Such a phenol compound having a molecular weight of 1,000 or less can be easily synthesized by those skilled in the art with reference to the method disclosed in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include, but are not limited to, a carboxylic acid derivative having a steroid structure such as cholic acid, deoxycholic acid, and lithocholic acid, an adamantane carboxylic acid derivative, adamantane dicarboxylic acid, cyclohexane carboxylic acid, and cyclohexane dicarboxylic acid.

[Pattern Forming Method]

Next, the pattern forming method of the present invention will be described.

The pattern forming method of the present invention includes at least:

(1) forming an active-light-sensitive or radiation-sensitive film, using the active-light-sensitive or radiation-sensitive resin, (2) exposing the active-light-sensitive or radiation-sensitive film, and (3) developing the exposed active-light-sensitive or radiation-sensitive film with a developer.

The exposure in the step (2) may be liquid immersion exposure.

The pattern forming method of the present invention preferably includes a heating step (4) after the exposing step (2).

The pattern forming method of the present invention may further include the exposing step (2) in plural times.

The pattern forming method of the present invention may include the heating step (4) in plural times.

The active-light-sensitive or radiation-sensitive film of the present invention is formed, using the active-light-sensitive or radiation-sensitive resin composition of the present invention, and more specifically, it is preferably a film formed by applying the active-light-sensitive or radiation-sensitive resin composition of the present invention. In the pattern forming method of the present invention, forming the film (active-light-sensitive or radiation-sensitive film) on a substrate, exposing the film, and a developing step can be carried out by a generally known method (for example, spin coating).

Furthermore, the substrate onto which the composition of the present invention is applied not particularly limited, and it is possible to use an inorganic substrate such as silicon, SiN, $SiO_2$, and TiN, a coating type inorganic substrate such as SOG, or a substrate generally used in a process for manufacturing a semiconductor such as an IC, in a process for manufacture of liquid crystals and a circuit board for a thermal head or the like, and in other lithographic processes of photofabrication. Further, if desired, an antireflection film (BARC) may be formed between the active-light-sensitive or radiation-sensitive film and the substrate. As the antireflection film, a known organic or inorganic antireflection film can be appropriately used (see, for example, U.S. Pat. No. 8,669,042B). In addition, an antireflection film (TARC) may also be formed on the upper layer of the active-light-sensitive or radiation-sensitive film.

It is also preferable that the method includes a pre-heating step (Prebake; PB) after forming the film and before the exposing step. In addition, it is also preferable that the method includes a post-exposure heating step (PEB; Post Exposure Bake) after forming the film and before the developing step.

For both of PB and PEB, the heating is preferably carried out at a heating temperature of 70° C. to 130° C., and more preferably 80° C. to 120° C.

The heating time is preferably 30 to 300 seconds, more preferably 30 to 180 seconds, and still more preferably 30 to 90 seconds.

Heating can be carried out using a means installed in an ordinary exposure machine or development machine, or may also be carried out using a hot plate or the like.

Baking accelerates the reaction in the exposed areas, and thus, the sensitivity and the pattern profile are enhanced.

The light source wavelength used in the exposure apparatus in the present invention is not limited, and examples thereof include infrared rays, visible light, ultraviolet rays, far ultraviolet rays, extreme ultraviolet rays. X-rays, and electron beams, for example, far ultraviolet rays at a wavelength of preferably 250 nm or less, more preferably 220 nm or less, and particularly preferably 1 to 200 nm, specifically a KrF excimer laser (248 nm), an ArF excimer laser (193 nm), an $F_2$ excimer laser (157 nm), X-rays, EUV (13 nm), electron beams, and the like, with the KrF excimer laser, the ArF excimer laser, EUV, or the electron beams being preferable, and the ArF excimer laser being more preferable.

Furthermore, a liquid immersion exposure method can be applied to the step of carrying out the exposure of the present invention. It is possible to combine the liquid immersion exposure method with super-resolution technology such as a phase shift method and a modified illumination method.

In a case of carrying out the liquid immersion exposure, rinsing the surface of a film with an aqueous chemical liquid may be carried out (A) after forming a film on a substrate and before an exposing step and/or (B) after subjecting the film to exposure through an immersion liquid and before heating the film.

The immersion liquid is preferably a liquid which is transparent to exposure wavelength and has a minimum temperature coefficient of refractive index so as to minimize the distortion of an optical image projected on the film. In particular, in a case where the exposure light source is an ArF excimer laser (wavelength: 193 nm), water is preferably used in terms of easy availability and easy handling, in addition to the above-described viewpoints.

In a case of using water, an additive (liquid) that decreases the surface tension of water while increasing the interfacial activity may be added at a slight proportion. It is preferable that this additive does not dissolve the resist layer on a substrate, and gives a negligible effect on the optical coat at the undersurface of a lens element.

Such an additive is preferably, for example, an aliphatic alcohol having a refractive index substantially equal to that of water, and specific examples thereof include methyl alcohol, ethyl alcohol, and isopropyl alcohol. By adding an alcohol having a refractive index substantially equal to that of water, even when the alcohol component in water is evaporated and its content concentration is changed, an advantage in that the change in the refractive index of the liquid as a whole can be advantageously made very small is obtained.

On the other hand, in a case where materials opaque to light at 193 nm or impurities having a great difference in the refractive index from water are incorporated, the distortion of an optical image projected on a resist is caused. Therefore, the water to be used is preferably distilled water. Further, pure water after filtration through an ion exchange filter or the like may also be used.

The electrical resistance of water used as the immersion liquid is preferably 18.3 MΩcm or less, and Total Organic Concentration (TOC) is preferably 20 ppb or less. The water is preferably one which has been subjected to a deaeration treatment.

In addition, it is possible to enhance the lithography performance by increasing the refractive index of the immersion liquid. From such a viewpoint, an additive for increasing the refractive index may be added to water, or heavy water ($D_2O$) may be used in place of water.

The receding contact angle of the resist film formed using the active-light-sensitive or radiation-sensitive resin composition of the present invention is preferably 700 or more at a temperature of 23° C.±3° C. at a humidity of 45%±5%, which is suitable in a case of the exposure through a liquid immersion medium. The receding contact angle is preferably 75° or more, and more preferably 75° to 850.

If the receding contact angle is extremely small, the resist film cannot be appropriately used in a case of the exposure through a liquid immersion medium. Further, it is not possible to sufficiently exhibit the effect of reducing defects due to remaining water (water marks). In order to realize a favorable receding contact angle, it is preferable to incorporate the hydrophobic resin (HR) as described above into the active-light-sensitive or radiation-sensitive resin composition. Alternatively, a film (hereinafter also referred to as a "top coat") which is sparingly soluble in an immersion liquid, which is formed of the hydrophobic resin (HR) as described above may be formed on the upper layer of the resist film. The functions required for the top coat are coating suitability on the upper layer part of a resist film, and sparing solubility in an immersion liquid. It is preferable that the top coat is not mixed with the composition film and can be uniformly applied onto the upper layer of a composition film.

Specific examples of the top coat include a hydrocarbon polymer, an acrylic acid ester polymer, a polymethacrylic acid, a polyacrylic acid, a polyvinyl ether, a silicon-containing polymer, and a fluorine-containing polymer. From the viewpoint that if impurities are eluted into the immersion liquid from the top coat, an optical lens is contaminated, it is preferable that a smaller amount of residual monomer components of the polymer is included in the top coat.

On peeling the top coat, a developer may be used, or a peeling agent may be separately used. As the peeling agent, a solvent which is less likely to permeate the film is preferable. From the viewpoint that this peeling step can be carried out simultaneously with the film developing step, the top coat is preferably peelable with a developer including an organic solvent.

When the difference in the refractive index between the top coat and the immersion liquid is null, the resolving power is improved. In a case where water is used as the immersion liquid, the refractive index of the top coat preferably has a refractive index close to that of the immersion liquid. From the viewpoint of making the refractive index close to that of the immersion liquid, it is preferable that the top coat has a fluorine atom. In addition, from the viewpoints of the transparency and the refractive index, it is preferable that the top coat is a thin film.

It is preferable that the top coat is unmixable with the film and further unmixable also with the immersion liquid. From this viewpoint, in a case where the immersion liquid is water, the solvent used for the top coat is preferably a medium that is sparingly soluble in the solvent used for the active-light-sensitive or radiation-sensitive resin composition of the present invention and is water-insoluble. Furthermore, in a case where the immersion liquid is an organic solvent, the top coat may be either water-soluble or water-insoluble. Hereinafter, the top coat composition used for formation of the top coat layer will be described.

The solvent used in the top coat composition in the present invention is preferably an organic solvent, and more preferably an alcohol-based solvent.

In a case where the solvent is an organic solvent, a solvent incapable of dissolving the resist film is preferable. As the solvent which can be used, an alcohol-based solvent, a fluorine-based solvent, or a hydrocarbon-based solvent is preferably used, and a fluorine-free alcohol-based solvent is more preferably used. The alcohol-based solvent is, from the viewpoint of coatability, preferably a primary alcohol, and more preferably a primary alcohol having 4 to 8 carbon atoms. As the primary alcohol having 4 to 8 carbon atoms, a linear, branched, or cyclic alcohol can be used, and preferred examples thereof include 1-butanol, 1-hexanol, 1-pentanol, 3-methyl-1-butanol, 2-ethylbutanol, and perfluorobutyl tetrahydrofuran.

Furthermore, as the resin for the top coat composition, the resins having an acidic group described in JP2009-134177A and JP2009-91798A can also be preferably used.

The weight-average molecular weight of the water-soluble resin is not particularly limited, but is preferably 2,000 to 1,000,000, more preferably 5,000 to 500,000, and particularly preferably 10,000 to 100,000. Here, the weight-average molecular weight of the resin indicates a molecular weight in terms of polystyrene measured by GPC (carrier: THF or N-methyl-2-pyrrolidone (NMP)).

In addition, as the top coat, a top coat including not only the resins as well as the basic compounds (quenchers) as described in JP2013-61647A, in particular, OC-5 to OC-11 of Table 3 in Examples of the document is also preferable. The top coat described in this document is considered to be particularly useful in a case where pattern formation is carried out using a developer including an organic solvent.

The pH of the top coat composition is not particularly limited, but is preferably 0 to 10, more preferably 0 to 8, and particularly preferably 1 to 7.

The concentration of the resin in the top coat composition is preferably 0.1% to 10% by mass, more preferably 0.2% to 5% by mass, and particularly preferably 0.3% to 3% by mass.

The top coat material may contain components other than the resin, but the proportion of the resin in the solid content of the top coat composition is preferably 80% to 100% by mass, more preferably 90% to 100% by mass, and particularly preferably 95% to 100% by mass.

The concentration of the solid content of the top coat composition in the present invention is preferably 0.1% to 10% by mass, more preferably 0.2% to 6% by mass, still more preferably 0.3% to 5% by mass. By adjusting the concentration of the solid content to fall in the range above, the top coat composition can be uniformly applied onto the resist film.

In the pattern forming method of the present invention, an active-light-sensitive or radiation-sensitive film (typically a resist film) can be formed on a substrate, using the active-light-sensitive or radiation-sensitive resin composition of the present invention, and a top coat layer can be formed on the resist film by using the top coat composition. The film thickness of the resist film is preferably 10 to 100 nm, and the film thickness of the top coat layer is preferably 10 to 200 nm, more preferably 20 to 100 nm, and particularly preferably 40 to 80 nm.

The method for applying the active-light-sensitive or radiation-sensitive resin composition on a substrate is preferably spin coating, and the rotation speed thereof is preferably 1,000 to 3,000 rpm.

For example, the active-light-sensitive or radiation-sensitive resin composition is applied onto such a substrate as used in the production of a precision integrated circuit device (for example, a silicon/silicon dioxide-coated substrate) by an appropriate coating method using a spinner, a coater, or the like, and then dried to form a resist film. Incidentally, a known antireflection film may be provided in advance by coating. In addition, it is preferable that the resist film is dried before forming a top coat layer.

Subsequently, the top coat composition is applied onto the obtained resist film by the same method as the method for forming the resist film, and dried, whereby a top coat layer can be formed.

The resist film having a top coat layer on the upper layer thereof is irradiated with active light or radiation, usually through a mask, then preferably baked (heated), and further developed, whereby a good pattern can be obtained.

In the liquid immersion exposing step, it is necessary for the immersion liquid to move on a wafer following the movement of an exposure head which scans the wafer at a high speed to form an exposure pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

The substrate on which the film is formed in the present invention is not particularly limited, and it is possible to use an inorganic substrate such as silicon, SiN, $SiO_2$, and TiN, a coating type inorganic substrate such as SOG, or a substrate generally used in a process for manufacturing a semiconductor such as an IC, in a process for manufacture of liquid crystals and a circuit board for a thermal head or the like, and in other lithographic processes of photofabrication. Further, if desired, an antireflection film may be formed between the resist film and the substrate. As the antireflection film, a known organic or inorganic antireflection film can be appropriately used.

The developer used in the step of developing the resist film formed using the active-light-sensitive or radiation-sensitive resin composition of the present invention is not particularly limited, but an alkaline developer or a developer containing an organic solvent (hereinafter also referred to as an organic developer), for example, can be used. It is particularly preferable that the developer is a developer including an organic solvent, and the formed pattern is a negative tone pattern.

In a case where the pattern forming method of the present invention includes carrying out development using an alkaline developer, the alkaline developer that can be used is not particularly limited, but generally, a 2.38% by mass aqueous tetramethylammonium hydroxide solution is preferable. In addition, an appropriate amount of alcohols or a surfactant may be added to the alkaline solution, and used.

The alkali concentration of the alkaline developer is usually 0.1% to 20% by mass.

The pH of the alkaline developer is usually 10.0 to 15.0.

Pure water is used as a rinsing liquid in the rinsing treatment which is carried out after the alkaline development, and it may also be used after adding an appropriate amount of a surfactant thereto.

In addition to those above, as the alkaline developer, an aqueous alkali solution of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkyl ammonium hydroxide such as tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, quaternary ammonium salts such as triethylphenylammonium hydroxide, trimethylbenzylammonium hydroxide, and triethylbenzylammonium hydroxide, or cyclic amines such as pyrrole and piperidine can be used.

Incidentally, after the development treatment or the rinsing treatment, a treatment for removing the developer or the rinsing liquid adhering on the pattern by a supercritical fluid may be carried out.

In a case where the pattern forming method of the present invention includes carrying out development using an organic developer, as the organic developer, a polar solvent such as a ketone-based solvent, an ester-based solvent, an alcohol-based solvent, an amide-based solvent, and an ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include dioxane and tetrahydrofuran, in addition to the glycol ether-based solvents above.

Examples of the amide-based solvent which can be used include N-methyl-2-pyrrolidone, N,N-dimethylacetamide. N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

The above solvents can be used by mixing a plurality of the solvents or by mixing the solvent with water or solvents other than the solvents. However, in order to sufficiently exhibit the effects of the present invention, the moisture content in the entire developer is preferably less than 10% by mass, but a developer having substantially no water is more preferable.

That is, the amount of the organic solvent to be used with respect to the organic developer is preferably from 90% by mass to 100% by mass, and more preferably from 95% by mass to 100% by mass, with respect to the total amount of the developer.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer at 20° C. is preferably 5 kPa or less, more preferably 3 kPa or less, and particularly preferably 2 kPa or less. By setting the vapor pressure of the organic developer to 5 kPa or less, the evaporation of the developer on the substrate or in a developing cup is inhibited, the temperature uniformity in the wafer surface is improved, and as a result, the dimensional uniformity within a wafer surface is improved.

It is possible to add an appropriate amount of a surfactant to the organic developer, if necessary.

The surfactant is not particularly limited, but it is possible to use, for example, ionic or non-ionic fluorine-based and/or silicon-based surfactants, or the like. Examples of the fluorine- and/or silicon-based surfactant include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP995-230165A (JP-H7-230165A), JP996-62834A (JP-H8-62834A), JP1997-54432A (JP-H9-54432A), JP1997-5988A (JP-H9-5988A), the specification of U.S. Pat. No. 5,405,720A, the specification of U.S. Pat. No. 5,360,692A, the specification of U.S. Pat. No. 5,529,881A, the specification of U.S. Pat. No. 5,296,330A, the specification of U.S. Pat. No. 5,436,098A, the specification of U.S. Pat. No. 5,576,143A, the specification of U.S. Pat. No. 5,294,511A, and the specification of U.S. Pat. No. 5,824,451A, and non-ionic surfactants are preferable. The non-ionic surfactant is not particularly limited, but it is more preferable to use a fluorine-based surfactant or a silicon-based surfactant.

The amount of the surfactant to be used is usually 0.001% to 5% by mass, preferably 0.005% to 2% by mass, and more preferably 0.01% to 0.5% by mass, with respect to the total amount of the developer.

The organic developer may also include a basic compound. Specific and preferred examples of the basic compound which can be included in the organic developer used in the present invention include the same ones as for the basic compound which can be included in the active-light-sensitive or radiation-sensitive resin composition as described above.

As the developing method, for example, a method in which a substrate is immersed in a tank filled with a developer for a certain period of time (a dip method), a method in which a developer is heaped up to the surface of a substrate by surface tension and developed by stopping for a certain period of time (a paddle method), a method in which a developer is sprayed on the surface of a substrate (a spray method), a method in which a developer is continuously discharged on a substrate spun at a constant rate while scanning a developer discharging nozzle at a constant rate (a dynamic dispense method), or the like, can be applied.

In a case where the various developing methods include discharging a developer toward a resist film from a development nozzle of a developing device, the discharge pressure of the developer discharged (the flow velocity per unit area of the developer discharged) is preferably 2 mL/sec/mm$^2$ or less, more preferably 1.5 mL/sec/mm$^2$ or less, and still more preferably 1 mL/sec/mm$^2$ or less. The flow velocity has no particular lower limit, but is preferably 0.2 mL/sec/mm$^2$ or more in consideration of a throughput.

By setting the discharge pressure of the discharged developer to the range as described above, pattern defects resulting from the resist scum after development may be significantly reduced.

Details on the mechanism are not clear, but it is thought to be due to a fact that the pressure imposed on the resist film by the developer is decreased by setting the discharge pressure to the above range so that the resist film and the resist pattern are inhibited from being inadvertently cut or collapsing.

Furthermore, the discharge pressure (mL/sec/mm$^2$) of the developer is the value at the outlet of the development nozzle in the developing device.

Examples of the method for adjusting the discharge pressure of the developer include a method of adjusting the discharge pressure by a pump or the like, and a method of supplying a developer from a pressurized tank and adjusting the pressure to change the discharge pressure.

In addition, after the step of carrying out development using a developer including an organic solvent, stopping the development while replacing the solvent with another solvent may also be carried out.

In the pattern forming method of the present invention, carrying out development by using a developer containing an organic solvent (organic solvent development step) and carrying out development by using an aqueous alkali solution (alkaline development step) may be used in combination. Due to this combination, a finer pattern can be formed. By virtue of a multiple development process in which development is carried out a plurality of times in this way, a pattern can be formed by keeping only a region with an intermediate exposure intensity from being dissolved, so that a finer pattern than usual can be formed (the same mechanism as in <0077> of JP2008-292975A). Here, the procedures of the alkaline development step and the organic solvent development step are not particularly limited.

The method preferably includes a rinsing step of carrying out rinsing using a rinsing liquid after the step of carrying out development using a developer including an organic solvent.

The rinsing liquid used in the rinsing step after the step of carrying out development using a developer including an organic solvent is not particularly limited as long as the rinsing liquid does not dissolve the resist pattern, and a solution including an ordinary organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same as those described for the developer including an organic solvent.

After the step of carrying out development using a developer including an organic solvent, it is more preferable to carry out carrying out rinsing using a rinsing liquid containing at least one organic solvent selected from the group consisting of a ketone-based solvent, an ester-based solvent, an alcohol-based solvent, and an amide-based solvent, it is still more preferable to carry out carrying out rinsing using a rinsing liquid containing a hydrocarbon-based solvent, an alcohol-based solvent, or an ester-based solvent, it is particularly preferable to carry out carrying out rinsing using a rinsing liquid containing a monohydric alcohol, and it is most preferable to carry out carrying out rinsing using a rinsing liquid containing a monohydric alcohol having 5 or more carbon atoms.

Here, examples of the monohydric alcohol to be used in the rinsing step include a linear, branched, or cyclic monohydric alcohol, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like can be used. As a particularly preferable monohydric alcohol having 5 or more carbon atoms, 1-hexanol, 2-hexanol, 4-methyl-2-pentanol, 1-pentanol, 3-methyl-1-butanol, or the like can be used.

A plurality of these respective solvents may be mixed, or the solvent may be used by mixing it with an organic solvent other than ones described above.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure of the rinsing liquid to be used after the step of carrying out development using a developer including an organic solvent at 20° C. is preferably from 0.05 kPa to 5 kPa, more preferably from 0.1 kPa to 5 kPa, and most preferably from 0.12 kPa to 3 kPa. By setting the vapor pressure of the rinsing liquid to a range from 0.05 kPa to 5 kPa, the temperature uniformity within a wafer surface is improved, and further, the dimensional uniformity within a wafer surface is enhanced by suppression of swelling due to the permeation of the rinsing liquid.

The rinsing liquid may also be used after adding an appropriate amount of a surfactant thereto.

In the rinsing step, the wafer which has been subjected to development using a developer including an organic solvent is subjected to a rinsing treatment using a rinsing liquid containing the organic solvent. A method for the rinsing treatment is not particularly limited, and for example, a method in which a rinsing liquid is continuously discharged onto a substrate rotated at a constant rate (a spin coating method), a method in which a substrate is immersed in a tank filled with a rinsing liquid for a certain period of time (a dip method), a method in which a rinsing liquid is sprayed on the surface of a substrate (a spray method), or the like, can be applied. Above all, it is preferable that a rinsing treatment is carried out using the spin coating method, and the substrate is rotated at a rotation speed of 2,000 rpm to 4,000 rpm after rinsing, thereby removing the rinsing liquid from the substrate. Further, it is also preferable that a heating step (Post Bake) is included after the rinsing step. The developer and the rinsing liquid that remain between and inside the patterns are removed by the bake. The heating step after the rinsing step is usually carried out at 40° C. to 160° C., and preferably at 70° C. to 95° C., and usually for 10 seconds to 3 minutes, and preferably for 30 seconds to 90 seconds.

The pattern formed by the method of the present invention is typically used as, for example, a mask in the etching step for manufacturing a semiconductor, but may also be used in other applications. Examples of such other applications include use for guide pattern formation in DSA (Directed Self-Assembly) (see ACS Nano, Vol. 4, No. 8, pp. 4815-4823, and the like), and use as a core material (core) in a so-called spacer process (see, for example, JP1991-270227A (JP-H03-270227A) and JP2013-164509A).

In addition, the present invention also relates to a method for manufacturing an electronic device, including the pattern (preferably negative tone pattern) forming method of the present invention as described above, and an electronic device manufactured by this manufacturing method.

The electronic device of the present invention is suitably mounted on electric or electronic equipment (home electronics, OA/media-related equipment, optical equipment, telecommunication equipment, and the like).

Various materials (for example, a developer, a rinsing liquid, a composition for forming an antireflection film, and a composition for forming a top coat) used in the composition of the present invention and the pattern forming method of the present invention preferably have various impurities reduced as much as possible, by filtration through a filter, or the like, during or before production.

The filter used for filtration is preferably a polytetrafluoroethylene-, polyethylene- or nylon-made filter having a pore size of 0.1 µm or less, more preferably 0.05 µm or less, and still more preferably 0.03 µm or less. In the filtration through a filter, as described in, for example, JP2002-62667A, circulating filtration may be carried out, or filtration may be carried out by connecting two or more kinds of filters in series or in parallel. In addition, the composition may be filtered a plurality of times. Furthermore, the composition may be subjected to a deaeration treatment or the like before or after filtration through a filter.

Moreover, it is certain that a lower content of elements of metal impurities in the composition is better in terms of the applications of the compositions/various materials. Thus, it is preferable that the content of the metal impurities of raw materials is managed to be low. In addition, a container that for storing or transporting the composition, which is chosen in consideration of impurities, is preferably used.

EXAMPLES

Hereinafter, the present invention will be described with respect to Examples, but the present invention is not limited thereto.

Examples 1 to 36, and Comparative Examples 1 to 4 (ArF Exposure)

Basic Compound (A)

A basic compound (A) which had been appropriately selected from the compounds (A-1) to (A-9) as described above was used.

Furthermore, as a comparative compound, the following (AR-1) and (AR-2) were used. Further, the pKa shown below was the value in terms of a conjugated acid of the comparative compound.

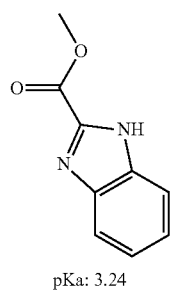

(AR-1)

pKa: 3.24

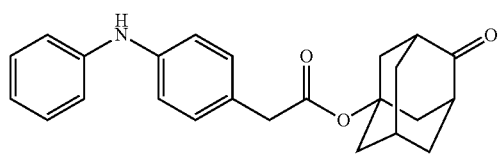

(AR-2)

pKa: 0.65

<Acid-Decomposable Resin (P)>

As the acid-decomposable resin (P), the following resins (P-1) to (P-6) were used.

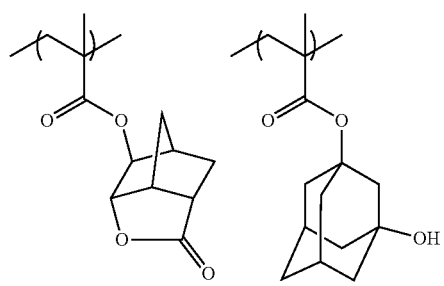

(P-1)

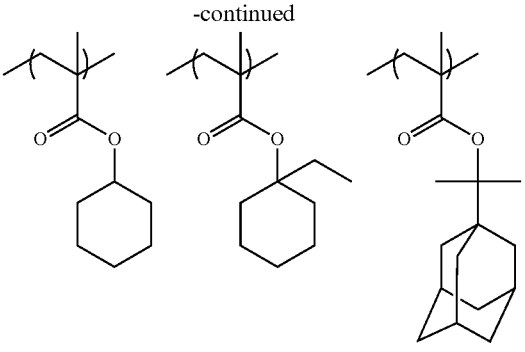

(P-2)

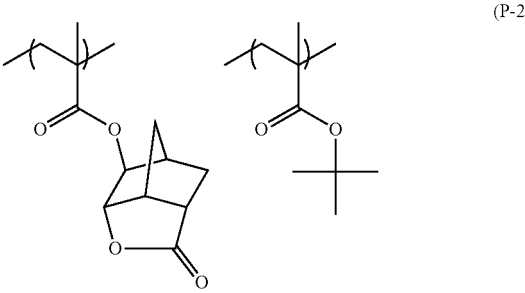

(P-3)

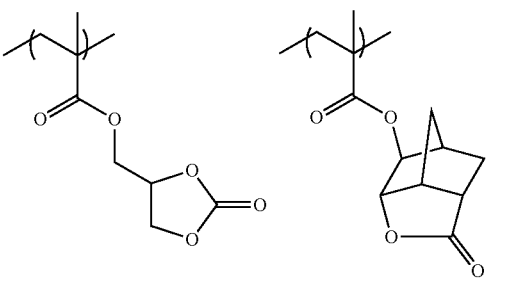

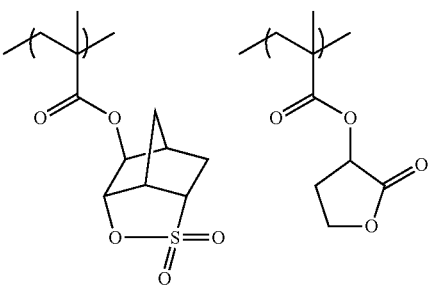

(P-4)

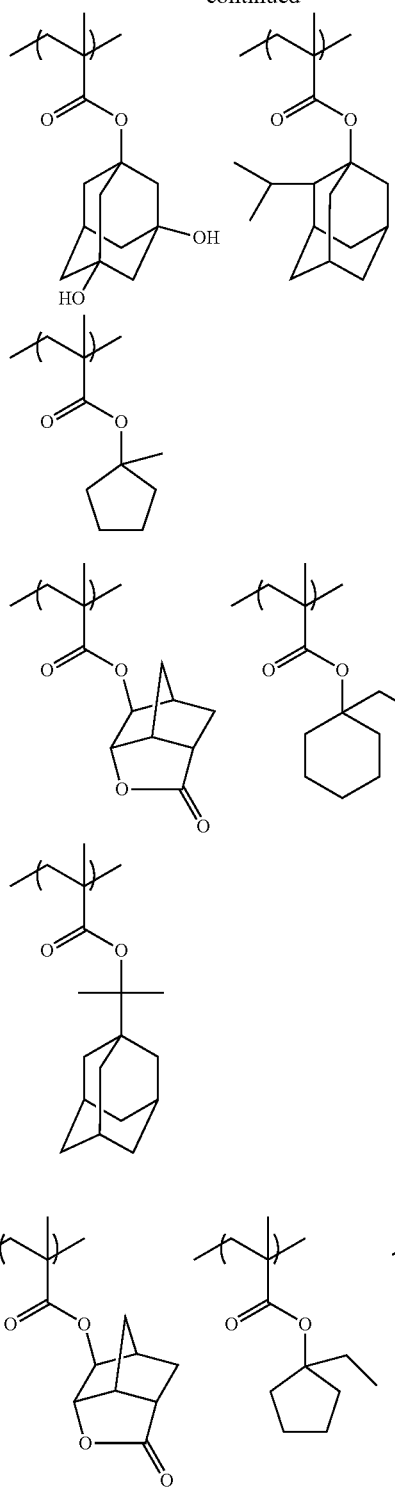

(P-5)

(P-6)

The weight-average molecular weight Mw, the dispersity Mw/Mn, and the compositional ratio (molar ratio) of the respective repeating units of the resins (P-1) to (P-6) are shown in Table 3 below. In Table 3, the positional relationship among the respective repeating units in the respective resins and the positional relationship among the numeral values of the compositional ratios (molar ratios) correspond to each other.

TABLE 3

| Resin | Compositional ratio | | | | | Mw | Mw/Mn |
|-------|----|----|----|----|----|--------|------|
| (P-1) | 31 | 5  | 5  | 45 | 14 | 12,100 | 1.62 |
| (P-2) | 40 | 60 |    |    |    | 22,100 | 1.93 |
| (P-3) | 30 | 11 | 19 | 40 |    | 6,800  | 1.48 |
| (P-4) | 20 | 20 | 5  | 15 | 40 | 10,100 | 1.55 |
| (P-5) | 40 | 45 | 15 |    |    | 15,100 | 1.72 |
| (P-6) | 30 | 60 | 10 |    |    | 8,200  | 1.53 |

Synthesis Example of Acid-Decomposable Resin (P): Synthesis of Resin (P-1)

Under a nitrogen stream, 6.44 g of cyclohexanone was put into a three-neck flask, and heated to 85° C. to obtain a solvent 1. Next, a monomer-1 (3.33 g), a monomer-2 (0.59 g), a monomer-3 (0.42 g), a monomer-4 (4.42 g), and a monomer-5 (1.97 g), each described below, were dissolved in cyclohexanone (25.75 g) to prepare a monomer solution. Further, a solution obtained by adding and dissolving a polymerization initiator V-601 (manufactured by Wako Pure Chemical Industries. Ltd.) in an amount of 4.2% by mole with respect to the total amount of the monomers was added dropwise to the solvent 1 for 6 hours. After completion of dropwise addition, reaction was further performed at 85° C. for 2 hours. The reaction liquid was left to be cooled and then added dropwise to a mixed solvent of 270 g of methanol/30 g of water, and the precipitated powder was filtered and dried to obtain 8.6 g of a resin (P-1). Regarding the obtained resin (P-1), the weight-average molecular weight was 12,100, the dispersity (Mw/Mn) was 1.62, and the compositional ratio (molar ratio) measured by $^{13}$C-NMR was 31/5/5/45/14.

monomer-1

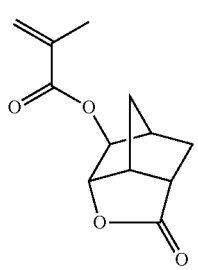

monomer-2

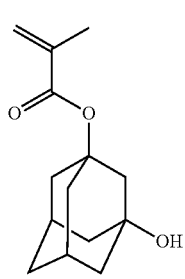

monomer-3

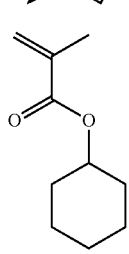

monomer-4

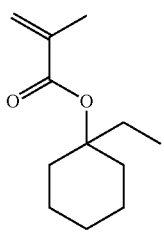

monomer-5

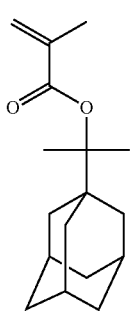

In the same manner as the resin (P-1), resins (P-2) to (P-6) were synthesized.

[Photoacid Generator (B)]

As the photoacid generator (B), the following ones were used.

(PAG-1)

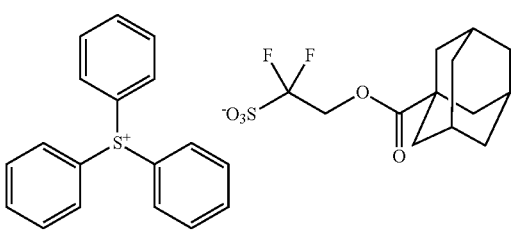

(PAG-2)

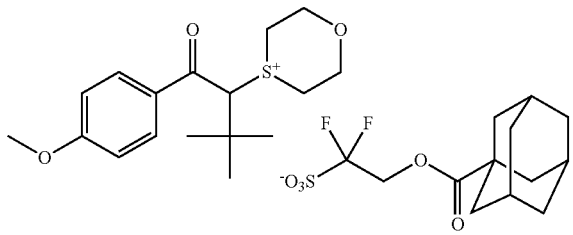

(PAG-3)

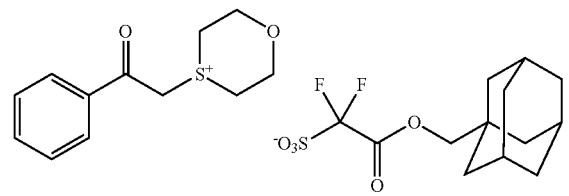

(PAG-4)

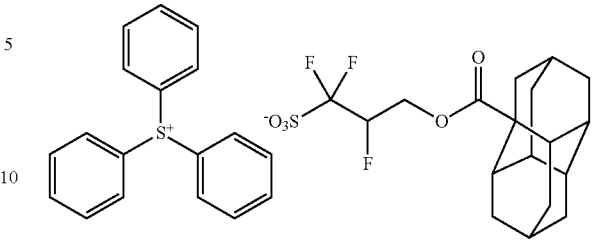

(PAG-5)

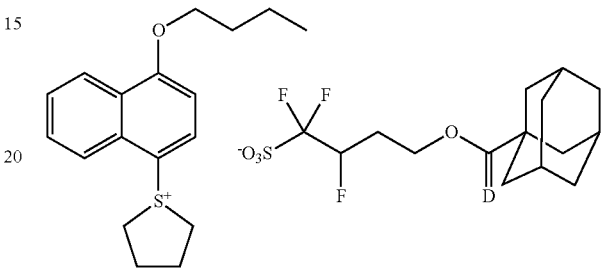

(PAG-6)

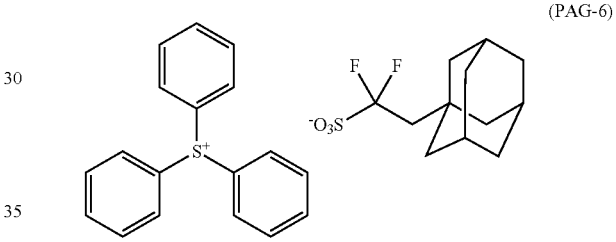

[Basic Compound]

As a basic compound to be used in combination with the basic compound (A), the following (N-1) and (N-2) were used.

(N-1)

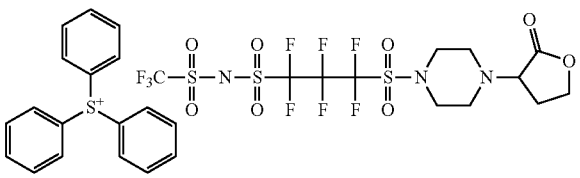

(N-2)

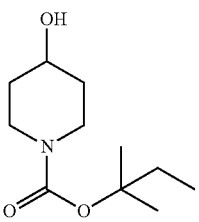

[Hydrophobic Resin]

As the hydrophobic resin, the following resins were selected from the above-mentioned resins (B-1) to (B-56), and (C-1) to (C-28), and used.

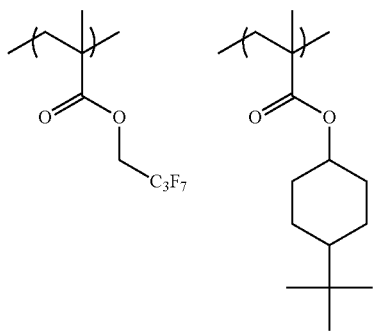
(B-1)
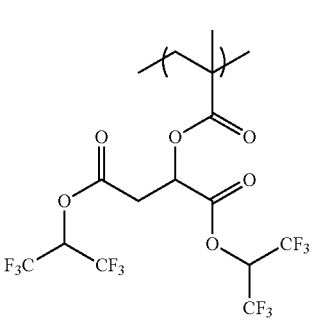
(B-39)
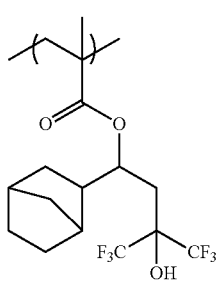
(B-19)
TABLE 4
| Resin | Compositional ratio | Mw | Dispersity |
|---|---|---|---|
| B-1 | 50/50 | 4,800 | 1.4 |
| B-19 | 100 | 4,900 | 1.6 |
| B-24 | 100 | 5,800 | 2.0 |
| B-37 | 20/80 | 5,400 | 1.6 |
| B-39 | 70/30 | 4,500 | 1.6 |
In Table 4, the compositional ratio of the repeating units is a molar ratio.
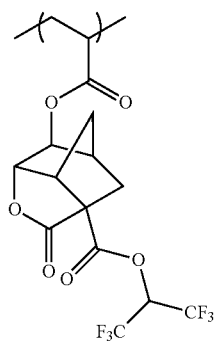
(B-24)
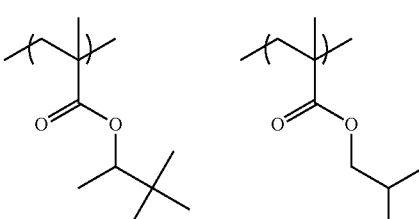
(C-1)
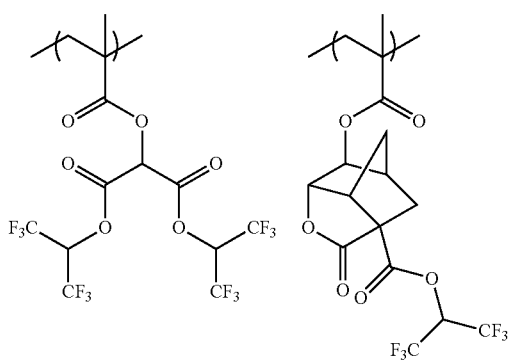
(B-37)
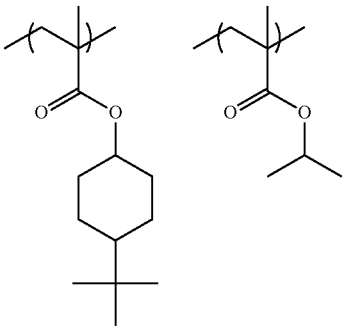
(C-10)
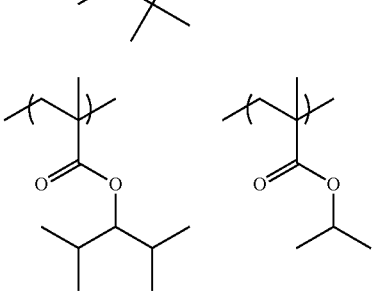
(C-14)

-continued

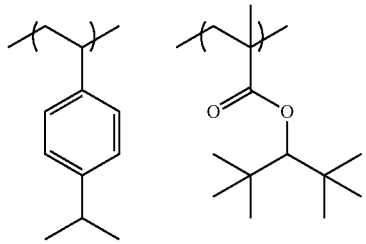

(C-19)

TABLE 5

| Resin | Compositional ratio | Mw | Mw/Mn |
|---|---|---|---|
| C-1 | 50/50 | 9,600 | 1.74 |
| C-10 | 50/50 | 23,800 | 1.46 |
| C-14 | 50/50 | 16,700 | 1.82 |
| C-19 | 70/30 | 12,400 | 1.49 |

In Table 5, the compositional ratio of the repeating units is a molar ratio.

[Surfactant]

As the surfactant, the following ones were used.

W-1: PF6320 (manufactured by OMNOVA Solutions Inc.)

W-2: TROYSOL S-366 (manufactured by Troy Chemical Co., Ltd.)

W-3: Polysiloxane Polymer KP-341 (manufactured by Shin-Etsu Chemical Co., Ltd.)

W-4: PF656 (manufactured by OMNOVA Solutions Inc.)

W-5: MEGAFACE F176 (manufactured by DIC, Inc.)

W-6: MEGAFACE R08 (manufactured by DIC, Inc.)

[Solvent]

The following solvents were provided.

SL-1: Propylene glycol monomethyl ether acetate (PGMEA)

SL-2: Cyclohexanone

SL-3: Propylene glycol monomethyl ether (PGME)

SL-4: γ-Butyrolactone

SL-5: Propylene carbonate

SL-6: 2-Ethylbutanol

SL-7: Perfluorobutyl tetrahydrofuran

SL-8: Ethyl lactate

<Preparation of Resist Composition and Pattern Formation (Negative Tone and Organic Solvent Development)>

The components shown in Table 6 below were dissolved in the solvents shown in the same table such that the solid content became 3.4% by mass, and each of the solutions was filtered through a polyethylene filter having a pore size of 0.03 μm to prepare an active-light-sensitive or radiation-sensitive resin composition (resist composition). An organic antireflection coating material, ARC29SR (manufactured by Nissan Chemical Industries, Ltd.), was applied onto a silicon wafer and baked at 205° C. for 60 seconds to form an antireflection film having a film thickness of 95 nm. The resist composition was applied thereonto and baked (PB; Prebake) at the temperature described in Table 7 for 60 seconds to form a resist film having a film thickness of 90 nm.

The silicon wafer having the resist film formed thereon was subjected to pattern exposure through a binary mask, using an ArF liquid immersion exposure apparatus (manufactured by ASML; XT1700i. NA1.20, C-Quad, outer sigma 0.900, inner sigma 0.812, XY deflection). Ultrapure water was used as an immersion liquid. Then, the wafer was baked (Post Exposure Bake: PEB) at the temperature described in Table 7 for 60 seconds, developed with the organic developer described in Table 7 for 30 seconds, and rinsed with a rinsing liquid. Thereafter, the silicon wafer was rotated at a rotation speed of 4,000 rpm for 30 seconds, thereby obtaining a resist pattern of a trench having a pitch of 128 nm and a space of 40 nm.

TABLE 6

| Resist composition | Basic compound (A) | (g) | Photo-acid generator (B) | (g) | Basic compound to be used in combination | (g) | Resin (P) | (g) | Hydrophobic resin | (g) | Surfactant | (g) | Solvent | (mass ratio) | Note |
|---|---|---|---|---|---|---|---|---|---|---|---|---|---|---|---|
| 1 | A-1 | 0.3 | PAG-1 | 1 | — | — | P-1 | 10 | B-1 | 0.4 | W-1 | 0.001 | SL-1/SL-6 | 70/30 | Example |
| 2 | A-2 | 0.4 | PAG-2 | 0.7 | — | — | P-3 | 10 | B-19 | 0.1 | W-2 | 0.002 | SL-1/SL-7 | 90/10 | Example |
| 3 | A-3 | 0.1 | PAG-3 | 1.1 | — | — | P-2 | 10 | B-24 | 0.03 | W-3 | 0.001 | SL-1/SL-4 | 90/10 | Example |
| 4 | A-4 | 0.25 | PAG-4 | 0.8 | — | — | P-4 | 10 | B-37 | 0.2 | W-4 | 0.001 | SL-1/SL-5 | 70/30 | Example |
| 5 | A-5 | 0.3 | PAG-5 | 0.9 | — | — | P-5 | 10 | B-39 | 0.1 | W-5 | 0.002 | SL-1/SL-6/SL-7 | 80/15/5 | Example |
| 6 | A-6 | 0.4 | PAG-6 | 1.2 | — | — | P-6 | 10 | C-14 | 0.08 | W-6 | 0.001 | SL-3/SL-8 | 95/5 | Example |
| 7 | A-7 | 0.15 | PAG1/PAG3 | 0.5/0.5 | N-1 | 0.05 | P-1 | 10 | C-19 | 0.06 | W-2 | 0.001 | SL-2 | 100 | Example |
| 8 | A-8 | 0.2 | PAG2/PAG4 | 0.7/0.3 | — | — | P-3 | 10 | C-1/C-10 | 0.1/0.03 | W-3 | 0.002 | SL-3/SL-4 | 80/20 | Example |
| 9 | A-9 | 0.3 | PAG-1 | 0.8 | N-2 | 0.02 | P-2 | 10 | B-1 | 0.4 | W-4 | 0.001 | SL-2/SL-6 | 80/20 | Example |
| 10 | A-2/A-5 | 0.1/0.1 | PAG-2 | 0.7 | — | — | P-4/P-1 | 5/5 | B-19 | 0.1 | W-5 | 0.001 | SL-1/SL-6 | 70/30 | Example |
| 11 | A-1 | 0.3 | PAG-3 | 1.1 | — | — | P-5 | 10 | B-24 | 0.03 | W-6 | 0.002 | SL-1/SL-7 | 90/10 | Example |
| 12 | A-2 | 0.4 | PAG-4 | 0.8 | — | — | P-6 | 10 | B-37 | 0.2 | W-1 | 0.001 | SL-1/SL-4 | 90/10 | Example |
| 13 | A-3 | 0.1 | PAG-5 | 0.9 | — | — | P-1 | 10 | B-39 | 0.1 | W-3 | 0.001 | SL-1/SL-5 | 70/30 | Example |
| 14 | A-4 | 0.25 | PAG-6 | 0.7 | N-1 | 0.02 | P-3 | 10 | C-14 | 0.08 | — | — | SL-1/SL-6/SL-8 | 80/15/5 | Example |
| 15 | A-5 | 0.3 | PAG1/PAG3 | 0.5/0.5 | — | — | P-2 | 10 | C-19 | 0.06 | W-5 | 0.001 | SL-3/SL-7 | 95/5 | Example |
| 16 | A-6 | 0.4 | PAG2/PAG4 | 0.7/0.3 | N-2 | 0.05 | P-4 | 10 | C-1/C-10 | 0.1/0.03 | W-6 | 0.001 | SL-3 | 100 | Example |
| 17 | A-7 | 0.15 | PAG-5 | 1.2 | — | — | P-5 | 10 | B-1 | 0.4 | W-1 | 0.002 | SL-3/SL-5 | 80/20 | Example |

TABLE 6-continued

| Resist compo- sition | Basic com- pound (A) | (g) | Photo- acid gener- ator (B) | (g) | Basic compound to be used in combi- nation | (g) | Resin (P) | (g) | Hydro- phobic resin | (g) | Surfac- tant | (g) | Solvent | (mass ratio) | Note |
|---|---|---|---|---|---|---|---|---|---|---|---|---|---|---|---|
| 18 | A-8 | 0.2 | PAG-6 | 0.7 | N-1 | 0.05 | P-6 | 10 | B-19 | 0.1 | W-2 | 0.001 | SL-2/SL-7 | 80/20 | Example |
| 19 | AR-1 | 0.1 | PAG-1 | 1 | — | — | P-1 | 10 | B-1 | 0.2 | W-1 | 0.001 | SL-1/SL-6 | 70/30 | Comparative Example |
| 20 | AR-2 | 0.3 | PAG-2 | 1 | — | — | P-1 | 10 | B-1 | 0.1 | W-1 | 0.001 | SL-1/SL-7 | 90/10 | Comparative Example |

<Organic Developer>
As the organic developer, the following ones were prepared.
SG-1: Butyl acetate
SG-2: Methyl amyl ketone
SG-3: Ethyl-3-ethoxypropionate
SG-4: Pentyl acetate
SG-5: Isopentyl acetate
SG-6: propylene glycol monomethyl ether acetate (PG-MEA)
SG-7: Cyclohexanone
<Rinsing Liquid>
As the rinsing liquid, the following ones were used.
SR-1: 4-Methyl-2-pentanol
SR-2: 1-Hexanol
SR-3: Butyl acetate
SR-4: Methyl amyl ketone
SR-5: Ethyl-3-ethoxy propionate
<Evaluation Method>
(Depth of Focus; DOF)
The exposure dose and the focus for forming a resist pattern of a trench with a pitch of 128 nm and a space of 40 nm were taken as the optimum exposure dose and the optimum focus, respectively. The focus range allowing a variation of ±10% of the pattern size when the focus was changed (defocused) while the exposure dose was kept at the optimal exposure dose was determined. A larger value indicates that the change in performance due to a change in the focus is smaller and the depth of focus (DOF) is better.

The temperature conditions (° C.) of PB and PEB in pattern formation, and the developer and rinsing liquid are shown in Table 7 below, with respect to each of Examples and Comparative Examples.

TABLE 7

| Resist compo- sition | PB temper- ature (° C.) | PEB temper- ature (° C.) | Devel- oper | Rinsing liquid | DOF (μm) | Note |
|---|---|---|---|---|---|---|
| 1 | 110 | 100 | SG-1 | SR-1 | 0.12 | Example 1 |
| 2 | 105 | 95 | SG-1 | SR-2 | 0.16 | Example 2 |
| 3 | 90 | 85 | SG-1 | SR-1 | 0.12 | Example 3 |
| 4 | 105 | 95 | SG-2 | — | 0.10 | Example 4 |
| 5 | 100 | 105 | SG-2 | SR-3 | 0.16 | Example 5 |
| 6 | 105 | 90 | SG-3 | SR-1 | 0.15 | Example 6 |
| 7 | 95 | 100 | SG-1 | — | 0.15 | Example 7 |
| 8 | 90 | 95 | SG-4 | SR-1 | 0.16 | Example 8 |
| 9 | 100 | 100 | SG-5 | SR-5 | 0.15 | Example 9 |
| 10 | 110 | 95 | SG-1 | — | 0.15 | Example 10 |
| 11 | 105 | 105 | SG-1 | SR-1 | 0.12 | Example 11 |
| 12 | 110 | 80 | SG-6 | SR-1 | 0.16 | Example 12 |
| 13 | 105 | 100 | SG-2 | — | 0.12 | Example 13 |
| 14 | 100 | 95 | SG-1 | SR-1 | 0.10 | Example 14 |
| 15 | 105 | 100 | SG-7 | SR-1 | 0.16 | Example 15 |
| 16 | 95 | 95 | SG-1 | SR-3 | 0.15 | Example 16 |
| 17 | 90 | 105 | SG-2 | — | 0.15 | Example 17 |
| 18 | 100 | 90 | SG-1 | SR-4 | 0.16 | Example 18 |
| 19 | 90 | 100 | SG-4 | SR-1 | 0.04 | Comparative Example 1 |
| 20 | 100 | 95 | SG-5 | SR-1 | 0.06 | Comparative Example 2 |

As clearly seen from the results shown in Table 7, in Examples 1 to 18 containing the basic compound (A), DOF was highly excellent, as compared with Comparative Examples 1 and 2 not containing the basic compound (A).

Furthermore, in the same manner as in Examples 1 to 18 except that the resist pattern to be formed was a hole pattern having a pitch of 110 nm and a hole diameter of 50 nm, a resist pattern was formed and evaluated in the same manner as above, and thus, DOF was highly excellent.

In addition, evaluation was carried out in the same manner as in Examples 1 to 18 except for further adding a step in which after forming the resist film, a top coat film was formed on the resist film, using the composition OC-5 in Table 3 of JP2013-61647A. In this evaluation, pattern formation could also be appropriately carried out.

<Preparation of Resist Composition and Pattern Forming Method (Positive Tone and Alkaline Development)>

The components shown in Table 6 were dissolved in the solvents shown in the same table such that the solid content became 3.4% by mass, and each of the solutions was filtered through a polyethylene filter having a pore size of 0.03 μm to prepare an active-light-sensitive or radiation-sensitive resin composition (resist composition). An organic antireflection coating material, ARC29SR (manufactured by Nissan Chemical Industries, Ltd.), was applied onto a silicon wafer and baked at 205° C. for 60 seconds to form an antireflection film having a film thickness of 95 nm. The resist composition was applied thereonto and baked (Prebake: PB) at the temperature described in Table 8 for 60 seconds to form a resist film having a film thickness of 90 nm.

The obtained wafer was subjected to pattern exposure through a binary mask, using an ArF liquid immersion exposure apparatus (manufactured by ASML; XT1700i, NA1.20, C-Quad, outer sigma 0.900, inner sigma 0.812, XY deflection). Ultrapure water was used as an immersion liquid. Then, the wafer was baked (PEB; Post Exposure Bake) at the temperature described in Table 8 for 60 seconds, developed with an aqueous tetramethylammonium hydroxide solution (2.38% by mass) for 30 seconds, and rinsed with pure water. Then, the wafer was rotated at a rotation speed of 4,000 rpm for 30 seconds to obtain a resist pattern of a trench having a pitch of 128 nm and a space of 88 nm.

(Depth of Focus; DOF)

The exposure dose and the focus for forming a resist pattern of a trench with a pitch of 128 nm and a space of 88 nm were taken as the optimum exposure dose and the optimum focus, respectively. The focus range allowing a variation of ±10% of the pattern size when the focus was changed (defocused) while the exposure dose was kept at the optimal exposure dose was determined. A larger value indicates that the change in performance due to a change in the focus is smaller and the depth of focus (DOF) is better.

The temperature conditions (° C.) of PE and PEB in pattern formation are shown in Table 8 below, with respect to each of Examples and Comparative Examples.

TABLE 8

| Resist composition | PB temperature (° C.) | PEB temperature (° C.) | DOF (μm) | Note |
|---|---|---|---|---|
| 1 | 110 | 100 | 0.11 | Example 19 |
| 2 | 105 | 95 | 0.16 | Example 20 |
| 3 | 110 | 90 | 0.12 | Example 21 |
| 4 | 105 | 95 | 0.09 | Example 22 |
| 5 | 100 | 105 | 0.16 | Example 23 |
| 6 | 105 | 90 | 0.15 | Example 24 |
| 7 | 95 | 100 | 0.15 | Example 25 |
| 8 | 90 | 95 | 0.16 | Example 26 |
| 9 | 100 | 85 | 0.15 | Example 27 |
| 10 | 110 | 95 | 0.15 | Example 28 |
| 11 | 105 | 105 | 0.12 | Example 29 |
| 12 | 110 | 90 | 0.15 | Example 30 |
| 13 | 105 | 100 | 0.11 | Example 31 |
| 14 | 100 | 95 | 0.10 | Example 32 |
| 15 | 100 | 80 | 0.16 | Example 33 |
| 16 | 95 | 95 | 0.15 | Example 34 |
| 17 | 90 | 105 | 0.15 | Example 35 |
| 18 | 100 | 90 | 0.16 | Example 36 |
| 19 | 90 | 100 | 0.06 | Comparative Example 3 |
| 20 | 100 | 95 | 0.04 | Comparative Example 4 |

As clearly seen from the results shown in Table 8, in Examples 19 to 36 containing the basic compound (A) in the present invention, DOF was highly excellent, as compared with Comparative Examples 3 and 4 not containing the basic compound (A) of the present invention.

Furthermore, in the same manner as in Examples 19 to 36 except that the resist pattern to be formed was a hole pattern having a pitch of 110 nm and a hole diameter of 50 nm, a resist pattern was formed and evaluated in the same manner as above, and thus, DOF was highly excellent.

Examples 37 to 41 (EUV Exposure)

Acid-Decomposable Resin (P)

As the acid-decomposable resin (P), the following resins (P-2-1) to (P-2-5) were used.

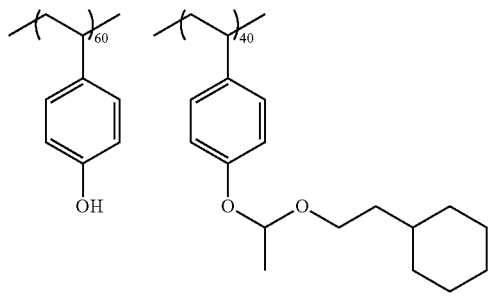

P-2-1

MW: 5000
Mw/Mn: 1.20

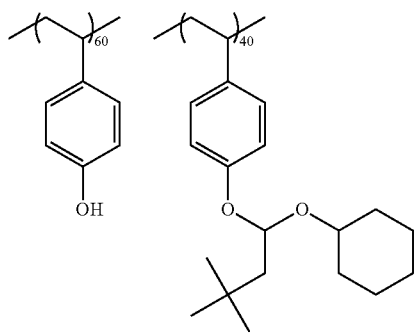

P-2-2

MW: 4800
Mw/Mn: 1.18

-continued

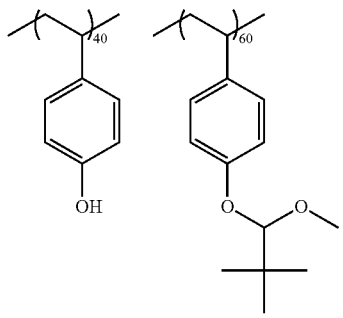

P-2-3

MW: 4500
Mw/Mn: 1.23

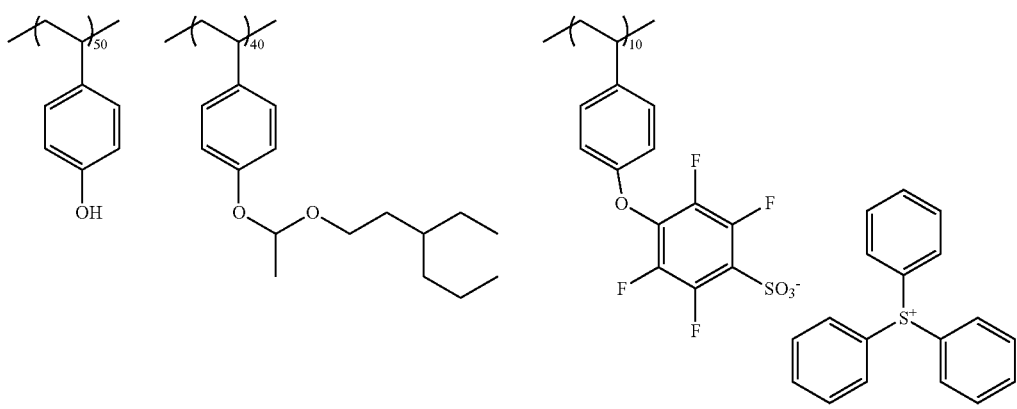

P-2-4

MW: 12200
Mw/Mn: 1.79

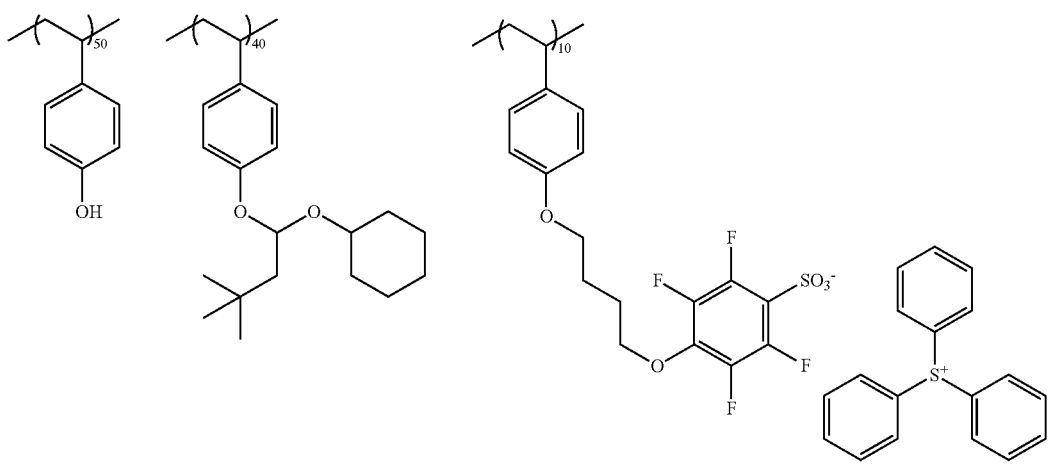

P-2-5

MW: 5800
Mw/Mn: 1.21

The ratios of the repeating units of the resins are molar ratios.

<Synthesis of Resin (P-2-1)>

20.0 g of poly(p-hydroxystyrene) (VP-2500, manufactured by Nippon Soda Co., Ltd.) was dissolved in 80.0 g of propylene glycol monomethyl ether acetate (PGMEA). To this solution, 10.3 g of 2-cyclohexylethyl vinyl ether and 20 mg of camphorsulfonic acid were added, and the mixture was stirred at room temperature for 2 hours. 84 mg of triethylamine was added thereto, the mixture was stirred for a while, and then the reaction liquid was transferred to a separating funnel including 100 mL of ethyl acetate. The organic layer was washed with 50 mL of distilled water three times, and then this organic layer was concentrated in an evaporator. The obtained polymer was dissolved in 300 mL of acetone and then reprecipitated by dropwise addition to 3,000 g of hexane, and the precipitate was filtered to

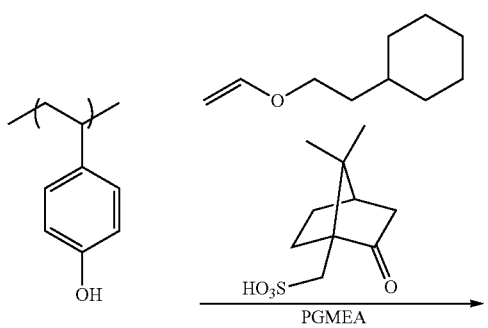

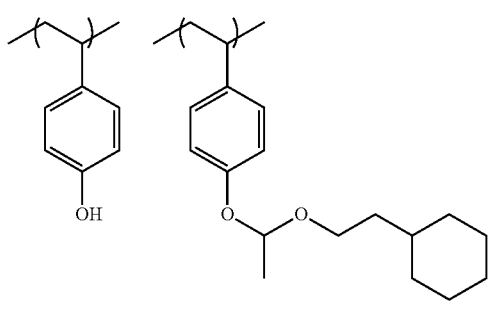

(P-2-1)

Resins (P-2-2) to (P-2-5) were synthesized in the same manner as the resin (P-2-1).

<Acid Generator>

As the acid generator, the following compounds (z2-1) and (z2-2) were used.

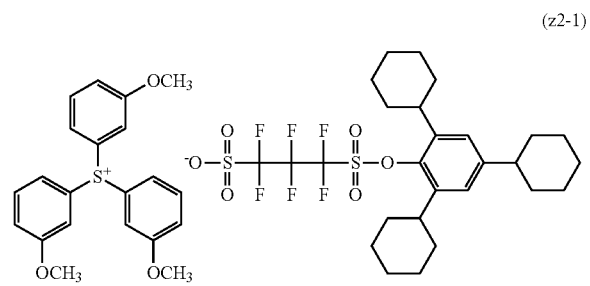

(z2-1)

(z2-2)

As the components, the developers, and the rinsing liquids other than the above ones, those described in [(ArF exposure)] were used.

(1) Preparation and Coating of Coating Solution of Active-Light-Sensitive or Radiation-Sensitive Resin Composition The components shown in Table 9 below were dissolved in the solvent shown in the same table such that the solid content became a concentration of 3.4% by mass, and each of the solutions was filtered through a polyethylene filter having a pore size of 0.05 μm to prepare an active-light-sensitive or radiation-sensitive resin composition (resist composition) solution.

This active-light-sensitive or radiation-sensitive resin composition solution was applied onto a 6-inch Si wafer that had been subjected to a hexamethyldisilazane (HMDS) treatment in advance, using a spin coater, Mark 8, manufactured by Tokyo Electron Ltd., and dried on a hot plate at 100° C. for 60 seconds to obtain a resist film having a film thickness of 50 nm.

(2) EUV Exposure and Development

The wafer having the resist film obtained in (1) formed thereon was subjected to pattern exposure through an exposure mask (line/space=1/1) by using an EUV exposure apparatus (Micro Exposure Tool, manufactured by Exitech, NA 0.3, Quadrupole, outer sigma 0.68, and inner sigma 0.36). After the exposure, the wafer was heated on a hot plate at 110° C. for 60 seconds, then developed by paddling the organic developer shown in the following table for 30 seconds, and rinsed using the rinsing liquid shown in Table 9 below. Thereafter, the wafer was rotated at a rotation speed of 4,000 rpm for 30 seconds and then baked at 90° C. for 60 seconds, thereby obtaining a resist pattern having a 1:1 line-and-space pattern with a line width of 50 nm.

TABLE 9

| | Resin (P) | Concentration | Basic compound (A) | Concentration | Acid generator | Concentration | Basic compound to be used in combination | Concentration | Organic solvent (D) | Mass ratio | Surfactant | Concentration | Developer | Rinsing liquid |
|---|---|---|---|---|---|---|---|---|---|---|---|---|---|---|
| Example 37 | P-2-1 | 86.6 | A-1 | 3 | z2-1 | 10 | N-1 | 0.3 | SL-1/SL-5 | 40/60 | W-1 | 0.1 | SG-1 | None |
| Example 38 | P-2-2 | 86.9 | A-2 | 3 | z2-2 | 10 | — | 0 | SL-1/SL-5 | 40/60 | W-2 | 0.1 | SG-1 | SR-1 |
| Example 39 | P-2-3 | 86.9 | A-3 | 3 | z2-1 | 10 | — | 0 | SL-1/SL-5 | 40/60 | W-1 | 0.1 | SG-1 | SR-1 |
| Example 40 | P-2-4 | 96.6 | A-4 | 3 | None | 0 | N-2 | 0.3 | SL-1/SL-6 | 40/60 | W-1 | 0.1 | SG-1 | None |
| Example 41 | P-2-5 | 96.9 | A-5 | 3 | None | 0 | — | 0 | SL-1/SL-6 | 40/60 | W-2 | 0.1 | SG-1 | SR-1 |

The concentration of each component indicates the concentration (% by mass) in the concentration of the total solid contents.

Good patterns could be obtained with any of resist compositions.

What is claimed is:

1. An active-light-sensitive or radiation-sensitive resin composition comprising
a basic compound (A) that is represented by the following General Formula (I),
an acid generator (B), and
a resin (P) having a group that decomposes by the action of an acid to generate a polar group, $$W\text{-}L\text{-}R_N \qquad (I)$$

in General Formula (I),
$R_N$ represents a basic site,
L represents a single bond or a divalent linking group, and
W represents a bridged alicyclic group having 7 to 15 carbon atoms, the bridged alicyclic group including a polar group, W represents a heterocyclic ring having 6 to 20 carbon atoms, or W represents a monovalent group formed by removing a hydrogen atom from the structure of anthraquinone.

2. The active-light-sensitive or radiation-sensitive resin composition according to claim 1, wherein the pKa of a conjugated acid of the basic compound (A) is from 1.0 to 6.0.

3. The active-light-sensitive or radiation-sensitive resin composition according to claim 1, wherein the basic compound (A) is a compound which is stable against an acid in the active-light-sensitive or radiation-sensitive resin composition.

4. The active-light-sensitive or radiation-sensitive resin composition according to claim 1, wherein W in General Formula (I) is a bridged alicyclic group having 7 to 15 carbon atoms and including a polar group, or a heterocyclic ring formed by removing a hydrogen atom from any one of structures of xanthene, thioxanthene, dibenzofuran, carbazole, dibenzothiophene, benzofuran, or benzothiophene, or a monovalent group formed by removing a hydrogen atom from the structure of anthraquinone.

5. The active-light-sensitive or radiation-sensitive resin composition according to claim 1, wherein W in General Formula (I) is a heterocyclic ring formed by removing a hydrogen atom from any one of structures of xanthene, thioxanthene, dibenzofuran, carbazole, dibenzothiophene, benzofuran, or benzothiophene, or a monovalent group formed by removing a hydrogen atom from the structure of anthraquinone.

6. The active-light-sensitive or radiation-sensitive resin composition according to claim 1, wherein W in General Formula (I) is a heterocyclic ring formed by removing a hydrogen atom from any one of structures of xanthene, thioxanthene, dibenzofuran, carbazole, dibenzothiophene, benzofuran, or benzothiophene.

7. The active-light-sensitive or radiation-sensitive resin composition according to claim 1, wherein $R_N$ in General Formula (I) is represented by any one of the following General Formulae (II-1) to (II-3),

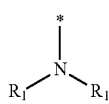
(II-1)

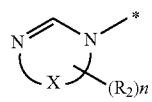
(II-2)

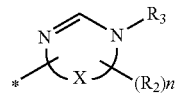
(II-3)

in General Formulae (II-1) to (II-3),
$R_1$'s each independently represent an alkyl group, and $R_1$'s may be bonded to each other to form a ring via at least one atom selected from a carbon atom, an oxygen atom, or a nitrogen atom,
$R_2$'s each independently represent a monovalent organic group and n represents an integer of 0 to 3,
$R_3$ represents a hydrogen atom or a monovalent organic group,
a plurality of $R_2$'s, and $R_2$ and $R_3$ may form a linked ring,
* represents a binding site to L, and
X represents a group that forms a ring together with a nitrogen atom.

8. The active-light-sensitive or radiation-sensitive resin composition according to claim 1, wherein $R_N$ in General Formula (I) is represented by any one of the following General Formulae (II-2) and (II-3),

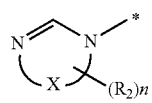
(II-2)

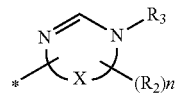
(II-3)

in General Formulae (II-2) and (II-3),
$R_2$'s each independently represent a monovalent organic group and n represents an integer of 0 to 3,
$R_3$ represents a hydrogen atom or a monovalent organic group,
a plurality of $R_2$'s, and $R_2$ and $R_3$ may form a linked ring,
* represents a binding site to L, and
X represents a group that forms a ring together with a nitrogen atom.

9. The active-light-sensitive or radiation-sensitive resin composition according to claim 1, wherein the resin (P) has a repeating unit having at least one structure selected from a lactone structure, a sultone structure, or a cyclic carbonic acid ester structure.

10. An active-light-sensitive or radiation-sensitive film formed using the active-light-sensitive or radiation-sensitive resin composition according to claim 1.

11. A pattern forming method comprising:
forming an active-light-sensitive or radiation-sensitive film using the active-light-sensitive or radiation-sensitive resin composition according to claim 1;
exposing the active-light-sensitive or radiation-sensitive film; and
developing the exposed active-light-sensitive or radiation-sensitive film by a developer.

12. The pattern forming method according to claim 11, wherein the developer is a developer including an organic solvent and the formed pattern is a negative tone pattern.

13. A method for manufacturing an electronic device, comprising the pattern forming method according to claim 11.

14. The active-light-sensitive or radiation-sensitive resin composition according to claim 1, wherein the bridged alicyclic group has a bridged alicyclic ring substituted with a polar group.

15. The active-light-sensitive or radiation-sensitive resin composition according to claim 1, wherein W in General Formula (I) represents at least a structure selected from the group consisting of the following structures:

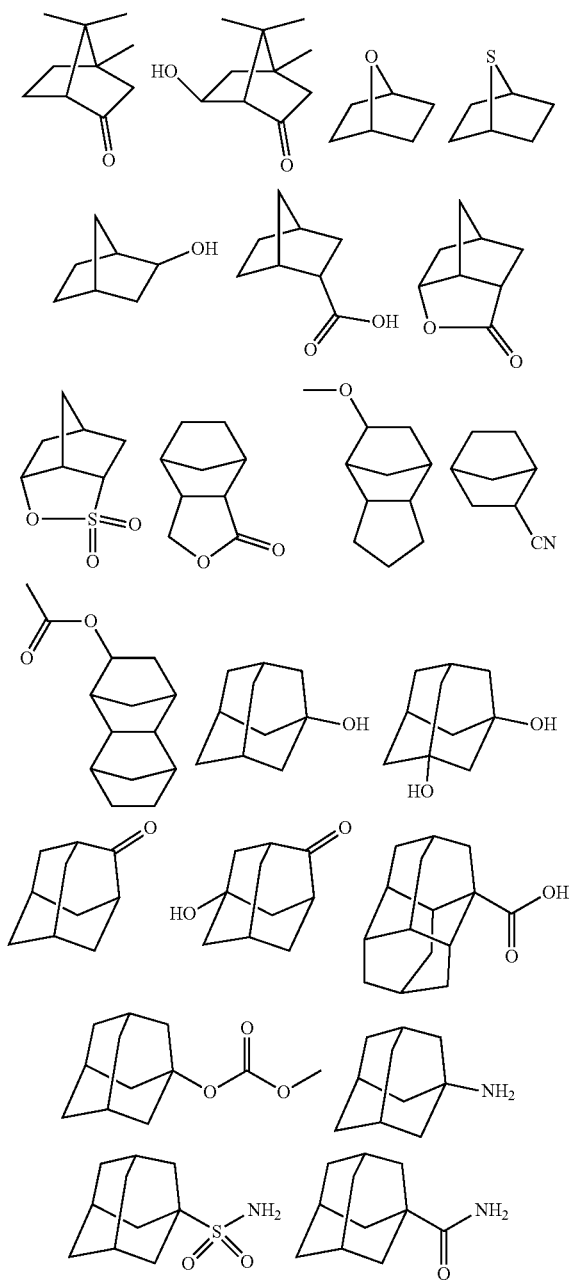

-continued

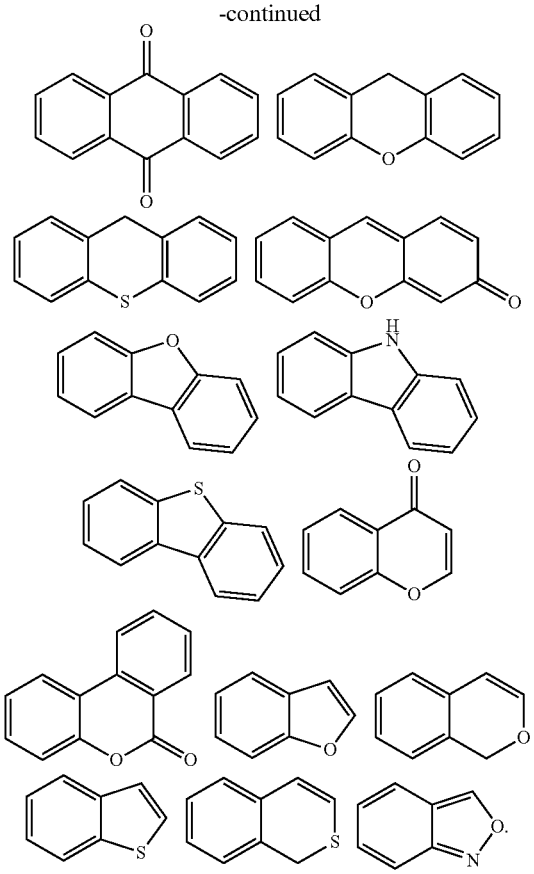

16. The active-light-sensitive or radiation-sensitive resin composition according to claim 1, wherein W in General Formula (I) represents a bridged alicyclic group having 7 to 15 carbon atoms, the bridged alicyclic group substituted with a polar group, or W represents a heterocyclic ring formed by removing a hydrogen atom from any one of structures of xanthene, thioxanthene, dibenzofuran, carbazole, dibenzothiophene, benzofuran, or benzothiophene, or W represents a monovalent group formed by removing a hydrogen atom from the structure of anthraquinone.

17. The active-light-sensitive or radiation-sensitive resin composition according to claim 1, wherein the General Formula (I) is represented by the General Formula (I') or the General Formula (I"):

$$W'-L'-R_N' \qquad (I')$$

in General Formula (I'), $R_N'$ represents a basic site,

L' represents a single bond or a divalent linking group, and

W' represents a bridged alicyclic group having 7 to 15 carbon atoms, the bridged alicyclic group substituted with a polar group, $$W''-L''-R_N'' \qquad (I'')$$

in General Formula (I"), $R_N''$ represents a basic site represented by any one of the following General Formulae (II-1') to (II-3'), L" represents a single bond or a divalent linking group, and W" represents a heterocyclic ring having 6 to 20 carbon atoms, or W" represents a monovalent group formed by removing a hydrogen atom from the structure of anthraquinone,

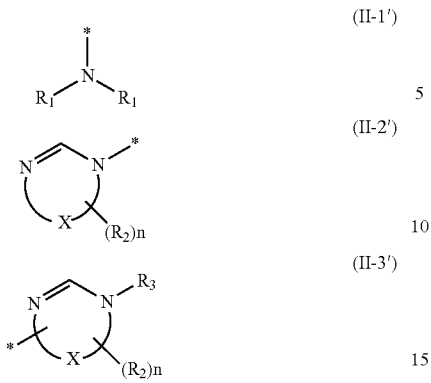

(II-1')

(II-2')

(II-3')

in General Formulae (II-1') to (II-3'), $R_1$'s each independently represent an alkyl group, and $R_1$'s may be bonded to each other to form a ring via at least one atom selected from a carbon atom, an oxygen atom, or a nitrogen atom, $R_2$'s each independently represent a monovalent organic group and n represents an integer of 0 to 3, $R_3$ represents a hydrogen atom or a monovalent organic group, a plurality of $R_2$'s, and $R_2$ and $R_3$ may form a linked ring,

* represents a binding site to L, and

X represents a group that forms a ring together with a nitrogen atom.

* * * * *